US012460127B2

(12) United States Patent
Geum et al.

(10) Patent No.: US 12,460,127 B2
(45) Date of Patent: Nov. 4, 2025

(54) COMPOUND AND ORGANIC LIGHT-EMITTING DEVICE COMPRISING SAME

(71) Applicant: LG CHEM, LTD., Seoul (KR)

(72) Inventors: Sujeong Geum, Daejeon (KR); Wanpyo Hong, Daejeon (KR); Moung Gon Kim, Daejeon (KR); Kyunghee Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 1000 days.

(21) Appl. No.: 17/417,349

(22) PCT Filed: Jan. 10, 2020

(86) PCT No.: PCT/KR2020/000473
§ 371 (c)(1),
(2) Date: Jun. 22, 2021

(87) PCT Pub. No.: WO2020/145725
PCT Pub. Date: Jul. 16, 2020

(65) Prior Publication Data

US 2022/0077410 A1 Mar. 10, 2022

(30) Foreign Application Priority Data

Jan. 11, 2019 (KR) ........................ 10-2019-0003903

(51) Int. Cl.

| | |
|---|---|
| ***C09K 11/06*** | (2006.01) |
| ***C07F 7/08*** | (2006.01) |
| ***H10K 50/11*** | (2023.01) |
| ***H10K 50/15*** | (2023.01) |
| ***H10K 50/16*** | (2023.01) |
| ***H10K 50/17*** | (2023.01) |
| ***H10K 85/40*** | (2023.01) |
| ***H10K 85/60*** | (2023.01) |
| ***H10K 101/10*** | (2023.01) |
| ***H10K 101/20*** | (2023.01) |

(52) U.S. Cl.
CPC ............ *C09K 11/06* (2013.01); *C07F 7/0816* (2013.01); *H10K 85/40* (2023.02); *H10K 85/626* (2023.02); *H10K 85/658* (2023.02); *C09K 2211/1014* (2013.01); *H10K 50/11* (2023.02); *H10K 50/15* (2023.02); *H10K 50/16* (2023.02); *H10K 50/171* (2023.02); *H10K 2101/10* (2023.02); *H10K 2101/20* (2023.02)

(58) Field of Classification Search
CPC .. H10K 85/322; H10K 2101/10; H10K 50/17; H10K 50/16; H10K 85/40; H10K 85/658; H10K 85/626; H10K 50/11; H10K 2101/20; H10K 50/15; C07F 5/027; C07F 7/0826; C09K 11/06; C09K 2211/1014
See application file for complete search history.

(56) References Cited

U.S. PATENT DOCUMENTS

| | | | | |
|---|---|---|---|---|
| 2018/0094000 | A1 | 4/2018 | Hatakeyama et al. | |
| 2018/0370993 | A1 | 12/2018 | Aguilera-Ipparaguirre et al. | |
| 2019/0006606 | A1 | 1/2019 | Aguilera-Ipparaguirre et al. | |
| 2019/0013478 | A1 | 1/2019 | Ijima et al. | |
| 2019/0115538 | A1* | 4/2019 | Lim | H10K 85/626 |
| 2020/0058885 | A1 | 2/2020 | Hong et al. | |
| 2020/0144513 | A1 | 5/2020 | Hatakeyama et al. | |
| 2020/0144514 | A1 | 5/2020 | Hatakeyama et al. | |
| 2020/0144515 | A1 | 5/2020 | Hatakeyama et al. | |
| 2020/0161552 | A1 | 5/2020 | Joo et al. | |
| 2020/0176679 | A1 | 6/2020 | Jeong et al. | |
| 2022/0399501 | A1* | 12/2022 | Lee | C07C 15/28 |
| 2023/0002420 | A1* | 1/2023 | Lee | C07C 15/28 |
| 2023/0084250 | A1* | 3/2023 | Lee | C07C 15/28 257/40 |

FOREIGN PATENT DOCUMENTS

| | | | |
|---|---|---|---|
| CN | 111205313 | | 5/2020 |
| KR | 10-2009-0041999 | * | 4/2009 |
| KR | 10-2016-0119683 | A | 10/2016 |
| KR | 10-2016-0134881 | A | 11/2016 |
| KR | 10-2017-0130435 | A | 11/2017 |
| KR | 10-2018-0010223 | A | 1/2018 |
| KR | 10-2018-0015794 | A | 2/2018 |
| KR | 10-2018-0122298 | A | 11/2018 |

(Continued)

OTHER PUBLICATIONS

Park et al., machine translation of KR 10-2009-0041999, Apr. 29, 2009, pp. 1-72. (Year: 2009).*

(Continued)

*Primary Examiner* — Dylan C Kershner

(74) *Attorney, Agent, or Firm* — Bryan Cave Leighton Paisner LLP

(57) ABSTRACT

A compound of Formula 1 and an organic light emitting device including the same, the compound used as a material for an organic material layer of the organic light emitting device, and providing high efficiency and low voltage characteristics of the organic light emitting device.

[Formula 1]

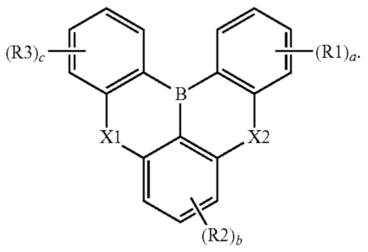

12 Claims, 3 Drawing Sheets

(56) References Cited

FOREIGN PATENT DOCUMENTS

| | | | | |
|---|---|---|---|---|
| KR | 10-2018-0127918 | A | 11/2018 | |
| WO | WO-2021020942 | A1 * | 2/2021 | ............. H10K 50/11 |
| WO | WO-2021020946 | A1 * | 2/2021 | ............. H10K 50/11 |
| WO | WO-2021020948 | A1 * | 2/2021 | ......... H01L 51/0071 |

OTHER PUBLICATIONS

Geum S et al., machine translation of WO-2021020942-A1 (2021) pp. 1-221. (Year: 2021).*
Geum S et al., machine translation of WO-2021020946-A1 (2021) pp. 1-258. (Year: 2021).*
Kim et al., machine translation of WO-2021020948-A1 (2021) pp. 1-379. (Year: 2021).*

* cited by examiner

[Figure 1]
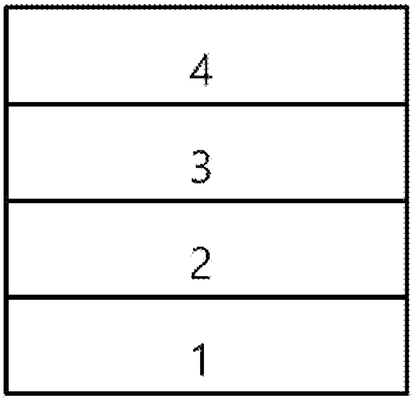
[Figure 2]
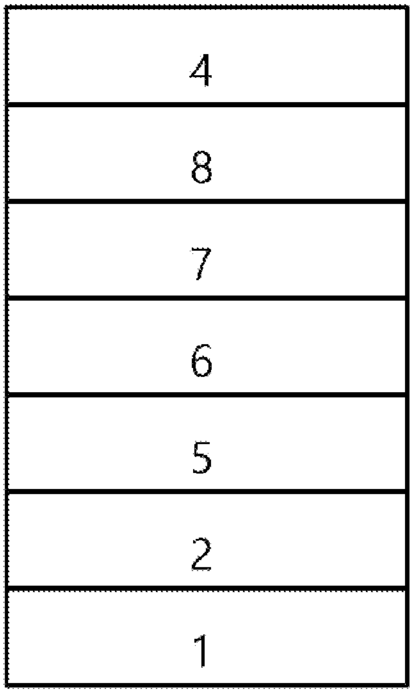

[Figure 3]
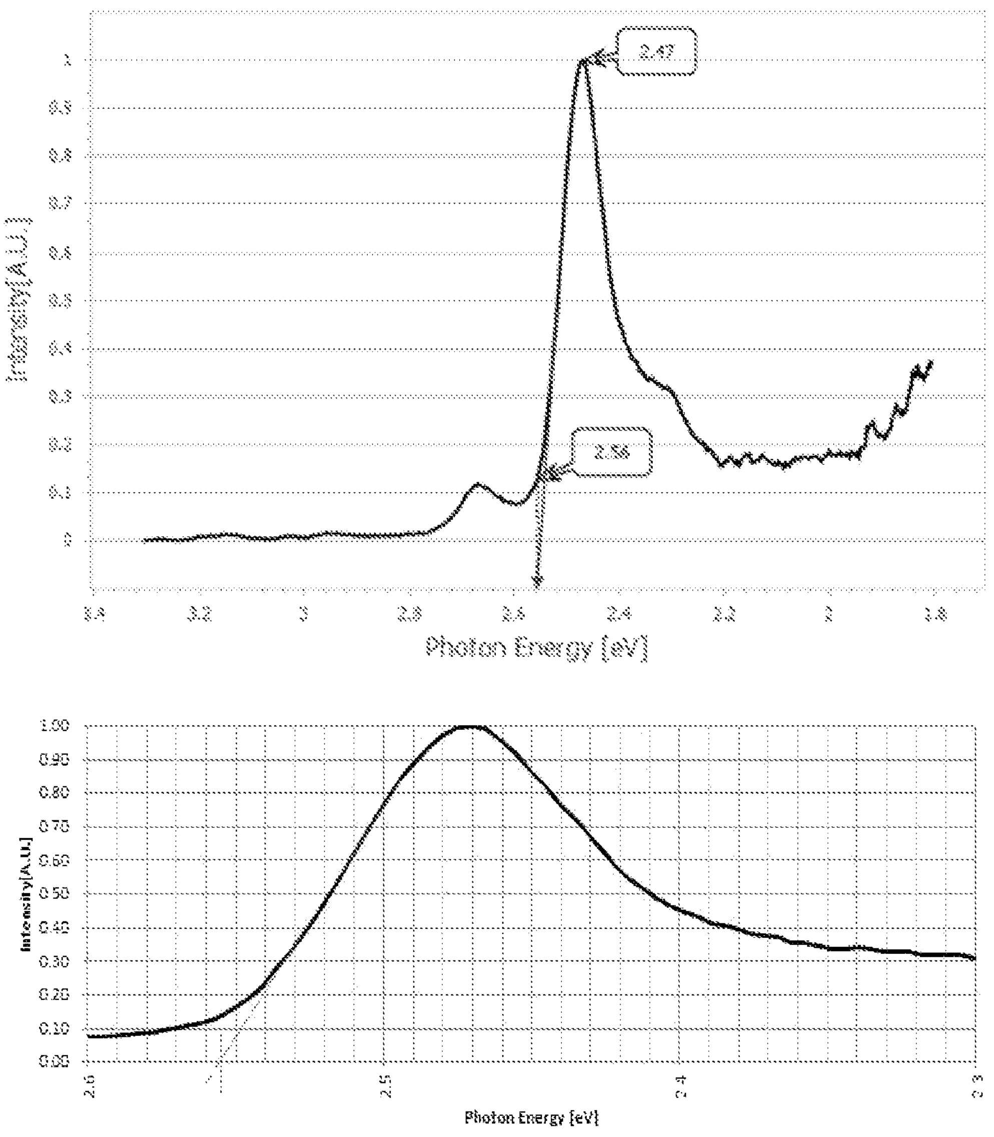

[Figure 4]
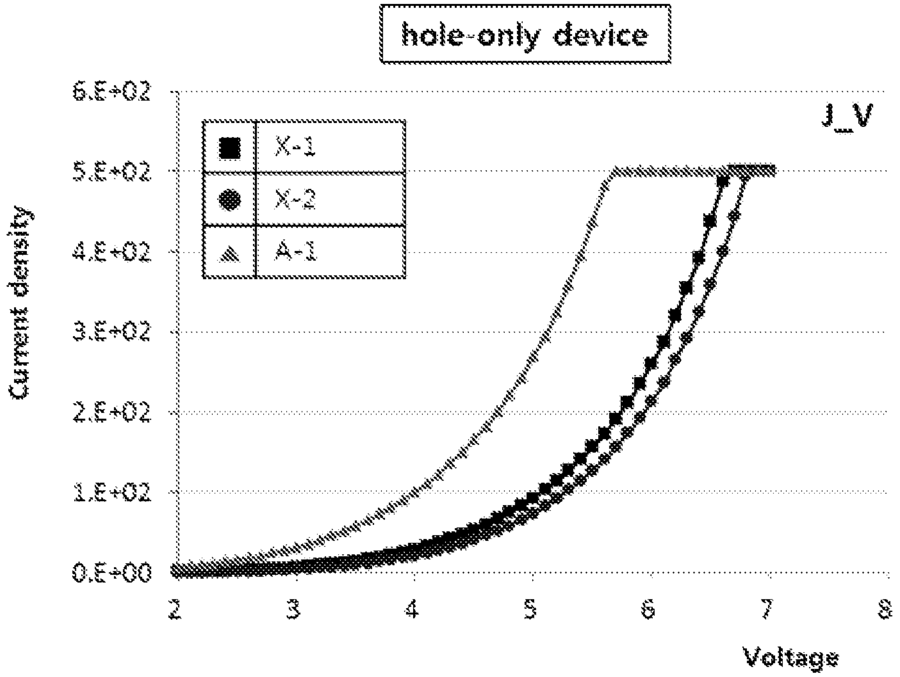
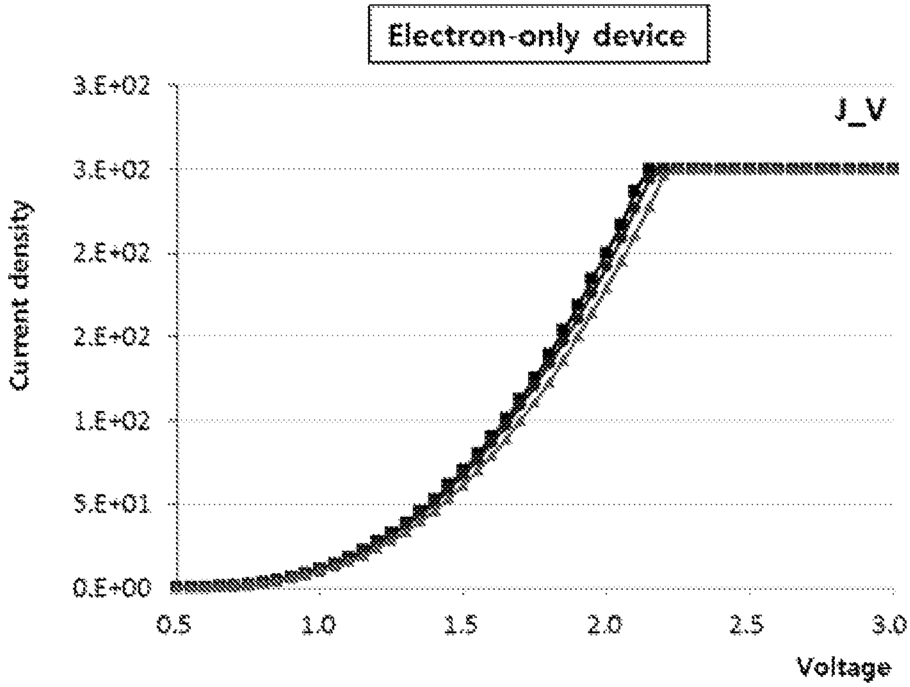

COMPOUND AND ORGANIC LIGHT-EMITTING DEVICE COMPRISING SAME

CROSS-REFERENCE TO RELATED APPLICATION(S)

This application is a National Stage Application of International Application No. PCT/KR2020/000473 filed on Jan. 10, 2020, which claims priority to Korean Patent Application No. 10-2019-0003903 filed on Jan. 11, 2019, disclosures of which are incorporated herein by reference in their entireties.

FIELD OF DISCLOSURE

The present specification relates to a compound and an organic light emitting device including the same.

BACKGROUND

An organic light emitting device is a light emitting device using an organic semiconductor material, and requires an exchange of holes and/or electrons between electrodes and organic semiconductor materials. The organic light emitting device may be roughly divided into two organic light emitting devices as follows depending on the operation principle thereof. A first organic light emitting device is a light emitting device in which an exciton is formed in an organic material layer by a photon that flows from an external light source to the device, the exciton is separated into electrons and holes, and the electrons and the holes are each transferred to different electrodes and used as an electric current source (voltage source). A second organic light emitting device is a light emitting device in which holes and/or electrons are injected into organic semiconductor material layers forming an interface with an electrode by applying a voltage or current to two or more electrodes, and the device is operated by the injected electrons and holes.

In general, an organic light emitting phenomenon refers to a phenomenon in which electric energy is converted into light energy by using an organic material. An organic light emitting device using the organic light emitting phenomenon typically has a structure including an anode, a cathode, and an organic material layer disposed therebetween. Here, the organic material layer has in many cases a multi-layered structure composed of different materials in order to improve the efficiency and stability of the organic light emitting device, and for example, may be composed of a hole injection layer, a hole transport layer, a light emitting layer, an electron blocking layer, an electron transport layer, an electron injection layer, and the like. In the structure of the organic light emitting device, if a voltage is applied between the two electrodes, holes are injected from the anode into the organic material layer and electrons are injected from the cathode into the organic material layer, and when the injected holes and electrons meet each other, an exciton is formed, and light is emitted when the exciton falls down again to a ground state. Such an organic light emitting device has been known to have characteristics such as self-emission, high brightness, high efficiency, a low driving voltage, a wide viewing angle, and high contrast.

In an organic light emitting device, materials used as an organic material layer may be classified into a light emitting material and a charge transport material, for example, a hole injection material, a hole transport material, an electron blocking material, an electron transport material, an electron injection material, and the like depending on the function. The light emitting materials include blue, green, and red light emitting materials according to the light emitting color, and yellow and orange light emitting materials required for implementing a much better natural color.

Furthermore, a host/dopant system may be used as a light emitting material for the purpose of enhancing color purity and light emitting efficiency through energy transfer. The principle is that when a small amount of dopant which has a smaller energy band gap and better light emitting efficiency than those of a host mainly constituting a light emitting layer is mixed in the light emitting layer, the excitons generated by the host are transported to the dopant to emit light with high efficiency. In this case, it is possible to obtain light with a desired wavelength according to the type of dopant used because the wavelength of the host moves to the wavelength range of the dopant.

In order to fully exhibit the above-described excellent characteristics of the organic light emitting device, a material constituting an organic material layer in a device, for example, a hole injection material, a hole transport material, a light emitting material, an electron blocking material, an electron transport material, an electron injection material, and the like need to be supported by stable and efficient materials, so that there is a continuous need for developing a new material.

SUMMARY

The present specification describes a compound and an organic light emitting device including the same.

An exemplary embodiment of the present specification provides a compound of the following Formula 1.

[Formula 1]

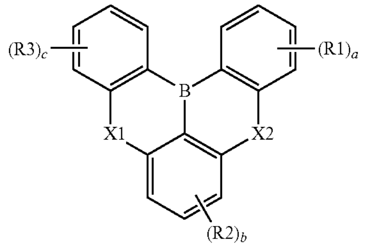

In Formula 1,

X1 and X2 are each independently NR, O, or S,

R and R1 to R3 are each independently hydrogen; deuterium; a halogen group; a substituted or unsubstituted amine group; a substituted or unsubstituted alkyl group; a substituted or unsubstituted cycloalkyl group; a substituted or unsubstituted silyl group; a substituted or unsubstituted aryl group; or a substituted or unsubstituted heterocyclic group, or may be bonded to an adjacent group to form a ring, a and c are each independently an integer from 0 to 4, b is an integer from 0 to 3, when a to c are each independently 2 or higher, substituents in the parentheses are the same as or different from each other, wherein at least one selected from the group of a ring formed by a plurality of R1s bonded to each other, a ring formed by a plurality of R3s bonded to each other, and R includes a substituted or unsubstituted dibenzosilole group.

Another exemplary embodiment provides an organic light emitting device including: a first electrode; a second electrode provided to face the first electrode; and an organic material layer having one or more layers provided between the first electrode and the second electrode, in which one or more layers of the organic material layer include the above-described compound.

Advantageous Effects

A compound of Formula 1 of the present invention can be used as a material for an organic material layer of an organic light emitting device.

When manufactured by including the compound of Formula 1 of the present invention, an organic light emitting device can have high efficiency and low voltage characteristics.

BRIEF DESCRIPTION OF DRAWINGS

FIG. 1 illustrates a structure of an organic light emitting device according to an exemplary embodiment.

FIG. 2 illustrates a structure of an organic light emitting device according to another exemplary embodiment.

FIG. 3 is a phosphorescence spectrum of Experimental Example 3 from which triplet energy is derived.

FIG. 4 shows results of measuring hole-only and electron-only devices in Experimental Example 4.

DESCRIPTION OF REFERENCE NUMERALS

1: Substrate
2: Anode
3: Light emitting layer
4: Cathode
5: Hole injection layer
6: Hole transport layer
7: Light emitting layer
8: Electron transport layer

DETAILED DESCRIPTION

Hereinafter, the present specification will be described in more detail.

The present specification provides the compound of Formula 1.

When one part "includes" one constituent element in the present specification, unless otherwise specifically described, this does not mean that another constituent element is excluded, but means that another constituent element may be further included.

When one member is disposed "on" another member in the present specification, this includes not only a case where the one member is brought into contact with another member, but also a case where still another member is present between the two members.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being substituted with one or two or more substituents selected from the group consisting of deuterium (-D); a halogen group; a nitrile group; a nitro group; a hydroxyl group; a silyl group; a boron group; an alkoxy group; an alkyl group; a cycloalkyl group; an aryl group; and a heterocyclic group, being substituted with a substituent to which two or more substituents among the above-exemplified substituents are linked, or having no substituent. For example, "the substituent to which two or more substituents are linked" may be a biphenyl group. That is, the biphenyl group may also be an aryl group, and may be interpreted as a substituent to which two phenyl groups are linked.

Examples of the substituents will be described below, but are not limited thereto.

In the present specification, examples of a halogen group include fluorine (—F), chlorine (—Cl), bromine (—Br) or iodine (—I).

In the present specification, a silyl group may be a formula of $—SiY_aY_bY_c$, and the $Y_a$, $Y_b$, and $Y_c$ may be each hydrogen; a substituted or unsubstituted alkyl group; or a substituted or unsubstituted aryl group. Specific examples of the silyl group include a trimethylsilyl group, a triethylsilyl group, a tert-butyldimethylsilyl group, a vinyldimethylsilyl group, a propyldimethylsilyl group, a triphenylsilyl group, a diphenylsilyl group, a phenylsilyl group, and the like, but are not limited thereto.

In the present specification, a boron group may be a formula of $—BY_dY_e$, and the $Y_d$ and $Y_e$ may be each hydrogen; a substituted or unsubstituted alkyl group; or a substituted or unsubstituted aryl group. Specific examples of the boron group include a trimethylboron group, a triethylboron group, a tert-butyldimethylboron group, a triphenylboron group, a phenylboron group, and the like, but are not limited thereto.

In the present specification, the alkyl group may be straight-chained or branched, and the number of carbon atoms thereof is not particularly limited, but is preferably 1 to 60. According to an exemplary embodiment, the number of carbon atoms of the alkyl group is 1 to 30. According to another exemplary embodiment, the number of carbon atoms of the alkyl group is 1 to 20. According to still another exemplary embodiment, the number of carbon atoms of the alkyl group is 1 to 10. Specific examples of the alkyl group include a methyl group, an ethyl group, a propyl group, an n-propyl group, an isopropyl group, a butyl group, an n-butyl group, an isobutyl group, a tert-butyl group, a pentyl group, an n-pentyl group, a hexyl group, an n-hexyl group, a heptyl group, an n-heptyl group, an octyl group, an n-octyl group, and the like, but are not limited thereto.

In the present specification, the alkoxy group may be straight-chained, branched, or cyclic. The number of carbon atoms of the alkoxy group is not particularly limited, but is preferably 1 to 20. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, and the like, but are not limited thereto.

Substituents including an alkyl group, an alkoxy group, and other alkyl group moieties described in the present specification include both a straight-chained form and a branched form.

In the present specification, a cycloalkyl group is not particularly limited, but has preferably 3 to 60 carbon atoms, and according to an exemplary embodiment, the number of carbon atoms of the cycloalkyl group is 3 to 30. According to another exemplary embodiment, the number of carbon atoms of the cycloalkyl group is 3 to 20. According to still another exemplary embodiment, the number of carbon atoms of the cycloalkyl group is 3 to 6. Specific examples thereof include a cyclopropyl group, a cyclobutyl group, a cyclopentyl group, a cyclohexyl group, a cycloheptyl group, a cyclooctyl group, an adamantyl group, and the like, but are not limited thereto.

In the present specification, an aryl group is not particularly limited, but has preferably 6 to 60 carbon atoms, and may be a monocyclic aryl group or a polycyclic aryl group. According to an exemplary embodiment, the number of carbon atoms of the aryl group is 6 to 39. According to an exemplary embodiment, the number of carbon atoms of the aryl group is 6 to 30. Examples of the monocyclic aryl group include a phenyl group, a biphenyl group, a terphenyl group, a quarterphenyl group, and the like, but are not limited thereto. Examples of the polycyclic aryl group include a naphthyl group, an anthracenyl group, a phenanthrenyl group, a pyrenyl group, a perylenyl group, a triphenyl group, a chrysenyl group, a fluorenyl group, a triphenylenyl group, and the like, but are not limited thereto.

In the present specification, a fluorene group may be substituted, and two substituents may be bonded to each other to form a spiro structure.

When the fluorene group is substituted, the fluorene group may be a spirofluorene group such as

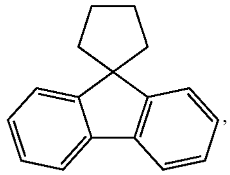
,
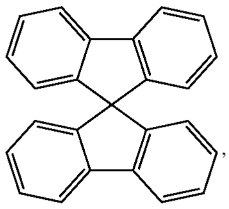
, and a substituted fluorene group such as

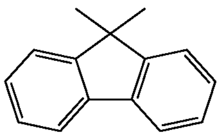

(a 9,9-dimethylfluorene group) and

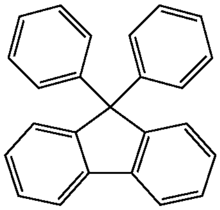 [SMILES: c1ccc(C2(c3ccccc3)c3ccccc3-c3ccccc32)cc1]

(a 9,9-diphenylfluorene group). However, the fluorene is not limited thereto.

In the present specification, a heterocyclic group is a cyclic group including one or more of N, O, P, S, Si, and Se as a heteroatom, and the number of carbon atoms thereof is not particularly limited, but is preferably 2 to 60. According to an exemplary embodiment, the number of carbon atoms of the heterocyclic group is 2 to 36. Examples of the heterocyclic group include a pyridine group, a pyrrole group, a pyrimidine group, a quinoline group, a pyridazine group, a furan group, a thiophene group, an imidazole group, a pyrazole group, a dibenzofuran group, a dibenzothiophene group, a dibenzosilole group, a carbazole group, a benzocarbazole group, a benzonaphthofuran group, a benzonaphthothiophene group, an indenocarbazole group, an indolocarbazole group, and the like, but are not limited thereto.

In the present specification, the above-described description on the heterocyclic group may be applied to a heteroaryl group except for an aromatic heteroaryl group.

In the present specification, an amine group may be selected from the group consisting of —$NH_2$; an alkylamine group; an N-alkylarylamine group; an arylamine group; an N-arylheteroarylamine group; an N-alkylheteroarylamine group; and a heteroarylamine group, and the number of carbon atoms thereof is not particularly limited, but is preferably 1 to 30. Specific examples of the amine group include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, an N-phenylnaphthylamine group, a ditolylamine group, an N-phenyltolylamine group, a triphenylamine group, an N-phenylbiphenylamine group, an N-phenylnaphthylamine group, an N-biphenylnaphthylamine group, an N-naphthylfluorenylamine group, an N-phenylphenanthrenylamine group, an N-biphenylphenanthrenylamine group, an N-phenylfluorenylamine group, an N-phenyl terphenylamine group, an N-phenanthrenylfluorenylamine group, an N-biphenylfluorenylamine group, and the like, but are not limited thereto.

In the present specification, an N-alkylarylamine group means an amine group in which an alkyl group and an aryl group are substituted with N of the amine group. In the present specification, an N-arylheteroarylamine group means an amine group in which an aryl group and a heteroaryl group are substituted with N of the amine group.

In the present specification, an N-alkylheteroarylamine group means an amine group in which an alkyl group and a heteroaryl group are substituted with N of the amine group.

In the present specification, an alkyl group, an aryl group, and a heteroaryl group in an alkylamine group; an N-alkylarylamine group; an arylamine group; an N-arylheteroarylamine group; an N-alkylheteroarylamine group, and a heteroarylamine group are each the same as the above-described examples of the alkyl group, the aryl group, and the heteroaryl group.

In the present specification, in a substituted or unsubstituted ring formed by being bonded to an adjacent group, the "ring" means a hydrocarbon ring; or a hetero ring.

The hydrocarbon ring may be an aromatic ring, an aliphatic ring, or a fused ring of the aromatic ring and the aliphatic ring, and may be selected from the examples of the cycloalkyl group or the aryl group, except for the divalent hydrocarbon ring.

In the present specification, the description on the aryl group may be applied to an aromatic hydrocarbon ring except for a divalent aromatic hydrocarbon ring.

The description on the heterocyclic group may be applied to the hetero ring except for a divalent hetero ring.

In the present specification, when R and R1 to R3 are each independently bonded to an adjacent group to form a ring, any one ring of the following structures may be formed.

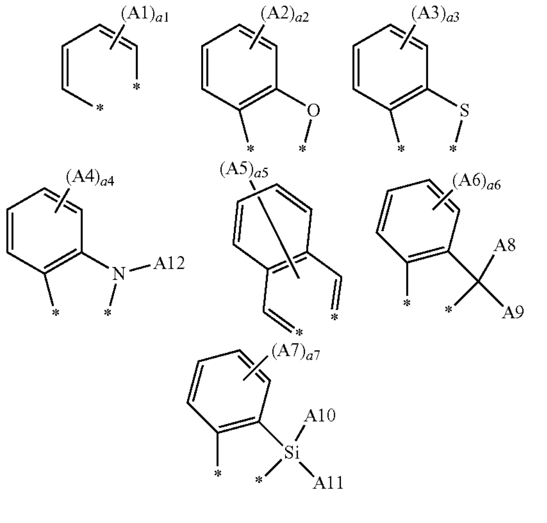

In the structures,

A1 to A11 are each independently hydrogen; deuterium; a halogen group; a substituted or unsubstituted alkyl group; a substituted or unsubstituted cycloalkyl group; a substituted or unsubstituted amine group; a substituted or unsubstituted aryl group; or a substituted or unsubstituted heterocyclic group, A12 is hydrogen; deuterium; a halogen group; a substituted or unsubstituted alkyl group; a substituted or unsubstituted cycloalkyl group; a substituted or unsubstituted aryl group; or a substituted or unsubstituted heterocyclic group, a1 to a4, a6, and a7 are each an integer from 0 to 4, a5 is an integer from 0 to 6, when a1 to a7 are each independently 2 or higher, the substituents in the parentheses are the same as or different from each other, and

* denotes a bonding position.

According to an exemplary embodiment of the present specification, X1 and X2 are each independently NR, O, or S.

According to an exemplary embodiment of the present specification, R and R1 to R3 are each independently hydrogen; deuterium; a halogen group; a substituted or unsubstituted amine group; a substituted or unsubstituted alkyl group; a substituted or unsubstituted cycloalkyl group; a substituted or unsubstituted silyl group; a substituted or unsubstituted aryl group; or a substituted or unsubstituted heterocyclic group.

According to an exemplary embodiment of the present specification, R and R1 to R3 are each independently hydrogen; deuterium; a halogen group; a substituted or unsubstituted diarylamine group having 12 to 60 carbon atoms; a substituted or unsubstituted alkyl group having 1 to 60 carbon atoms; a substituted or unsubstituted cycloalkyl group having 3 to 60 carbon atoms; a substituted or unsubstituted silyl group; a substituted or unsubstituted aryl group having 6 to 60 carbon atoms; or a substituted or unsubstituted heterocyclic group having 2 to 60 carbon atoms.

According to an exemplary embodiment of the present specification, R and R1 to R3 are each independently hydrogen; deuterium; a halogen group; a substituted or unsubstituted diarylamine group having 12 to 30 carbon atoms; a substituted or unsubstituted alkyl group having 1 to 30 carbon atoms; a substituted or unsubstituted cycloalkyl group having 3 to 30 carbon atoms; a substituted or unsubstituted silyl group; a substituted or unsubstituted aryl group having 6 to 30 carbon atoms; or a substituted or unsubstituted heterocyclic group having 2 to 30 carbon atoms.

According to an exemplary embodiment of the present specification, R and R1 to R3 are each independently hydrogen; deuterium; a halogen group; a substituted or unsubstituted diarylamine group having 12 to 20 carbon atoms; a substituted or unsubstituted alkyl group having 1 to 20 carbon atoms; a substituted or unsubstituted cycloalkyl group having 3 to 20 carbon atoms; a substituted or unsubstituted silyl group; a substituted or unsubstituted aryl group having 6 to 20 carbon atoms; or a substituted or unsubstituted heterocyclic group having 2 to 20 carbon atoms.

According to an exemplary embodiment of the present specification, R and R1 to R3 are each independently, hydrogen; deuterium; a halogen group; a diarylamine group having 12 to 20 carbon atoms, which is unsubstituted or substituted with a substituent selected from the group consisting of deuterium, an alkyl group, and a substituted or unsubstituted silyl group; an alkyl group having 1 to 10 carbon atoms, which is unsubstituted or substituted with deuterium; a substituted or unsubstituted cycloalkyl group having 3 to 15 carbon atoms; a silyl group which is unsubstituted or substituted with a substituent selected from the group consisting of a substituted or unsubstituted alkyl group and a substituted or unsubstituted aryl group; an aryl group having 6 to 20 carbon atoms, which is unsubstituted or substituted with a substituent selected from the group consisting of deuterium, a halogen group, an alkyl group, and a haloalkyl group; or a heterocyclic group having 2 to 15 carbon atoms, which is unsubstituted or substituted with a substituent selected from the group consisting of deuterium, a substituted or unsubstituted alkyl group, and a substituted or unsubstituted aryl group.

According to an exemplary embodiment of the present specification, R is an aryl group having 6 to 20 carbon atoms, which is unsubstituted or substituted with a substituent selected from the group consisting of deuterium, a halogen group, an alkyl group, and a haloalkyl group; or a heterocyclic group having 2 to 15 carbon atoms, which is unsubstituted or substituted with a substituent selected from the group consisting of deuterium, a substituted or unsubstituted alkyl group, and a substituted or unsubstituted aryl group.

According to an exemplary embodiment of the present specification, R is a phenyl group which is unsubstituted or substituted with a substituent selected from the group consisting of deuterium, a halogen group, an alkyl group, and a haloalkyl group; a biphenyl group which is unsubstituted or substituted with a substituent selected from the group consisting of deuterium, a halogen group, an alkyl group, and a haloalkyl group; a terphenyl group which is unsubstituted or substituted with a substituent selected from the group consisting of deuterium, a halogen group, an alkyl group, and a haloalkyl group; or a dibenzosilole group which is unsubstituted or substituted with a substituent selected from the group consisting of deuterium, an alkyl group, and an aryl group which is unsubstituted or substituted with an alkyl group.

According to an exemplary embodiment of the present specification, R1 to R3 are each independently hydrogen; deuterium; a halogen group; a diarylamine group having 12 to 20 carbon atoms, which is unsubstituted or substituted with a substituent selected from the group consisting of deuterium, an alkyl group, and a substituted or unsubstituted silyl group; an alkyl group having 1 to 10 carbon atoms, which is unsubstituted or substituted with deuterium; a substituted or unsubstituted cycloalkyl group having 3 to 15 carbon atoms; a silyl group which is unsubstituted or substituted with a substituent selected from the group consisting of a substituted or unsubstituted alkyl group and a substituted or unsubstituted aryl group; an aryl group having 6 to 20 carbon atoms, which is unsubstituted or substituted with a substituent selected from the group consisting of deuterium, a halogen group, an alkyl group, and a haloalkyl group; or a heterocyclic group having 2 to 15 carbon atoms, which is unsubstituted or substituted with a substituent selected from the group consisting of deuterium or an alkyl group.

According to an exemplary embodiment of the present specification, R1 to R3 are each independently hydrogen; deuterium; a halogen group; a diphenylamine group which is unsubstituted or substituted with a substituent selected from the group consisting of deuterium, an alkyl group, and a substituted or unsubstituted silyl group; a methyl group which is unsubstituted or substituted with deuterium; an isopropyl group which is unsubstituted or substituted with deuterium; a tert-butyl group which is unsubstituted or substituted with deuterium; a substituted or unsubstituted adamantyl group; a substituted or unsubstituted cyclohexyl group; a substituted or unsubstituted trialkylsilyl group; a substituted or unsubstituted triarylsilyl group; a phenyl group which is unsubstituted or substituted with a substituent selected from the group consisting of deuterium, a halogen group, an alkyl group, and a haloalkyl group; a biphenyl group which is unsubstituted or substituted with a substituent selected from the group consisting of deuterium, a halogen group, an alkyl group, and a haloalkyl group; a terphenyl group which is unsubstituted or substituted with a substituent selected from the group consisting of deuterium, a halogen group, an alkyl group, and a haloalkyl group; a naphthyl group which is unsubstituted or substituted with a substituent selected from the group consisting of deuterium, a halogen group, an alkyl group, and a haloalkyl group; or a carbazolyl group which is unsubstituted or substituted with an alkyl group.

According to an exemplary embodiment of the present specification, a to c are each independently an integer from 0 to 3, and when a to c are each independently 2 or higher, substituents in the parentheses are the same as or different from each other, and adjacent groups may be bonded to each other to form a ring.

According to an exemplary embodiment of the present specification, the compound of Formula 1 has at least one silicon atom.

According to an exemplary embodiment of the present specification, the compound of Formula 1 has 1 to 3 siliconatoms.

According to an exemplary embodiment of the present specification, the compound of Formula 1 has 1 to 2 silicon atoms Further, according to an exemplary embodiment of the present specification, at least one of a plurality of R1s each independently bonded to each other, a plurality of R3s each independently bonded to each other, and R includes a substituted or unsubstituted dibenzosilole group. In this case, the case where R1 and R3 are bonded to each other to form a ring is excluded.

In an exemplary embodiment of the present specification, including a substituted or unsubstituted dibenzosilole group means that the backbone of formula 1 may have a substituted or unsubstituted dibenzosilole group as a substituent, or that a fused ring may be formed in the backbone of Formula 1 to have a substituted or unsubstituted dibenzosilole group including a benzene group in the backbone of Formula 1.

According to an exemplary embodiment of the present specification, when a plurality of R1s are bonded to each other to include a substituted or unsubstituted dibenzosilole group, a plurality of R1s may be bonded to form a ring of

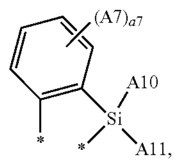

so that it is possible to have a substituted or unsubstituted dibenzosilole group including a benzene group in the backbone of Formula 1. In this case, A7, A10, A11, and a7 are the same as the above-described definitions.

According to an exemplary embodiment of the present specification, when a plurality of R3s are bonded to each other to include a substituted or unsubstituted dibenzosilole group, a plurality of R3s may be bonded to form a ring of

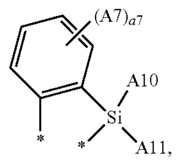

so that it is possible to have a substituted or unsubstituted dibenzosilole group including a benzene group in the backbone of Formula 1. In this case, A7, A10, A11, and a7 are the same as the above-described definitions.

According to an exemplary embodiment of the present specification, A7, A10, and A11 may be each independently hydrogen; a substituted or unsubstituted alkyl group; a substituted or unsubstituted aryl group; or a substituted or unsubstituted heterocyclic group.

According to an exemplary embodiment of the present specification, A10 and A11 may be each independently a substituted or unsubstituted aryl group having 6 to 30 carbon atoms; or a substituted or unsubstituted heterocyclic group having 2 to 30 carbon atoms.

According to an exemplary embodiment of the present specification, A10 and A11 may be each independently a substituted or unsubstituted aryl group having 6 to 30 carbon atoms; or a substituted or unsubstituted heterocyclic group having 2 to 30 carbon atoms.

According to an exemplary embodiment of the present specification, A10 and A11 may be each independently a substituted or unsubstituted aryl group having 6 to 15 carbon atoms.

According to an exemplary embodiment of the present specification, A10 and A11 may be a substituted or unsubstituted phenyl group.

According to an exemplary embodiment of the present specification, R includes the following Formula 5, and thus may include a substituted or unsubstituted dibenzosilole group.

[Formula 5]

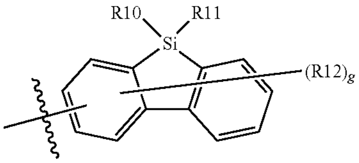

R10 and R11 are each independently a substituted or unsubstituted alkyl group; or a substituted or unsubstituted aryl group, R12 is hydrogen; deuterium; a substituted or unsubstituted alkyl group; a substituted or unsubstituted cycloalkyl group; a substituted or unsubstituted silyl group; a substituted or unsubstituted aryl group; or a substituted or unsubstituted heterocyclic group including N, O, or S, g is an integer from 0 to 7, and when g is 2 or higher, substituents in the parentheses are the same as or different from each other.

According to an exemplary embodiment of the present specification, Formula 1 may be any one of the following Formulae 2 to 4.

[Formula 2]

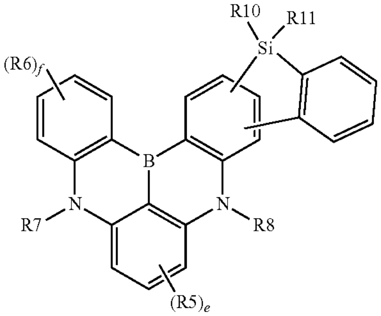

[Formula 3]

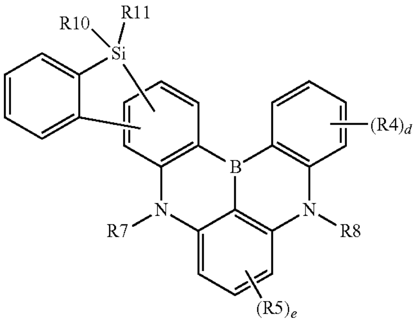

[Formula 4]

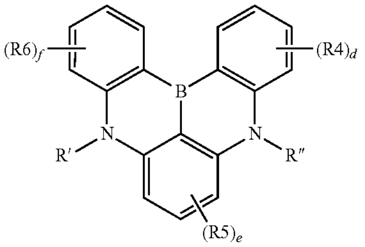

In Formulae 2 to 4,

R4 to R8 are each independently hydrogen; deuterium; a halogen group; a substituted or unsubstituted amine group; a substituted or unsubstituted alkyl group; a substituted or unsubstituted cycloalkyl group; a substituted or unsubstituted silyl group; a substituted or unsubstituted aryl group; or a substituted or unsubstituted heterocyclic group including N, O, or S, d and f are each independently an integer from 0 to 4, e is an integer from 0 to 3, when d to f are each independently 2 or higher, substituents in the parentheses are the same as or different from each other, R' and R" are each independently a substituted or unsubstituted alkyl group; a substituted or unsubstituted cycloalkyl group; a substituted or unsubstituted silyl group; a substituted or unsubstituted aryl group; or a substituted or unsubstituted heterocyclic group, at least one of R' and R" includes the following Formula 5,

[Formula 5]

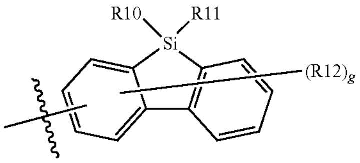

R10 and R11 are each independently a substituted or unsubstituted alkyl group; or a substituted or unsubstituted aryl group, R12 is hydrogen; deuterium; a substituted or unsubstituted alkyl group; a substituted or unsubstituted cycloalkyl group; a substituted or unsubstituted silyl group; a substituted or unsubstituted aryl group; or a substituted or unsubstituted heterocyclic group including N, O, or S, g is an integer from 0 to 7, and when g is 2 or higher, substituents in the parentheses are the same as or different from each other.

According to an exemplary embodiment of the present specification, R4 to R8 are each independently hydrogen; deuterium; a halogen group; a substituted or unsubstituted amine group; a substituted or unsubstituted alkyl group having 1 to 60 carbon atoms; a substituted or unsubstituted cycloalkyl group having 3 to 60 carbon atoms; a substituted or unsubstituted silyl group having 1 to 60 carbon atoms; a substituted or unsubstituted aryl group having 6 to 60 carbon atoms; or a substituted or unsubstituted heterocyclic group having 2 to 60 carbon atoms, including N, O, or S.

According to an exemplary embodiment of the present specification, R4 to R8 are each independently hydrogen; deuterium; a halogen group; a substituted or unsubstituted amine group; a substituted or unsubstituted alkyl group having 1 to 30 carbon atoms; a substituted or unsubstituted cycloalkyl group having 3 to 30 carbon atoms; a substituted or unsubstituted silyl group having 1 to 30 carbon atoms; a substituted or unsubstituted aryl group having 6 to 30 carbon atoms; or a substituted or unsubstituted heterocyclic group having 2 to 30 carbon atoms, including N, O, or S.

According to an exemplary embodiment of the present specification, R4 to R8 are each independently hydrogen; deuterium; a halogen group; a substituted or unsubstituted amine group; a substituted or unsubstituted alkyl group having 1 to 15 carbon atoms; a substituted or unsubstituted cycloalkyl group having 3 to 15 carbon atoms; a substituted or unsubstituted silyl group having 1 to 15 carbon atoms; a substituted or unsubstituted aryl group having 6 to 15 carbon atoms; or a substituted or unsubstituted heterocyclic group having 2 to 15 carbon atoms, including N, o, or S.

According to an exemplary embodiment of the present specification, R' and R" are each independently a substituted or unsubstituted alkyl group having 1 to 60 carbon atoms; a substituted or unsubstituted cycloalkyl group having 3 to 60 carbon atoms; a substituted or unsubstituted silyl group having 1 to 60 carbon atoms; a substituted or unsubstituted aryl group having 6 to 60 carbon atoms; or a substituted or unsubstituted heterocyclic group having 2 to 60 carbon atoms.

According to an exemplary embodiment of the present specification, R' and R" are each independently a substituted or unsubstituted alkyl group having 1 to 30 carbon atoms; a substituted or unsubstituted cycloalkyl group having 3 to 30 carbon atoms; a substituted or unsubstituted silyl group having 1 to 30 carbon atoms; a substituted or unsubstituted aryl group having 6 to 30 carbon atoms; or a substituted or unsubstituted heterocyclic group having 2 to 30 carbon atoms.

According to an exemplary embodiment of the present specification, R' and R" are each independently a substituted or unsubstituted alkyl group having 1 to 15 carbon atoms; a substituted or unsubstituted cycloalkyl group having 3 to 15 carbon atoms; a substituted or unsubstituted silyl group having 1 to 15 carbon atoms; a substituted or unsubstituted aryl group having 6 to 15 carbon atoms; or a substituted or unsubstituted heterocyclic group having 2 to 15 carbon atoms.

According to an exemplary embodiment of the present specification, at least one of R' and R" includes the following Formula 5.

[Formula 5]

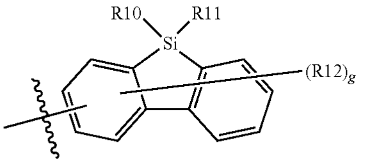

The definition of the substituent in Formula 5 is the same as described above.

According to an exemplary embodiment of the present specification, at least one of R' and R" is the above-described Formula 5.

According to an exemplary embodiment of the present specification, R' and R" are each independently the above-described Formula 5.

According to an exemplary embodiment of the present specification, R10 and R11 are each independently a substituted or unsubstituted alkyl group having 1 to 60 carbon atoms; or a substituted or unsubstituted aryl group having 6 to 60 carbon atoms.

According to an exemplary embodiment of the present specification, R10 and R11 are each independently a substituted or unsubstituted alkyl group having 1 to 30 carbon atoms; or a substituted or unsubstituted aryl group having 6 to 30 carbon atoms.

According to an exemplary embodiment of the present specification, R10 and R11 are each independently a substituted or unsubstituted alkyl group having 1 to 15 carbon atoms; or a substituted or unsubstituted aryl group having 6 to 15 carbon atoms.

According to an exemplary embodiment of the present specification, R10 and R11 are a substituted or unsubstituted phenyl group.

According to an exemplary embodiment of the present specification, R12 is hydrogen; deuterium; a substituted or unsubstituted alkyl group having 1 to 60 carbon atoms; a substituted or unsubstituted cycloalkyl group having 3 to 60 carbon atoms; a substituted or unsubstituted silyl group having 1 to 60 carbon atoms; a substituted or unsubstituted aryl group having 6 to 60 carbon atoms; or a substituted or unsubstituted heterocyclic group having 2 to 60 carbon atoms, including N, O, or S.

According to an exemplary embodiment of the present specification, R12 is hydrogen; deuterium; a substituted or unsubstituted alkyl group having 1 to 30 carbon atoms; a substituted or unsubstituted cycloalkyl group having 3 to 30 carbon atoms; a substituted or unsubstituted silyl group having 1 to 30 carbon atoms; a substituted or unsubstituted aryl group having 6 to 30 carbon atoms; or a substituted or unsubstituted heterocyclic group having 2 to 30 carbon atoms, including N, O, or S.

According to an exemplary embodiment of the present specification, R12 is hydrogen; deuterium; a substituted or unsubstituted alkyl group having 1 to 15 carbon atoms; a substituted or unsubstituted cycloalkyl group having 3 to 15 carbon atoms; a substituted or unsubstituted silyl group having 1 to 15 carbon atoms; a substituted or unsubstituted aryl group having 6 to 15 carbon atoms; or a substituted or unsubstituted heterocyclic group having 2 to 15 carbon atoms, including N, O, or S.

According to an exemplary embodiment of the present specification, Formula 1 may be any one of the following compounds.

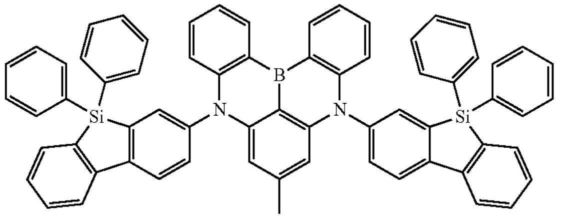

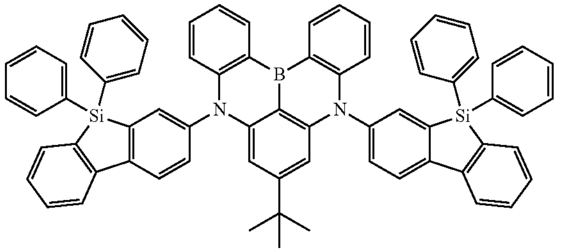

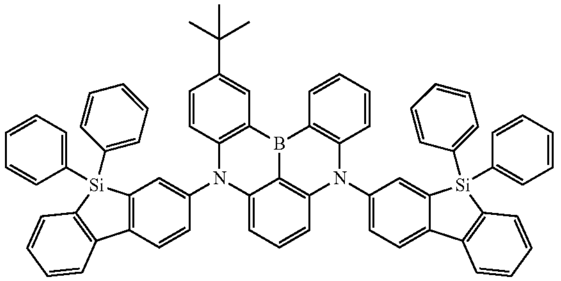

-continued
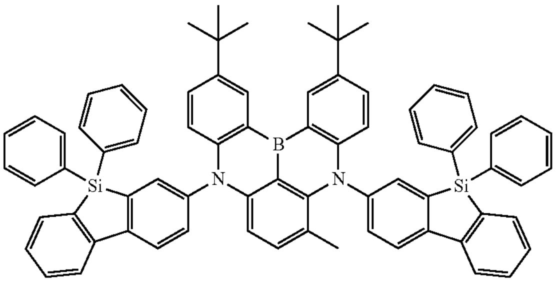
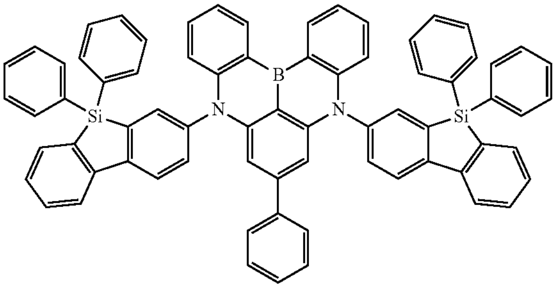
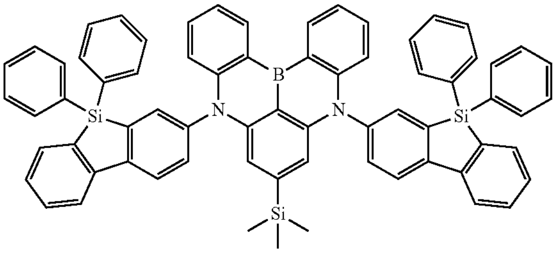
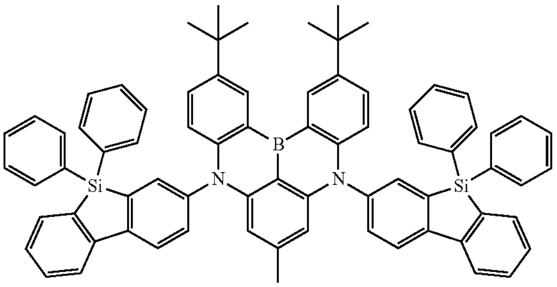
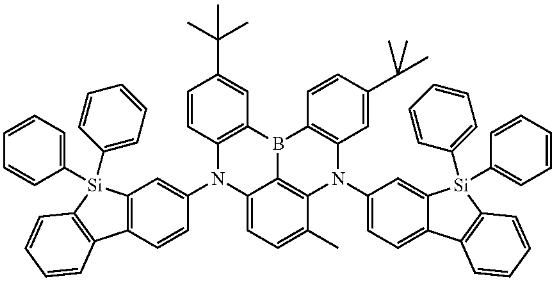
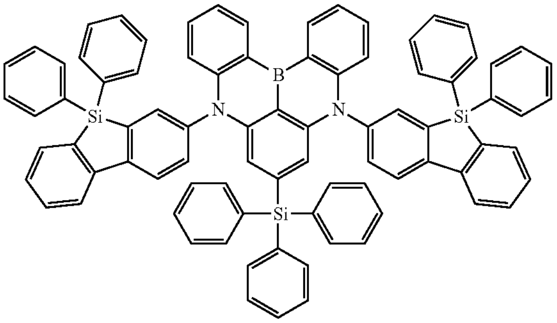
-continued
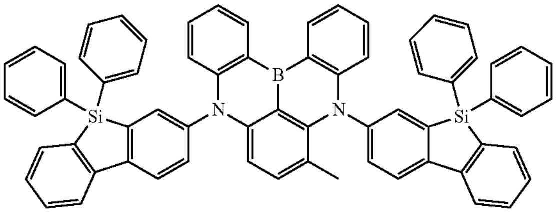
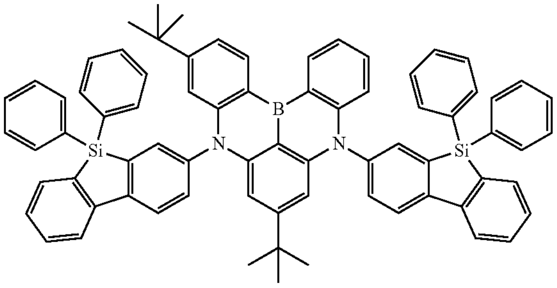
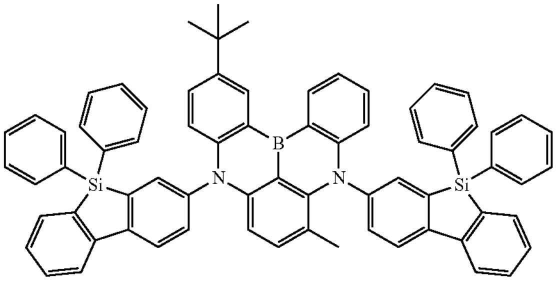
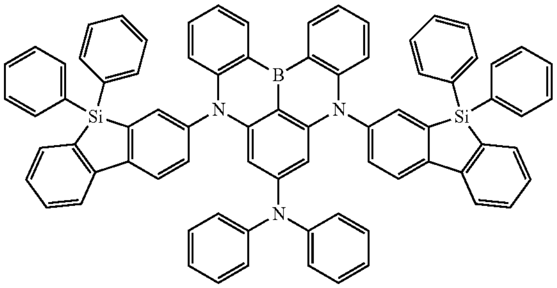
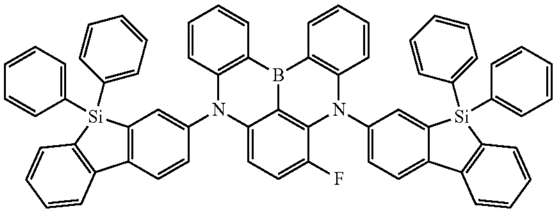
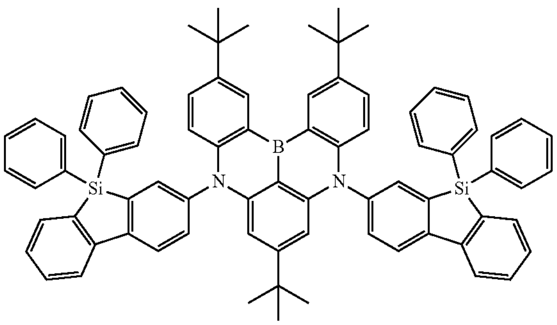

-continued
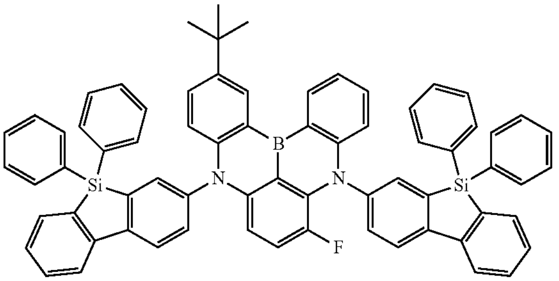
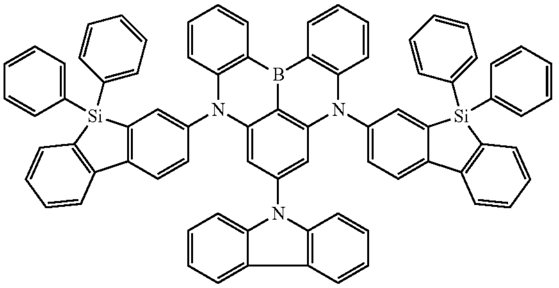
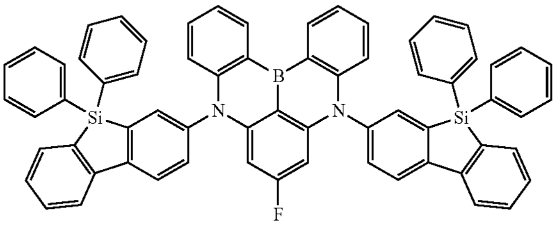
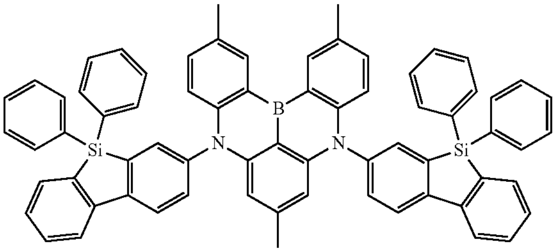
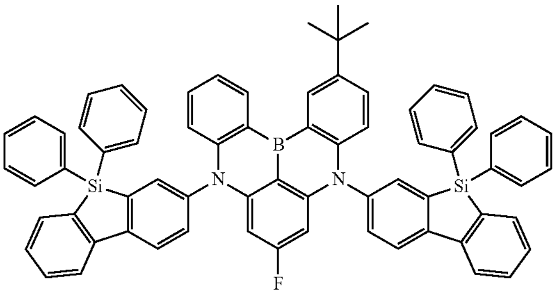
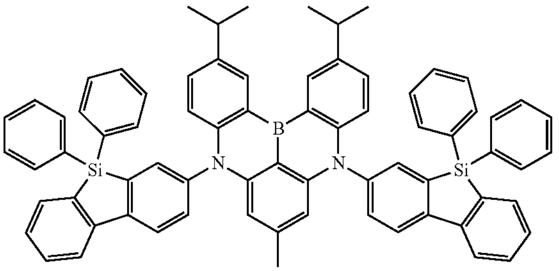
-continued
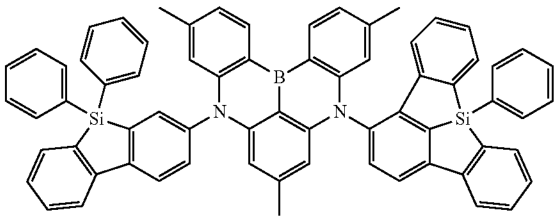
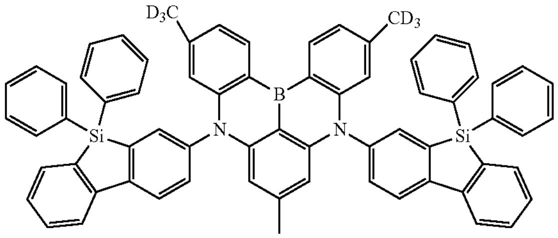
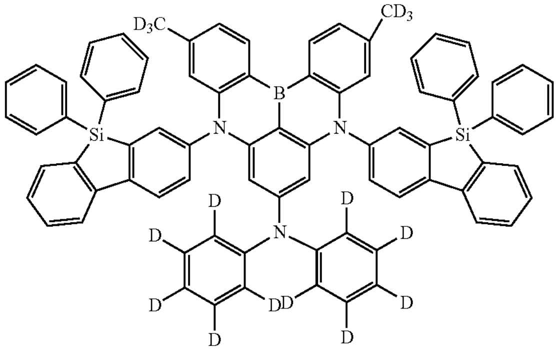
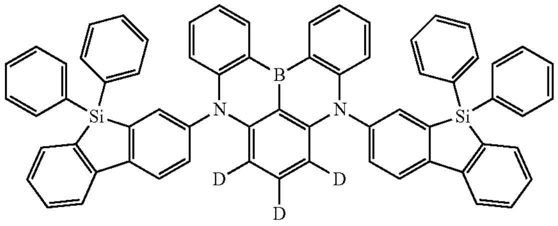
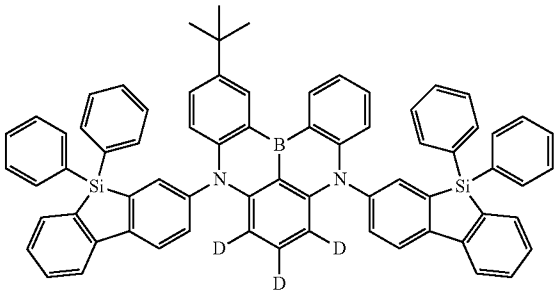
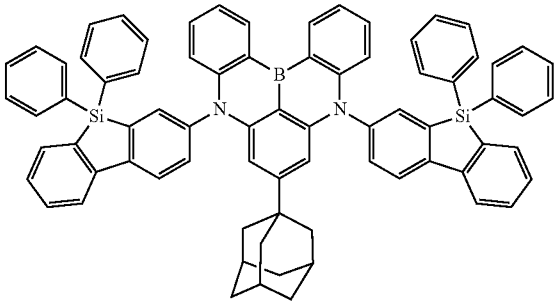

-continued
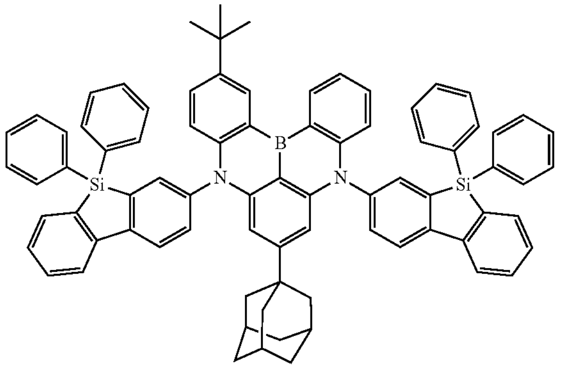
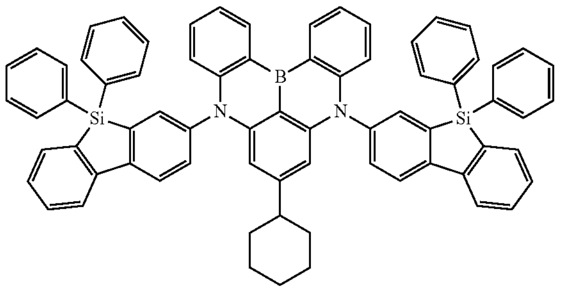
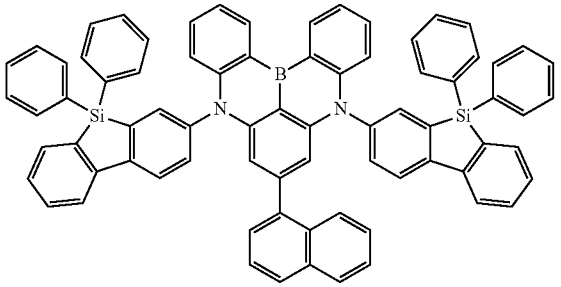
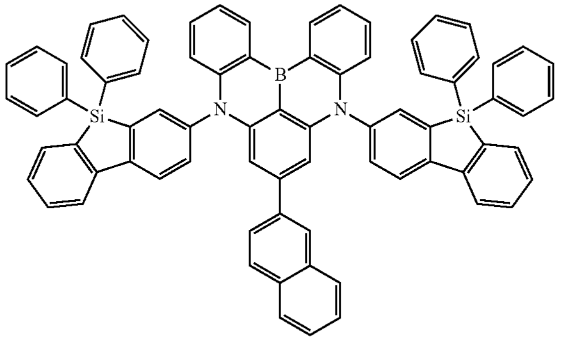
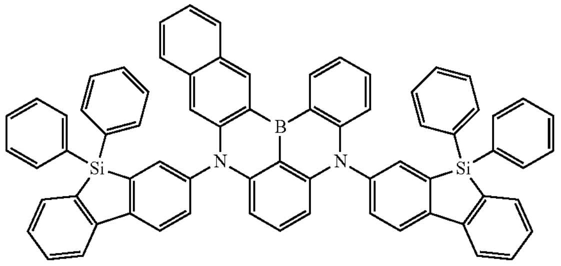
-continued
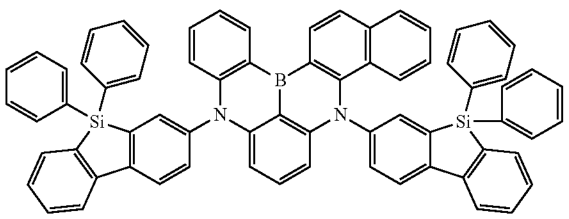
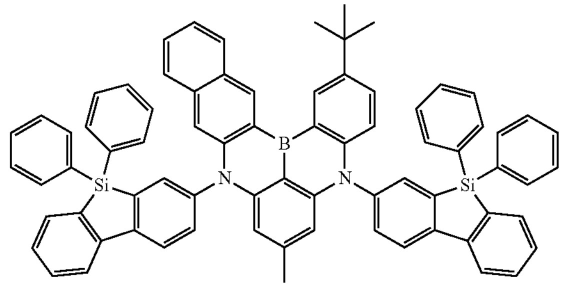
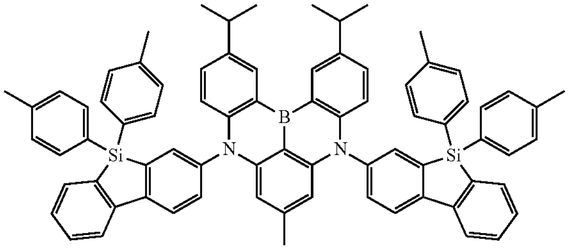
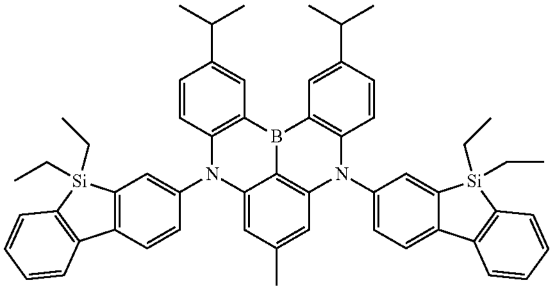
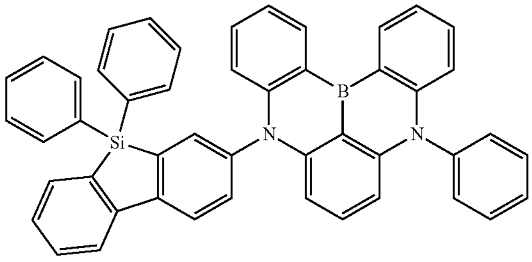
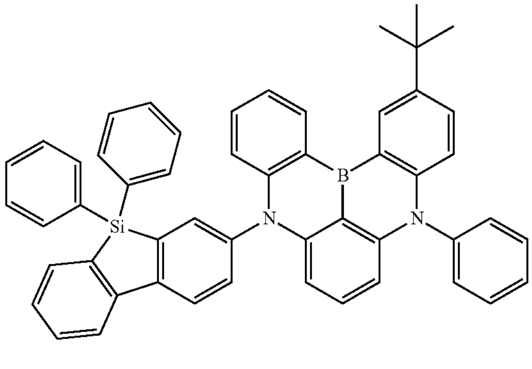

-continued
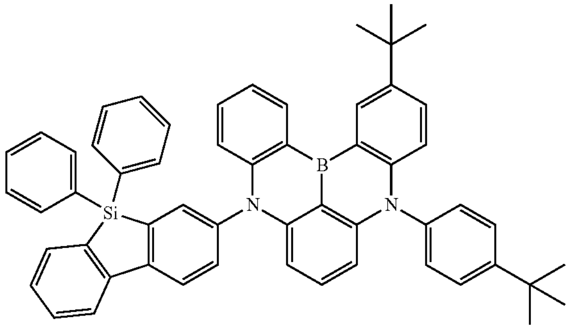
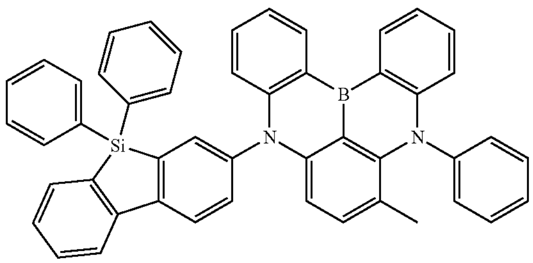
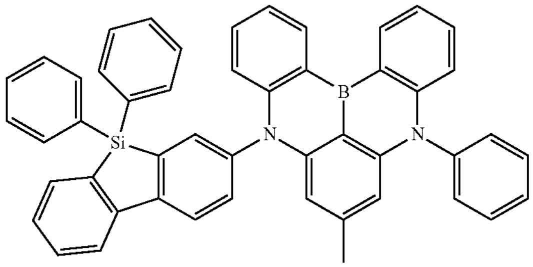
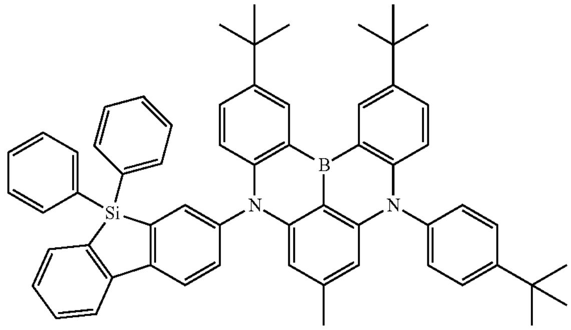
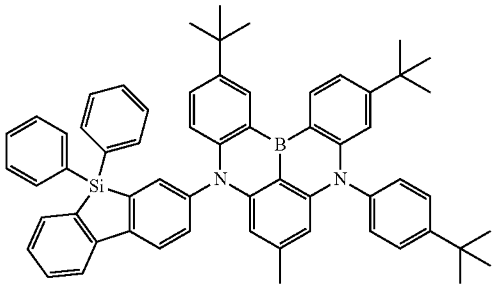
-continued
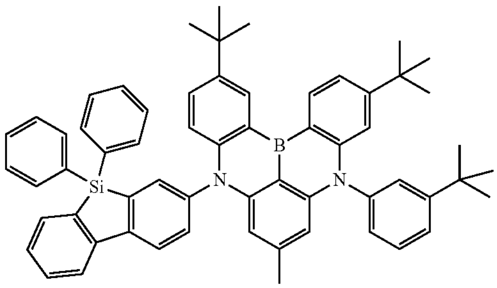
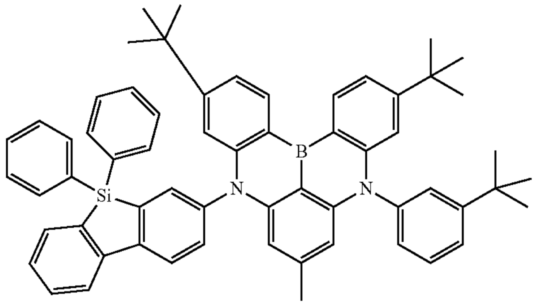
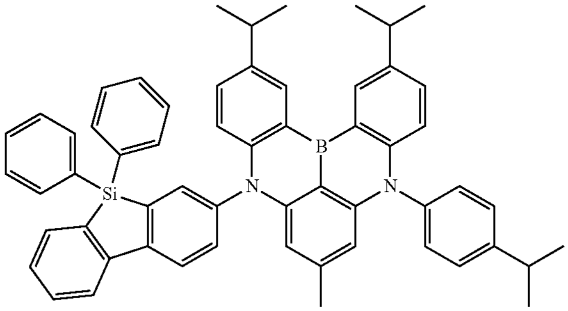
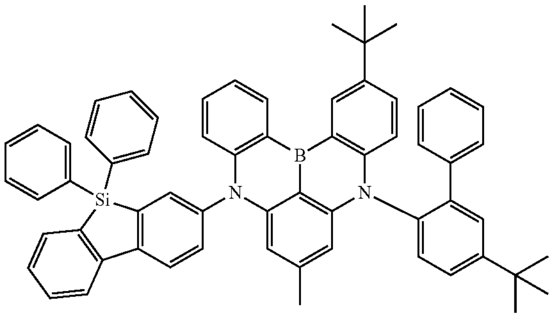
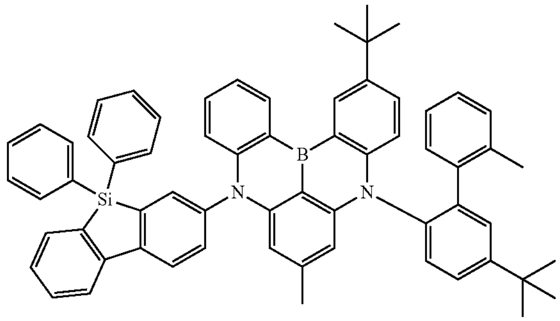

-continued
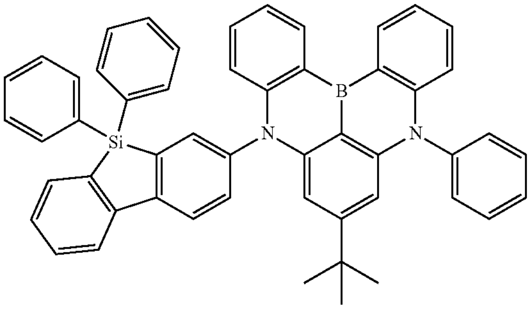
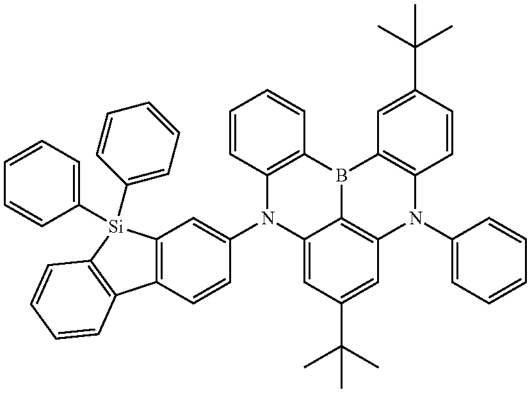
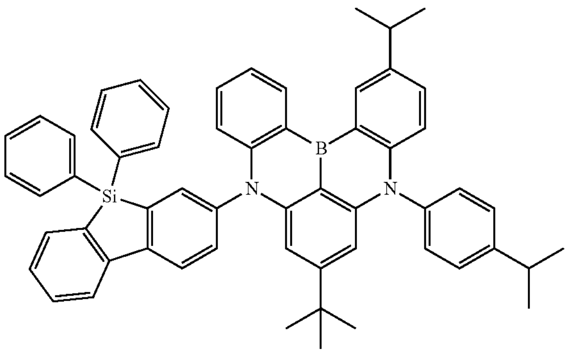
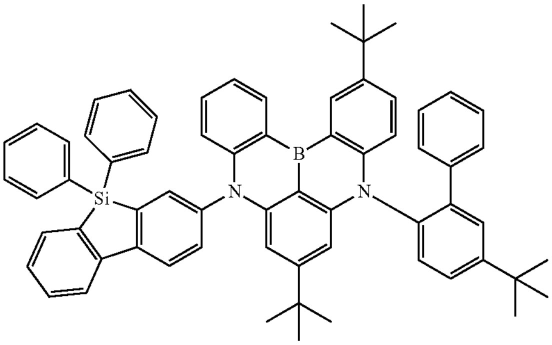
-continued
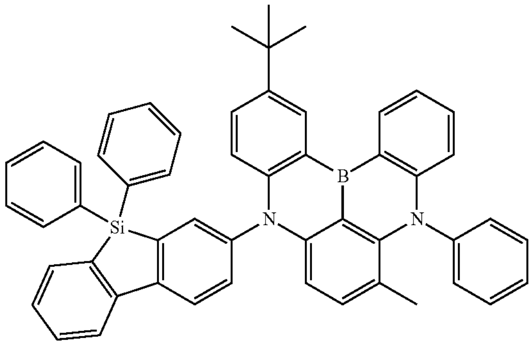
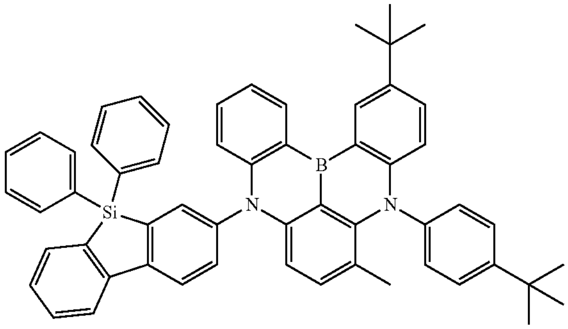
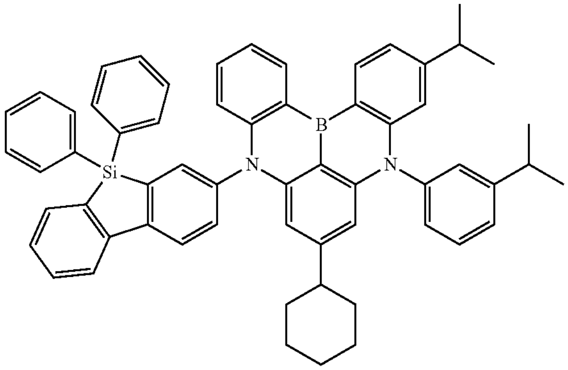
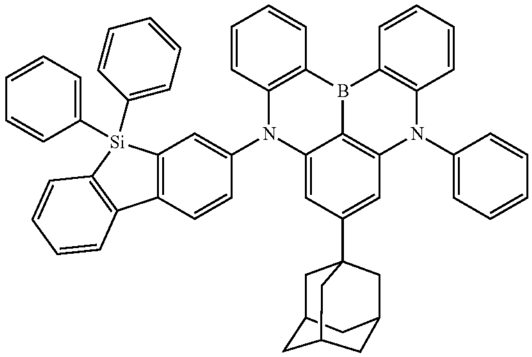
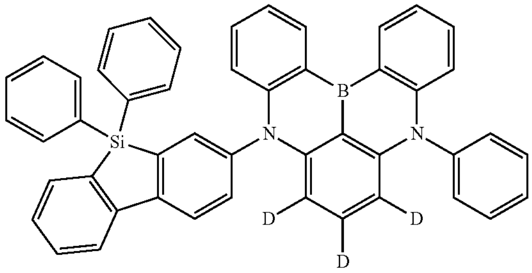

-continued
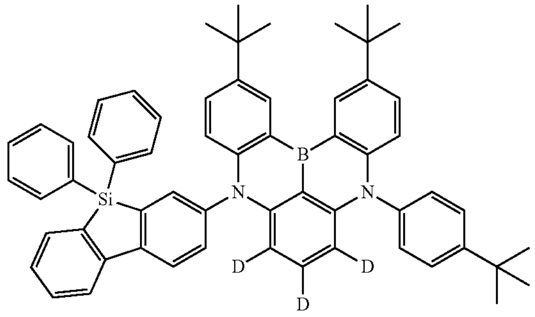
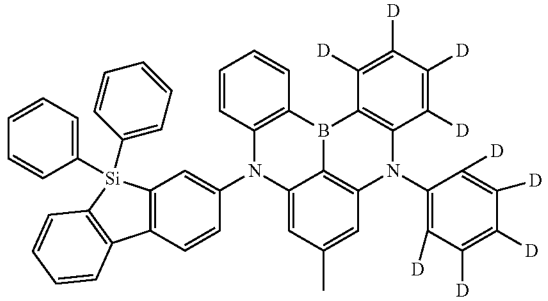
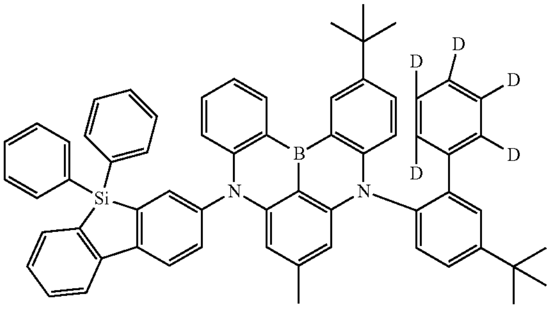
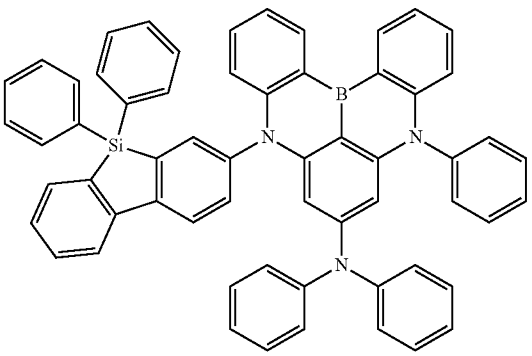
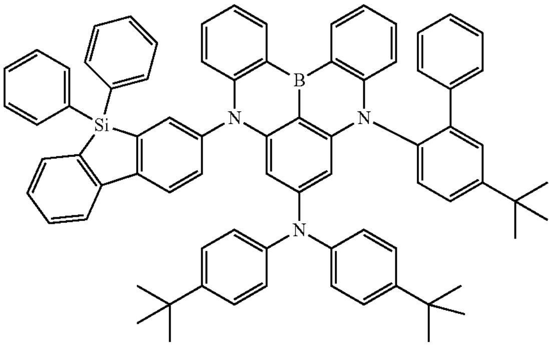
-continued
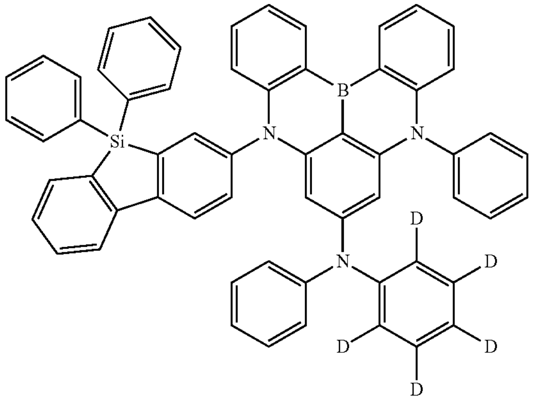
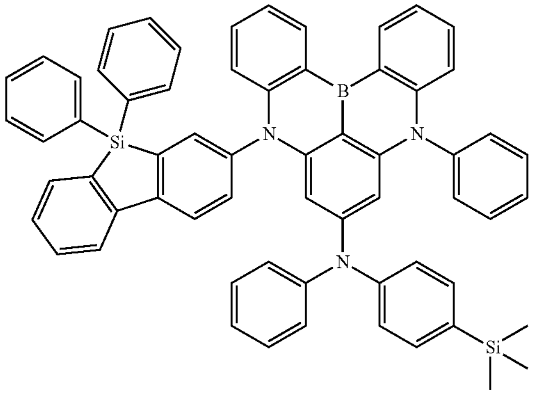
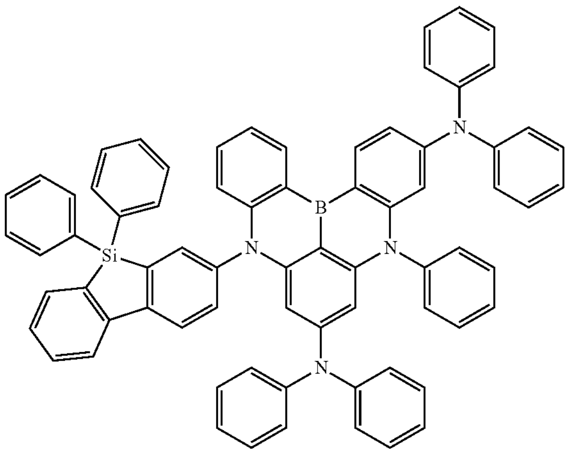
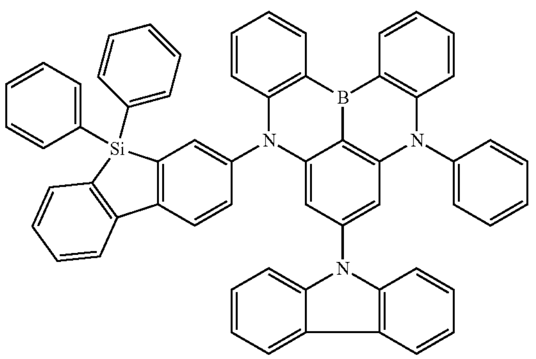

-continued
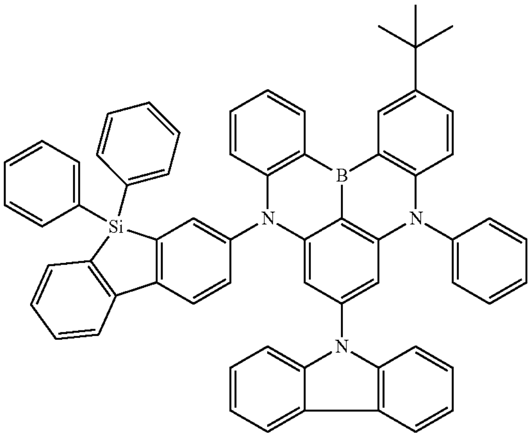
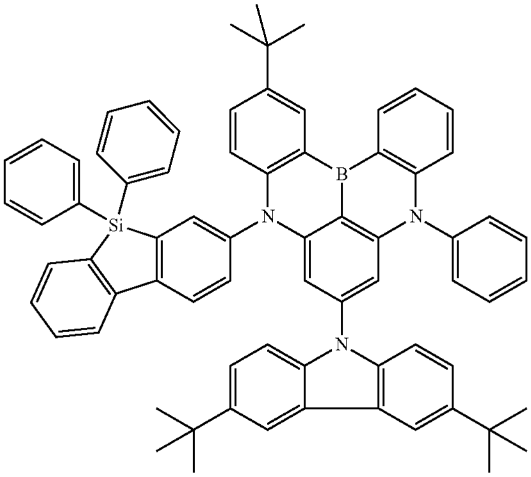
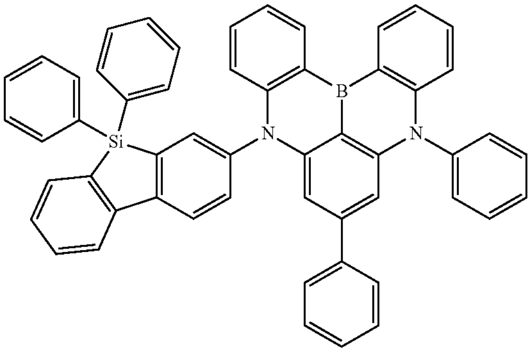
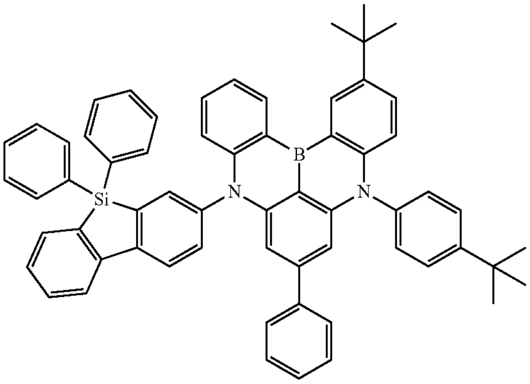
-continued
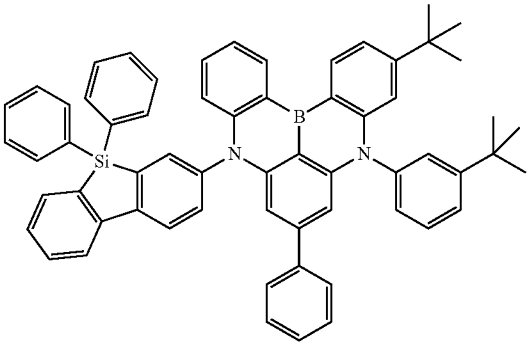
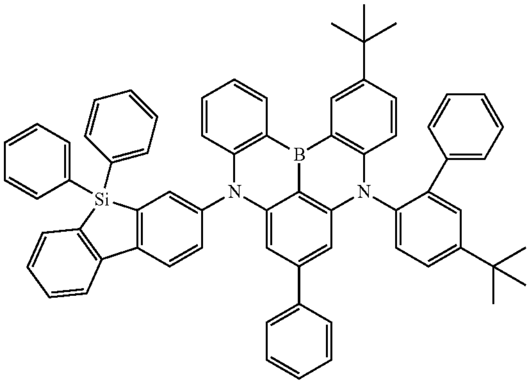
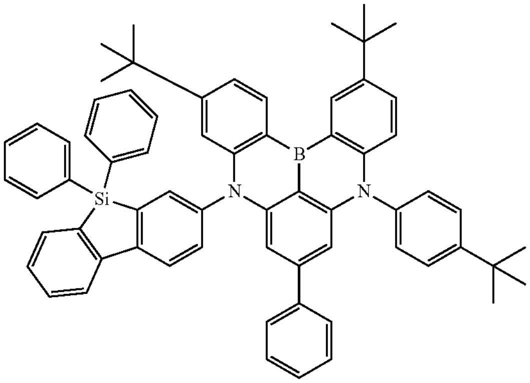
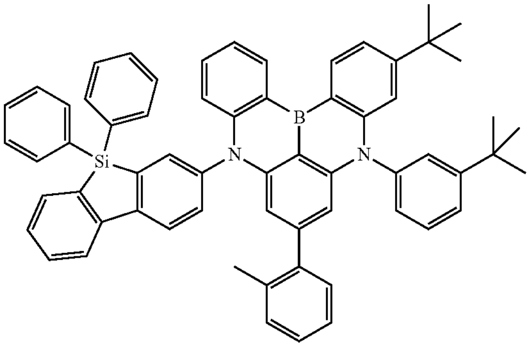

-continued
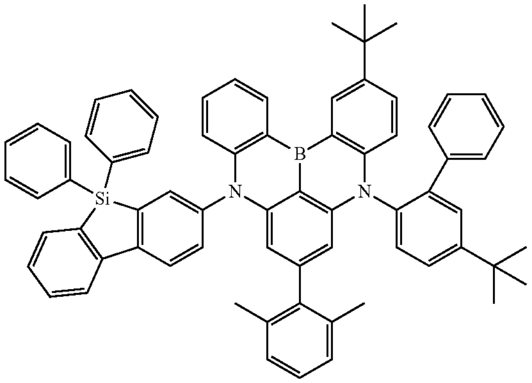
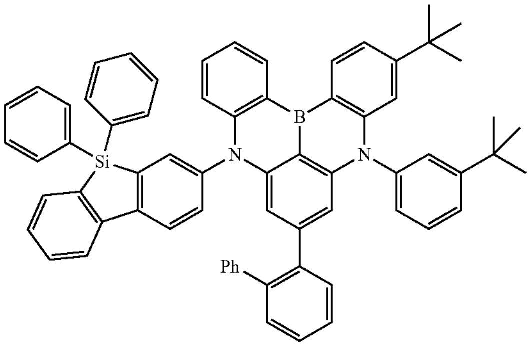
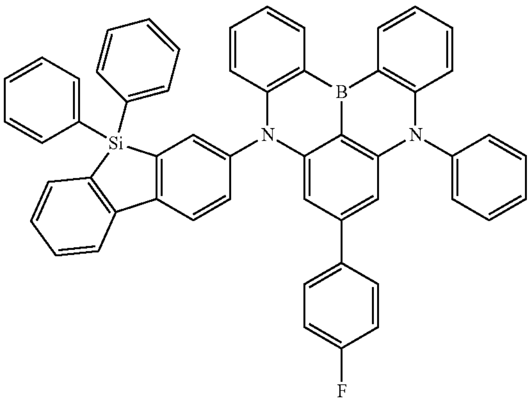
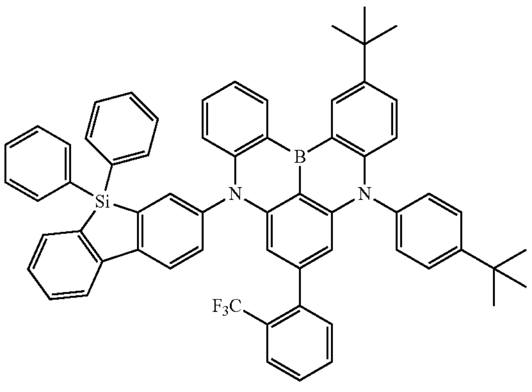
-continued
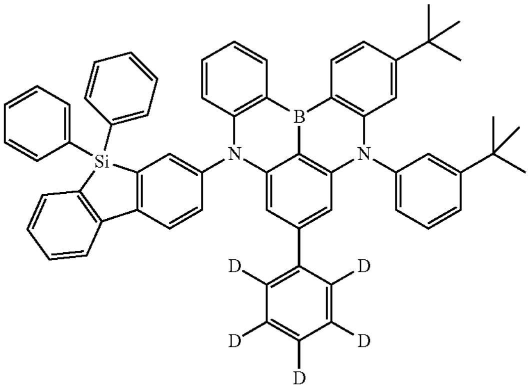
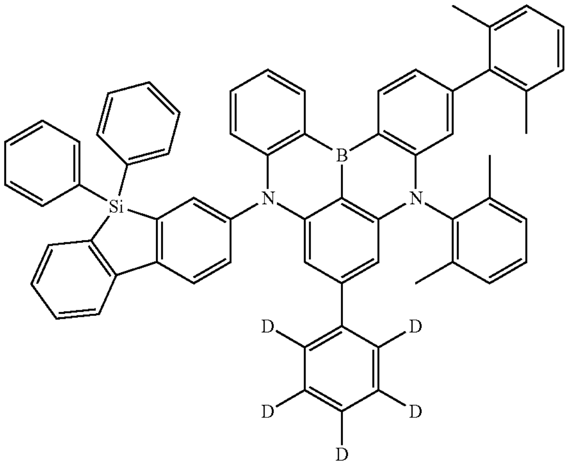
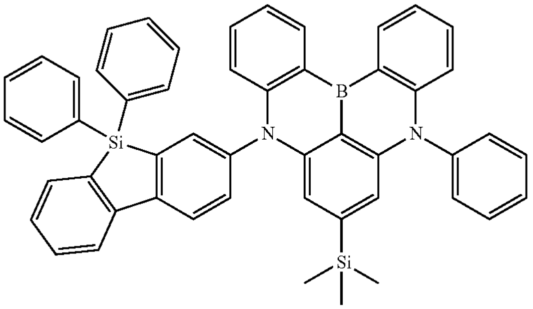
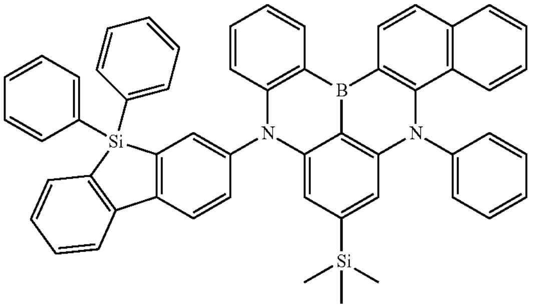

-continued
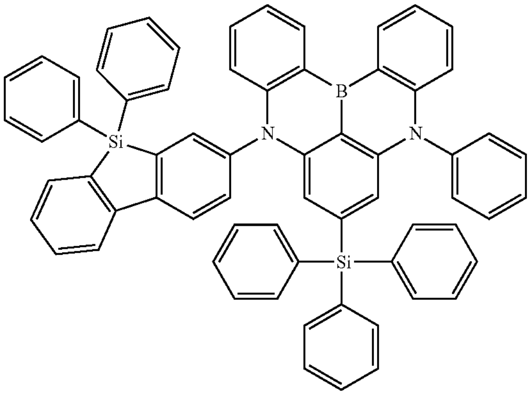
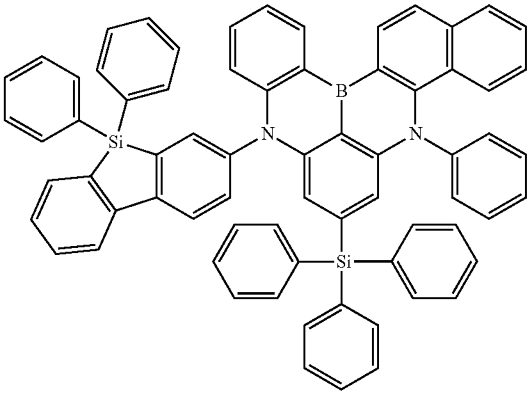
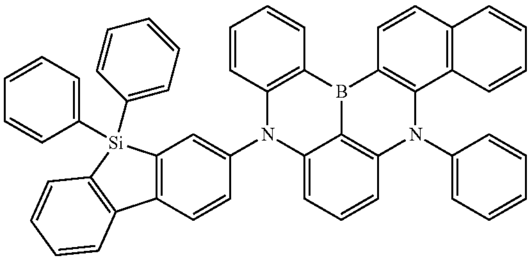
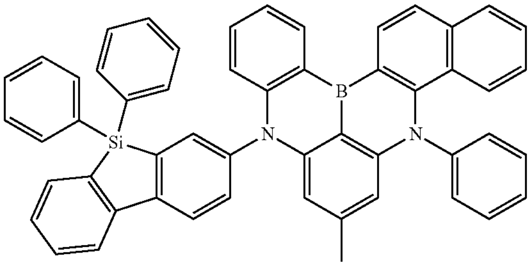
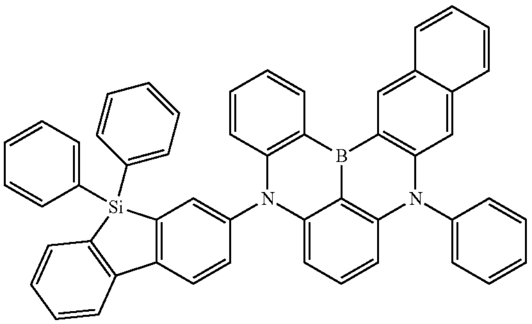
-continued
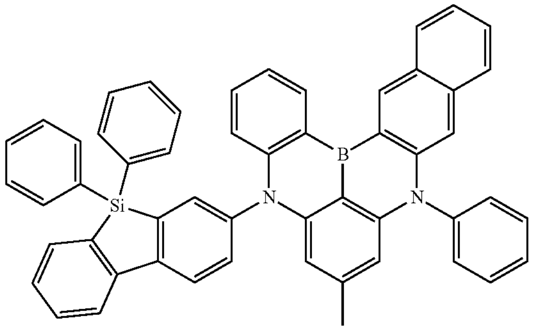
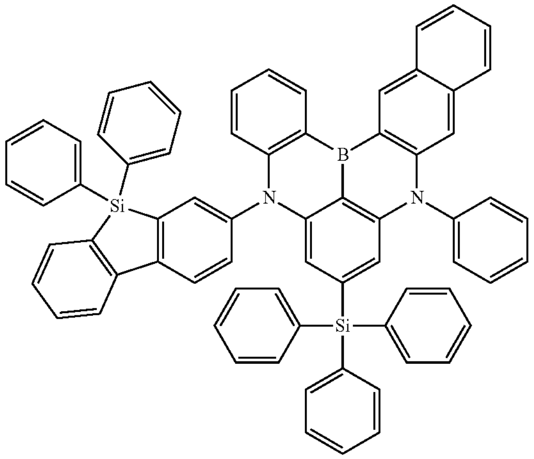
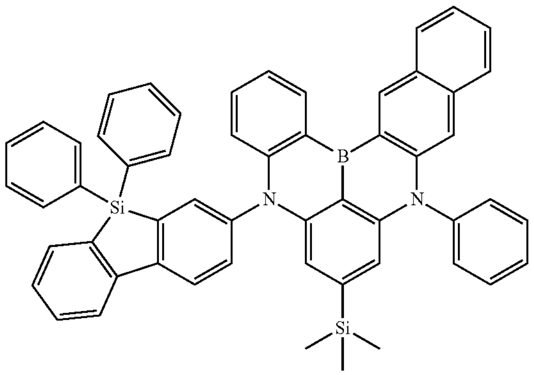
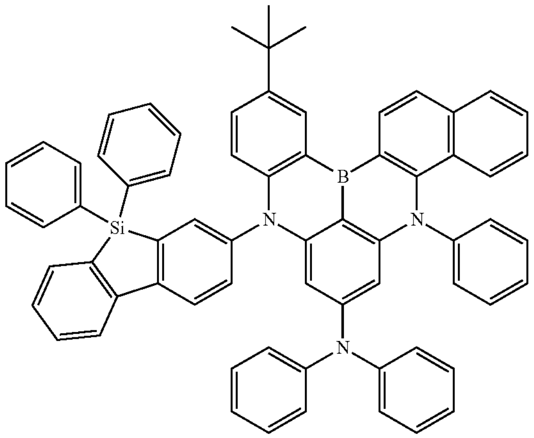

-continued
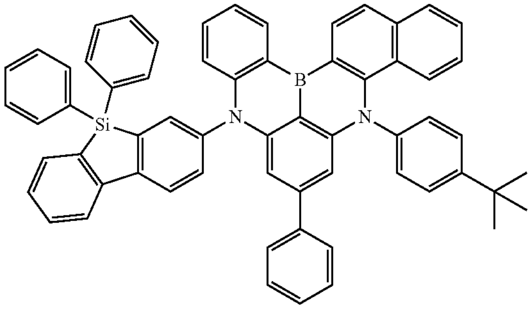
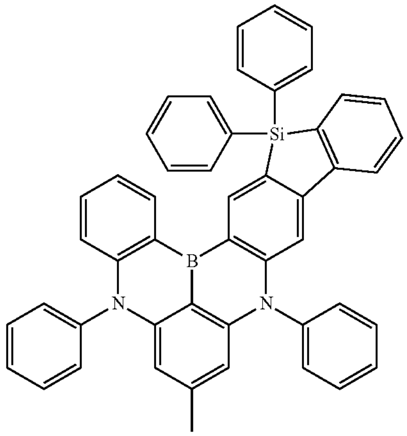
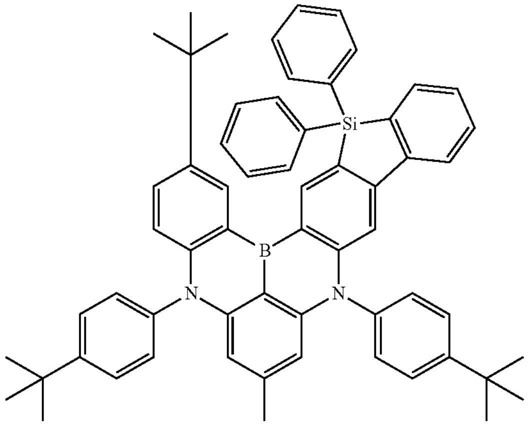
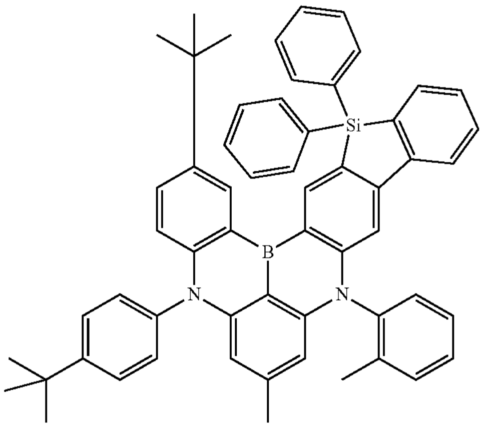
-continued
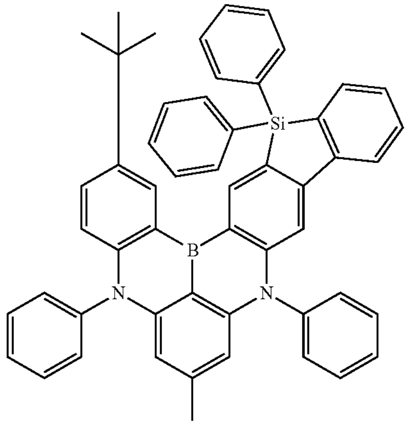
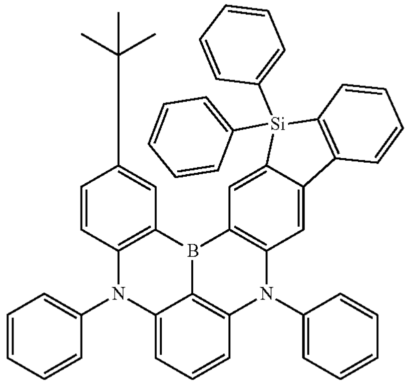
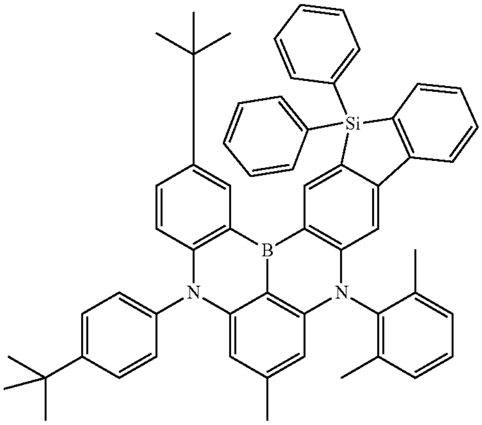
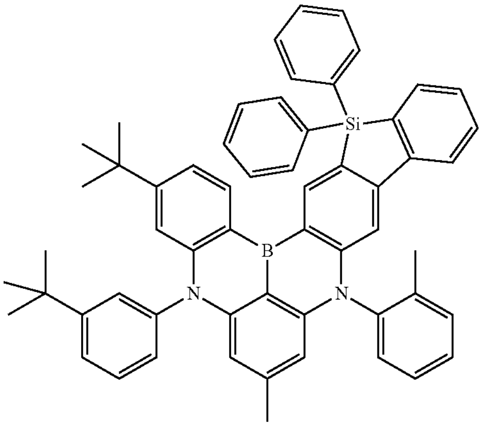

-continued
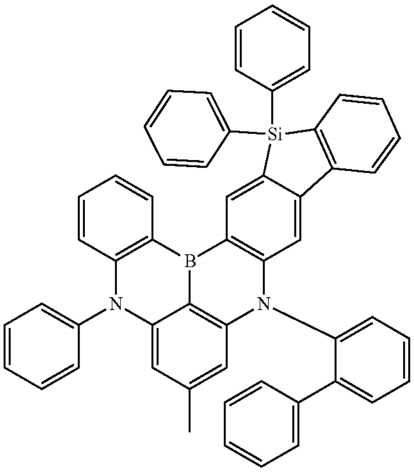
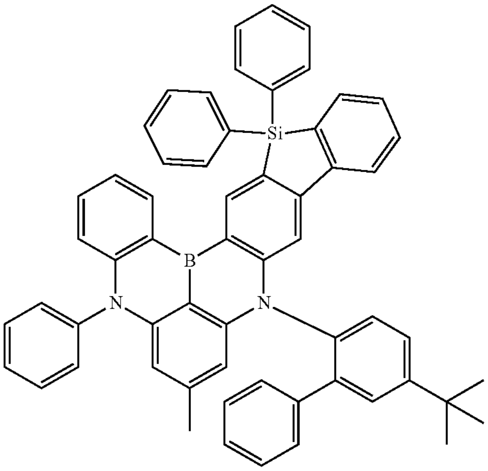
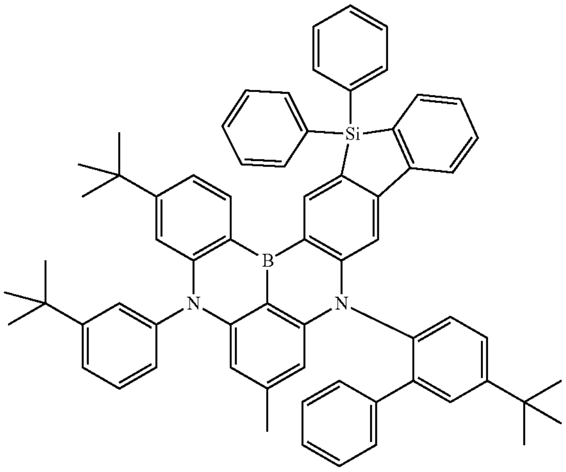
-continued
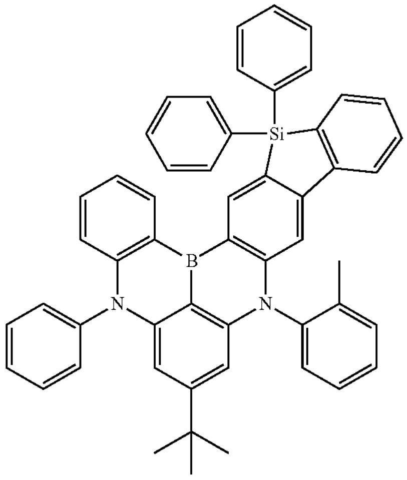
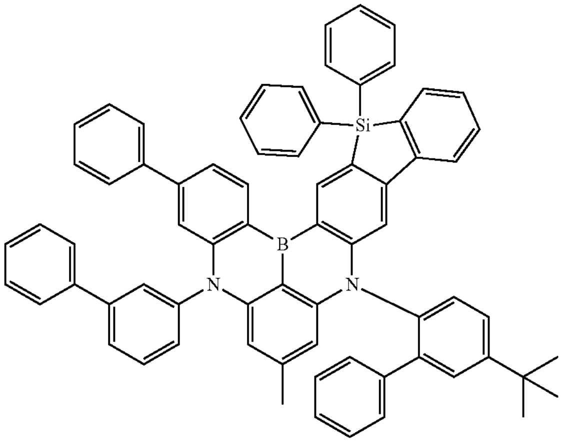
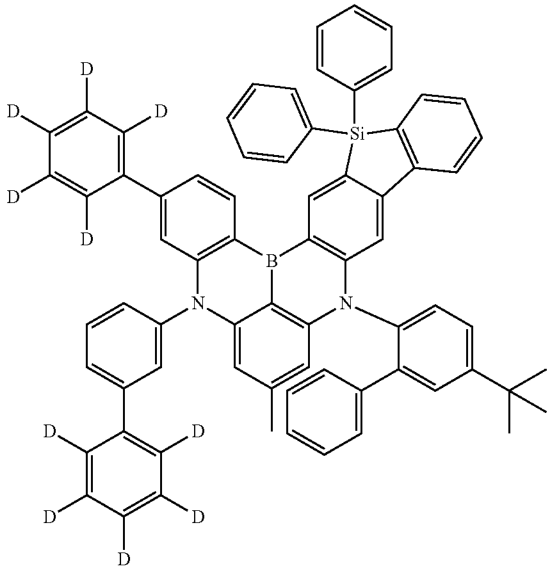

-continued
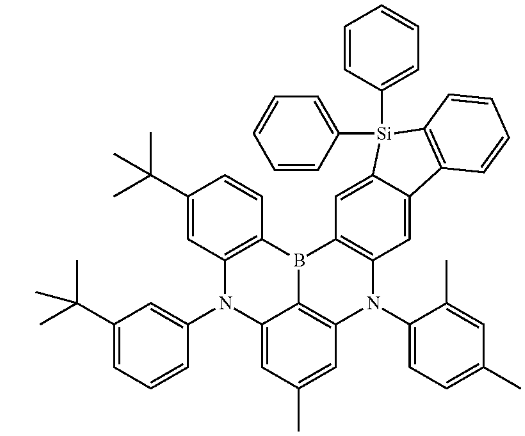
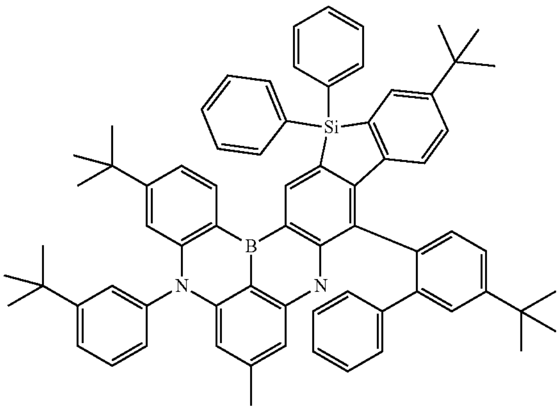
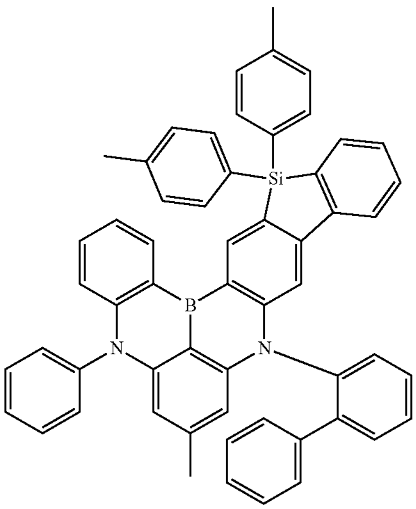
-continued
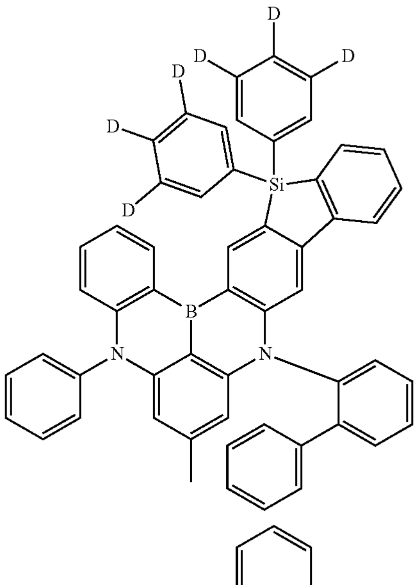
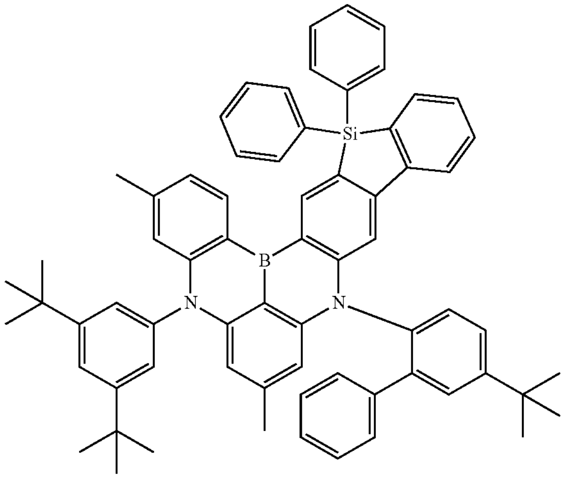
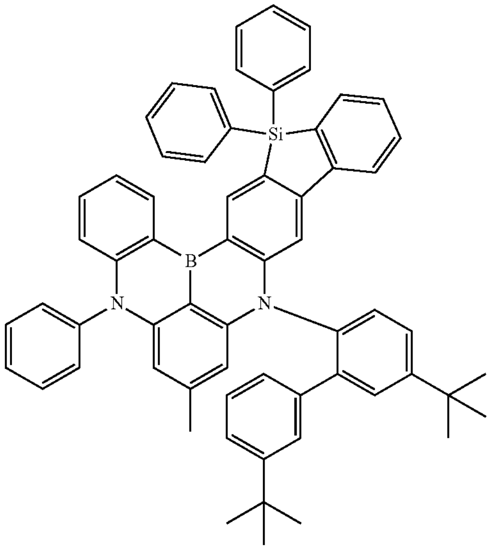

-continued
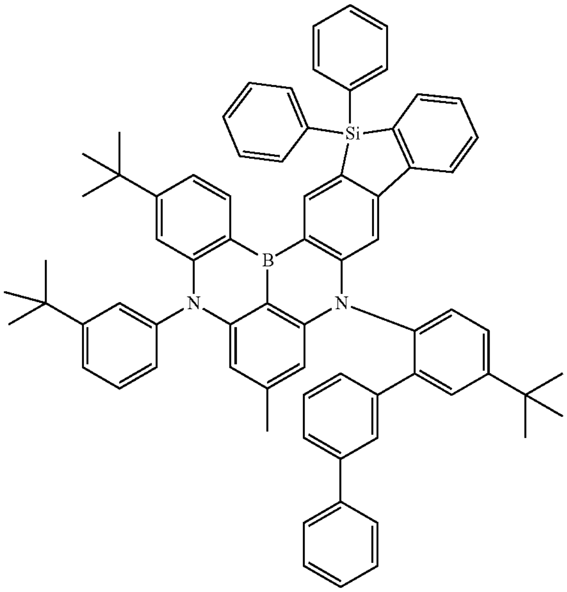
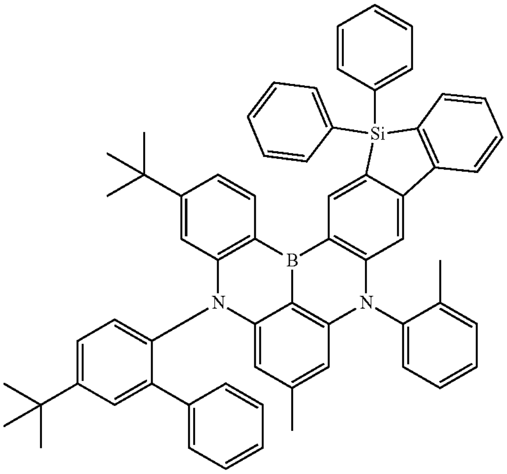
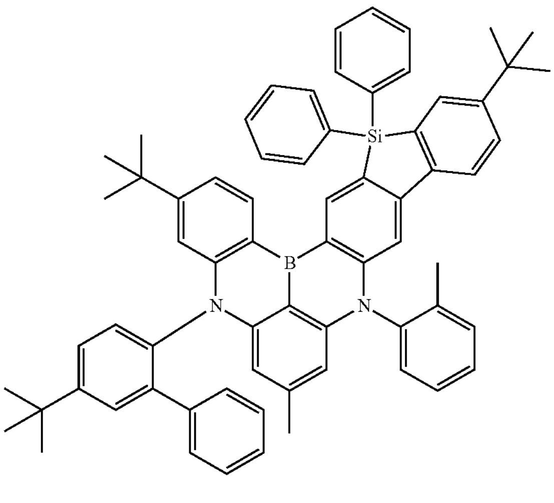
-continued
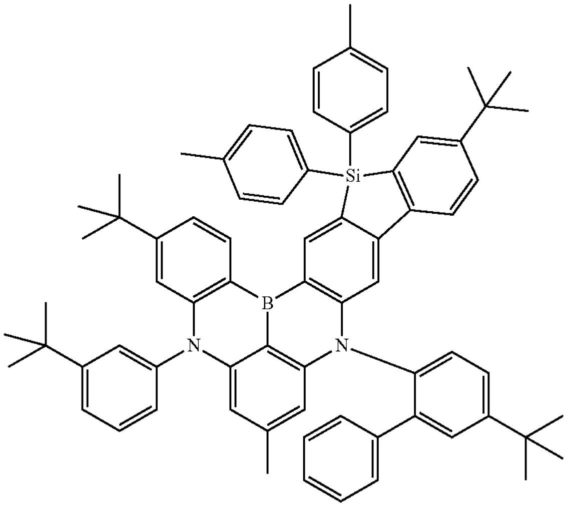
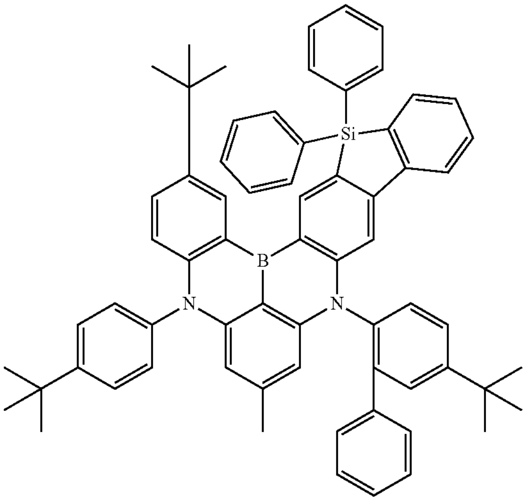
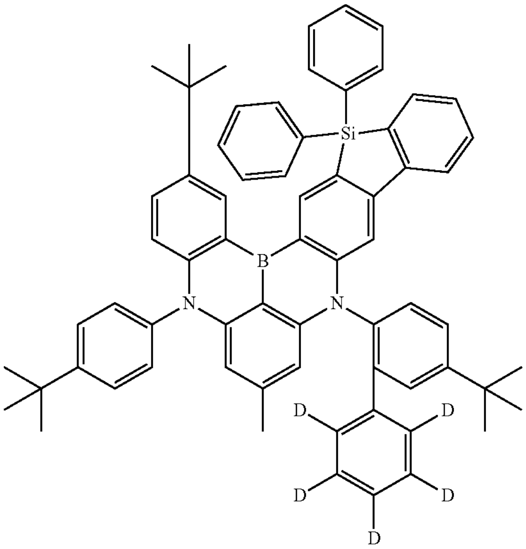

-continued
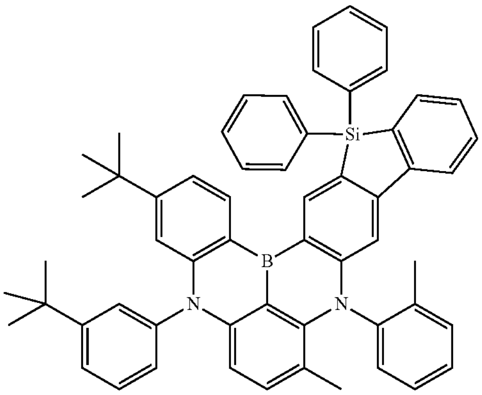
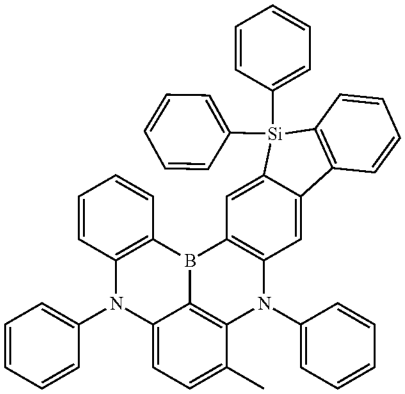
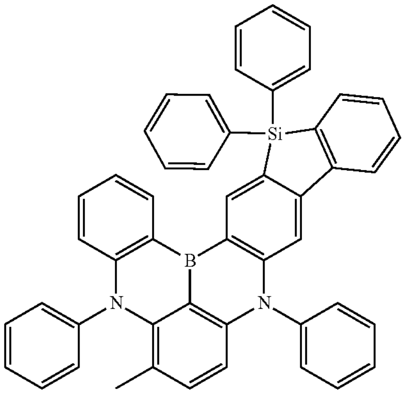
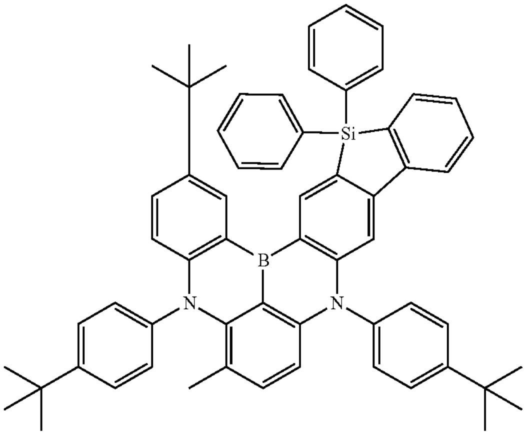
-continued
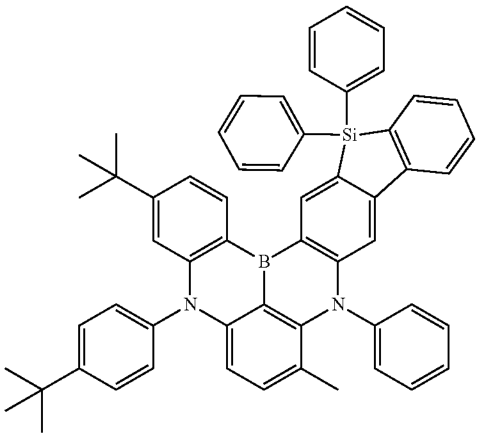
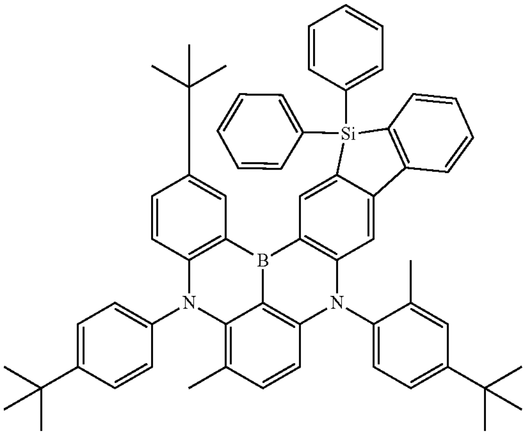
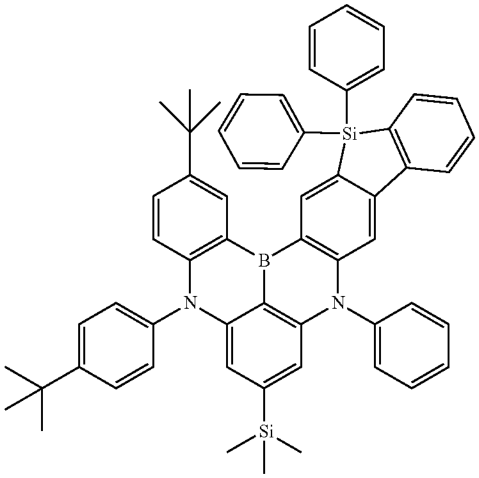

-continued
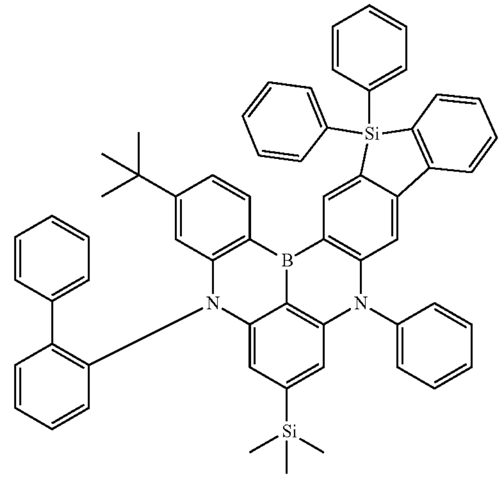
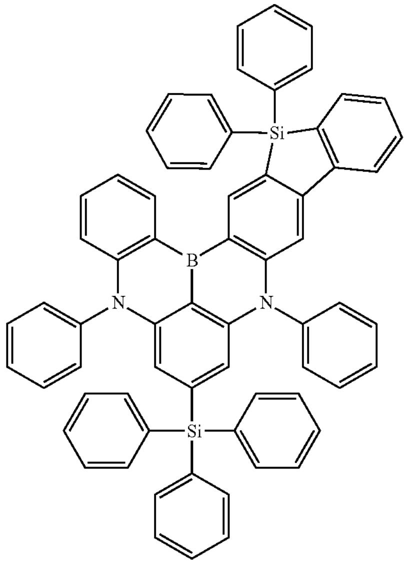
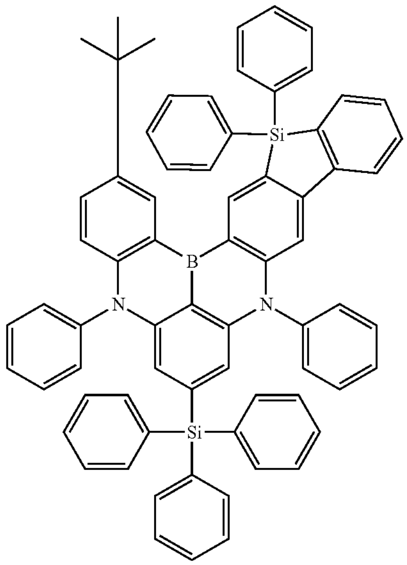
-continued
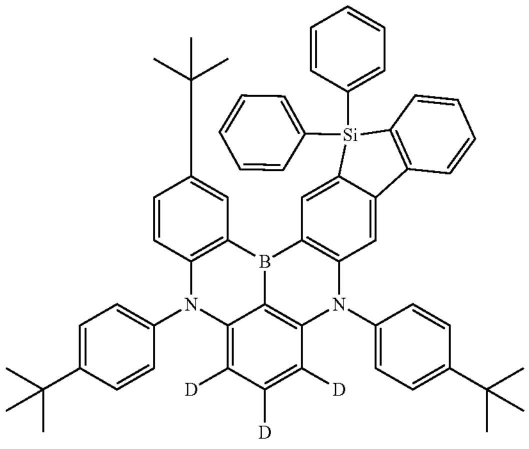
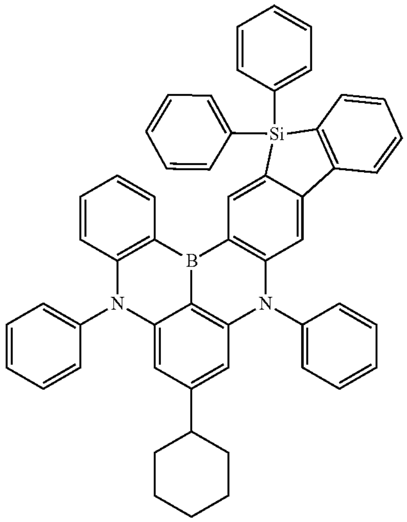
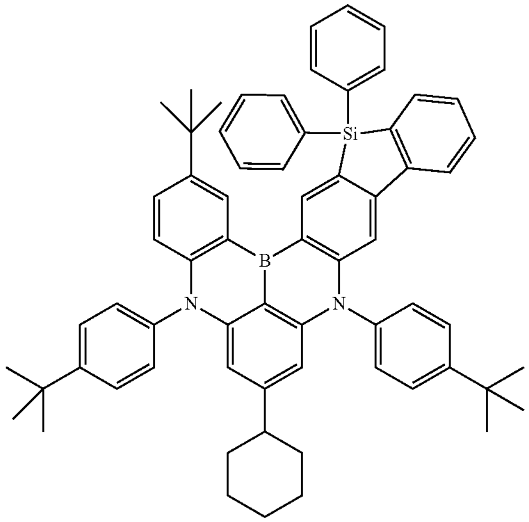

-continued
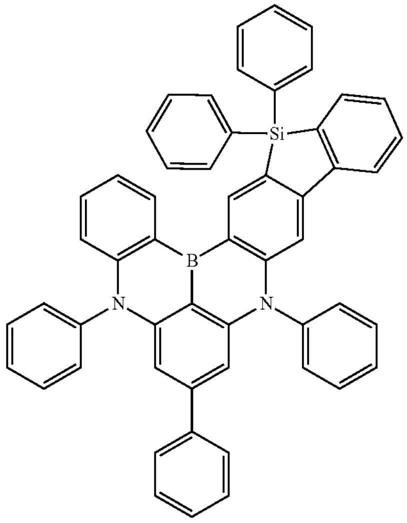
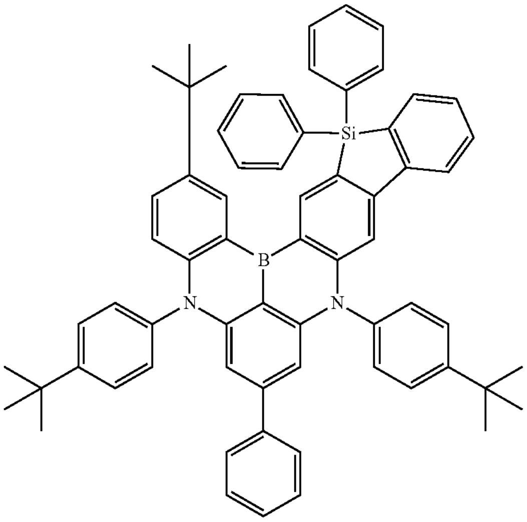
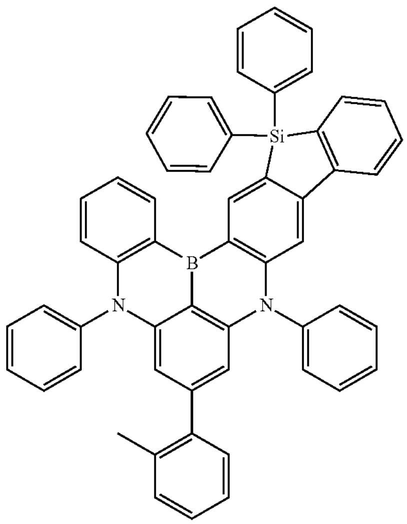
-continued
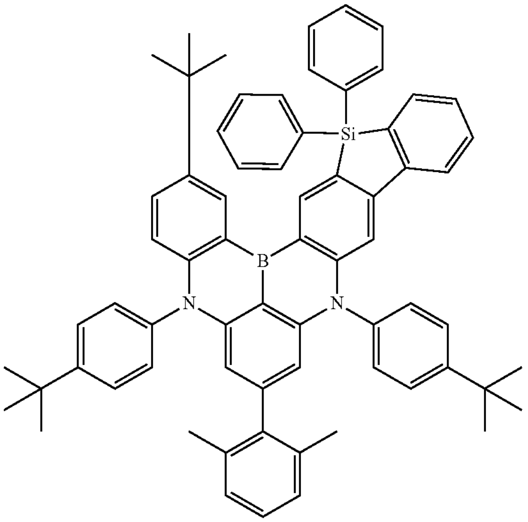
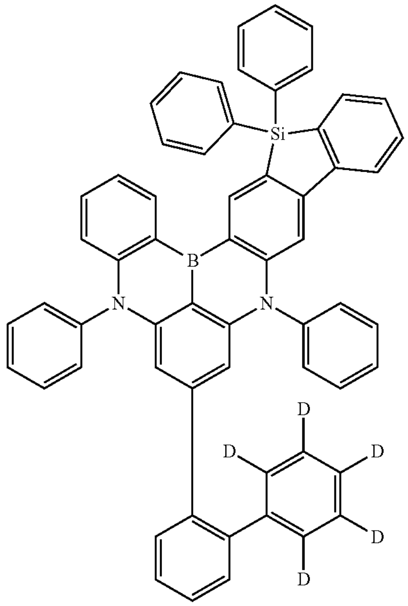
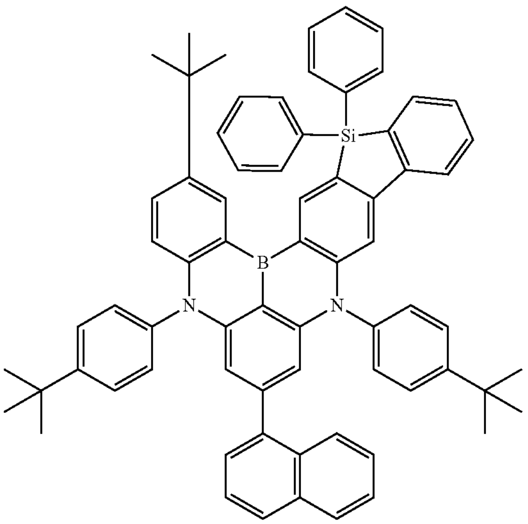

-continued
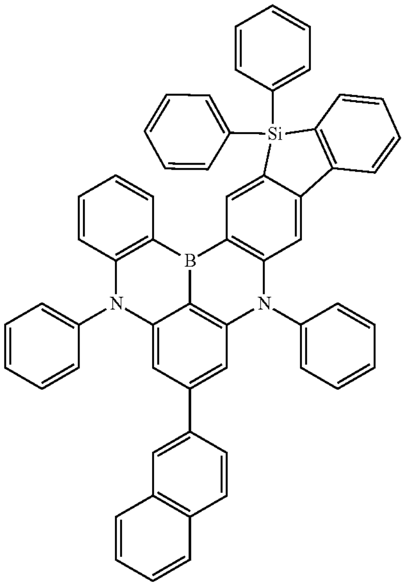
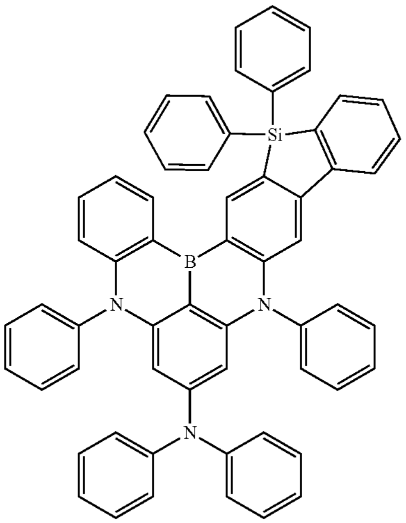
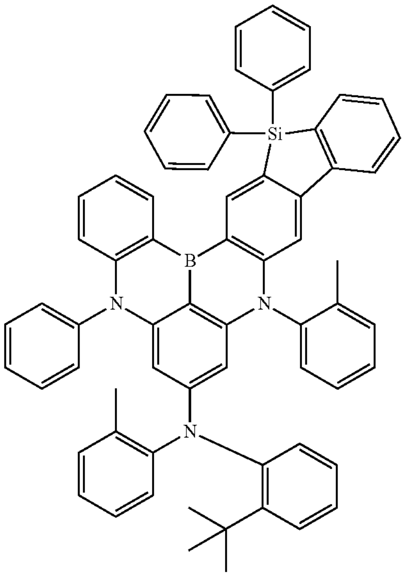
-continued
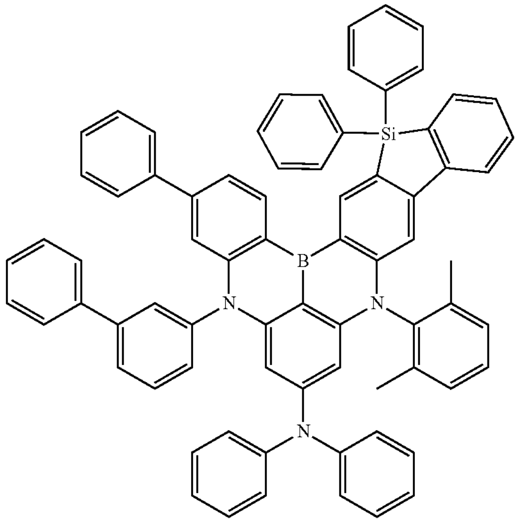
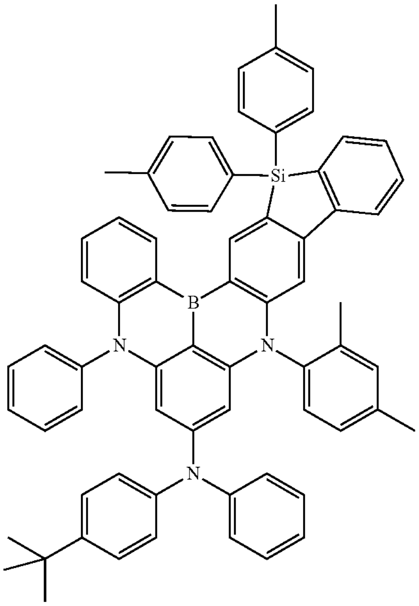
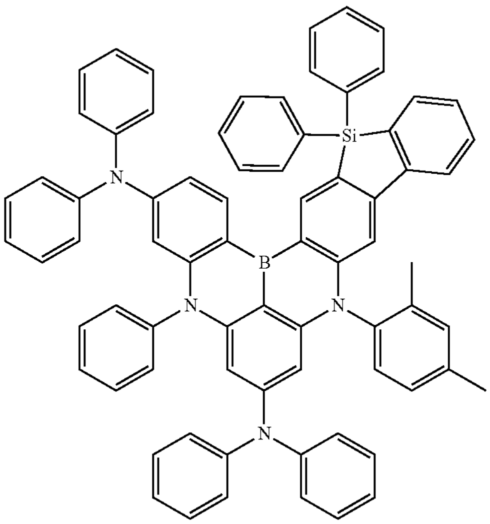

-continued
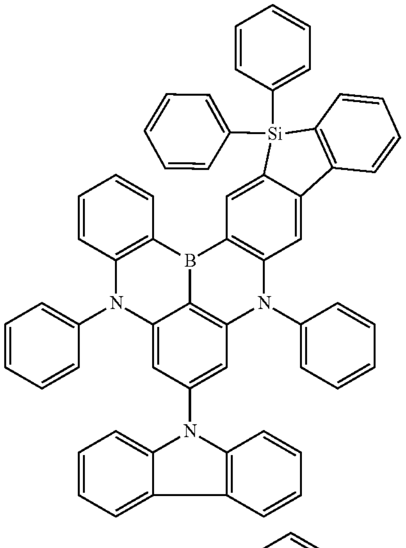
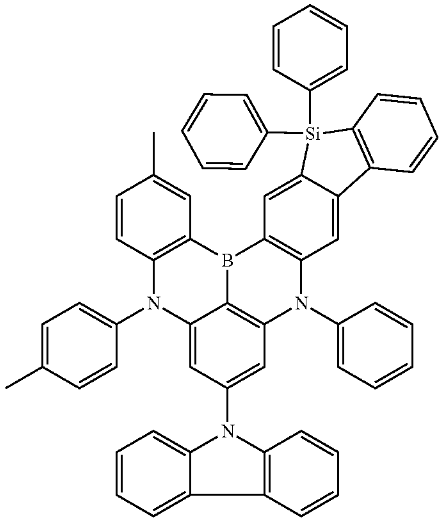
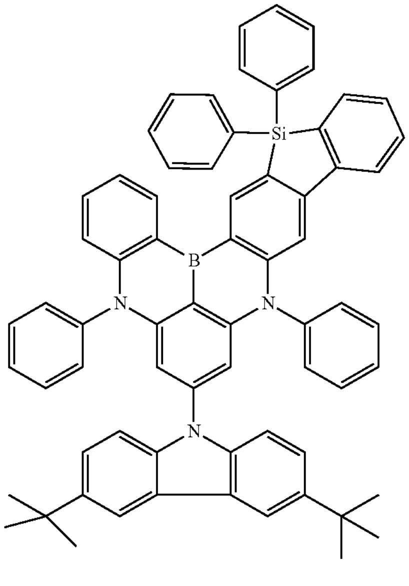
-continued
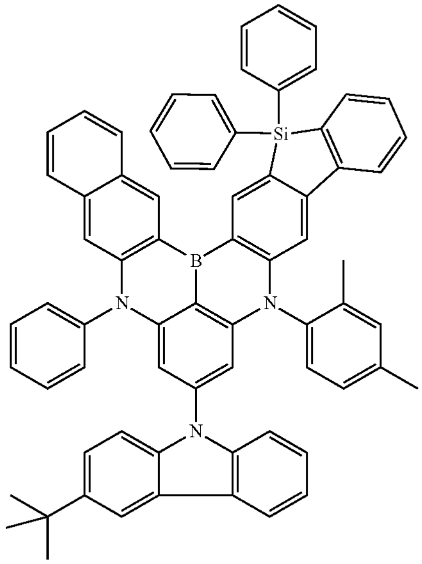
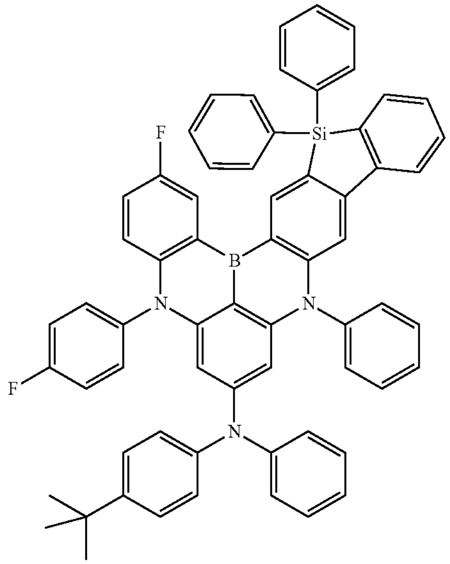
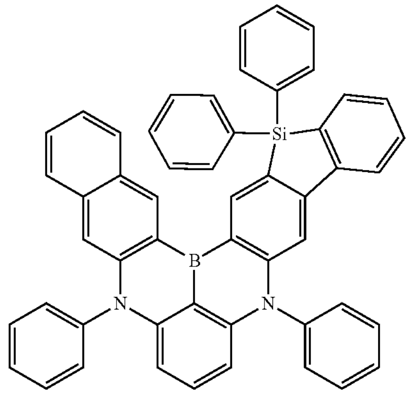

-continued
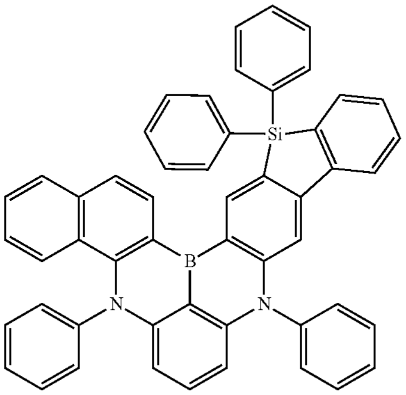
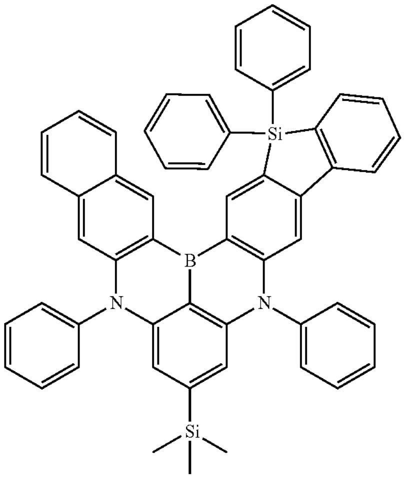
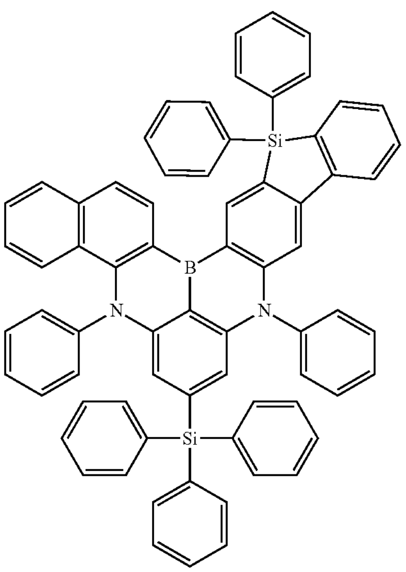
-continued
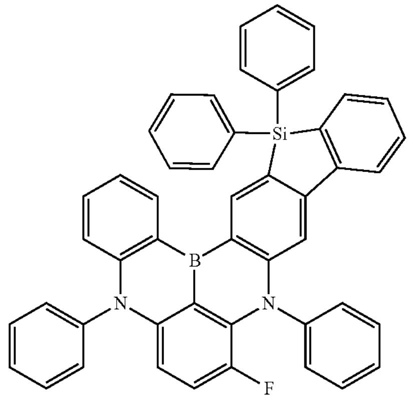
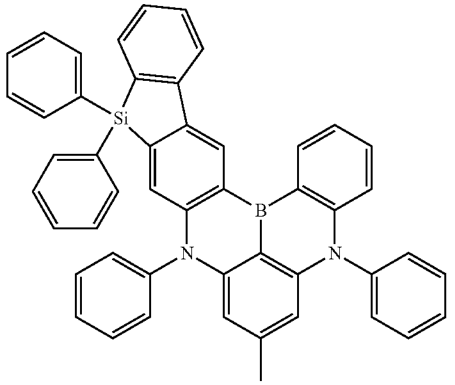
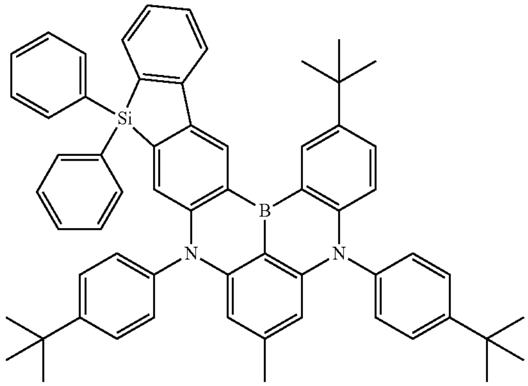
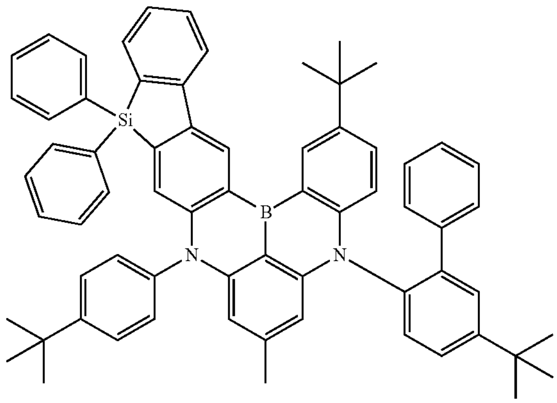

-continued
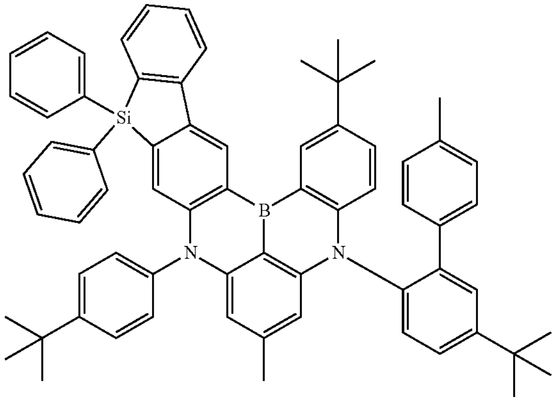
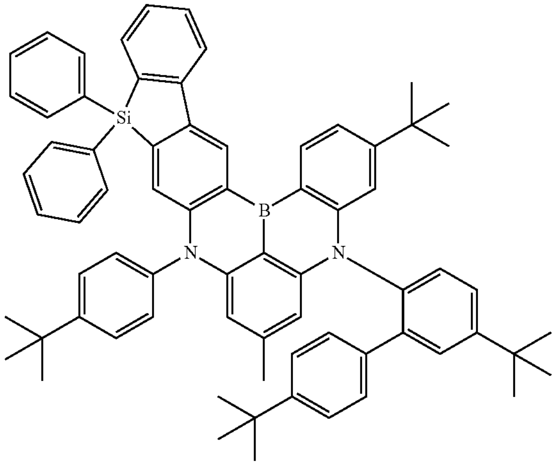
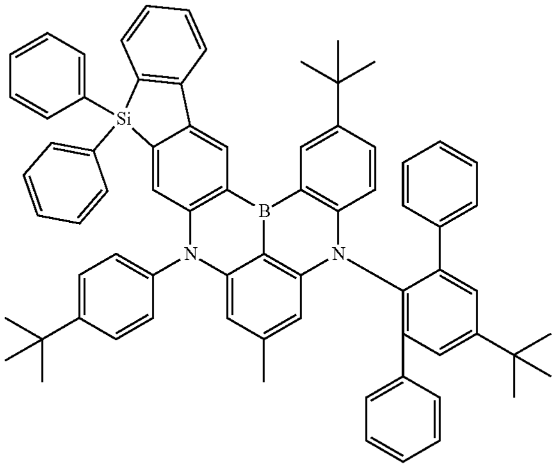
-continued
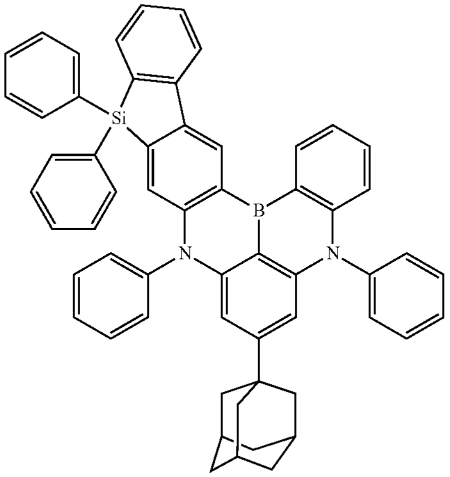
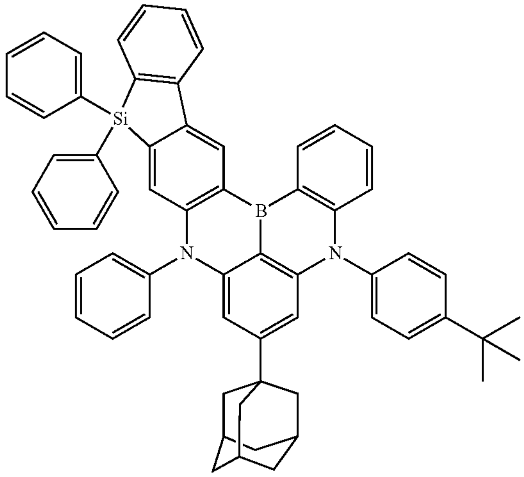
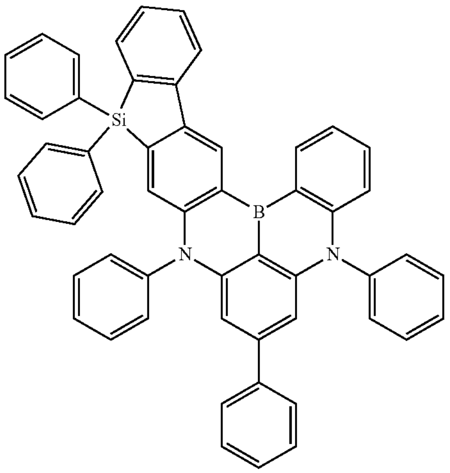

-continued
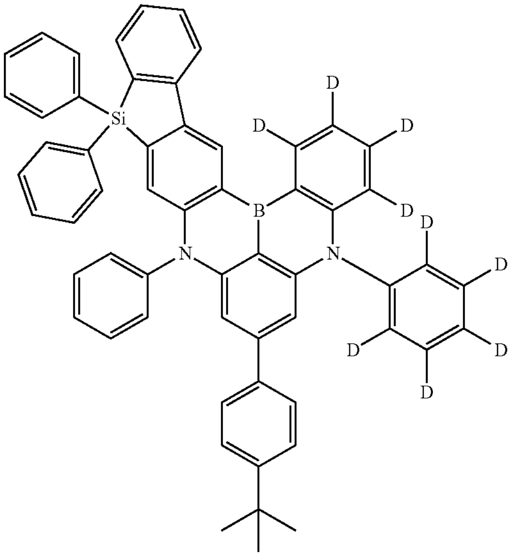
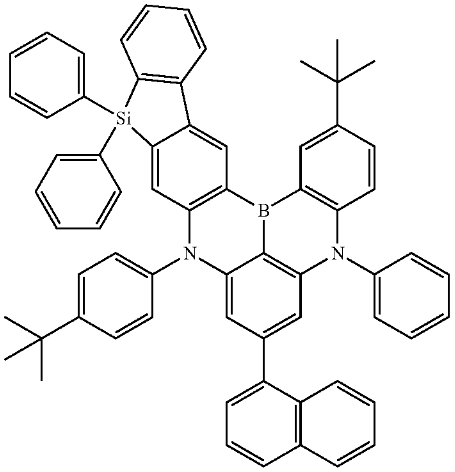
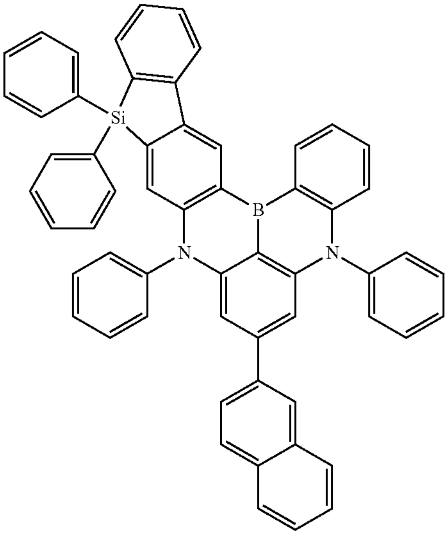
-continued
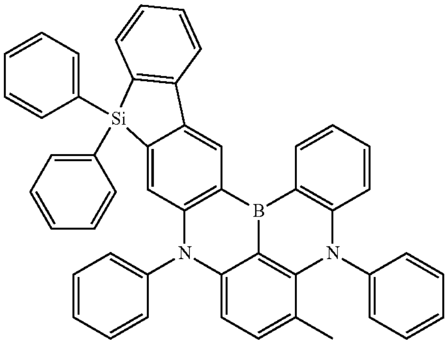
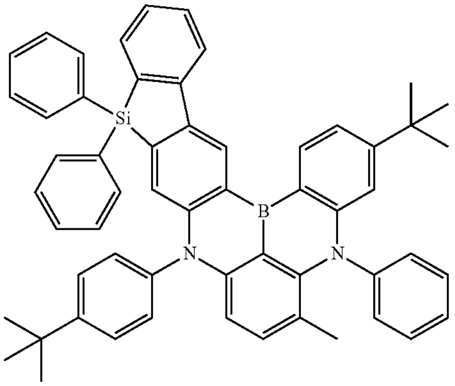
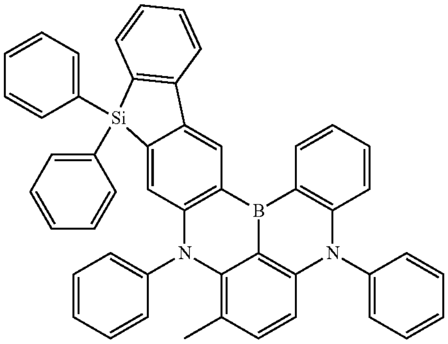
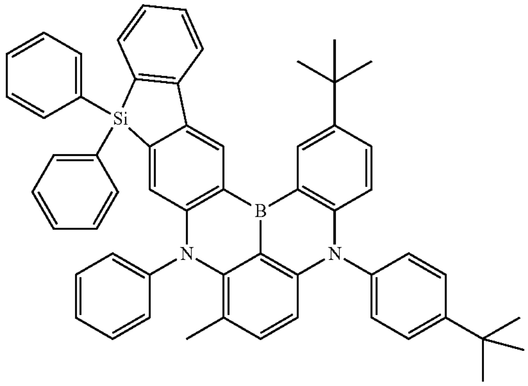

-continued
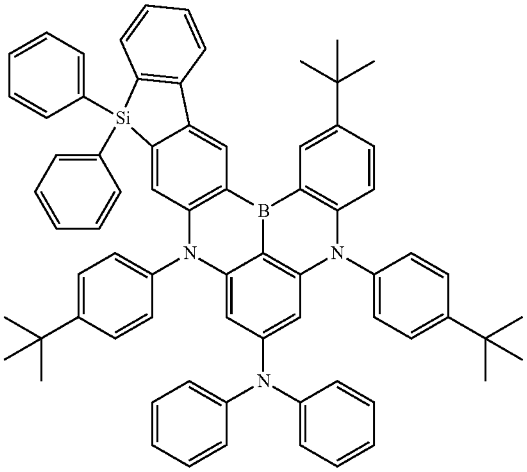
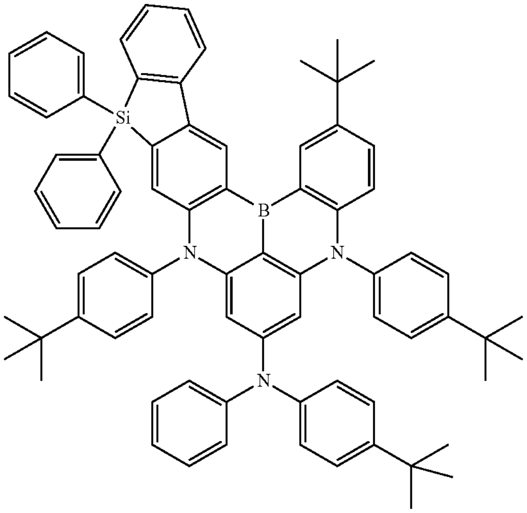
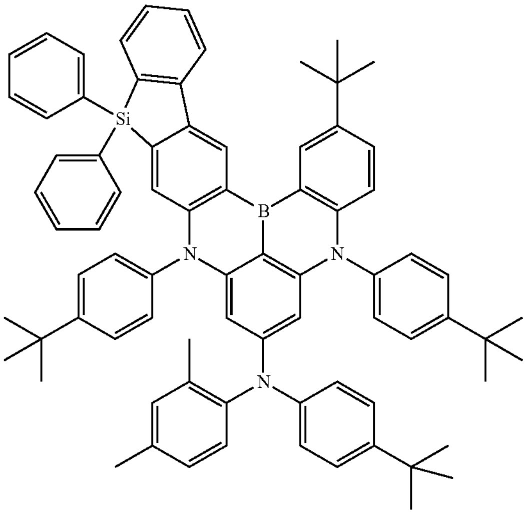
-continued
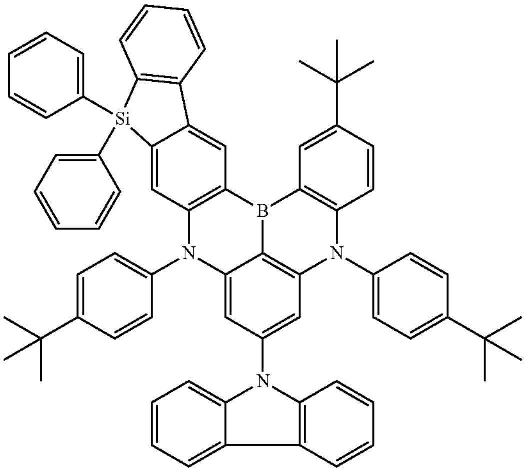
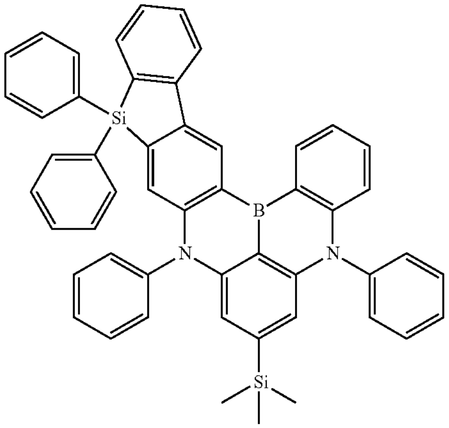
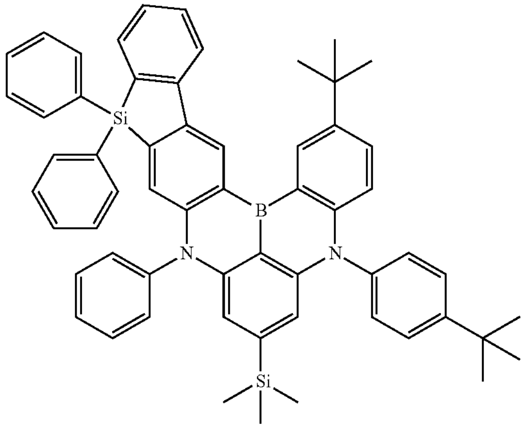

-continued
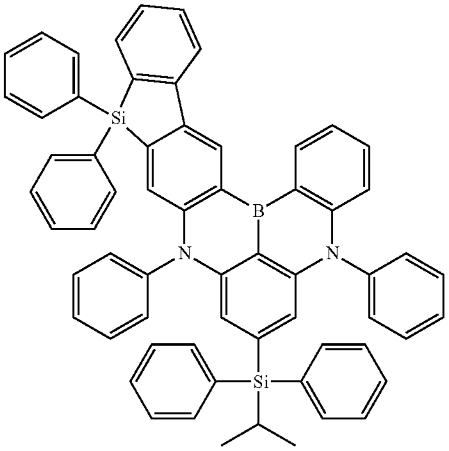
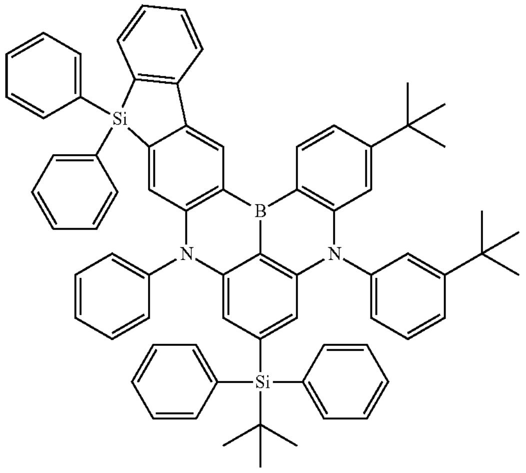
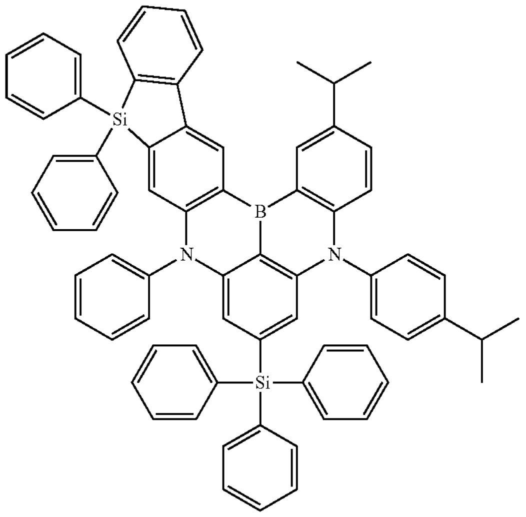
-continued
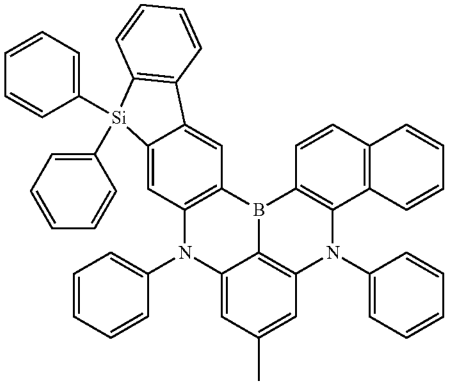
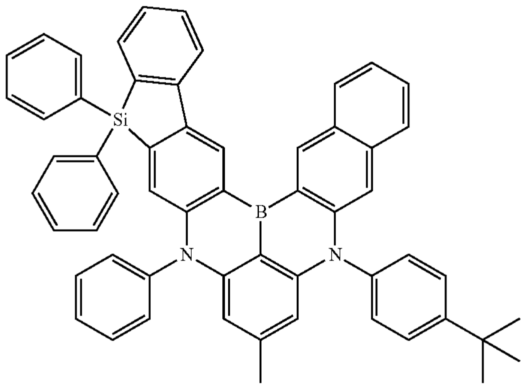
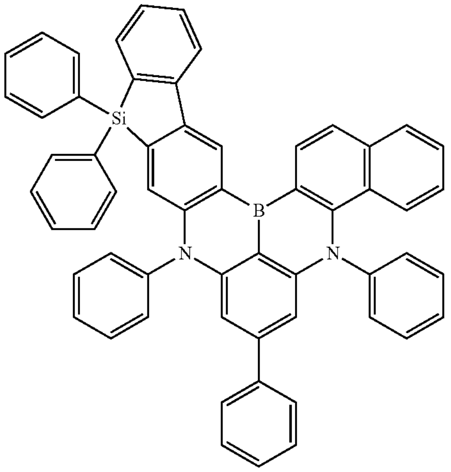

-continued
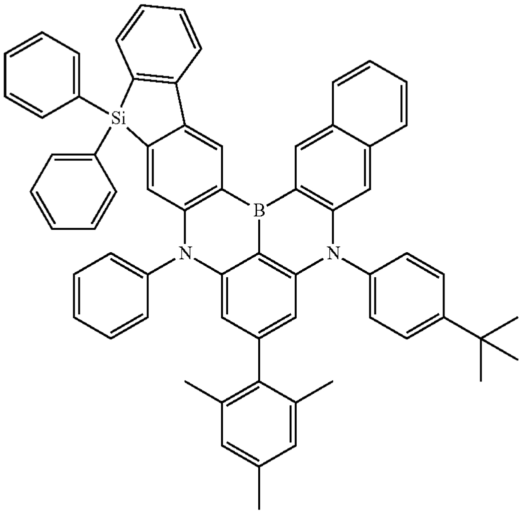
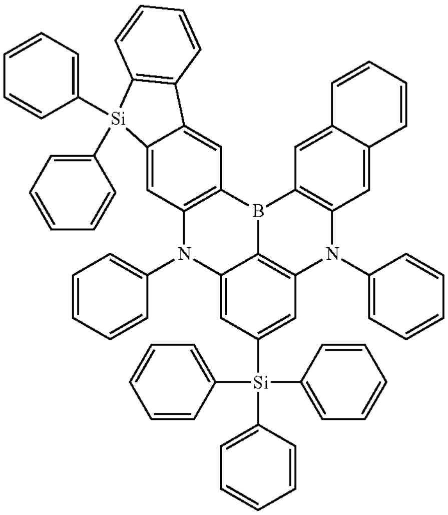
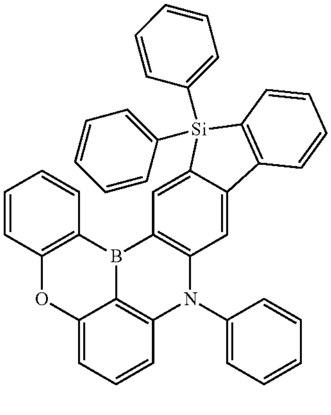
-continued
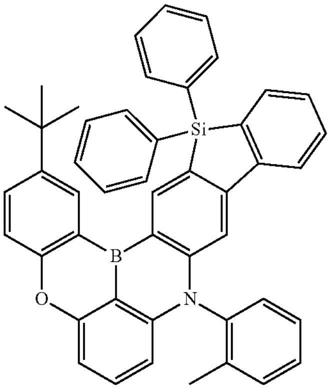
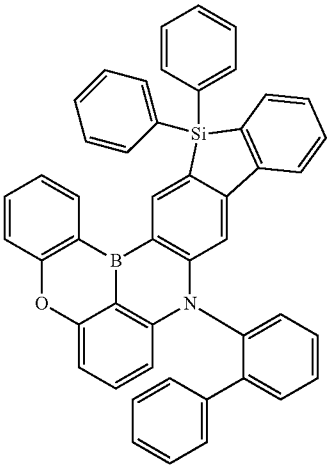
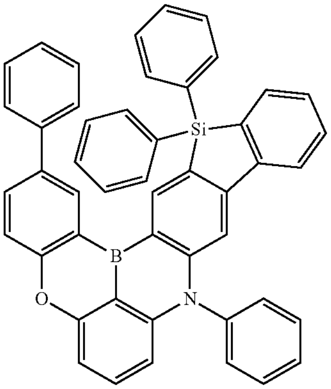
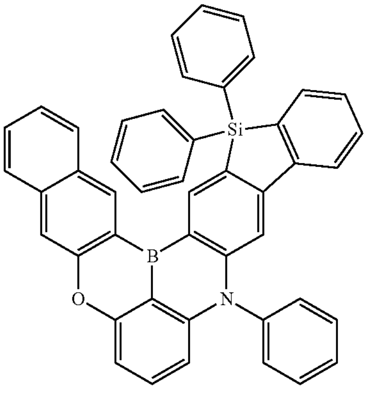

-continued
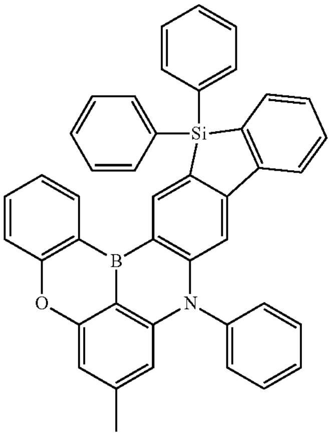
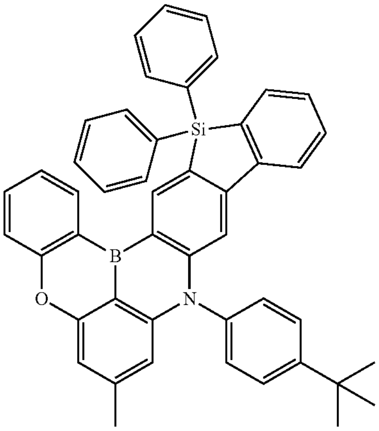
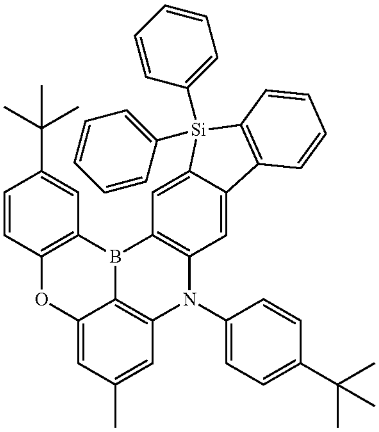
-continued
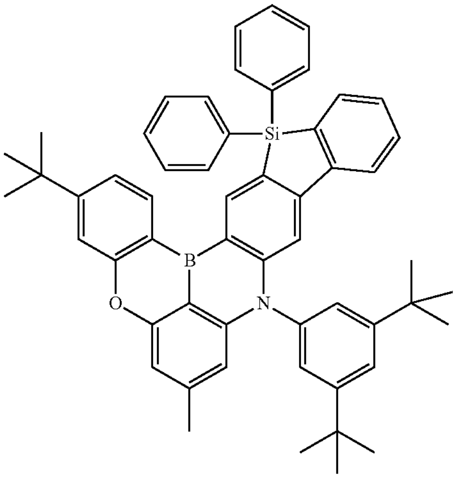
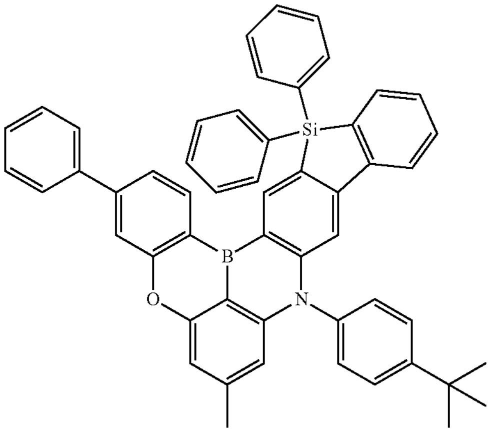
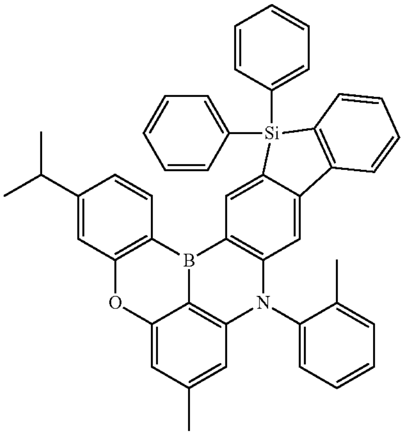

-continued
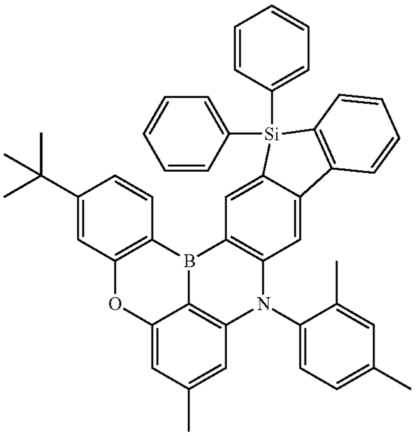
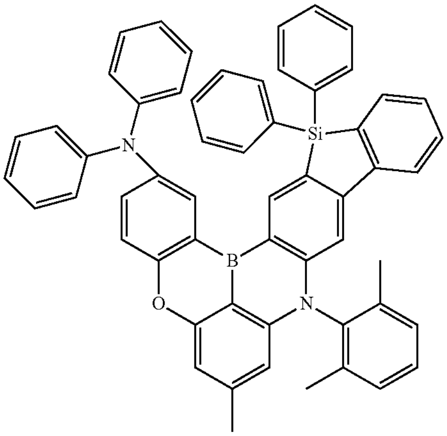
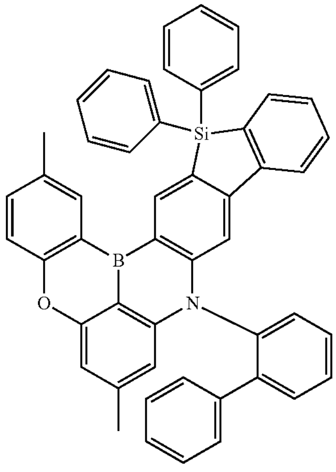
-continued
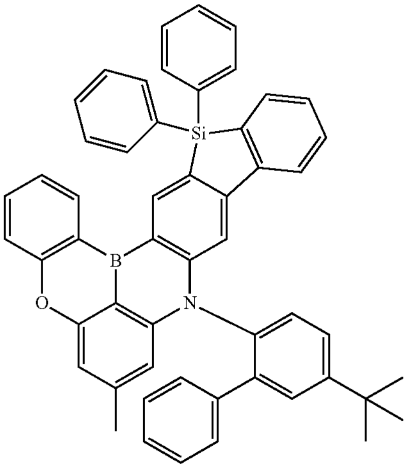
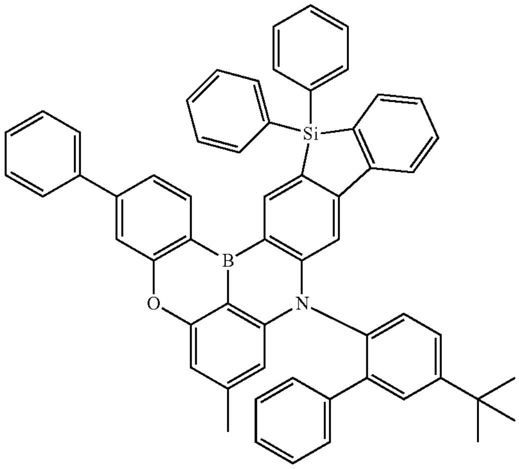
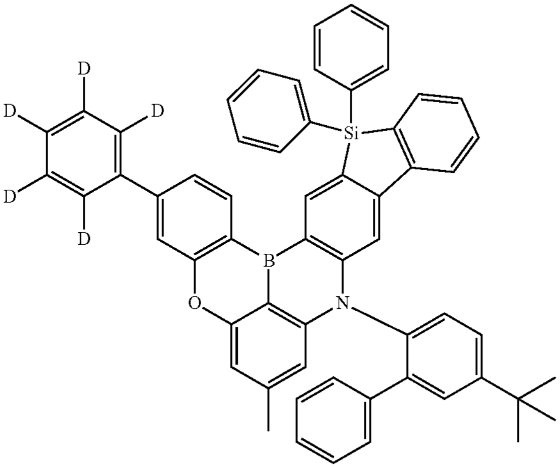

-continued
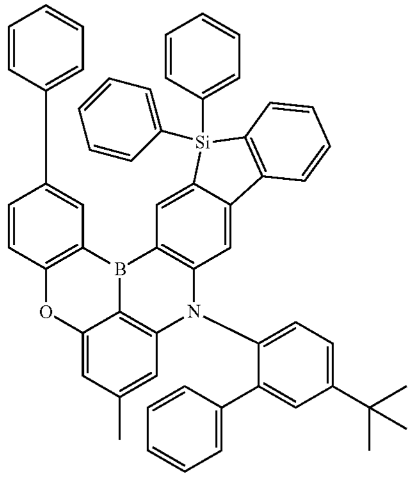
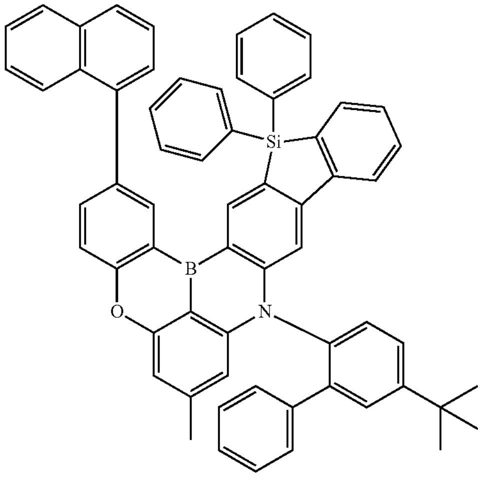
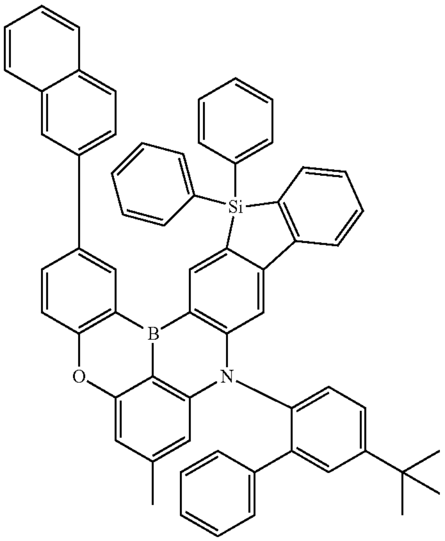
-continued
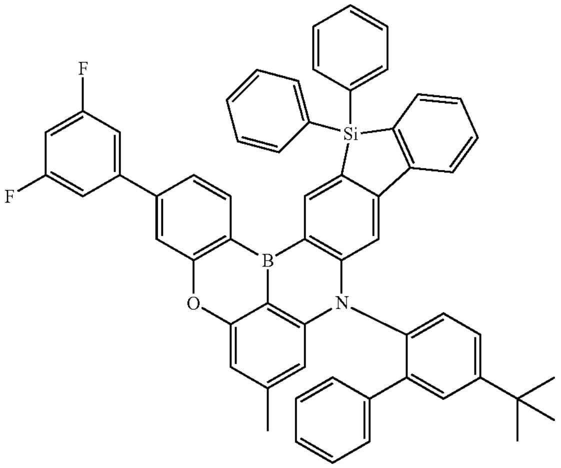
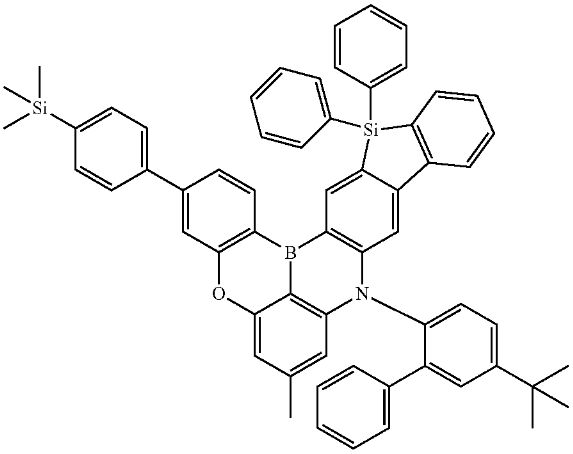
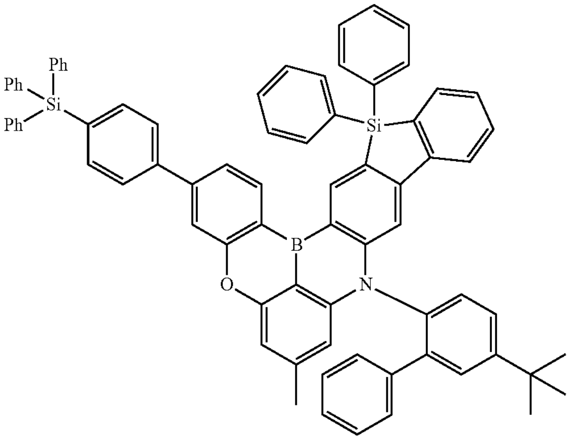

-continued
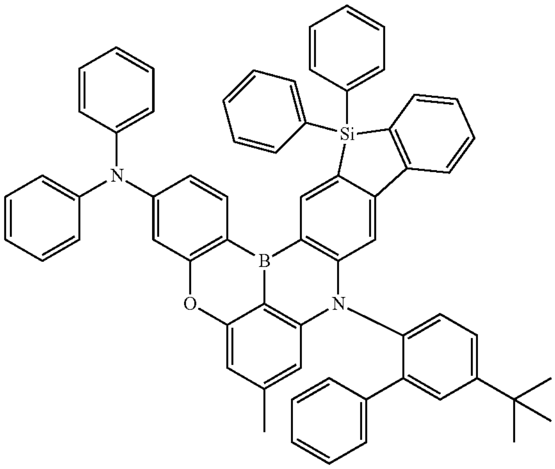
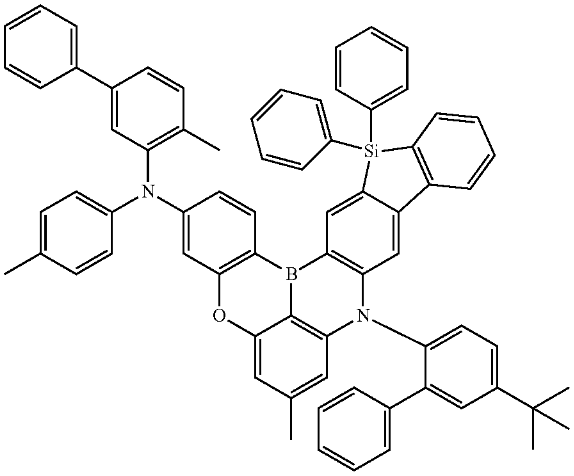
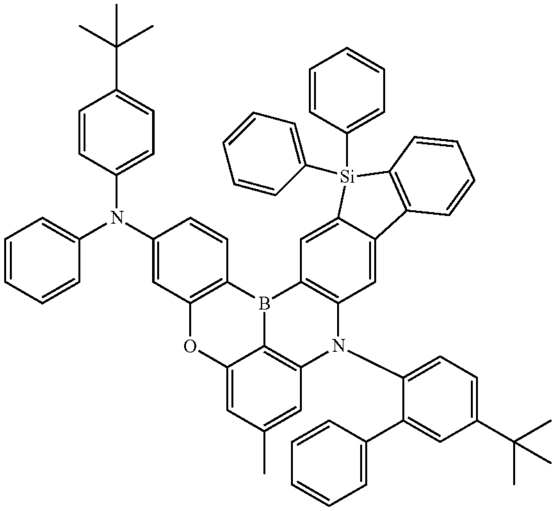
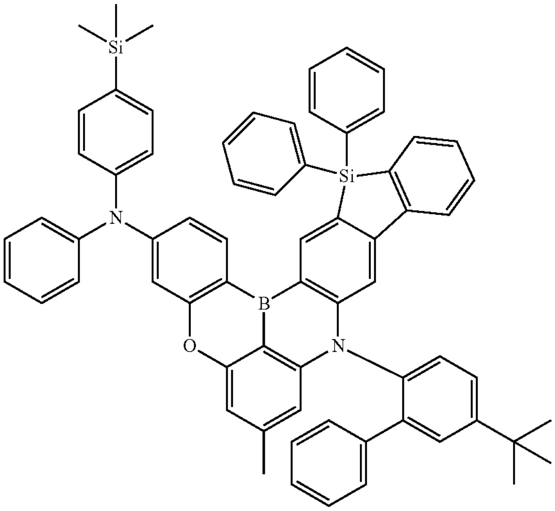
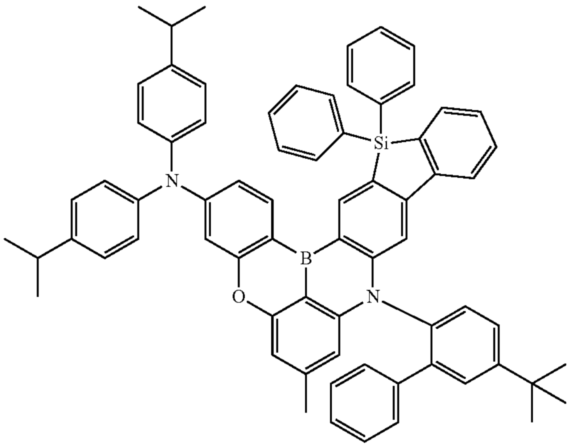
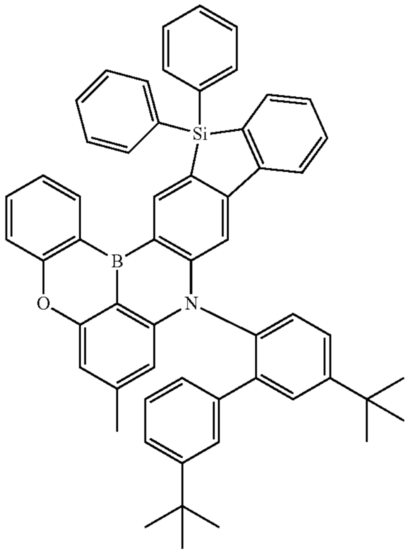
-continued -continued
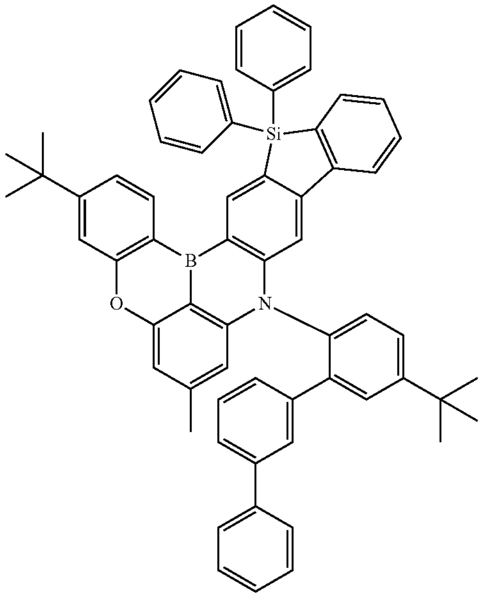
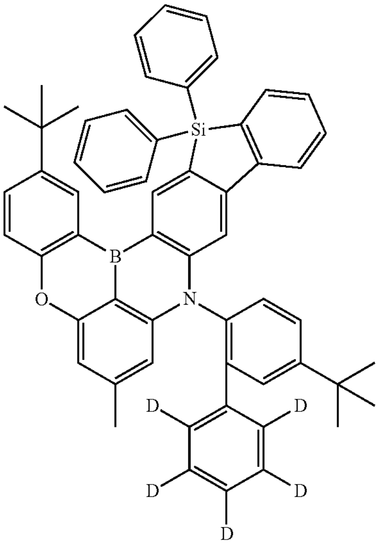
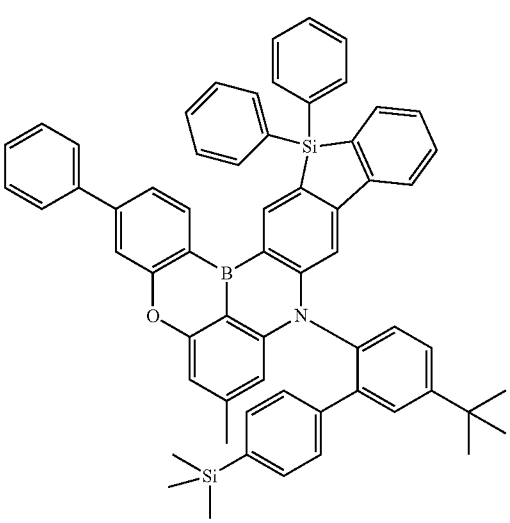
-continued
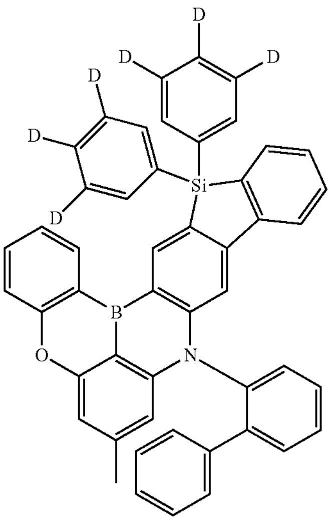
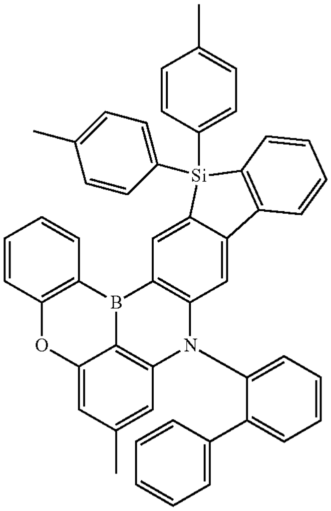
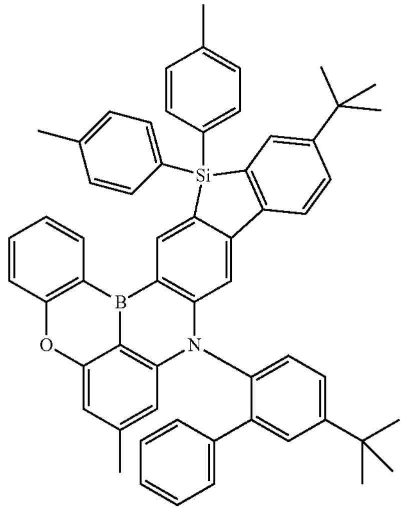

-continued
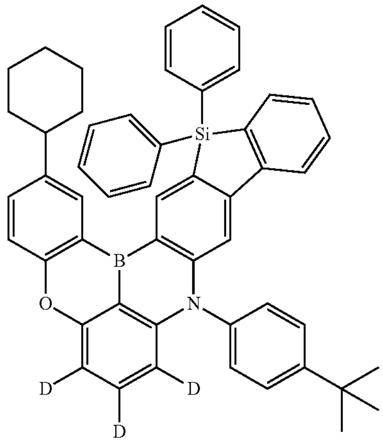
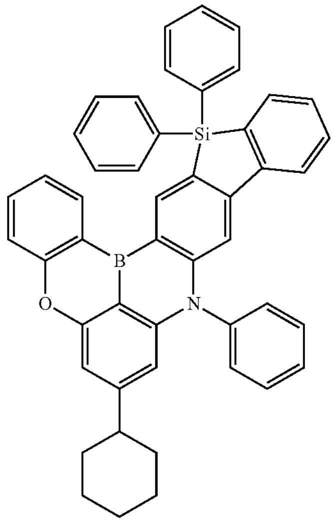
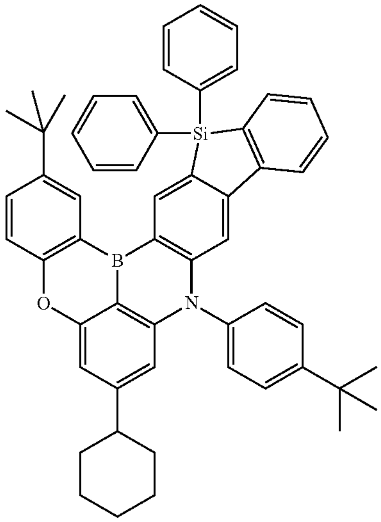
-continued
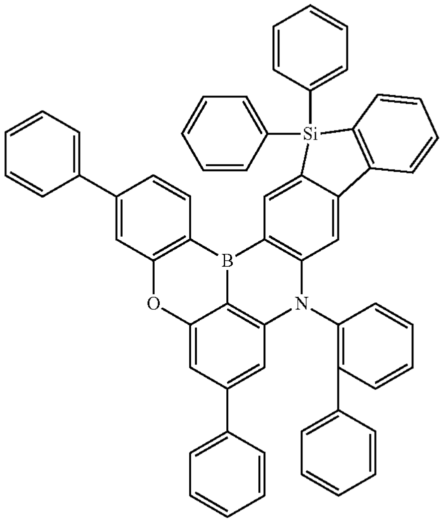
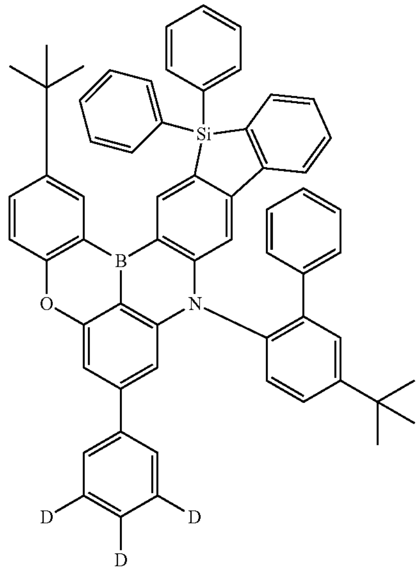
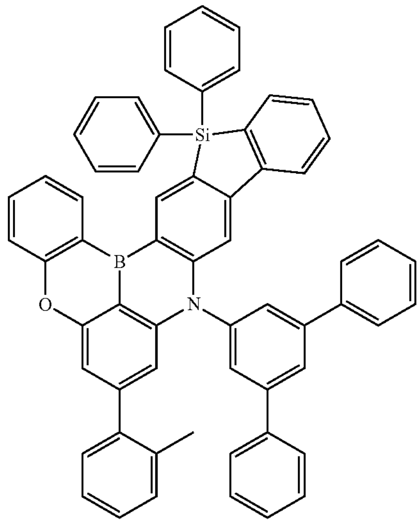

-continued
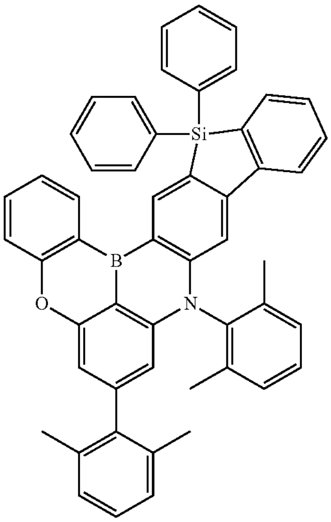
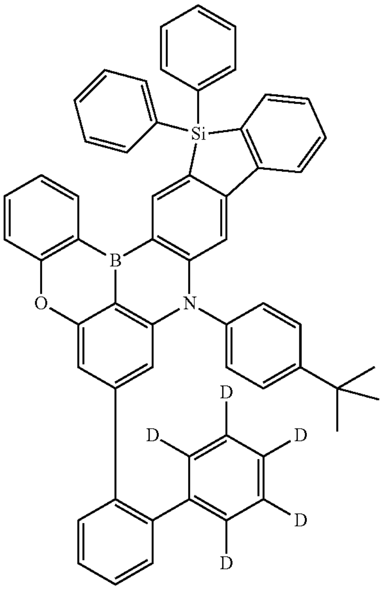
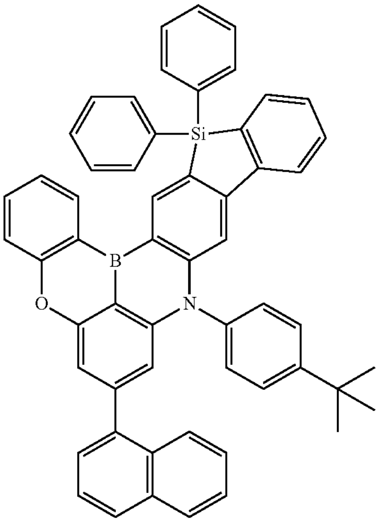
-continued
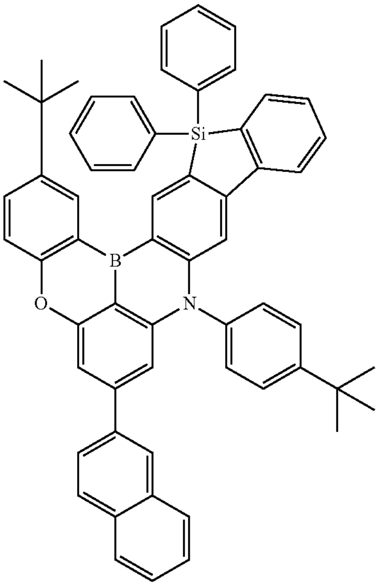
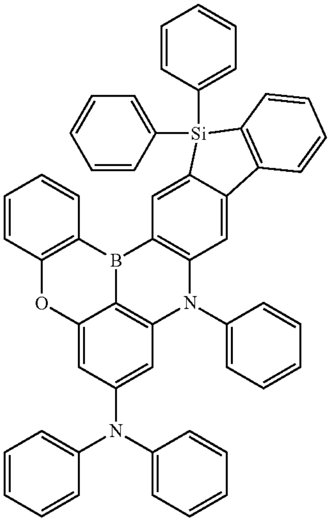
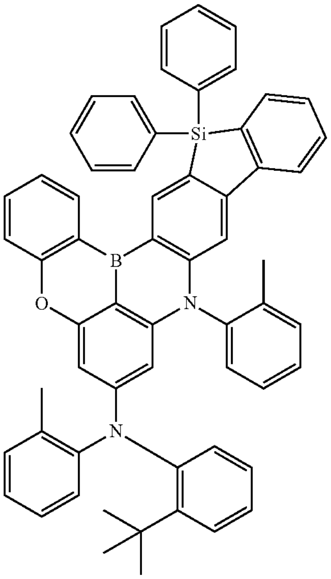

-continued
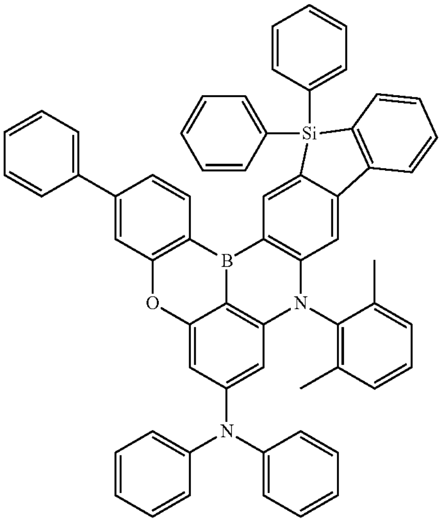
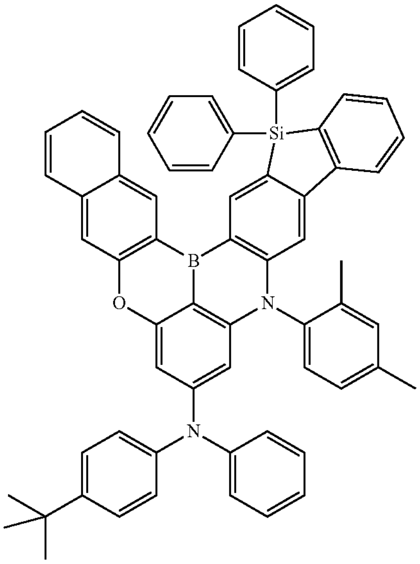
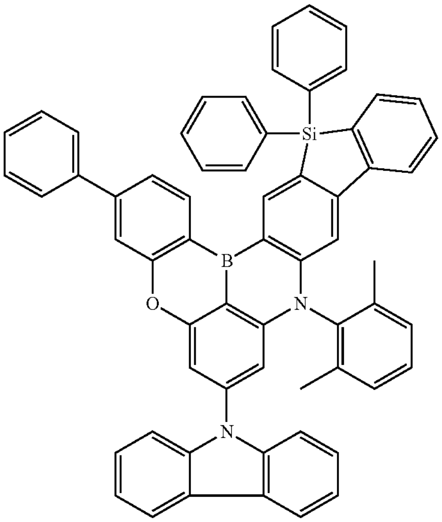
-continued
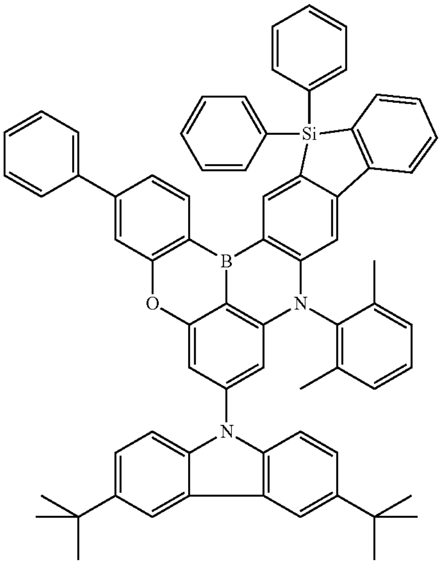
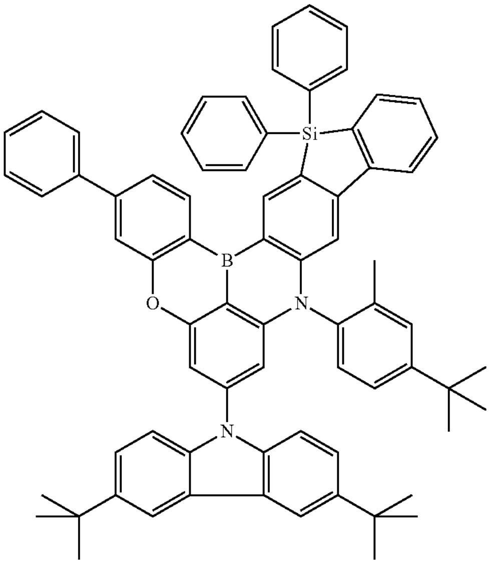
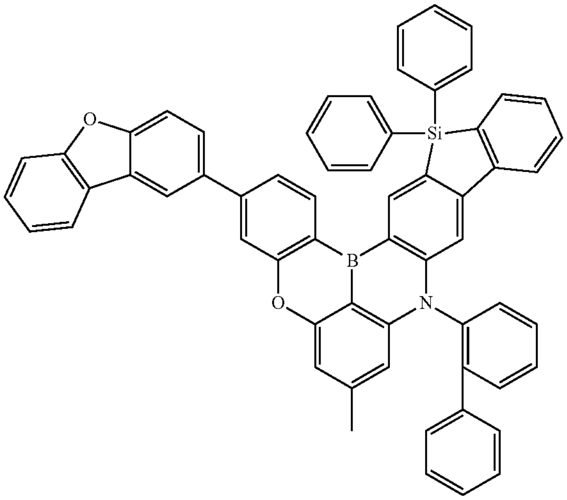

-continued
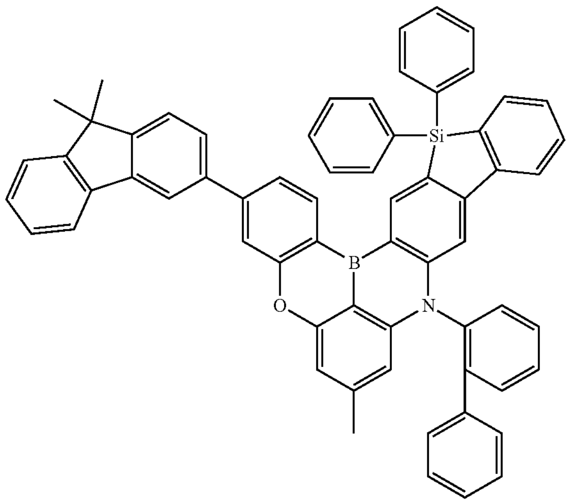
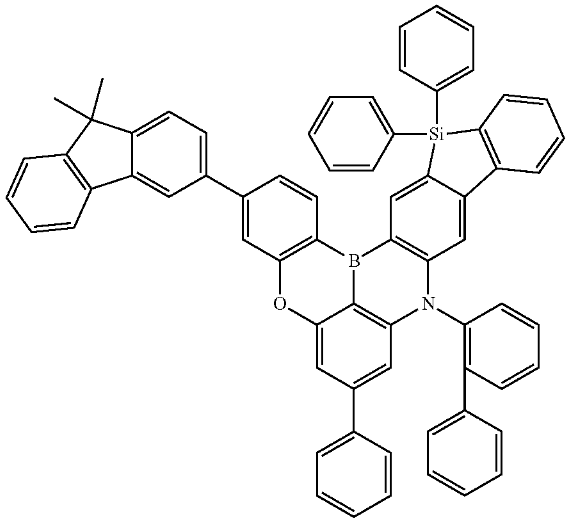
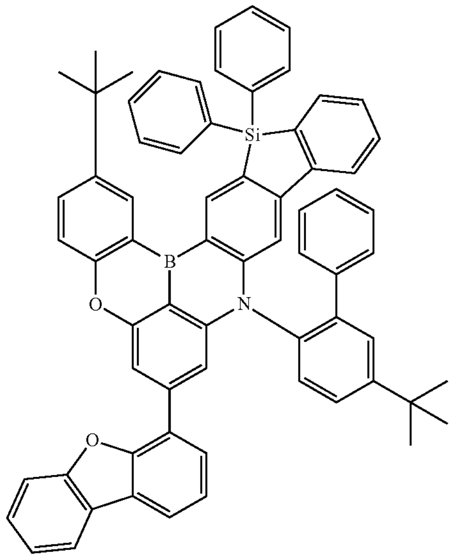
-continued
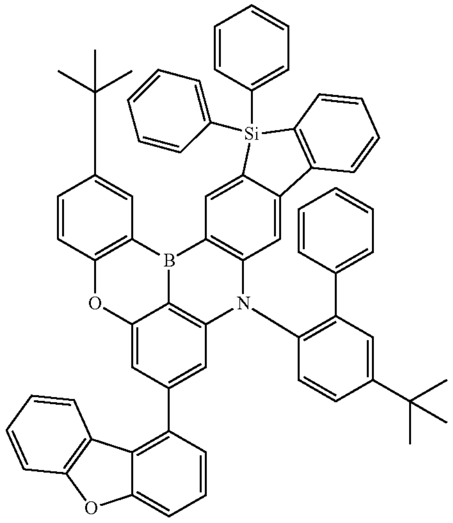
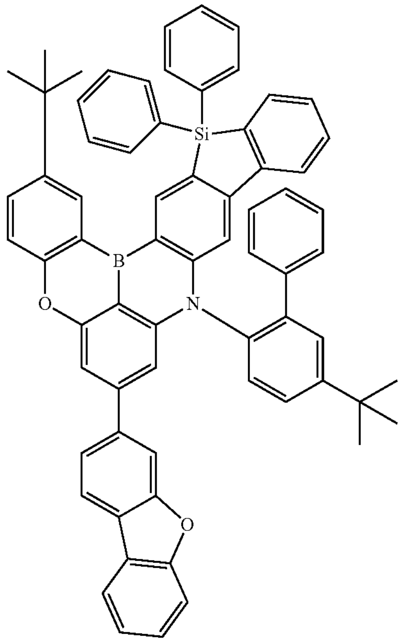

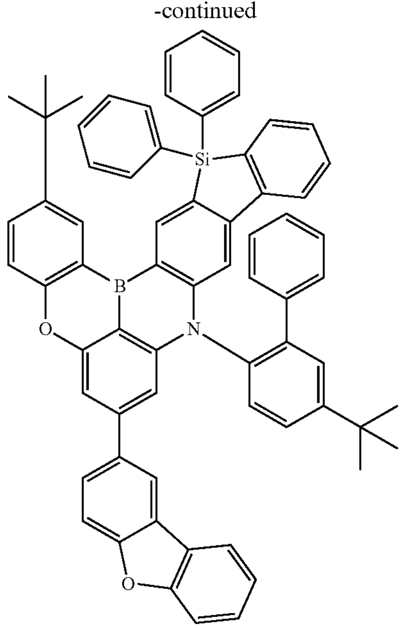
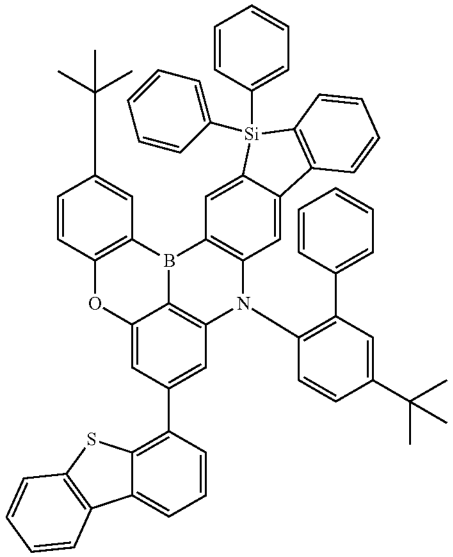
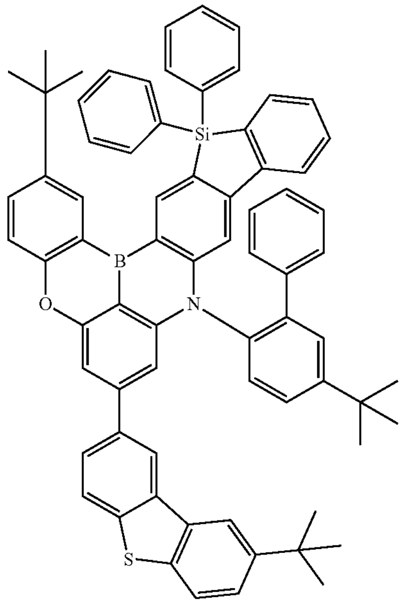
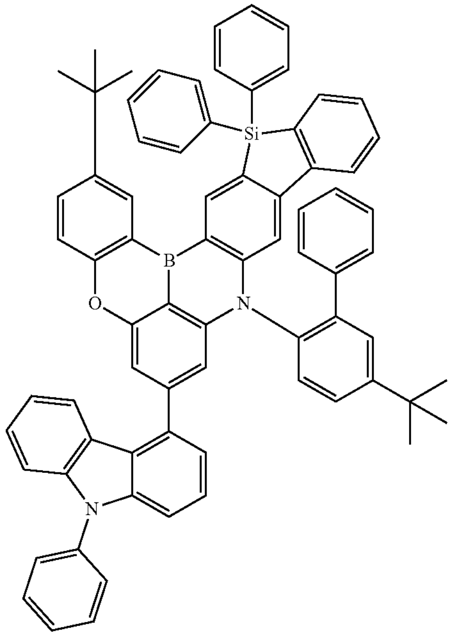

-continued
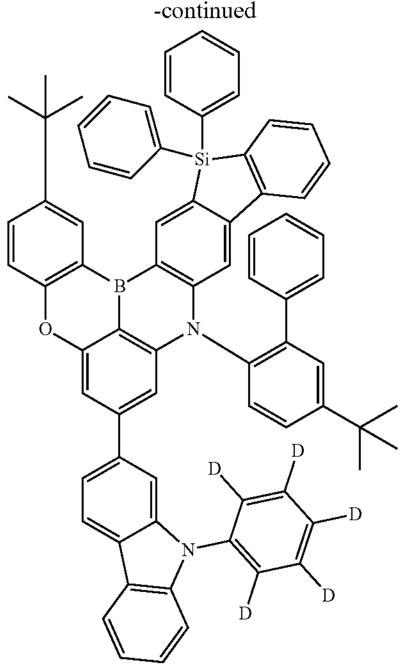
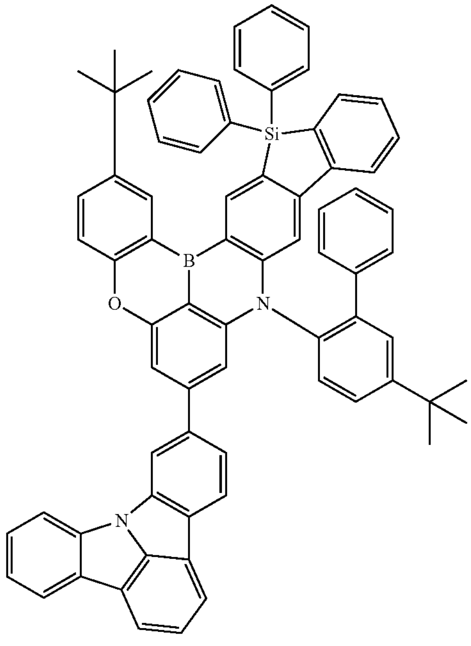
-continued
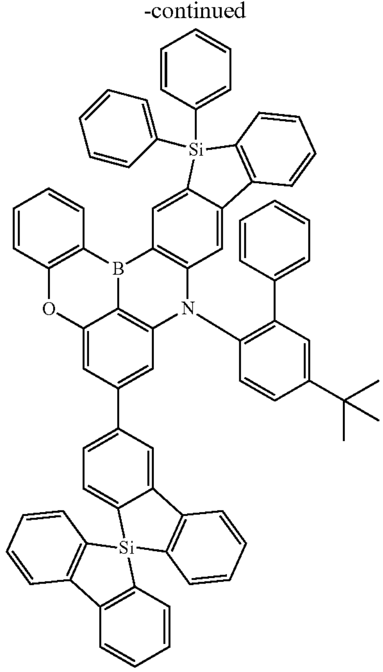
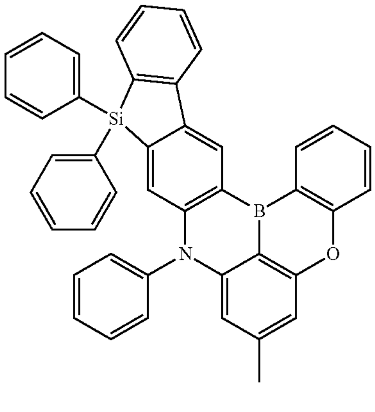
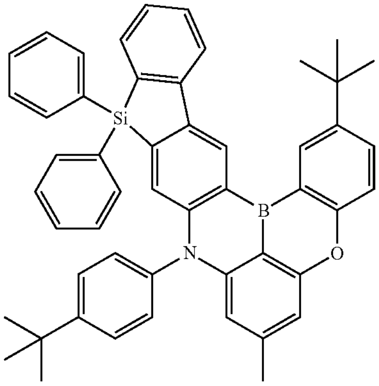

-continued
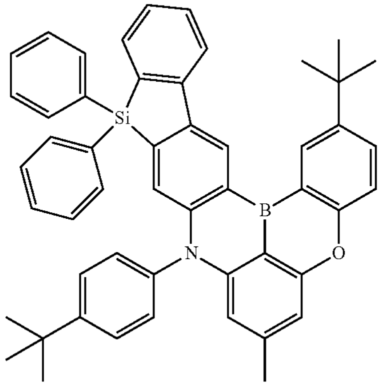
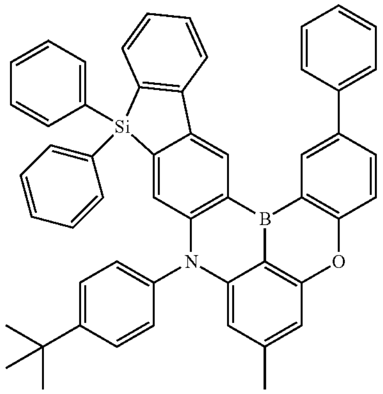
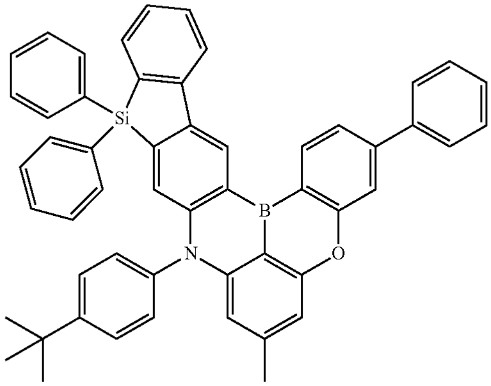
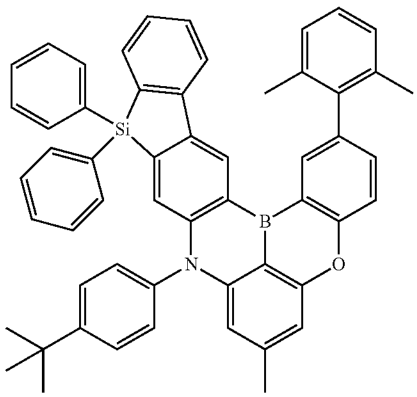
-continued
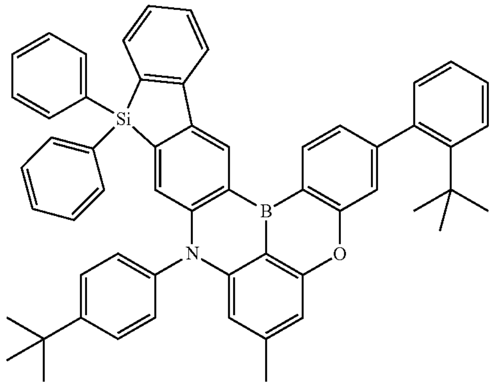
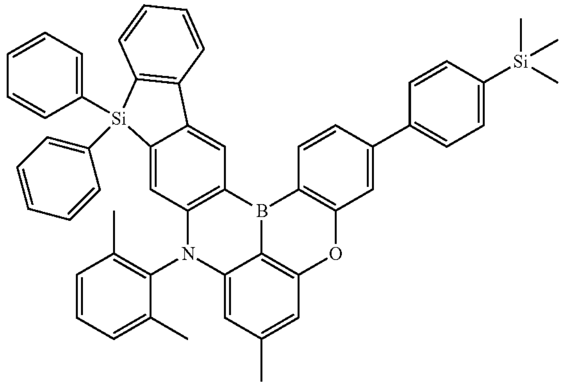
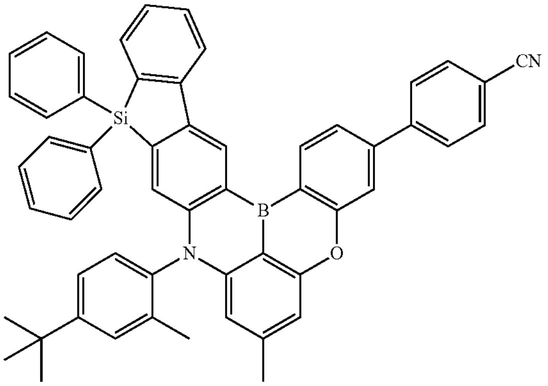
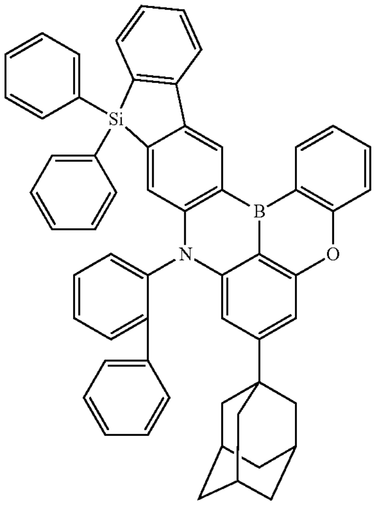

-continued
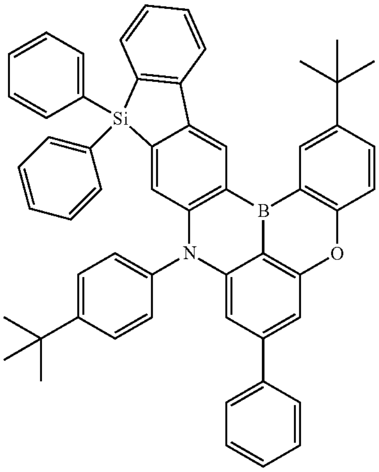
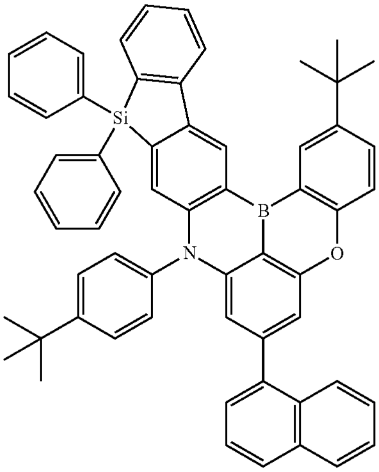
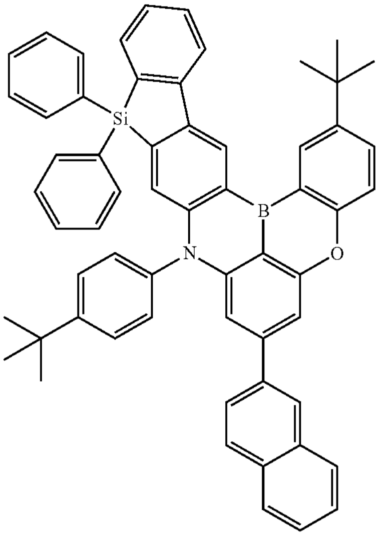
-continued
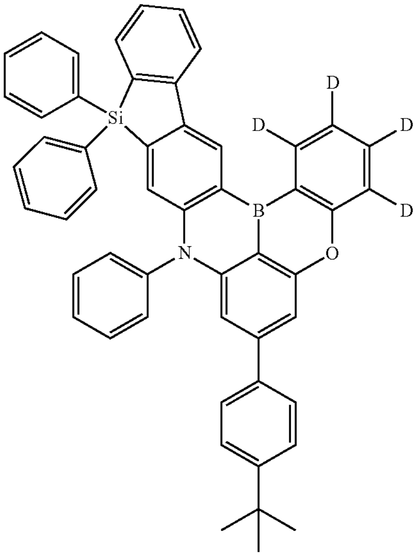
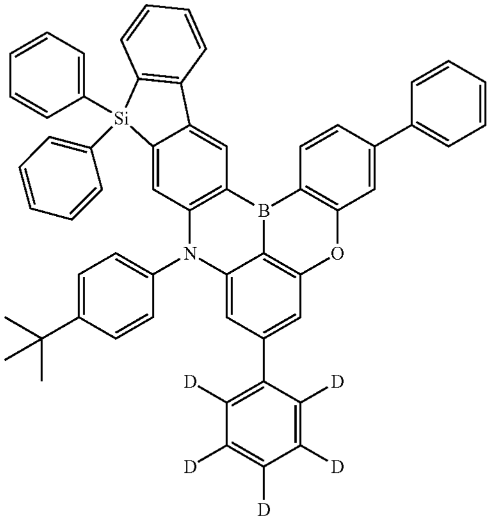
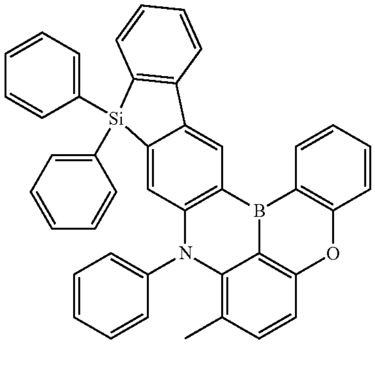

-continued
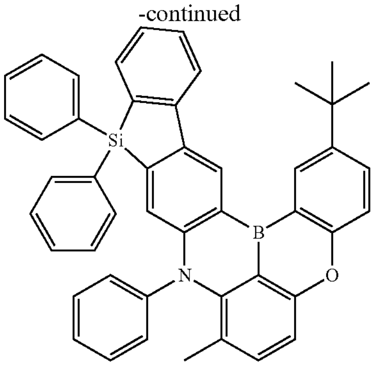
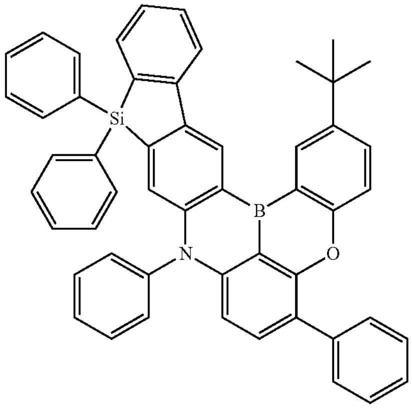
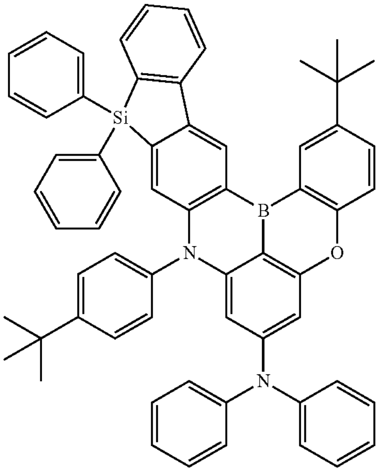
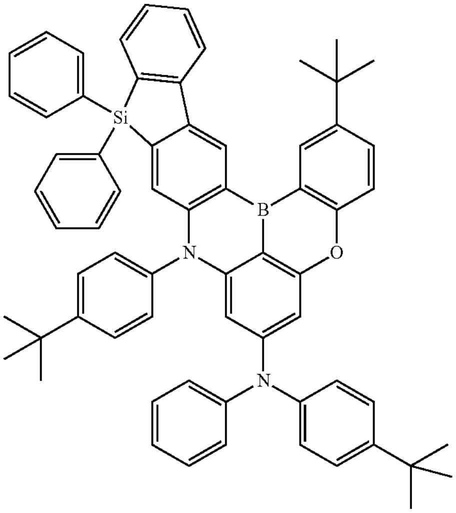
-continued
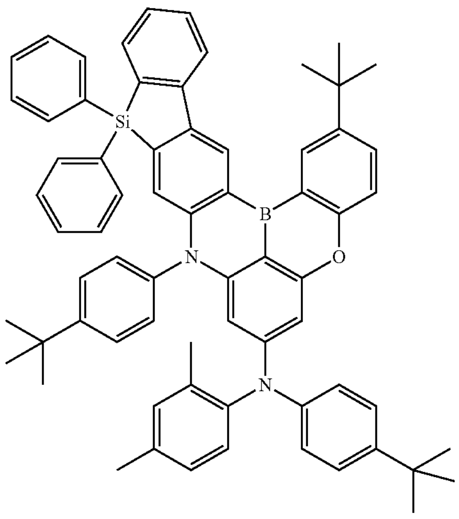
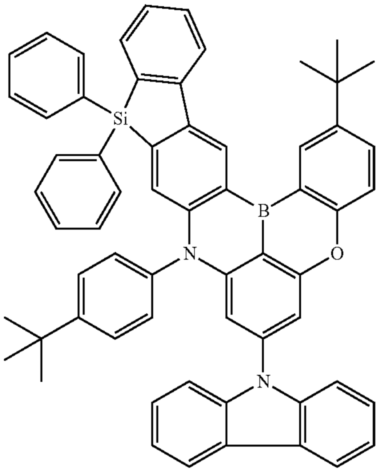
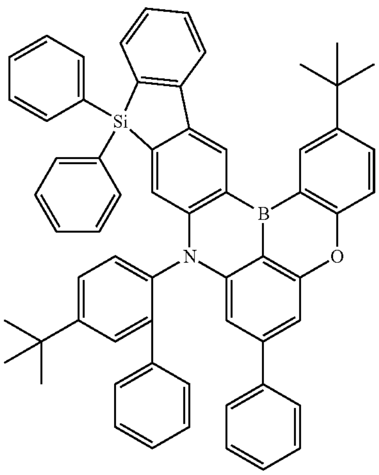

-continued
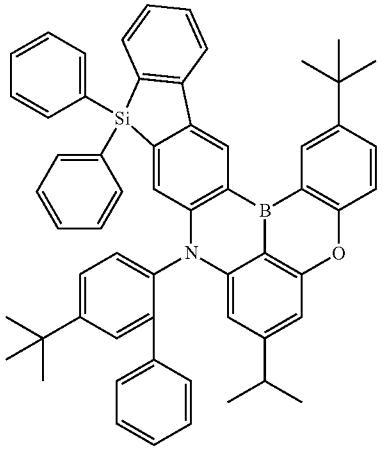
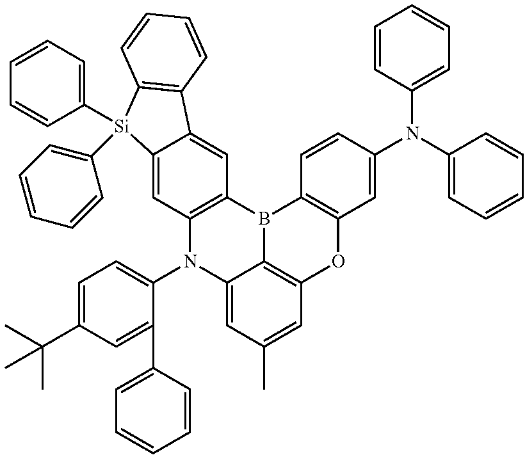
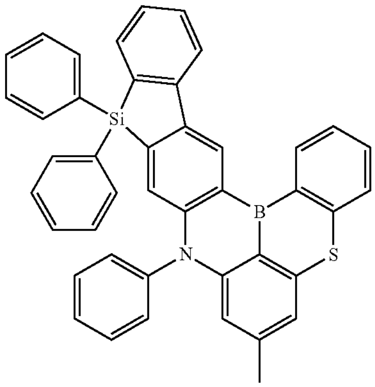
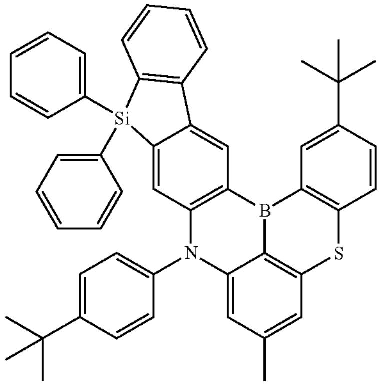
-continued
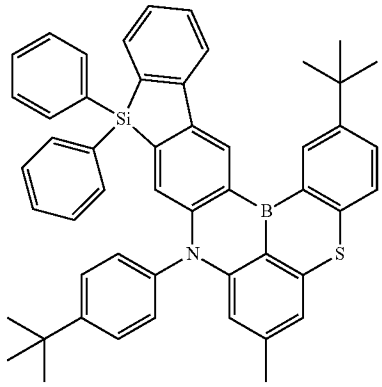
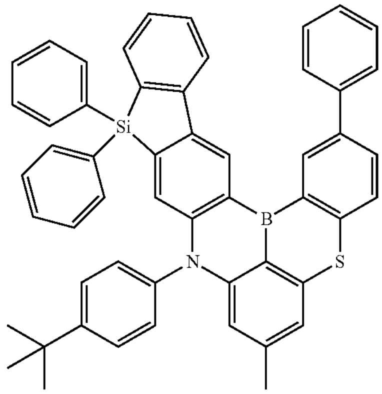
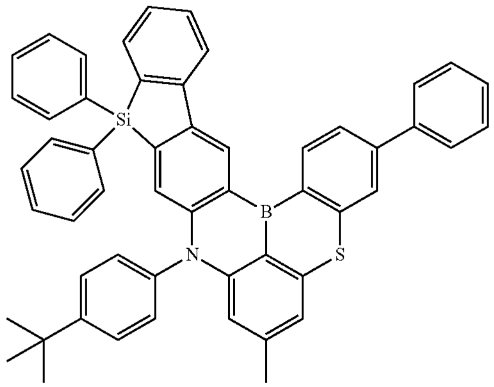
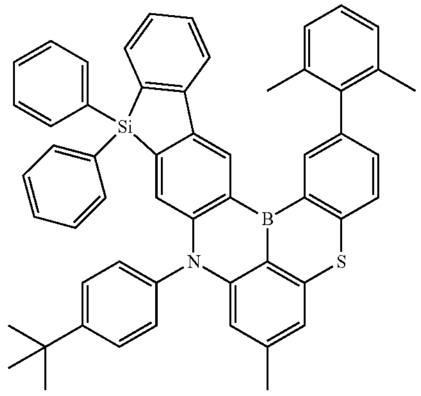

-continued
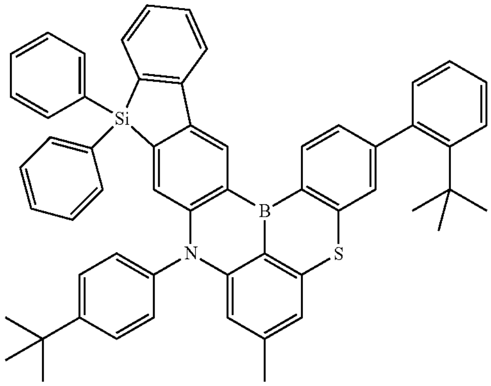
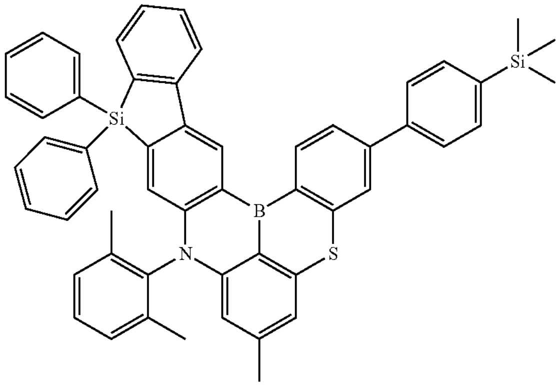
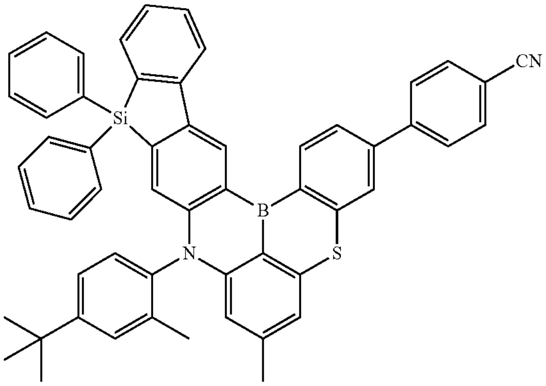
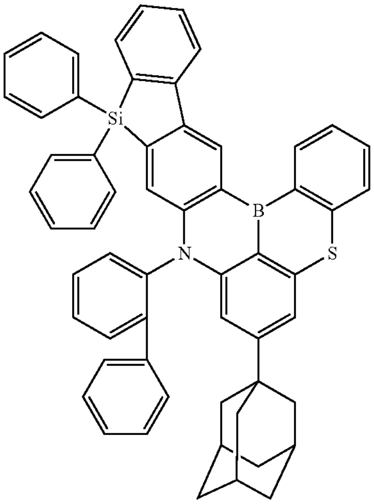
-continued
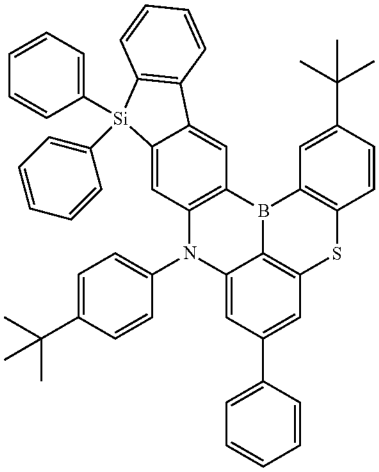
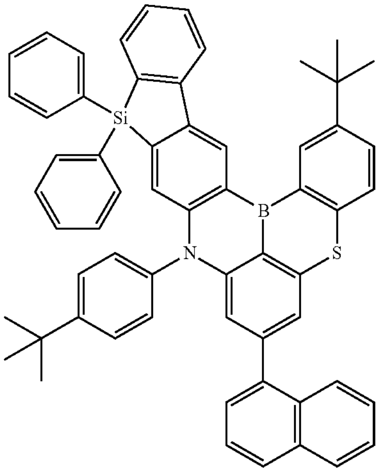
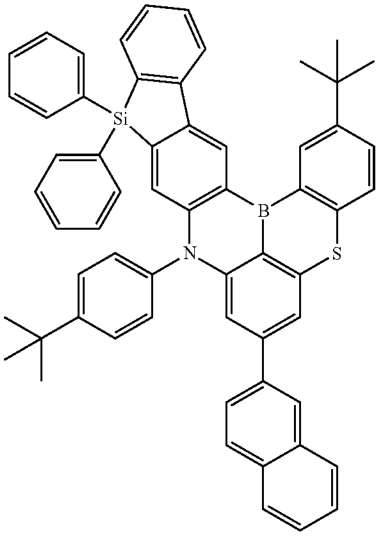

-continued
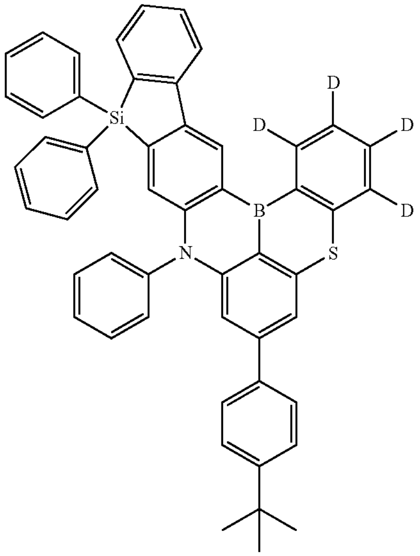
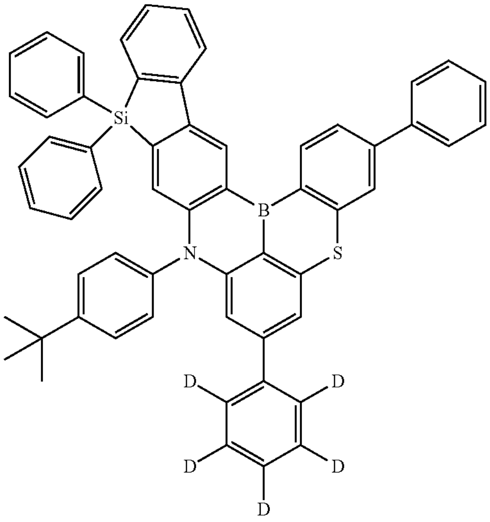
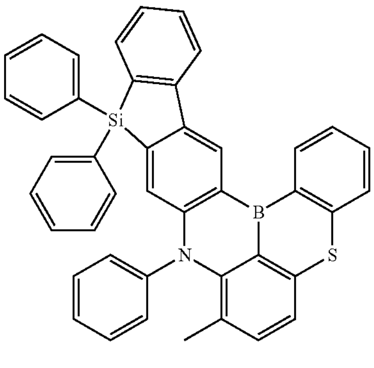
-continued
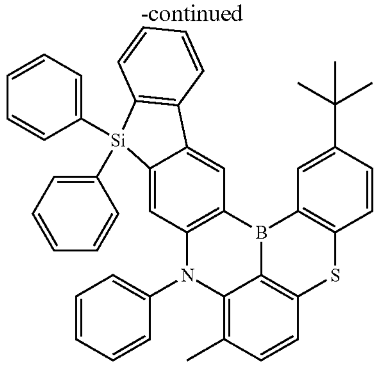
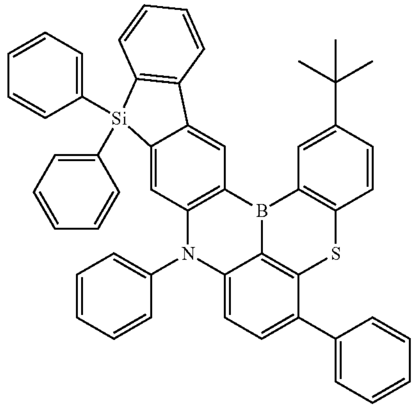
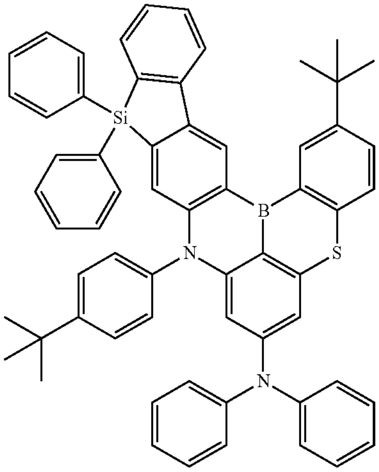
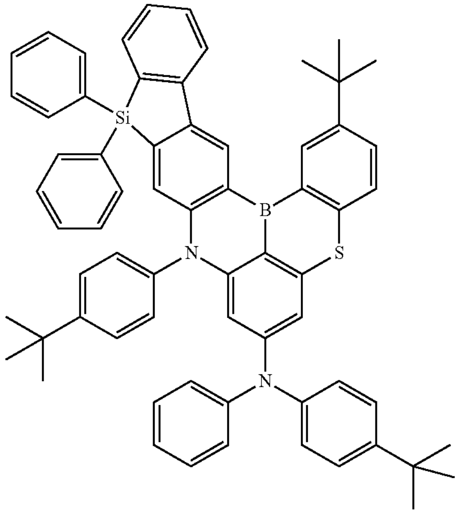

-continued
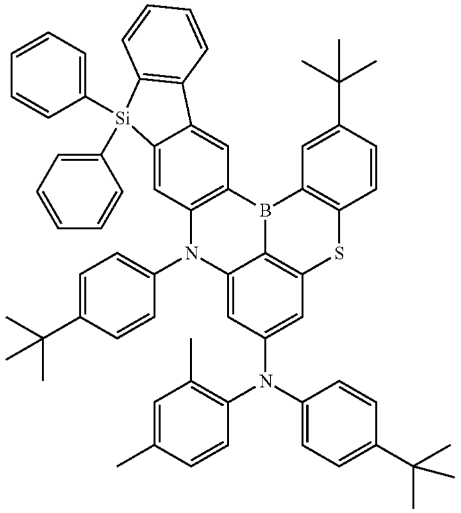
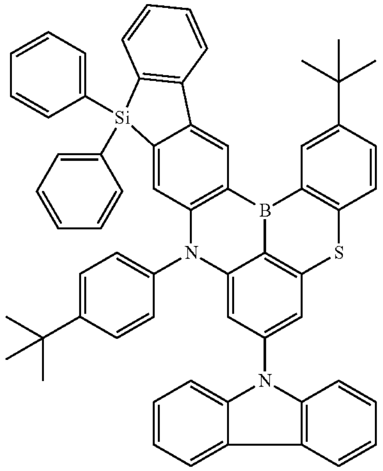
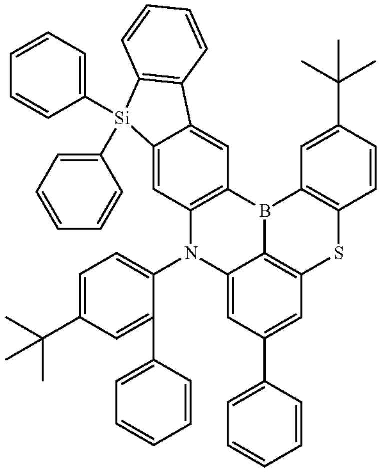
-continued
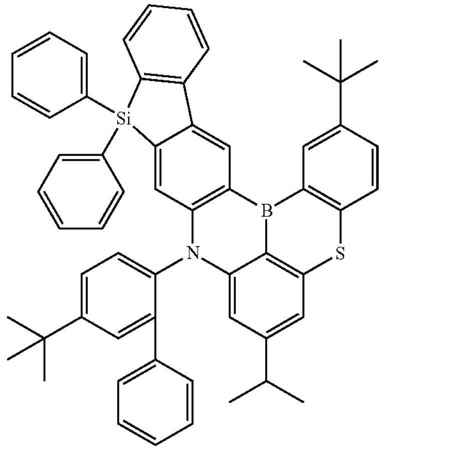
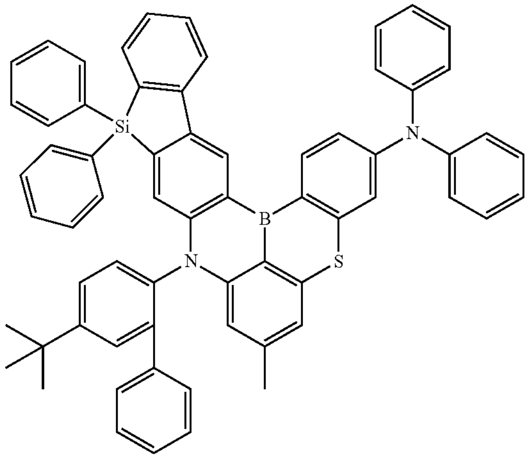
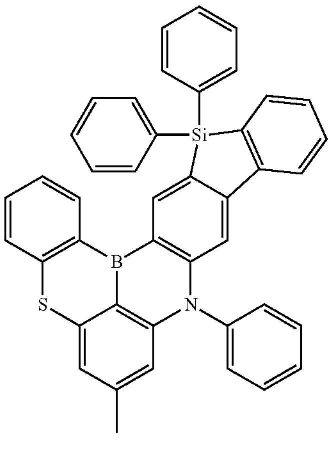

-continued
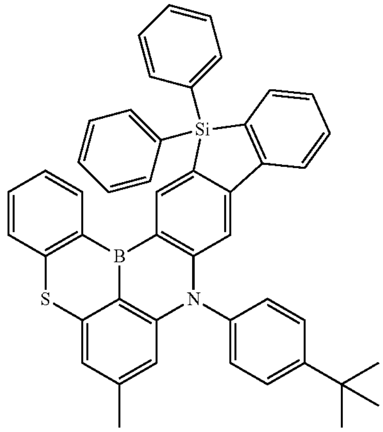
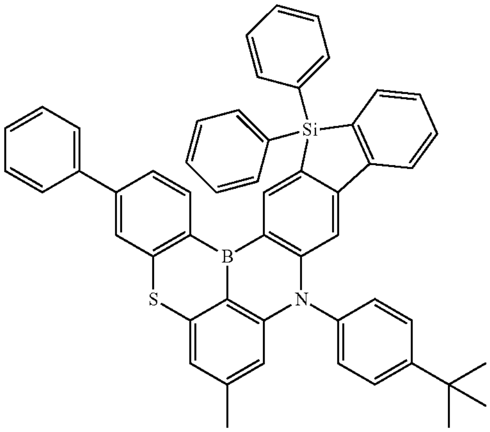
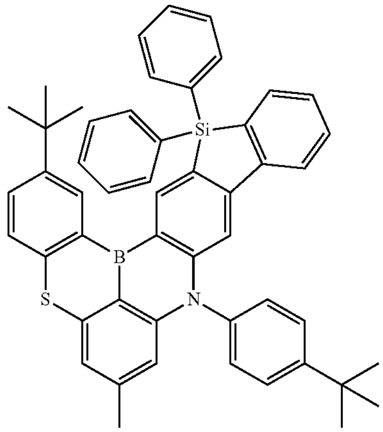
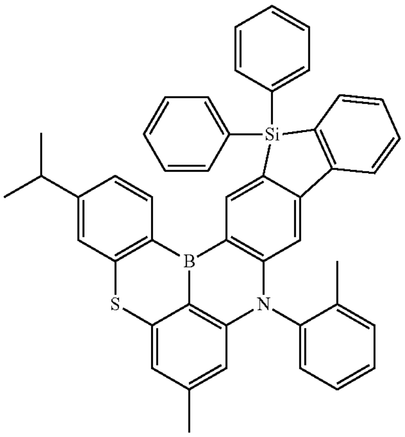
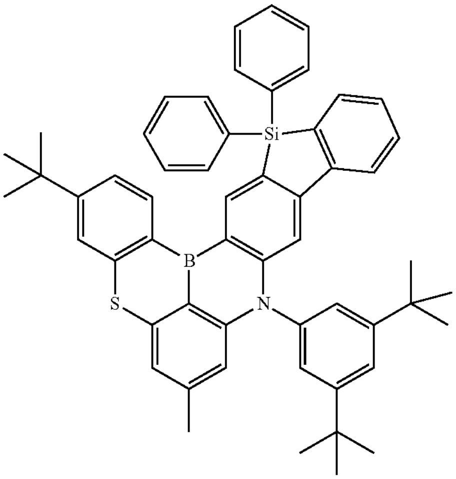
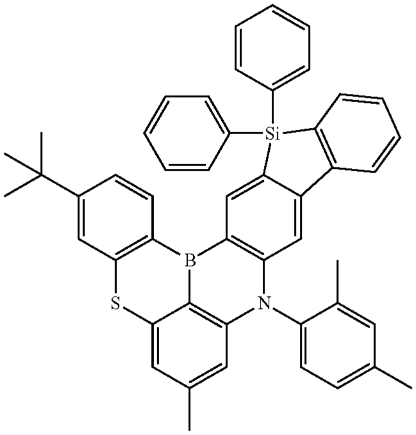

-continued
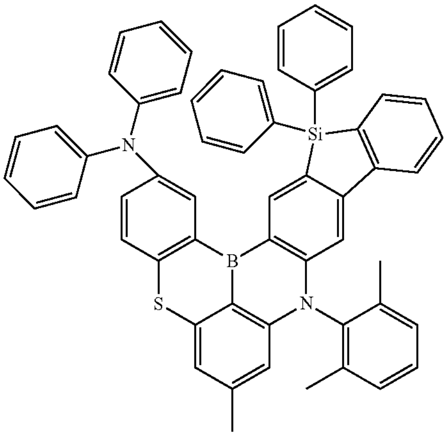
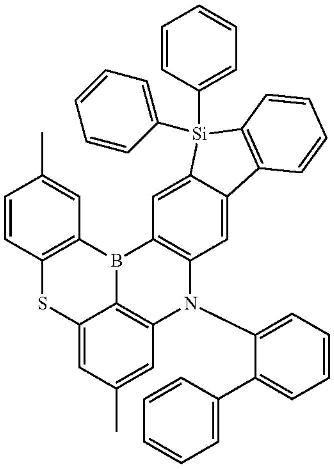
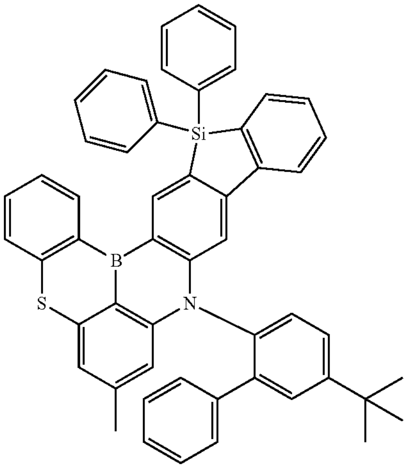
-continued
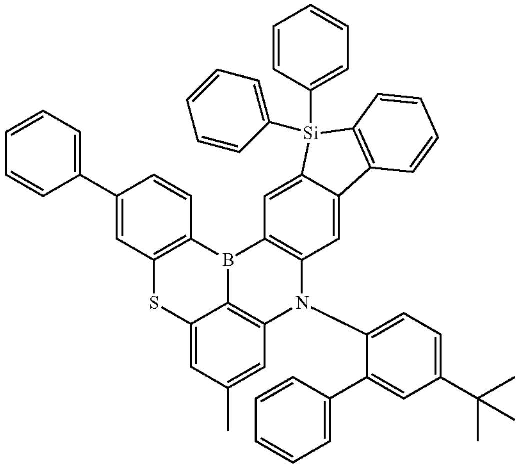
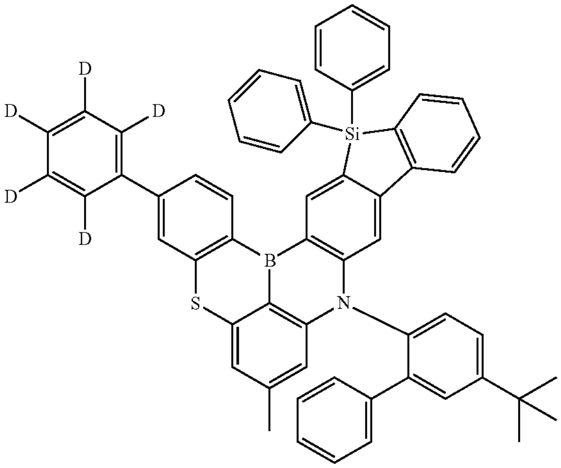
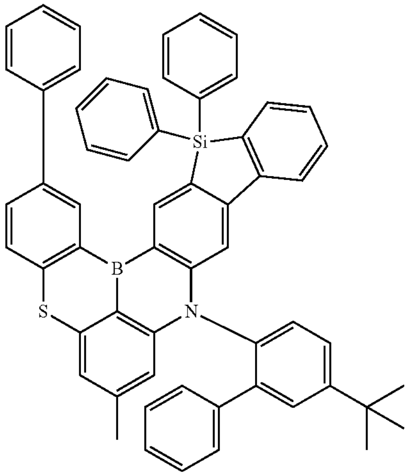

-continued
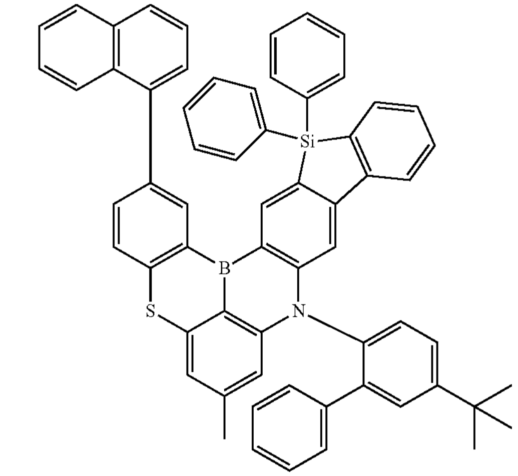
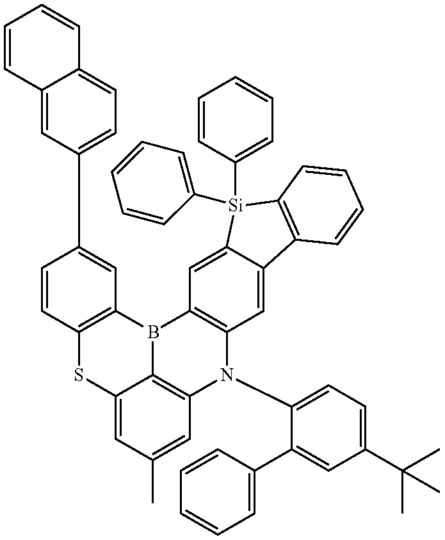
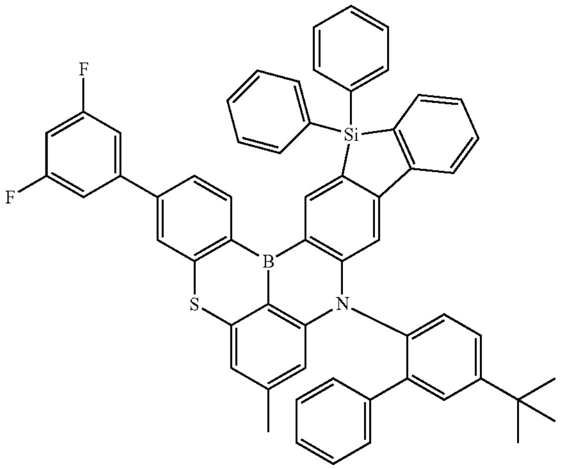
-continued
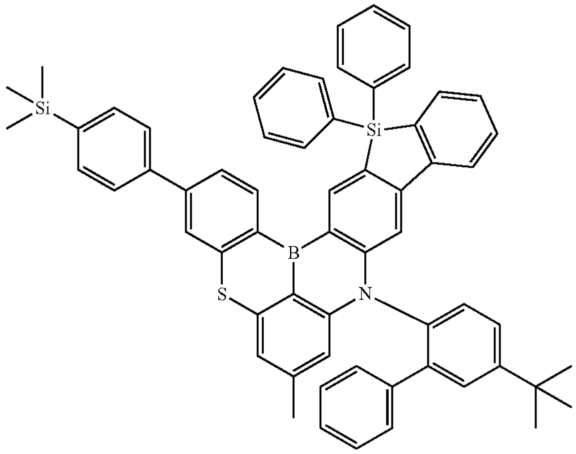
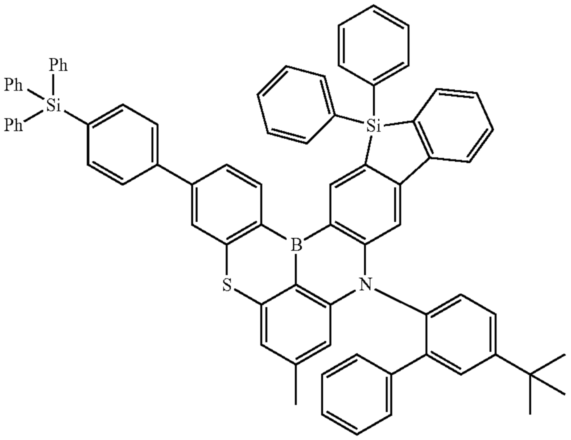
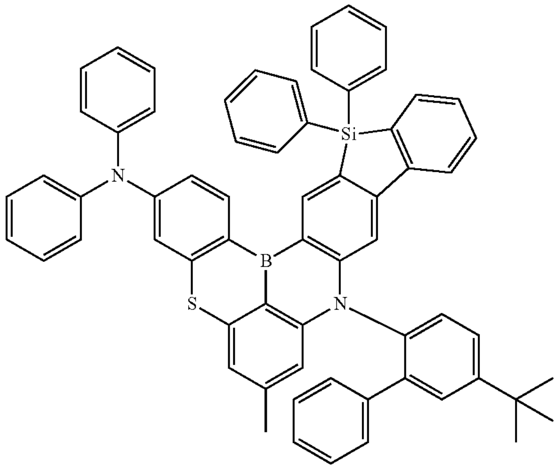

-continued
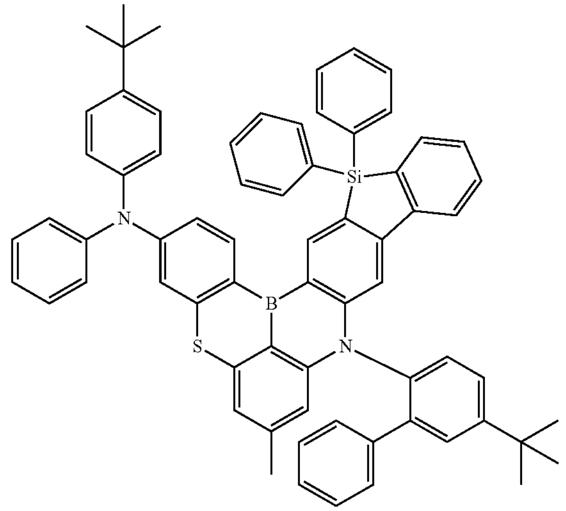
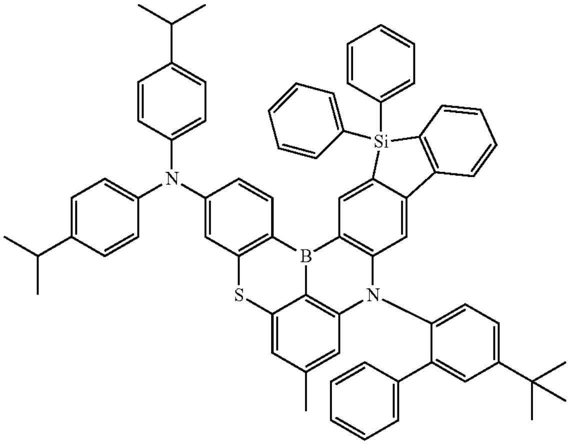
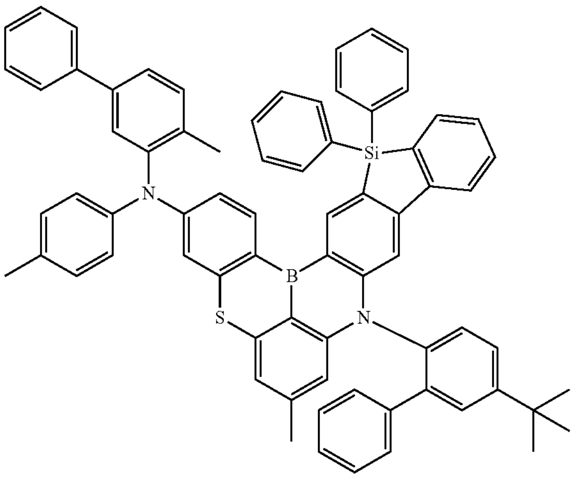
-continued
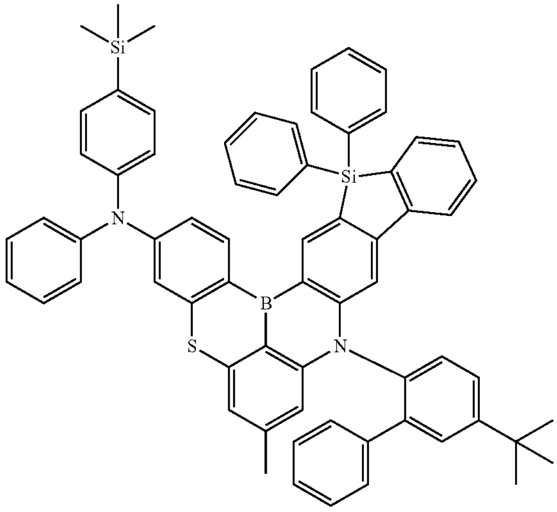
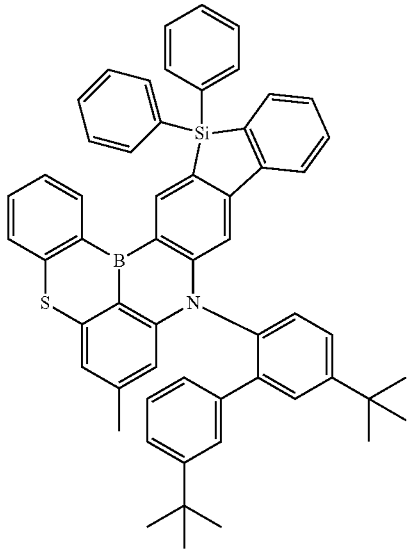
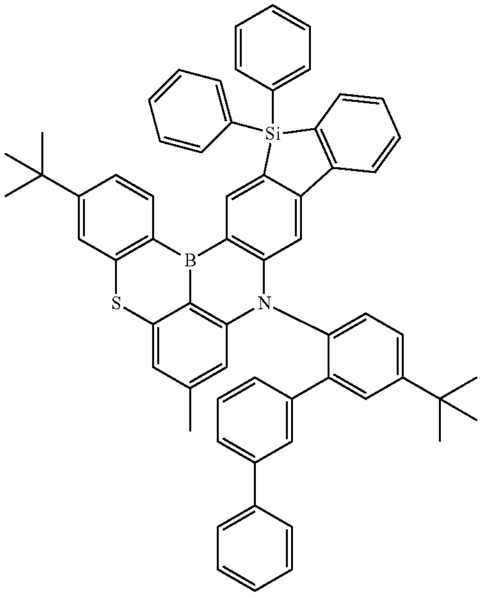

-continued
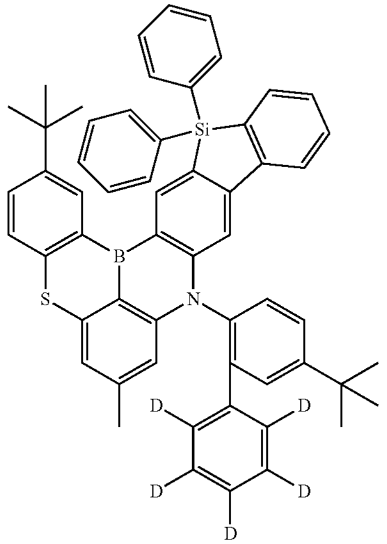
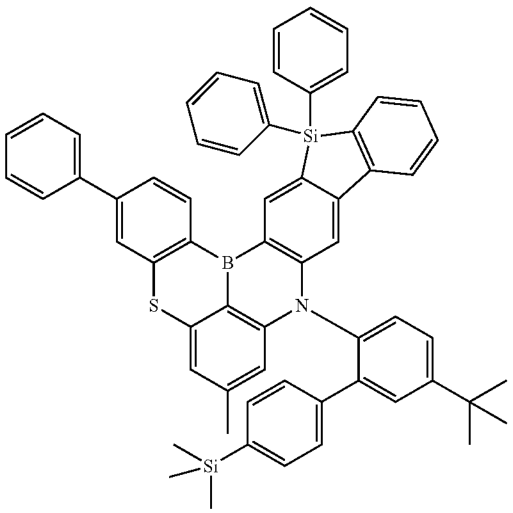
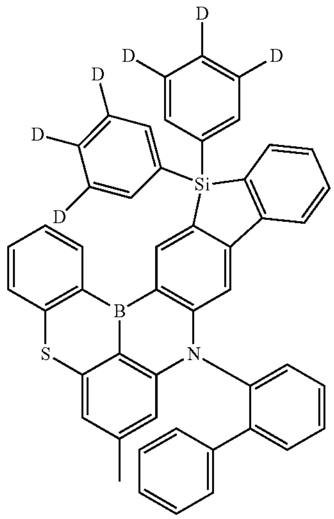
-continued
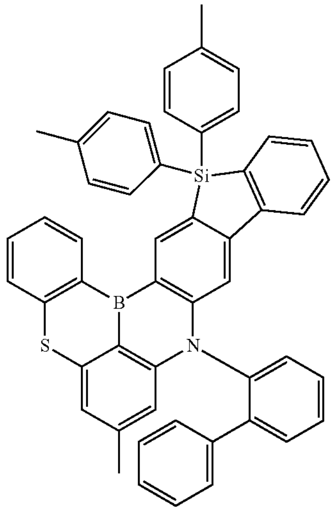
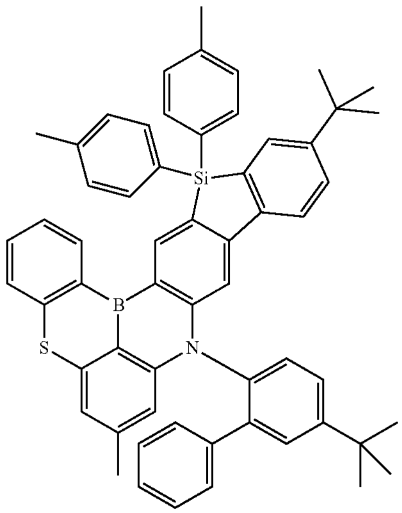
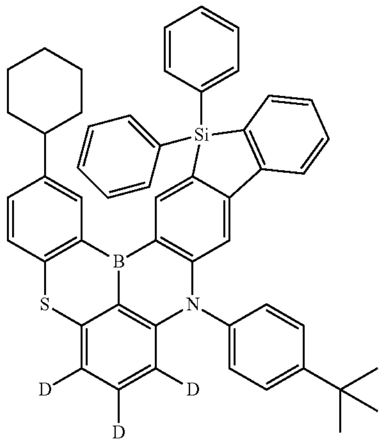

-continued
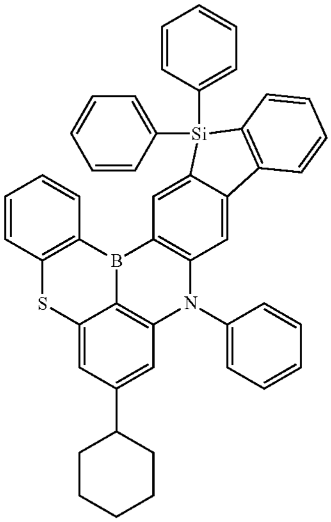
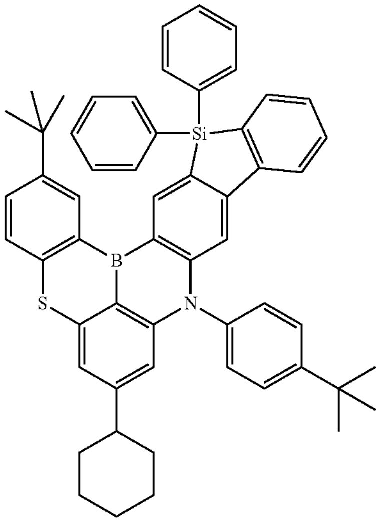
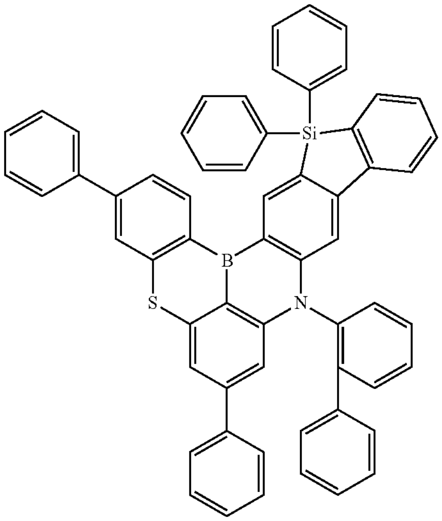
-continued
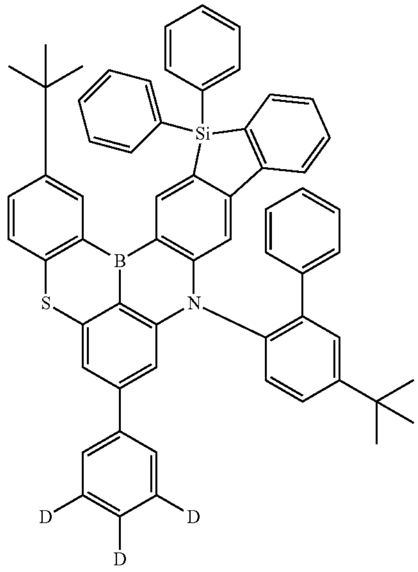
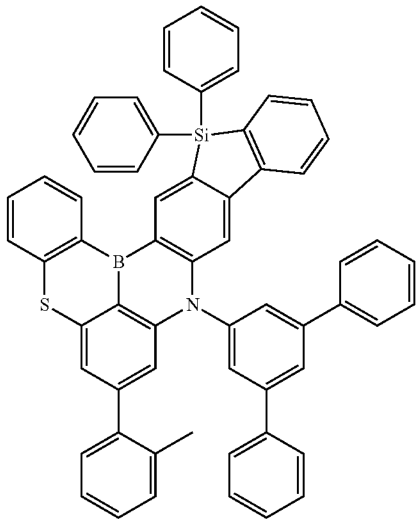
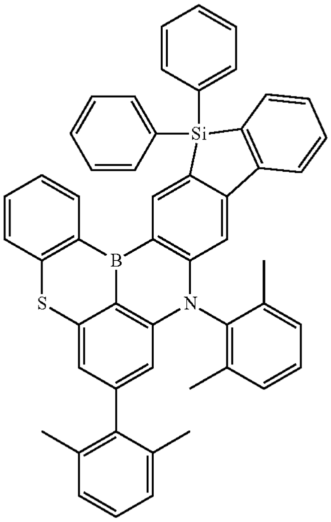

-continued
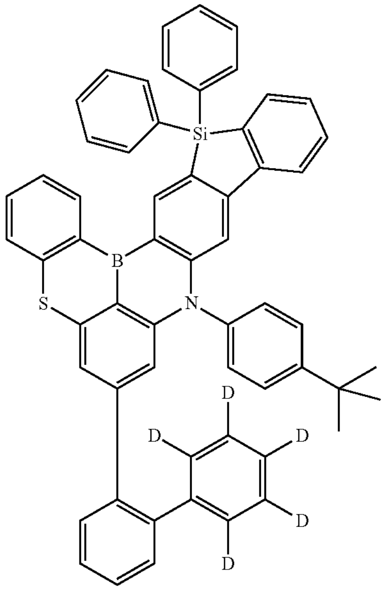
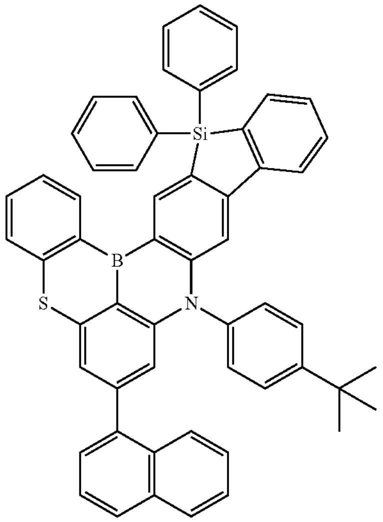
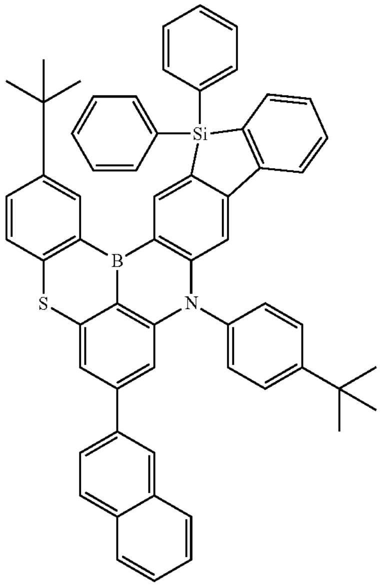
-continued
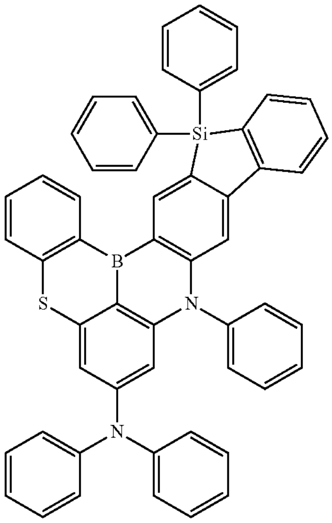
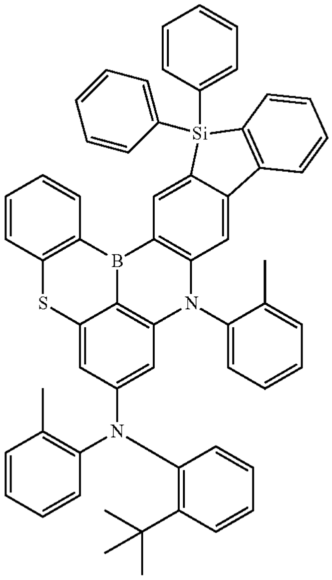
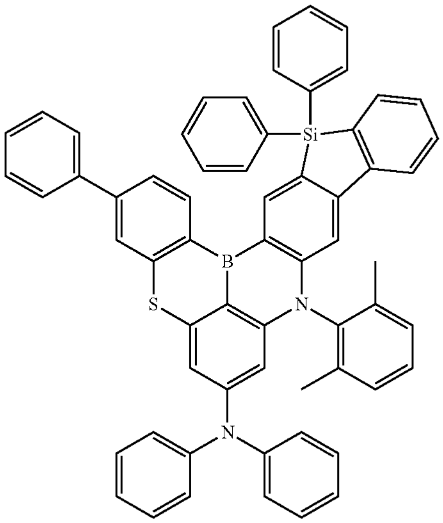

-continued
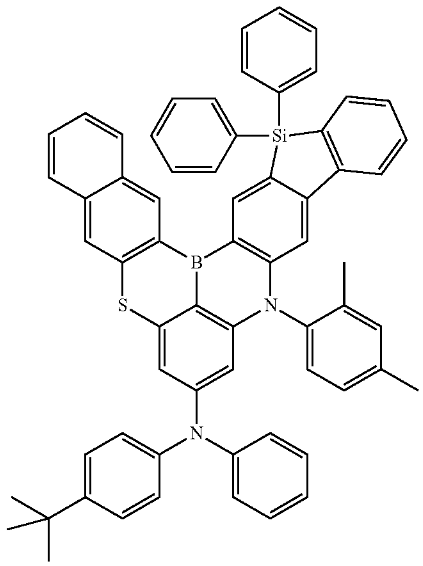
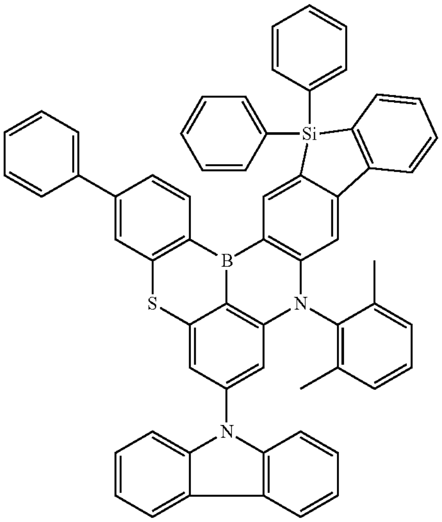
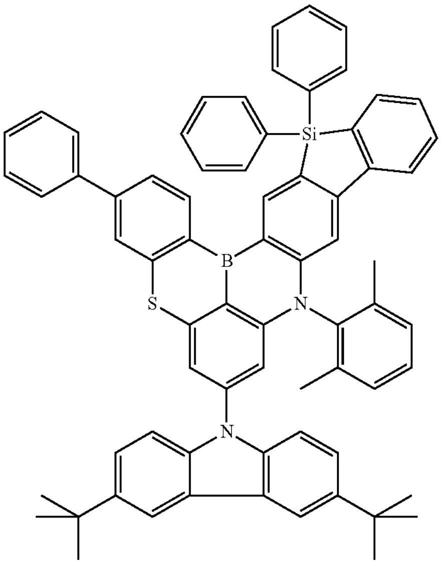
-continued
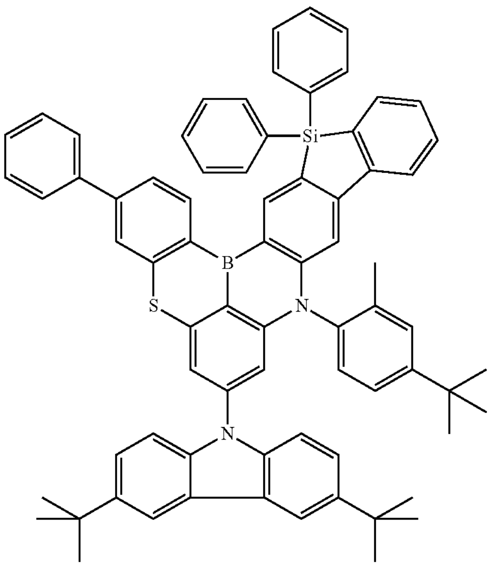
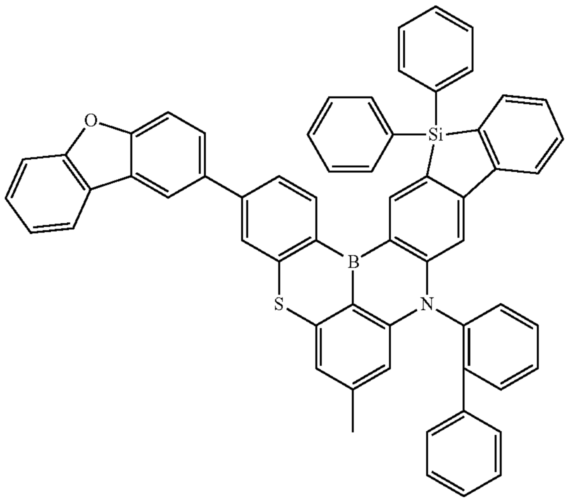
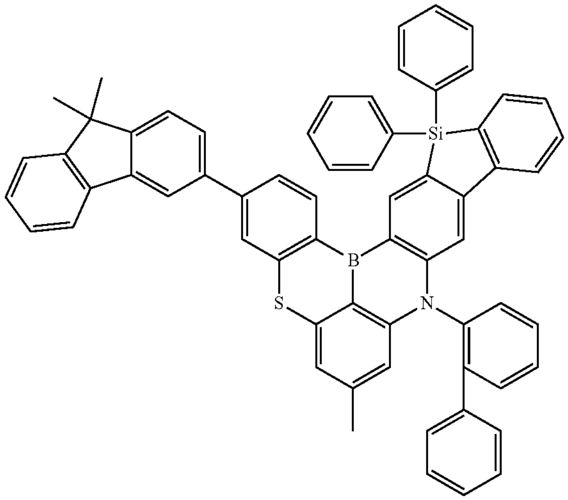

-continued
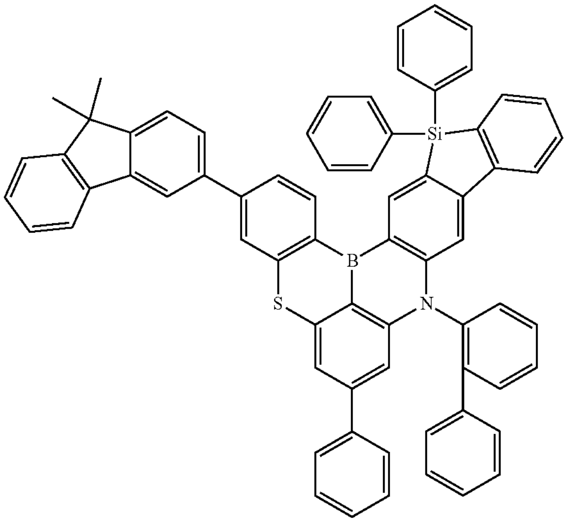
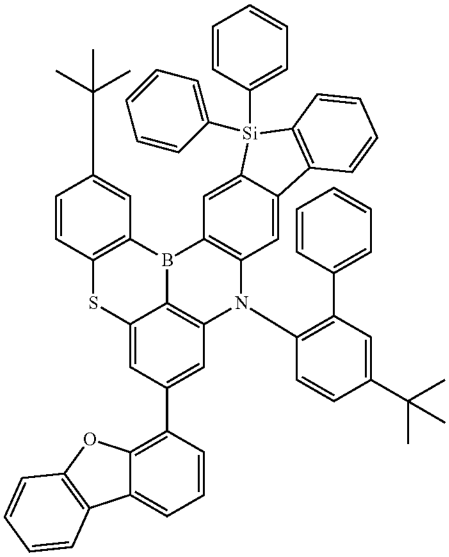
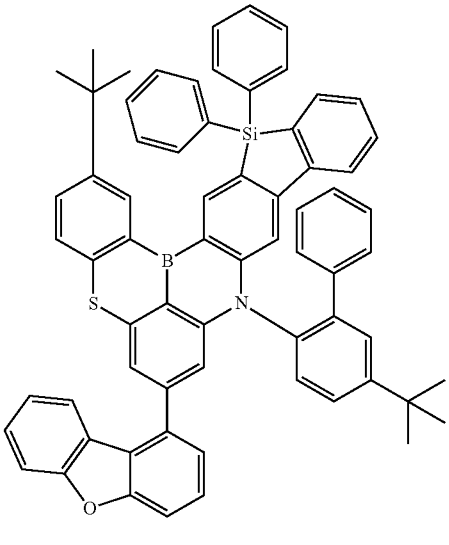
-continued
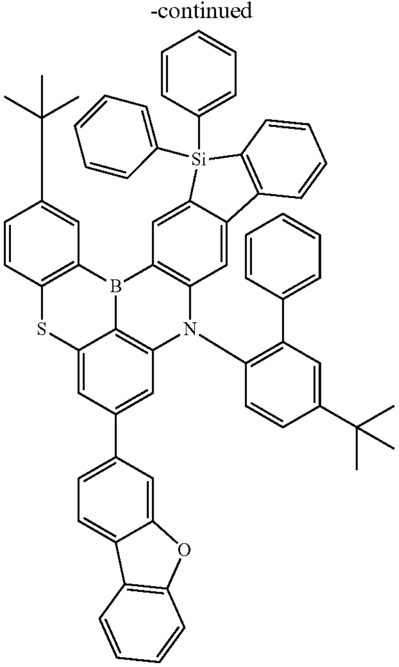
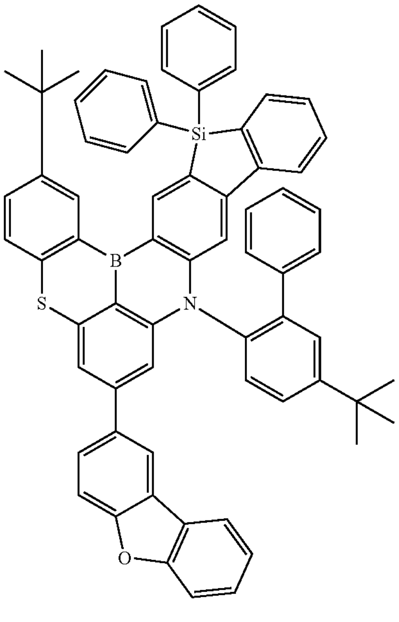

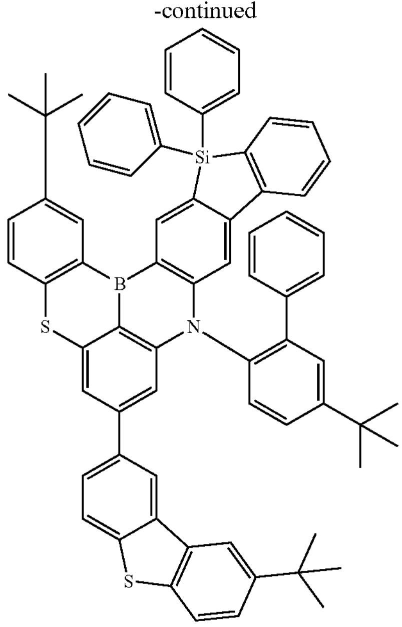
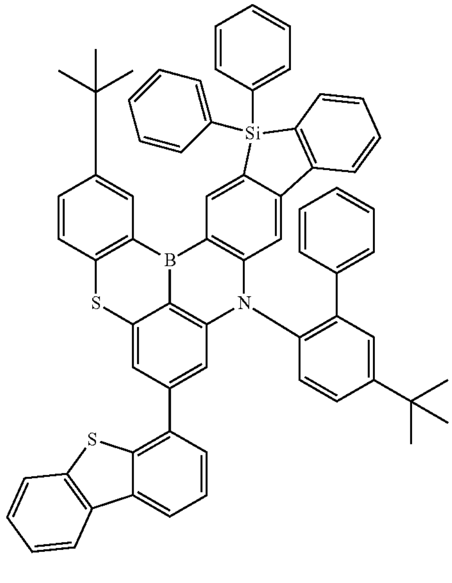
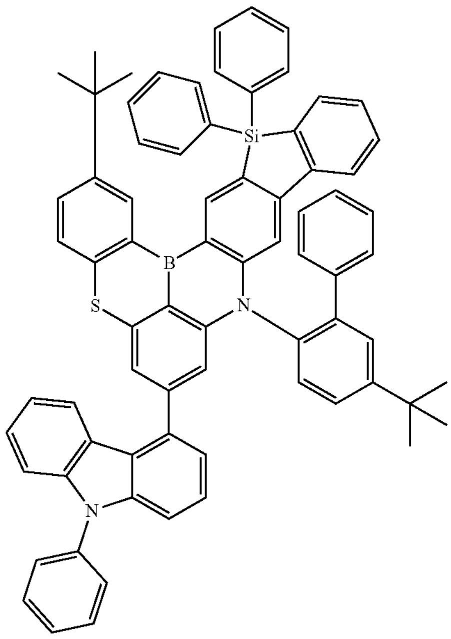
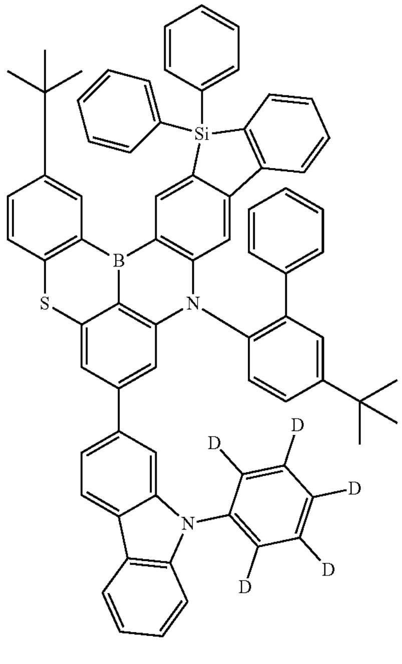

-continued

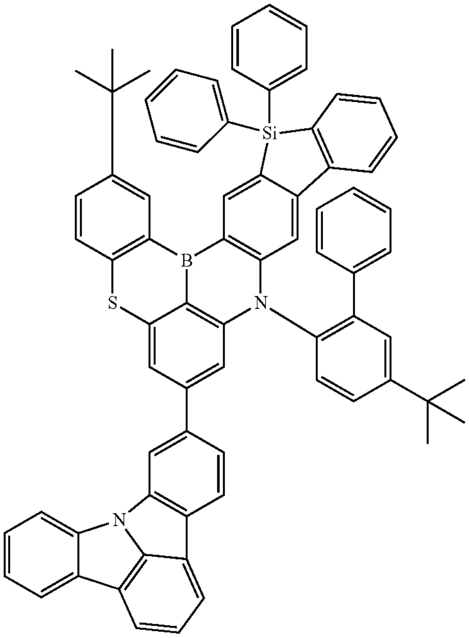

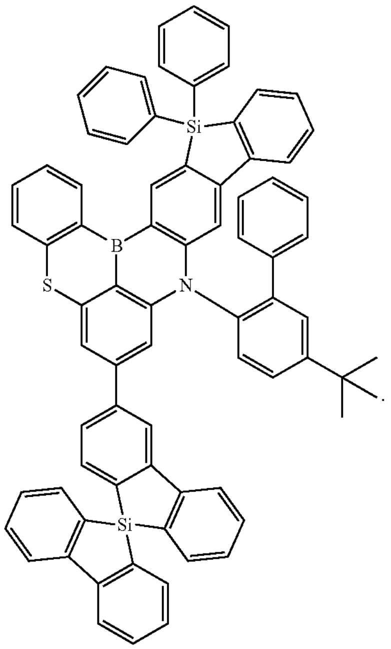

In the present specification, various substituents may be introduced into the core structure as described above to synthesize compounds having various energy bandgaps. Further, in the present specification, various substituents may be introduced into the core structures having the structure described above to adjust the HOMO and LUMO energy levels of a compound.

In addition, an organic light emitting device according to the present specification is characterized by including: a first electrode; a second electrode provided to face the first electrode; and an organic material layer having one or more layers provided between the first electrode and the second electrode, in which one or more layers of the organic material layer include the above-described compound.

According to an exemplary embodiment of the present specification, one or more layers of the organic material layer may use a compound of the following Formula 6 as a host.

[Formula 6]

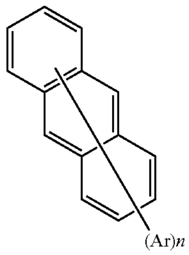

In Formula 6,

Ar is deuterium; a substituted or unsubstituted aryl group; or substituted or unsubstituted heterocyclic group, n is an integer from 1 to 10, and when n is 2 or higher, substituents in the parentheses are the same as or different from each other.

Since the triplet energy of the compound of Formula 6 is lower than that of the compound of Formula 1 of the present application, the compound may be used as a host material for emitting fluorescence.

According to an exemplary embodiment of the present specification, the content of the doping material for the light emitting layer may be 1 part by weight to 10 parts by weight based on 100 parts by weight of the host. According to an example, the content of the doping material for the light emitting layer may be 1 part by weight to 5 parts by weight based on 100 parts by weight of the host. When the doping material is included within the above content range in the light emitting layer, there is an advantage in that the manufactured organic light emitting device has a low driving voltage and excellent light emitting efficiency.

According to an exemplary embodiment of the present specification, Ar is deuterium; a substituted or unsubstituted aryl group having 6 to 60 carbon atoms; or a substituted or unsubstituted heterocyclic group having 2 to 60 carbon atoms.

According to an exemplary embodiment of the present specification, Ar is deuterium; a substituted or unsubstituted aryl group having 6 to 30 carbon atoms; or a substituted or unsubstituted heterocyclic group having 2 to 30 carbon atoms.

According to an exemplary embodiment of the present specification, Ar is deuterium; a substituted or unsubstituted aryl group having 6 to 15 carbon atoms; or a substituted or unsubstituted heterocyclic group having 2 to 15 carbon atoms.

According to an exemplary embodiment of the present specification, Ar is deuterium; an aryl group which is unsubstituted or substituted with a substituent selected from the group consisting of deuterium, an aryl group which is unsubstituted or substituted with deuterium, and a heterocyclic group which is unsubstituted or substituted with deuterium; or a heterocyclic group which is unsubstituted or substituted with a substituent selected from the group consisting of deuterium, an aryl group which is unsubstituted or substituted with deuterium, and a heterocyclic group which is unsubstituted or substituted with deuterium.

In an exemplary embodiment of the present specification, the compound of Formula 6 may include one or more deuteriums.
In an exemplary embodiment of the present specification, the compound of Formula 6 may be any one selected from the following compounds.
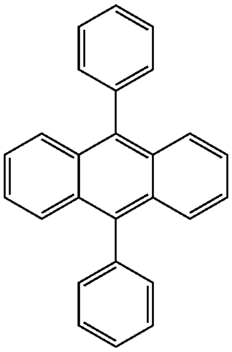
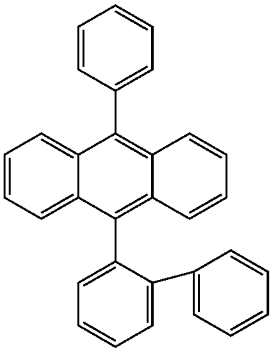
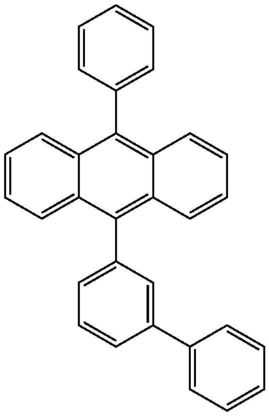
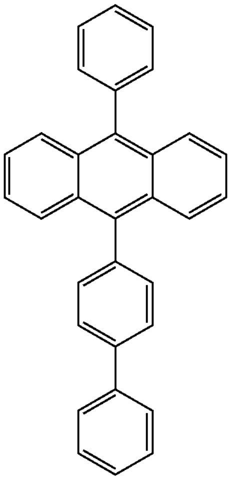
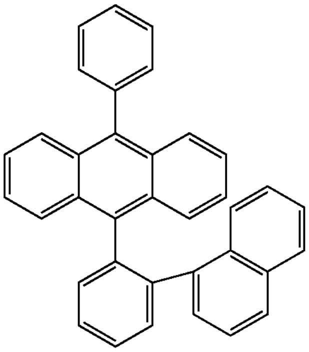
-continued
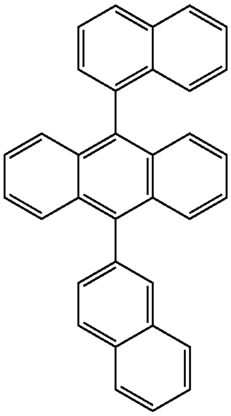
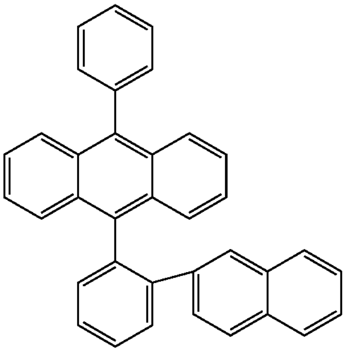
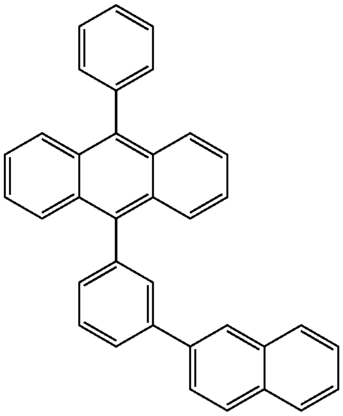
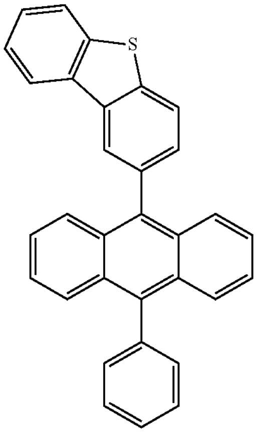

-continued
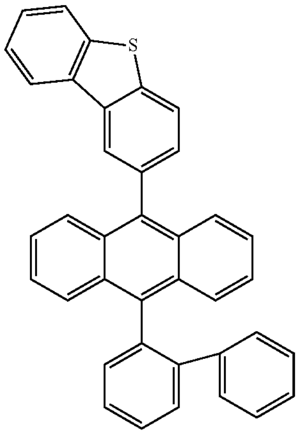
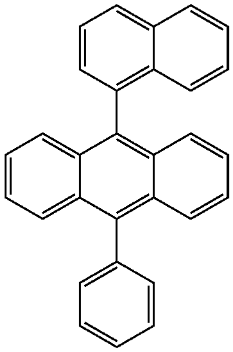
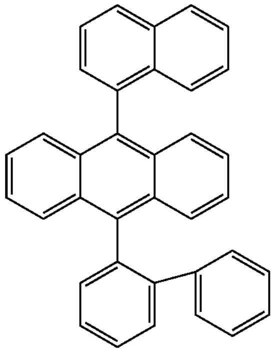
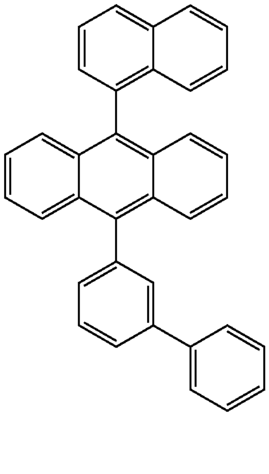
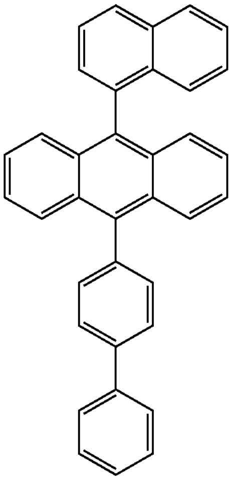
-continued
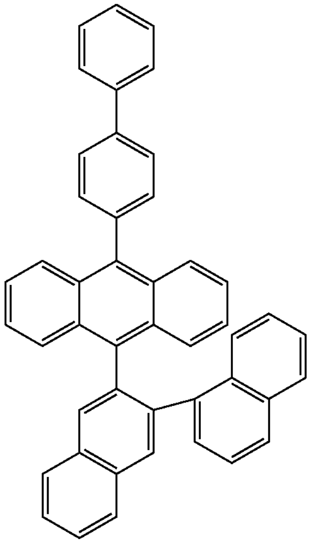
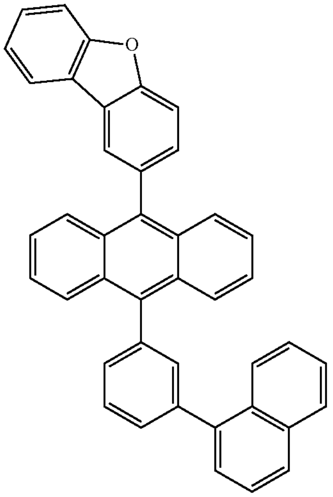
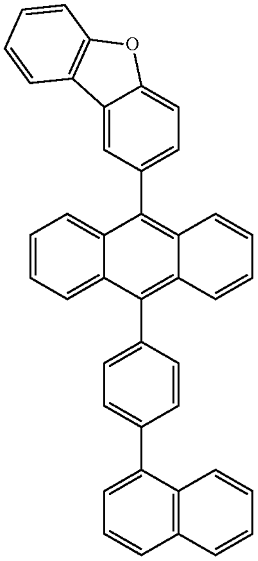

-continued
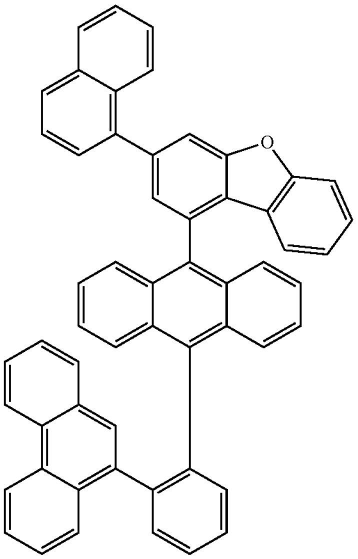
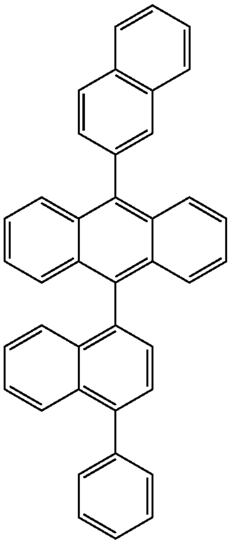
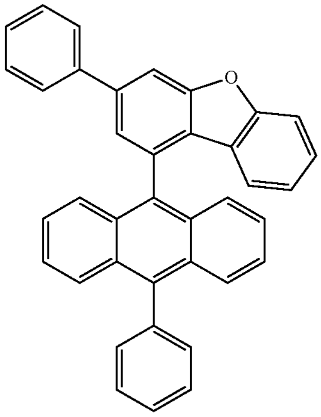
-continued
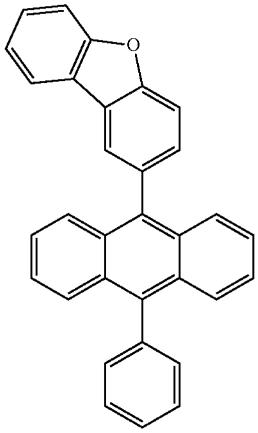
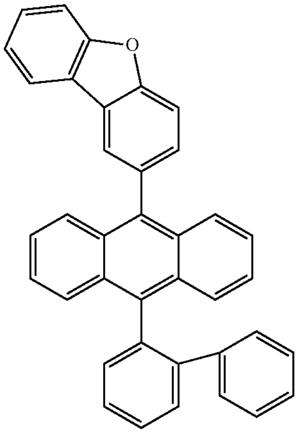
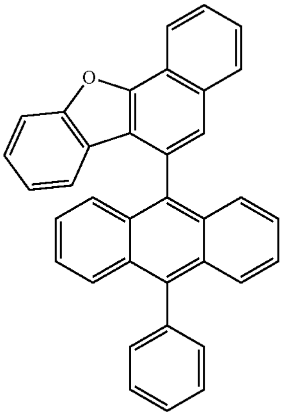
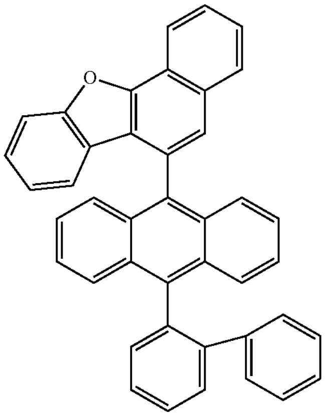

-continued
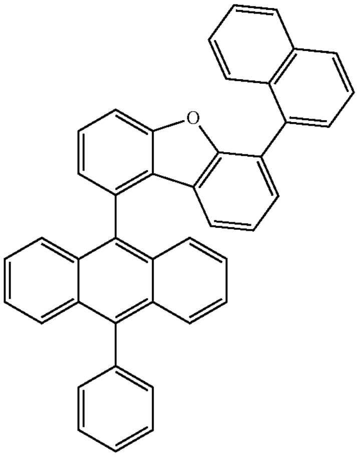
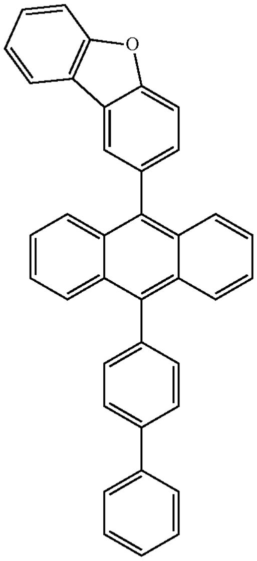
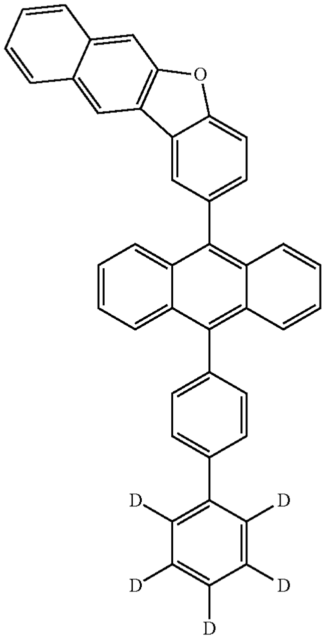
-continued
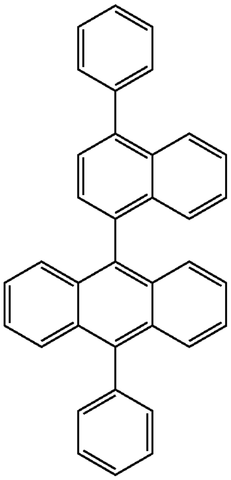
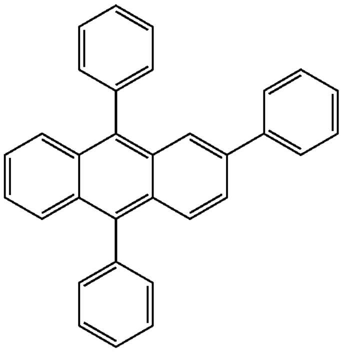
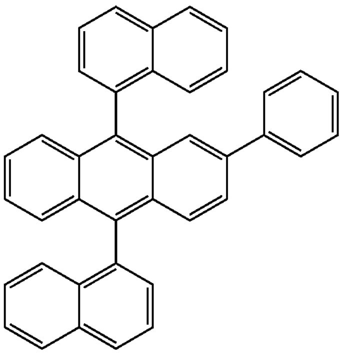
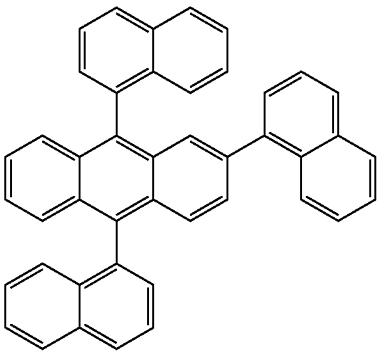

-continued
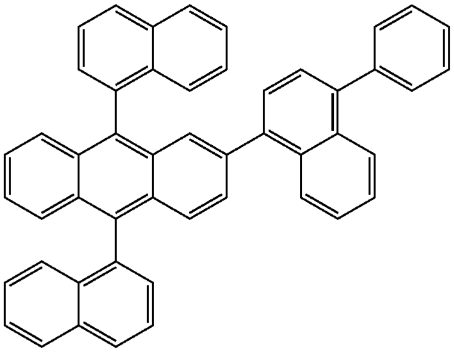
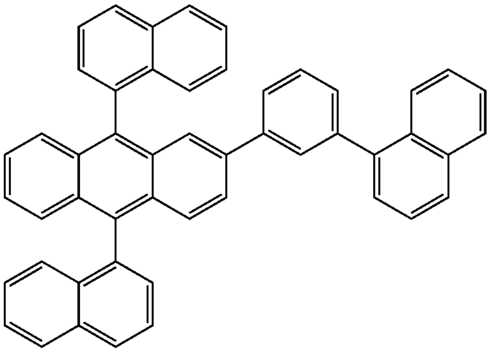
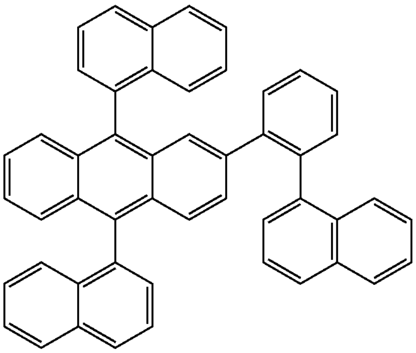
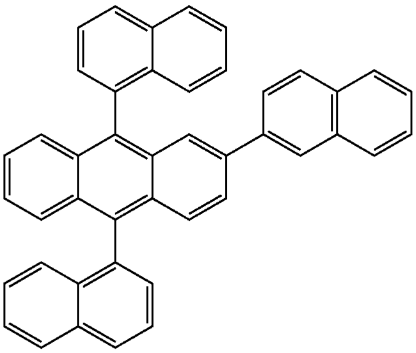
-continued
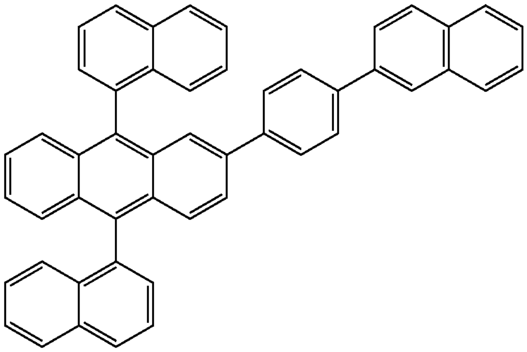
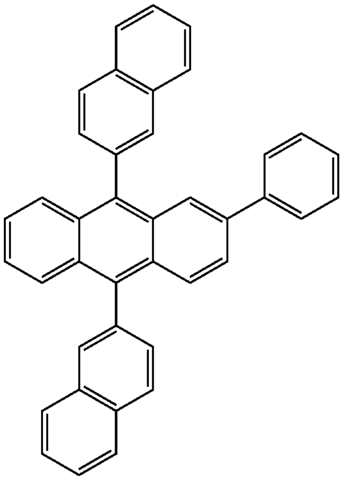
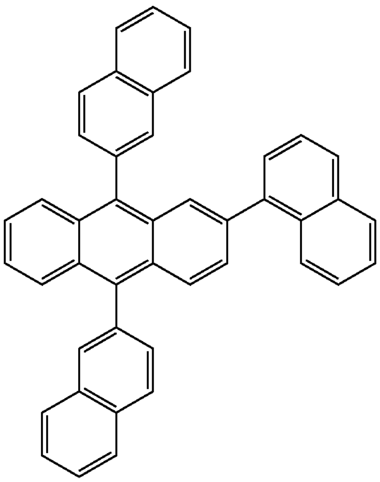

-continued
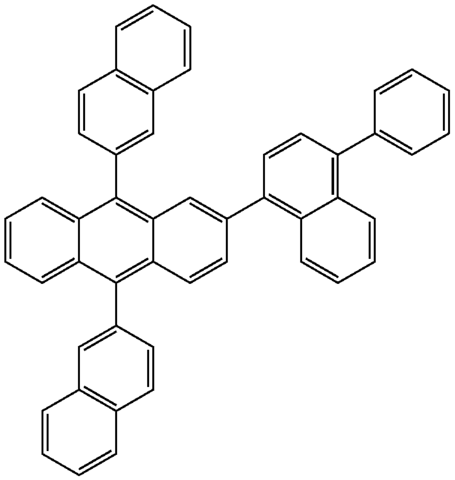
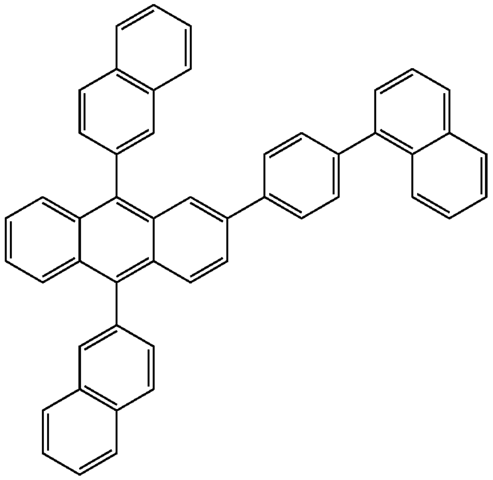
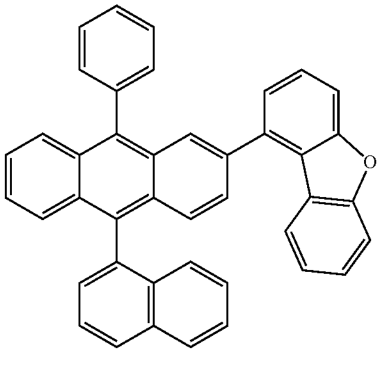
-continued
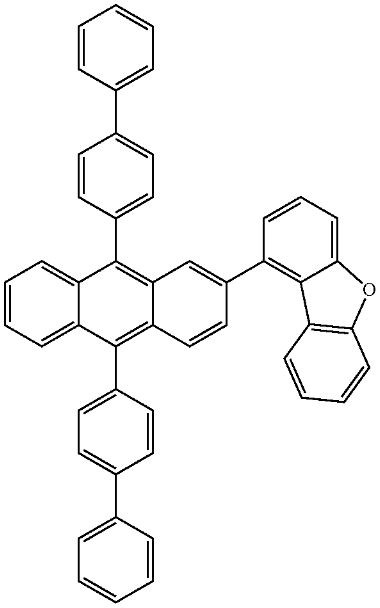
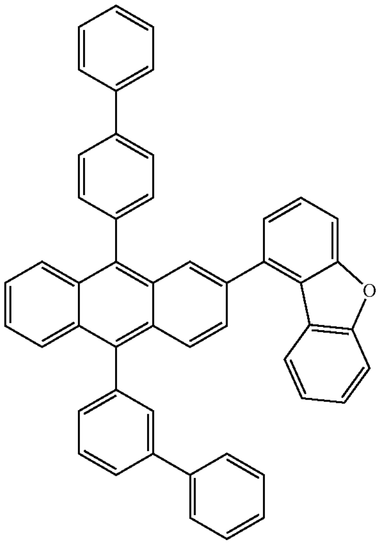
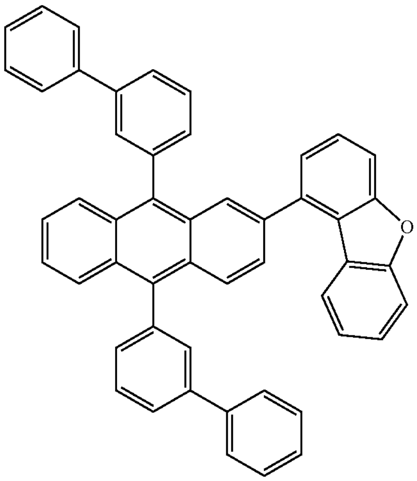

-continued
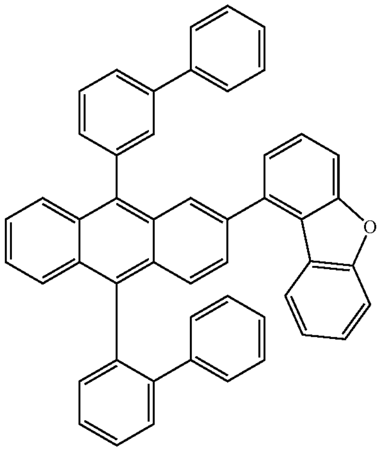
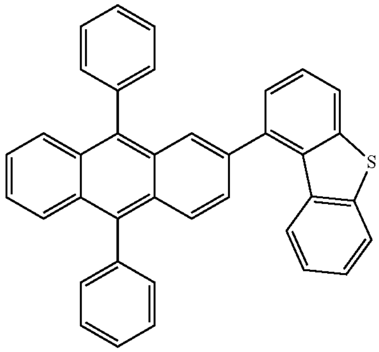
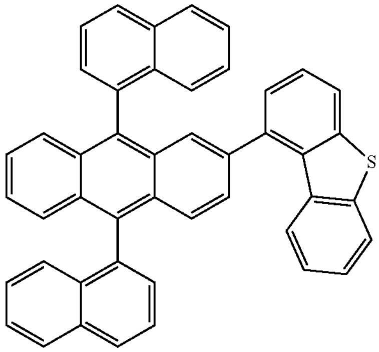
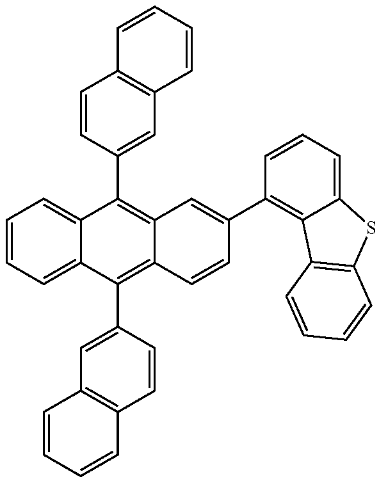
-continued
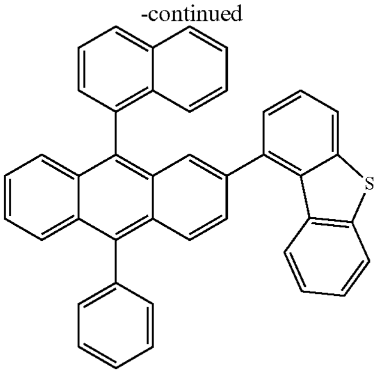
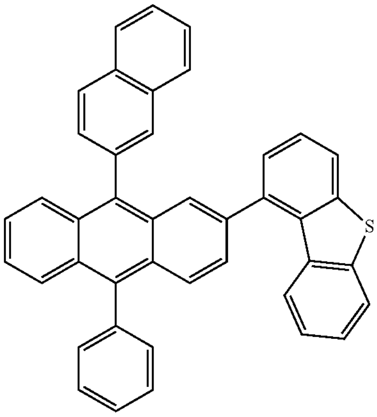
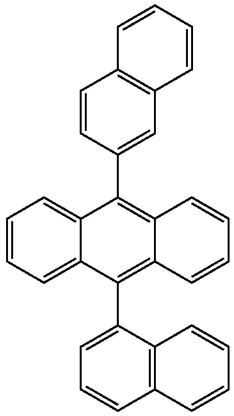
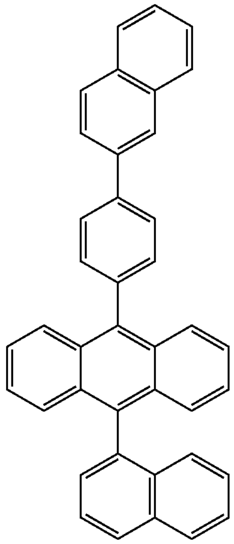

-continued
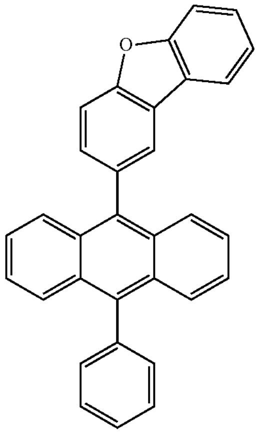
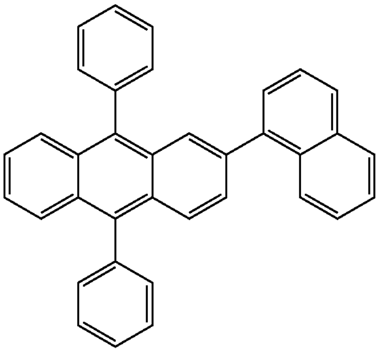
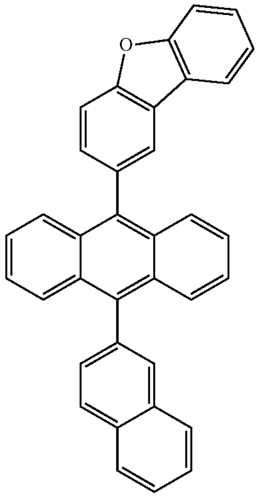
-continued
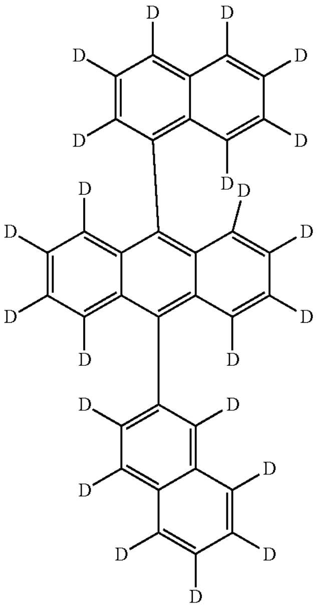
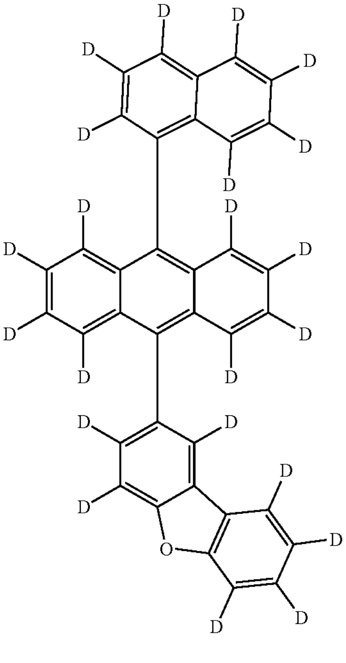

-continued
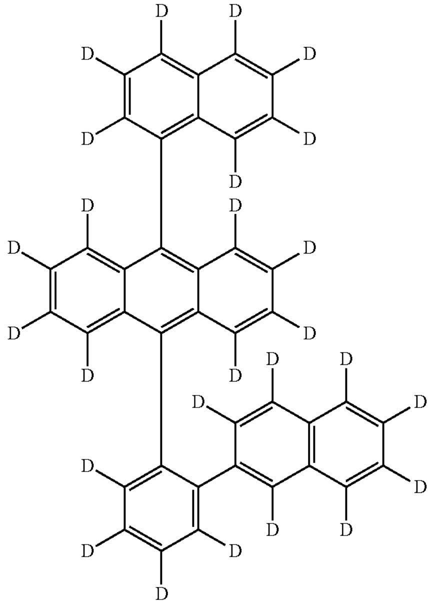
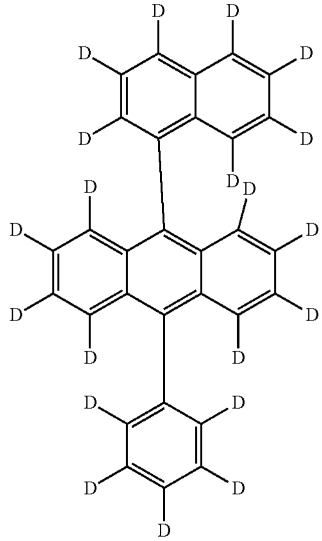
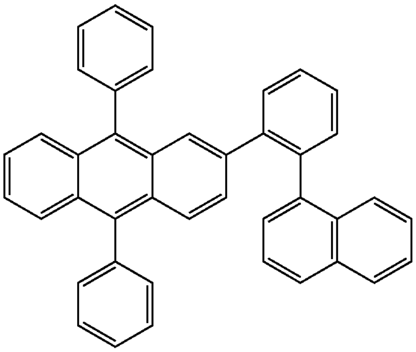
-continued
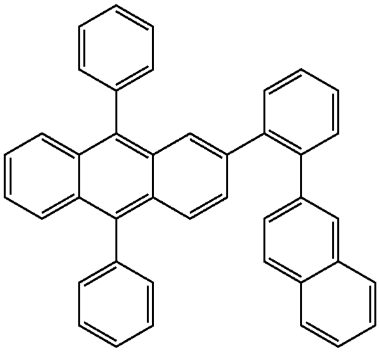
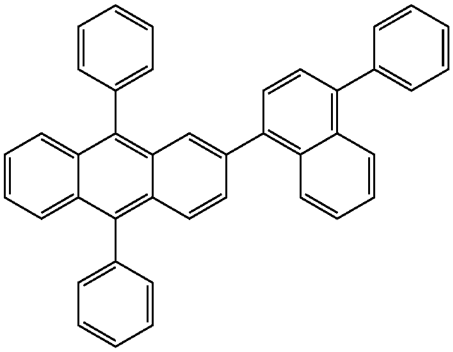
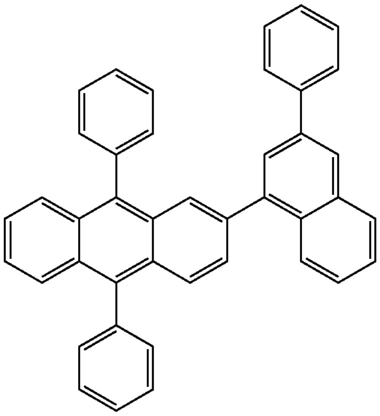
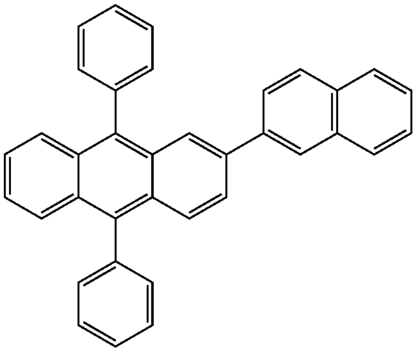

-continued
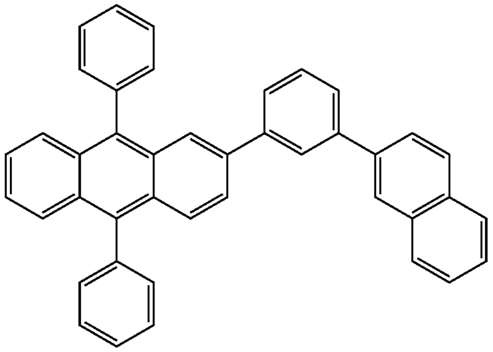
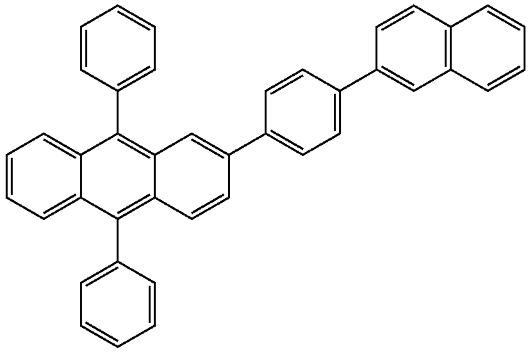
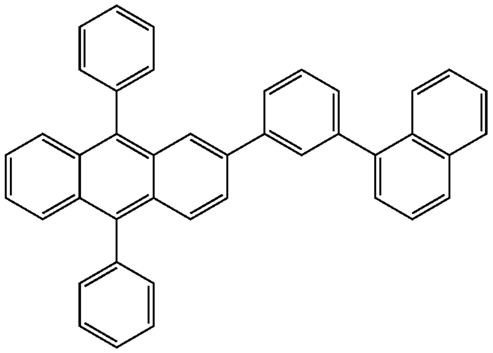
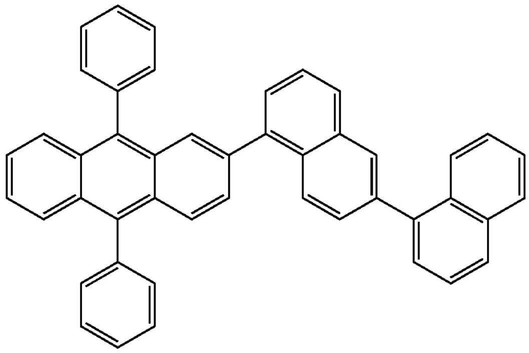
-continued
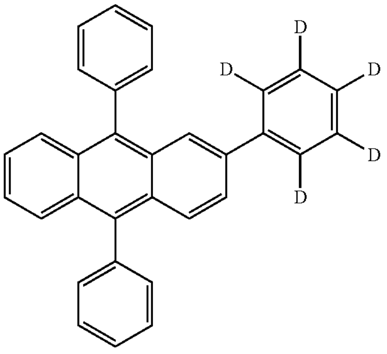
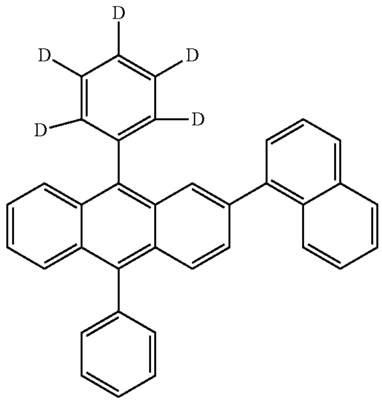
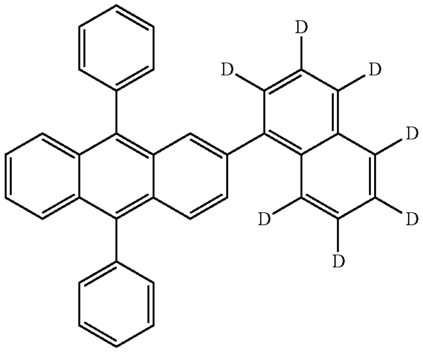
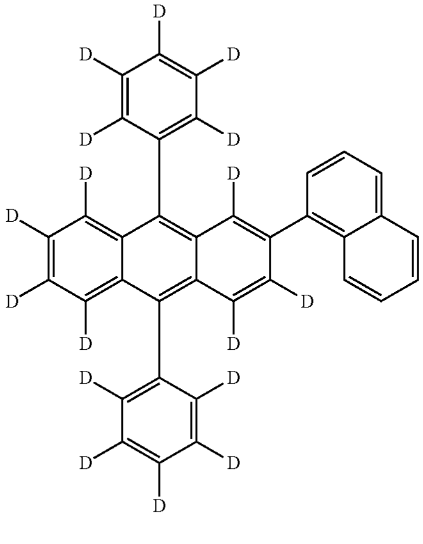

-continued
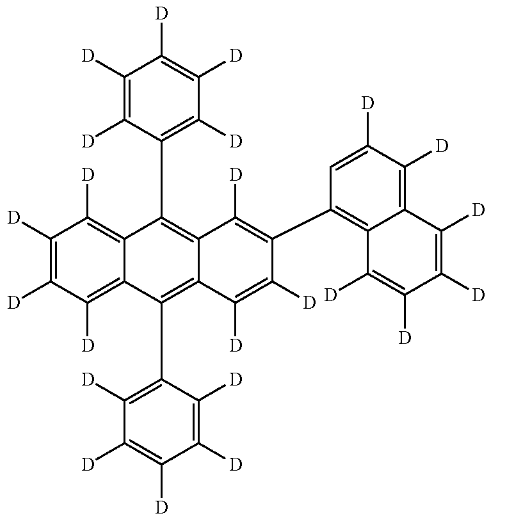
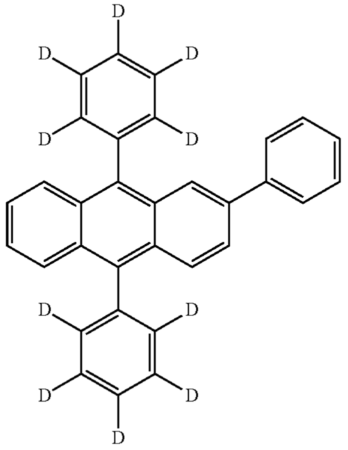
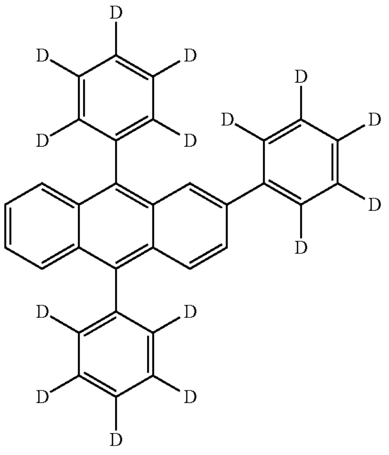
-continued
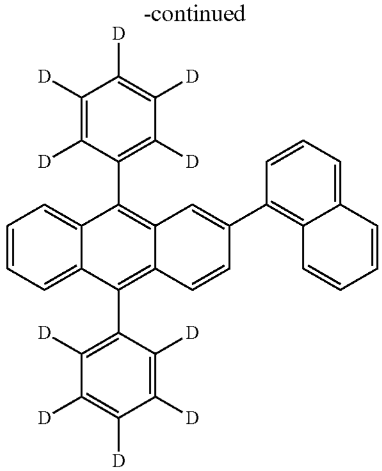
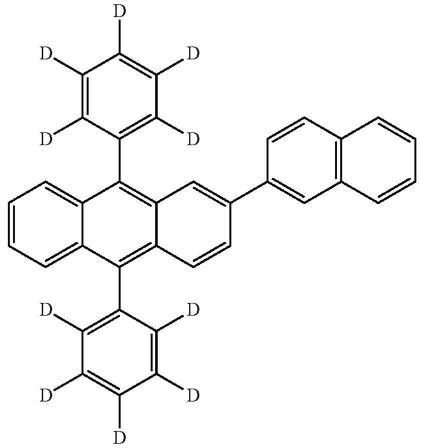
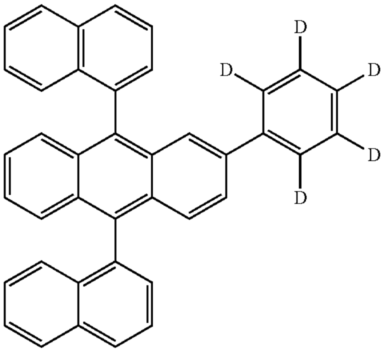
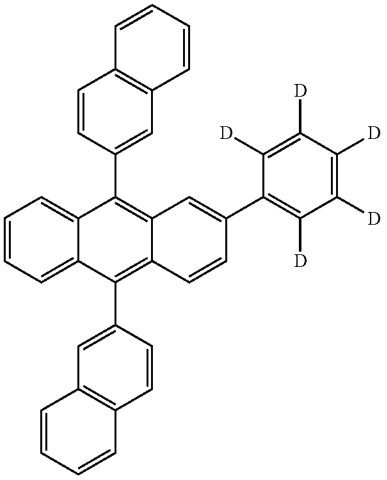

-continued
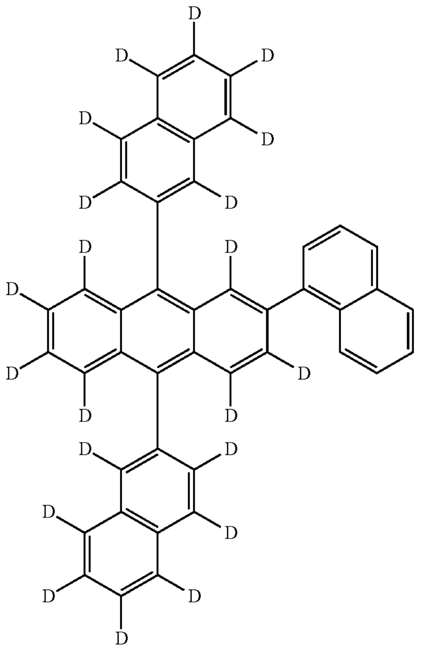
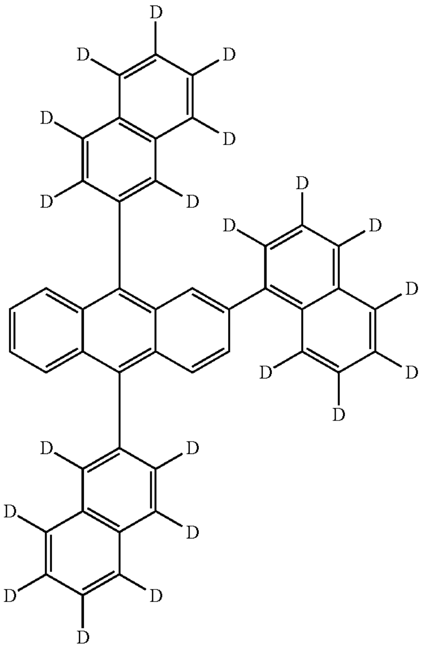
-continued
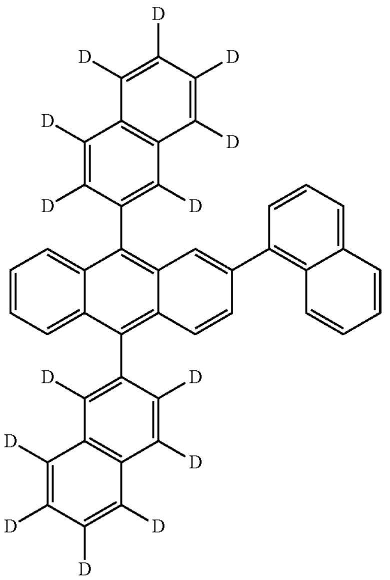
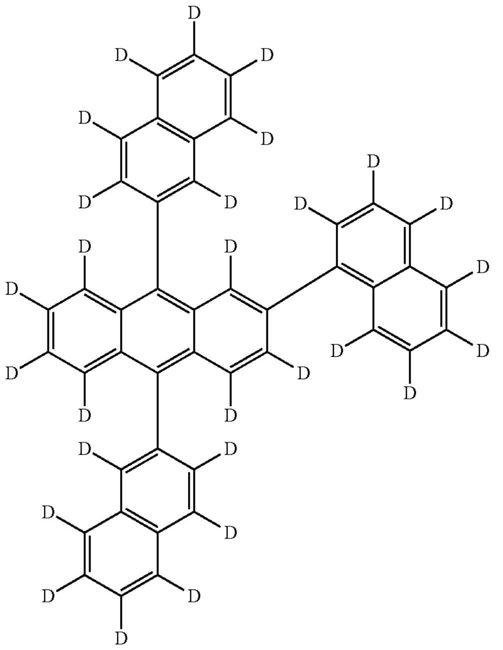
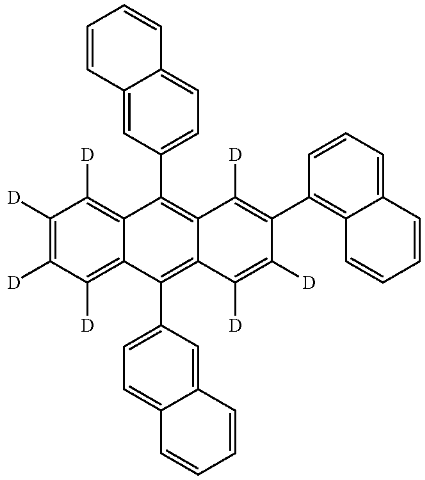

-continued
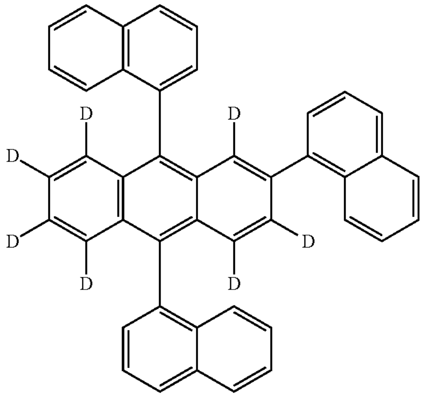
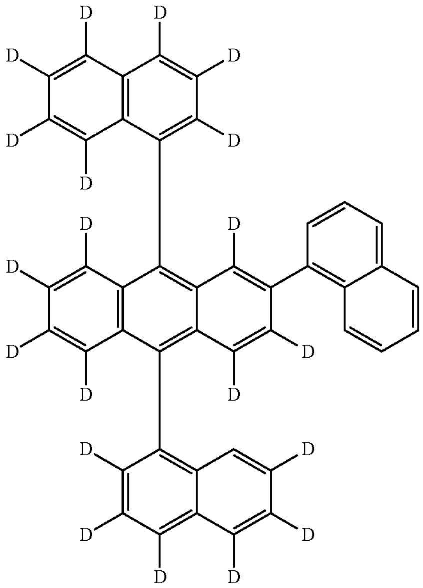
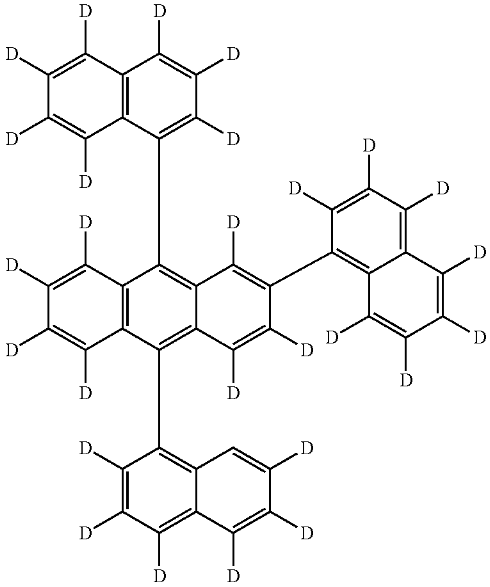
-continued
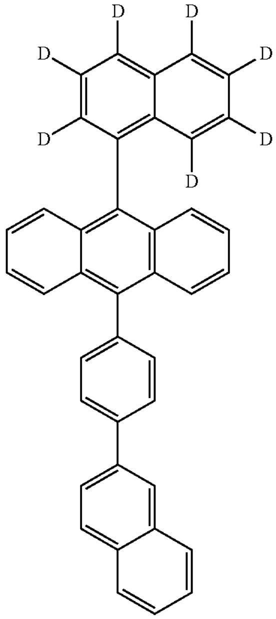
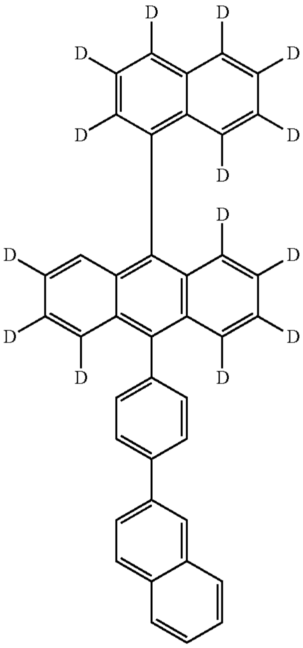

-continued
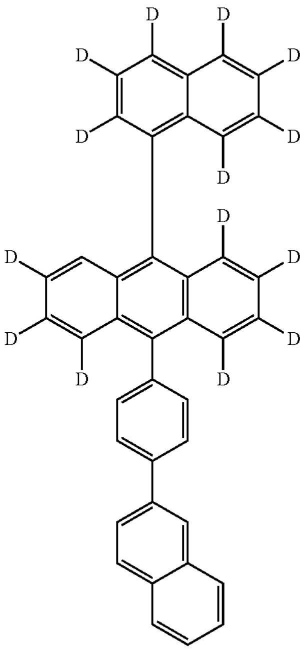
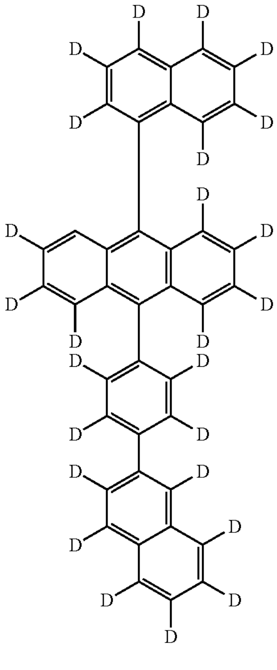
-continued
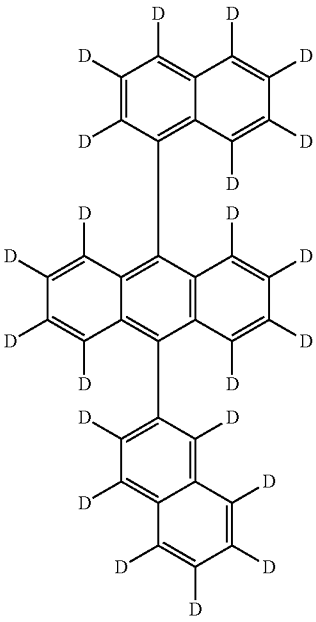
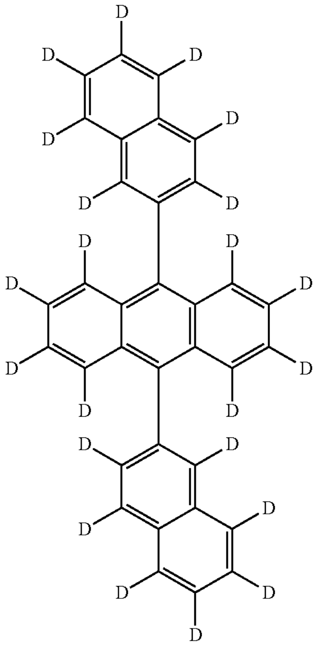

-continued
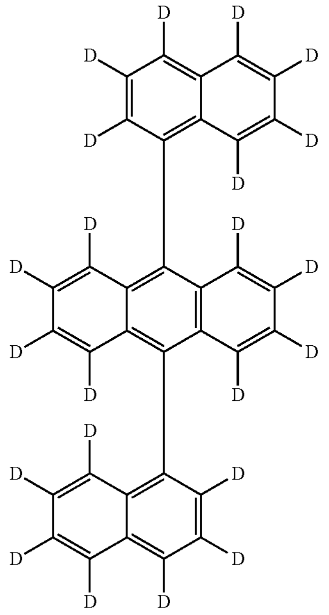
-continued
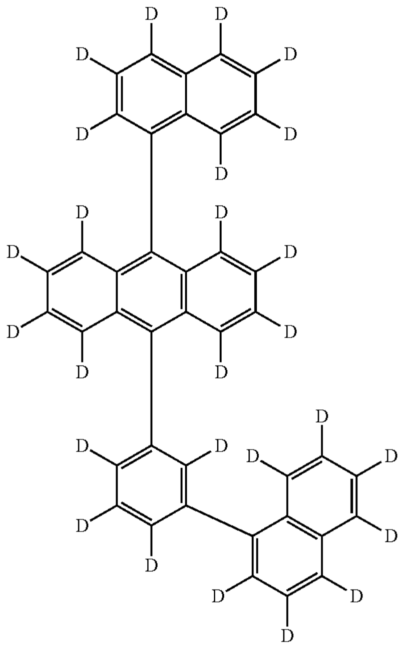
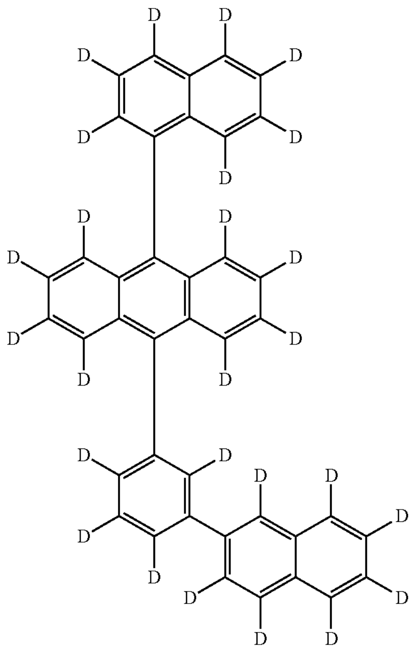
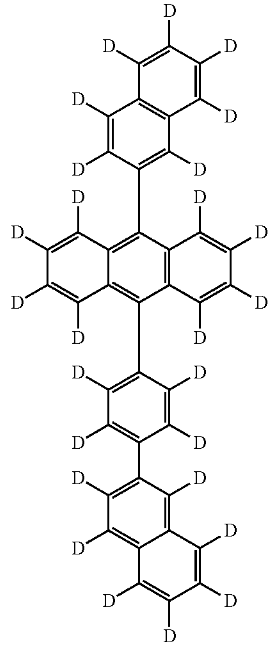

-continued
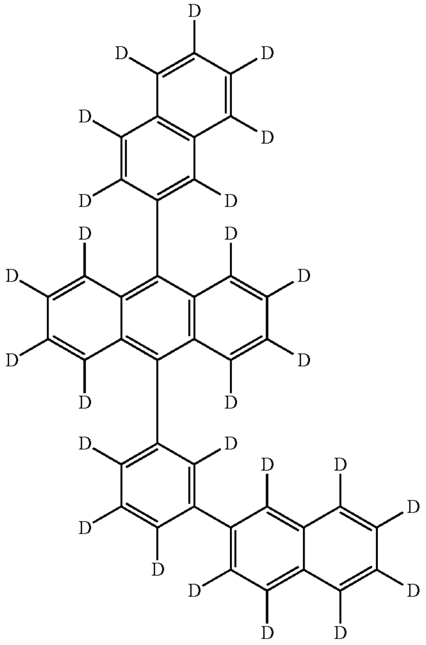
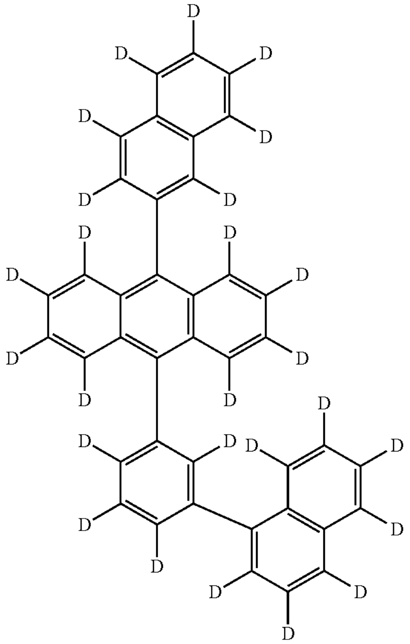
-continued
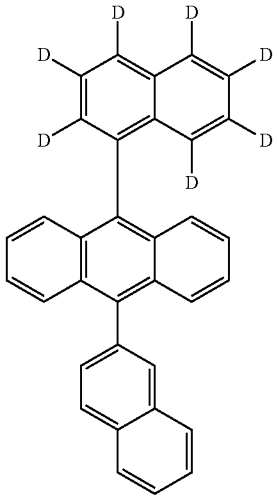
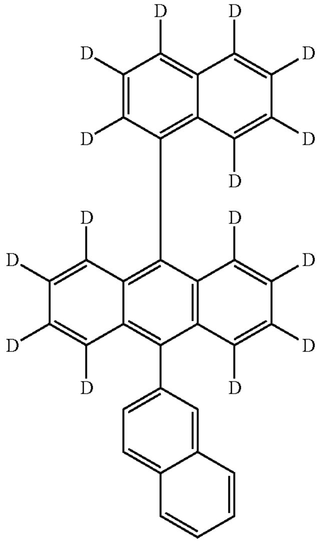
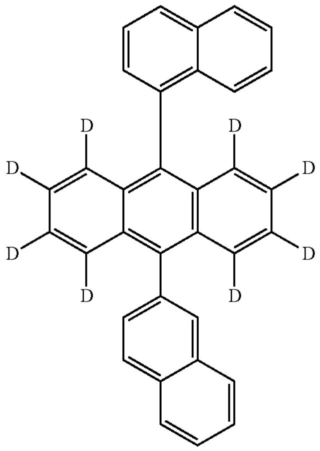

-continued

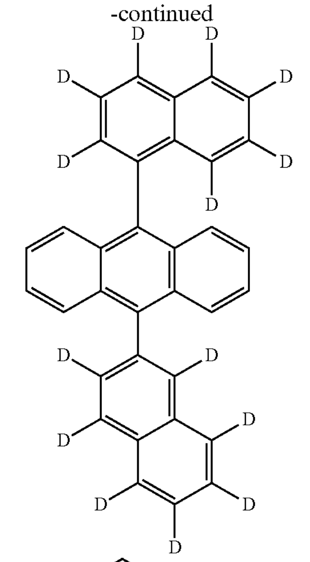

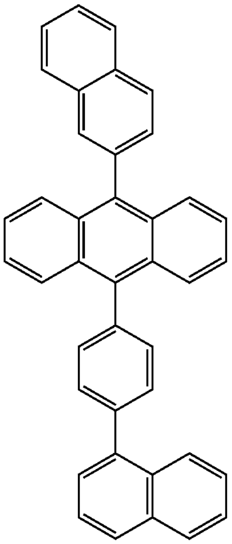

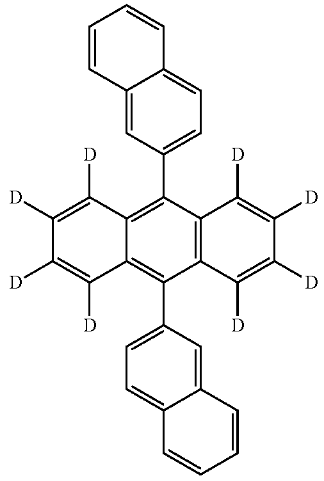

In a general organic light emitting device, excitons produced from the singlet and the triplet are produced at a ratio of 25:75 (singlet: triplet), and the organic light emitting device may be divided into fluorescence emission, phosphorescence emission, and thermally activated delayed fluorescence emission depending on the emission form due to the migration of excitons. The thermally activated delayed fluorescence indicates a phenomenon using a phenomenon in which the reverse intersystem crossing (RISC) occurs from triplet excitons to singlet excitons, and also refers to TADF. When such a thermally activated delayed fluorescence is used, a 100% internal quantum efficiency equivalent to the phosphorescence emission is possible theoretically even in fluorescence emission due to electric field excitation.

In order to exhibit the thermally activated delayed fluorescence, a reverse intersystem crossing to singlet excitons from 75% triplet excitons produced by electric field excitation at room temperature or a temperature of a light emitting layer in a light emitting device needs to occur. Further, the singlet excitons produced by the reverse intersystem crossing emit fluorescence like 25% singlet excitons produced by the direct excitation, so that the above-described 100% internal quantum efficiency is theoretically possible. In order for the reverse intersystem crossing to occur, the absolute value ($\Delta E_{st}$) of the difference between the lowest excited singlet energy level (S1) and the lowest excited triplet energy level (T1) is required to be small.

The compound of the present invention has delayed fluorescence characteristics of $\Delta E_{st}$ of less than 0.5 eV.

Since the compound of the present invention has delayed fluorescence characteristics of $\Delta E_{st}$ of less than 0.5 eV, excitons in a triplet excited state are generally subjected to reverse intersystem crossing in a singlet excited state, thereby implementing an organic light emitting device having high efficiency.

In general, materials having $\Delta E_{st}$ of less than 0.5 eV satisfy delayed fluorescence characteristics, and whether the materials satisfy delayed fluorescence characteristics may be confirmed by measuring a photoluminescence quantum yield (PLQY) and measuring the lifetime of excitons. It can be said that when the PLQY difference between the nitrogen atmosphere and the oxygen atmosphere is large, the material has a delayed fluorescence characteristic, and it can be said that the shorter the lifetime of excitons in microseconds is, the stronger the delayed fluorescence characteristic is.

The organic light emitting device of the present specification may be manufactured by typical manufacturing methods and materials of an organic light emitting device, except that an organic material layer having one or more layers is formed using the above-described compound of Formula 1.

During the manufacture of an organic light emitting device in which an organic material layer including the compound of Formula 1 is formed, the compound may be formed as an organic material layer by not only a vacuum deposition method, but also a solution application method. Here, the solution application method means spin coating, dip coating, inkjet printing, screen printing, a spray method, roll coating, and the like, but is not limited thereto.

The organic material layer of the organic light emitting device of the present specification may be composed of a single-layered structure, but may also be composed of a multi-layered structure in which two or more organic material layers are stacked. For example, the organic light emitting device of the present invention may have a structure including one or more layers of a hole transport layer, a hole injection layer, an electron blocking layer, a layer which simultaneously transports and injects holes, an electron transport layer, an electron injection layer, a hole blocking layer, and a layer which simultaneously transports and injects electrons as organic material layers. However, the structure of the organic light emitting device of the present specification is not limited thereto, and may include a fewer or greater number of organic material layers.

In the organic light emitting device of the present specification, the organic material layer may include a hole transport layer or a hole injection layer, and the hole transport layer or the hole injection layer may include the above-described compound of Formula 1.

In another organic light emitting device of the present specification, the organic material layer may include an electron transport layer or an electron injection layer, and the electron transport layer or the electron injection layer may include the above-described compound of Formula 1.

In still another organic light emitting device of the present specification, the organic material layer may include a light emitting layer, and the light emitting layer may include the above-described compound of Formula 1.

According to another exemplary embodiment, the organic material layer includes a light emitting layer, and the light emitting layer may include the above-described compound of Formula 1 as a doping material for the light emitting layer.

According to still another exemplary embodiment, the organic material layer includes a light emitting layer, and the light emitting layer may include the above-described compound of Formula 1 as a blue fluorescence doping material for the light emitting layer.

According to yet another exemplary embodiment, the organic material layer includes a light emitting layer, and the light emitting layer may include the above-described compound of Formula 1 as a blue fluorescence doping material for the light emitting layer and the compound of Formula 6 as a host of the light emitting layer.

In an exemplary embodiment of the present specification, the first electrode is an anode, and the second electrode is a cathode.

According to another exemplary embodiment, the first electrode is a cathode, and the second electrode is an anode.

The organic light emitting device may have, for example, a stacking structure described below, but the stacking structure is not limited thereto.

(1) Anode/Hole transport layer/Light emitting layer/Cathode (2) Anode/Hole injection layer/Hole transport layer/Light emitting layer/Cathode (3) Anode/Hole transport layer/Light emitting layer/Electron transport layer/Cathode (4) Anode/Hole transport layer/Light emitting layer/Electron transport layer/Electron injection layer/Cathode (5) Anode/Hole injection layer/Hole transport layer/Light emitting layer/Electron transport layer/Cathode (6) Anode/Hole injection layer/Hole transport layer/Light emitting layer/Electron transport layer/Electron injection layer/Cathode (7) Anode/Hole transport layer/Electron blocking layer/Light emitting layer/Electron transport layer/Cathode (8) Anode/Hole transport layer/Electron blocking layer/Light emitting layer/Electron transport layer/Electron injection layer/Cathode (9) Anode/Hole injection layer/Hole transport layer/Electron blocking layer/Light emitting layer/Electron transport layer/Cathode

(10) Anode/Hole injection layer/Hole transport layer/Electron blocking layer/Light emitting layer/Electron transport layer/Electron injection layer/Cathode

(11) Anode/Hole transport layer/Light emitting layer/Hole blocking layer/Electron transport layer/Cathode

(12) Anode/Hole transport layer/Light emitting layer/Hole blocking layer/Electron transport layer/Electron injection layer/Cathode

(13) Anode/Hole injection layer/Hole transport layer/Light emitting layer/Hole blocking layer/Electron transport layer/Cathode

(14) Anode/Hole injection layer/Hole transport layer/Light emitting layer/Hole blocking layer/Electron transport layer/Electron injection layer/Cathode

(15) Anode/Hole injection layer/First hole transport layer/Second hole transport layer/Light emitting layer/First electron transport layer/Second electron transport layer/Cathode

(16) Anode/Hole injection layer/First hole transport layer/Second hole transport layer/Light emitting layer/Electron transport layer/Layer which simultaneously transports and injects electrons/Cathode The structure of the organic light emitting device of the present specification may have structures illustrated in FIGS. 1 and 2, but is not limited thereto.

FIG. 1 exemplifies the structure of an organic light emitting device in which an anode 2, a light emitting layer 3, and a cathode 4 are sequentially stacked on a substrate 1. In the structure described above, the compound may be included in the light emitting layer 3.

FIG. 2 exemplifies a structure of an organic light emitting device in which an anode 2, a hole injection layer 5, a hole transport layer 6, a light emitting layer 7, an electron transport layer 8, and a cathode 4 are sequentially stacked on a substrate 1.

For example, the organic light emitting device according to the present specification may be manufactured by depositing a metal or a metal oxide having conductivity, or an alloy thereof on a substrate to form an anode, forming an organic material layer including a hole injection layer, a hole transport layer, a light emitting layer, an electron blocking layer, an electron transport layer, and an electron injection layer thereon, and then depositing a material, which may be used as a cathode, thereon, by using a physical vapor deposition (PVD) method such as sputtering or e-beam evaporation. In addition to the method described above, an organic light emitting device may also be made by sequentially depositing a cathode material, an organic material layer, and an anode material on a substrate.

The organic material layer may also have a multi-layered structure including a hole injection layer, a hole transport layer, a layer which simultaneously injects and transports electrons, an electron blocking layer, a light emitting layer, an electron transport layer, an electron injection layer, a layer which simultaneously injects and transports electrons, and the like, but is not limited thereto, and may have a single-layered structure. Further, the organic material layer may be manufactured to include a fewer number of layers by a method such as a solvent process, for example, spin coating, dip coating, doctor blading, screen printing, inkjet printing, or a thermal transfer method, using various polymer materials, instead of a deposition method.

The anode is an electrode which injects holes, and as an anode material, materials having a high work function are usually preferred so as to facilitate the injection of holes into an organic material layer. Specific examples of the anode material which may be used in the present invention include: a metal, such as vanadium, chromium, copper, zinc, and gold, or an alloy thereof; a metal oxide, such as zinc oxide, indium oxide, indium tin oxide (ITO), and indium zinc oxide (IZO); a combination of a metal and an oxide, such as ZnO:Al or $SnO_2$:Sb; a conductive polymer, such as poly(3-methylthiophene), poly[3,4-(ethylene-1,2-dioxy)thiophene] (PEDOT), polypyrrole, and polyaniline; and the like, but are not limited thereto.

The cathode is an electrode which injects electrons, and as a cathode material, materials having a low work function are usually preferred so as to facilitate the injection of electrons into an organic material layer. Specific examples of the cathode material include: a metal such as magnesium, calcium, sodium, potassium, titanium, indium, yttrium, lithium, gadolinium, aluminum, silver, tin, and lead, or an alloy thereof; a multi-layer structured material, such as LiF/Al or $LiO_2$/Al; and the like, but are not limited thereto.

The hole injection layer is a layer which serves to facilitate the injection of holes from an anode to a light emitting layer, and a hole injection material is preferably a material which may proficiently accept holes from an anode at a low voltage, and the highest occupied molecular orbital (HOMO) of the hole injection material is preferably a value between the work function of the anode material and the HOMO of the neighboring organic material layer.

Specific examples of the hole injection material include metal porphyrin, oligothiophene, arylamine-based organic materials, hexanitrile hexaazatriphenylene-based organic materials, quinacridone-based organic materials, perylene-based organic materials, anthraquinone, polyaniline-based and polythiophene-based conductive polymers, and the like, but are not limited thereto. The hole injection layer may have a thickness of 1 nm to 150 nm. When the hole injection layer has a thickness of 1 nm or more, there is an advantage in that it is possible to prevent hole injection characteristics from deteriorating, and when the hole injection layer has a thickness of 150 nm or less, there is an advantage in that it is possible to prevent the driving voltage from being increased in order to improve the movement of holes due to the too thick hole injection layer.

The hole transport layer may serve to facilitate the transport of holes. A hole transport material is suitably a material having high hole mobility which may accept holes from an anode or a hole injection layer and transfer the holes to a light emitting layer. Specific examples thereof include arylamine-based organic materials, conductive polymers, block copolymers having both conjugated portions and non-conjugated portions, and the like, but are not limited thereto.

An electron blocking layer may be provided between the hole transport layer and the light emitting layer. For the electron blocking layer, materials known in the art may be used.

The light emitting layer may emit red, green, or blue light, and may be composed of a phosphorescent material or a fluorescent material. The light emitting material is a material which may receive holes and electrons from a hole transport layer and an electron transport layer, respectively, and combine the holes and the electrons to emit light in a visible ray region, and is preferably a material having high quantum efficiency for fluorescence or phosphorescence. Specific examples thereof include: 8-hydroxy-quinoline aluminum complexes ($Alq_3$); carbazole-based compounds; dimerized styryl compounds; BAlq; 10-hydroxybenzoquinoline-metal compounds; benzoxazole-based, benzthiazole-based and benzimidazole-based compounds; poly(p-phenylenevinylene) (PPV)-based polymers; spiro compounds; polyfluorene, lubrene, and the like, but are not limited thereto.

When the light emitting layer emits blue light, a compound of Formula 1 of the present application may be used as a light emitting dopant. Additionally, it is possible to further include a phosphorescent material such as (4,6-$F2ppy)_2$Irpic or a fluorescent material such as spiro-DPVBi, spiro-6P, distyrylbenzene (DSB), distyrylarylene (DSA), a PFO-based polymer, and a PPV-based polymer.

Examples of the host material for the light emitting layer include fused aromatic ring derivatives, or hetero ring-containing compounds, and the like. Specifically, examples of the fused aromatic ring derivative include anthracene derivatives, pyrene derivatives, naphthalene derivatives, pentacene derivatives, phenanthrene compounds, fluoranthene compounds, and the like, and examples of the hetero ring-containing compound include carbazole derivatives, dibenzofuran, dibenzofuran derivatives, dibenzothiophene, dibenzothiophene derivatives, ladder-type furan compounds, pyrimidine derivatives, and the like, but the examples thereof are not limited thereto.

When the compound of Formula 1 of the present application is used as a light emitting dopant, the above-described compound of Formula 6 may be used as a host. In this case, the compounds of Formula 6 may be used either alone or in mixture with an additional host.

The electron transport layer may serve to facilitate the transport of electrons. An electron transport material is suitably a material having high electron mobility which may proficiently accept electrons from a cathode and transfer the electrons to a light emitting layer. Specific examples thereof include: Al complexes of 8-hydroxyquinoline; complexes including $Alq_3$; organic radical compounds; hydroxyflavone-metal complexes; and the like, but are not limited thereto. The electron transport layer may have a thickness of 1 to 50 nm. When the electron transport layer has a thickness of 1 nm or more, there is an advantage in that it is possible to prevent electron transport characteristics from deteriorating, and when the electron transport layer has a thickness of 50 nm or less, there is an advantage in that it is possible to prevent the driving voltage from being increased in order to improve the movement of electrons due to the too thick electron transport layer.

The electron injection layer may serve to facilitate the injection of electrons. An electron injection material is preferably a compound which has a capability of transporting electrons, an effect of injecting electrons from a cathode, and an excellent effect of injecting electrons into a light emitting layer or a light emitting material, prevents excitons produced from a light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto.

Examples of the metal complex compounds include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris (2-methyl-8-hydroxyquinolinato) aluminum, tris(8-hydroxyquinolinato) gallium, bis(10-hydroxybenzo[h]

quinolinato) beryllium, bis(10-hydroxybenzo[h] quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The hole blocking layer is a layer which blocks holes from reaching a cathode, and may be generally formed under the same conditions as those of the hole injection layer. Specific examples thereof include oxadiazole derivatives or triazole derivatives, phenanthroline derivatives, BCP, aluminum complexes, and the like, but are not limited thereto.

The organic light emitting device according to the present invention may be a top emission type, a bottom emission type, or a dual emission type according to the material to be used.

Mode of Disclosure

By a compound of Formula 1 of the present specification, a core structure may be prepared as in the following reaction formula. The substituent may be bonded by a method known in the art, and the type and position of the substituent and the number of substituents may be changed according to the technology known in the art.

<Reaction Formula>

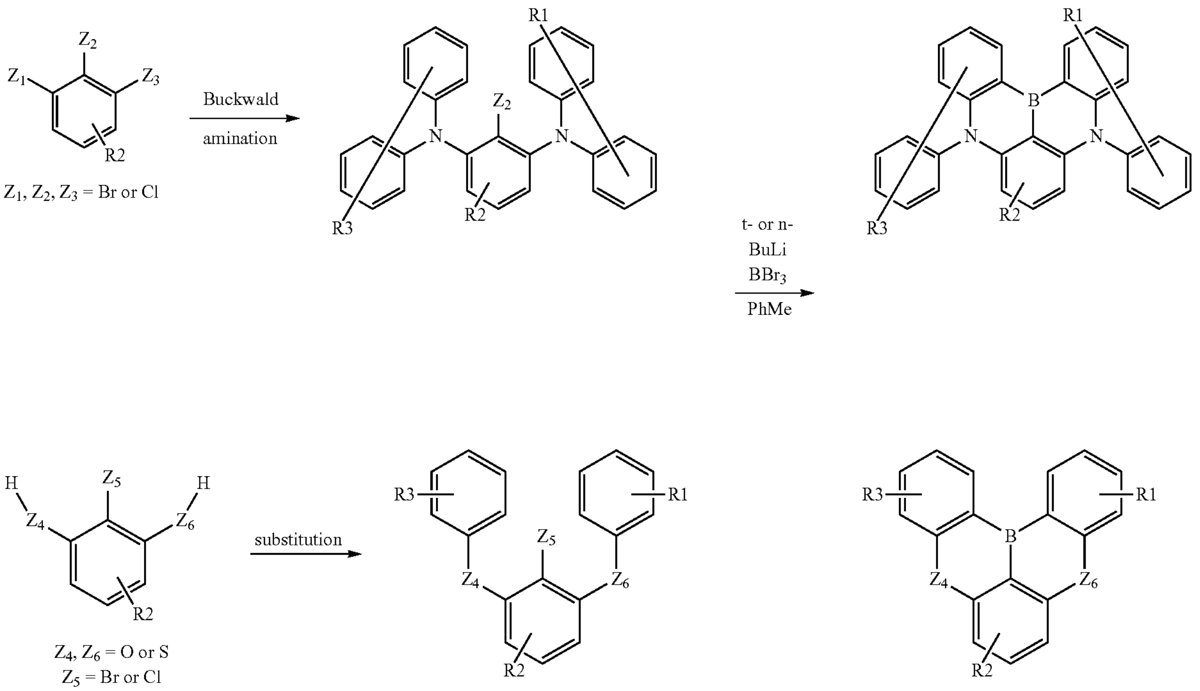

Here, R1 to R3 are the same as those defined in Formula 1.

Hereinafter, the present specification will be described in detail with reference to Examples for specifically describing the present specification. However, the Examples according to the present specification may be modified in various forms, and it is not interpreted that the scope of the present application is limited to the Examples described in detail below. The Examples of the present application are provided to more completely explain the present specification to a person with ordinary skill in the art.

SYNTHESIS EXAMPLES

[Synthesis Example 1] Synthesis of Compound A-1

A. Synthesis of Intermediate C-3

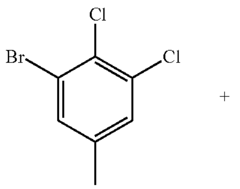

C-1

-continued

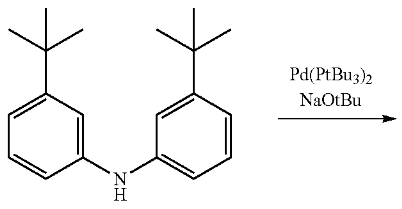

C-2

-continued

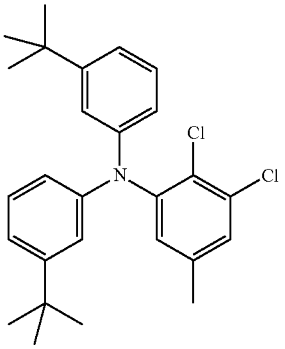

C-3

A flask containing starting materials C-1 (10 g), C-2 (12.3 g), $Pd(PtBu_3)_2$ (0.43 g), NaOtBu (8.0 g), and toluene (200 ml) was heated at 110° C. and stirred for 1 hour. The reaction solution was cooled to room temperature, the solution was aliquoted by adding water and toluene thereto, and then the solvent was distilled off under reduced pressure. The product was purified with recrystallization (diethyl ether/hexane/methanol) to obtain Compound C-3 (14.9 g). As a result of measuring the mass spectrum of the obtained solid, a peak was confirmed at $[M+H]^+=440$.

Here, tBu is a tert-butyl group.

B. Synthesis of Intermediate C-5

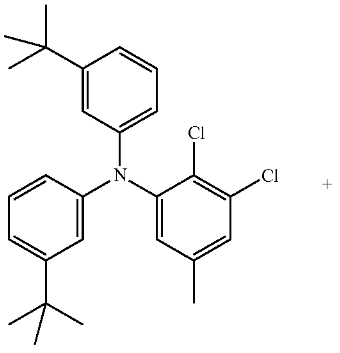

C-3

-continued

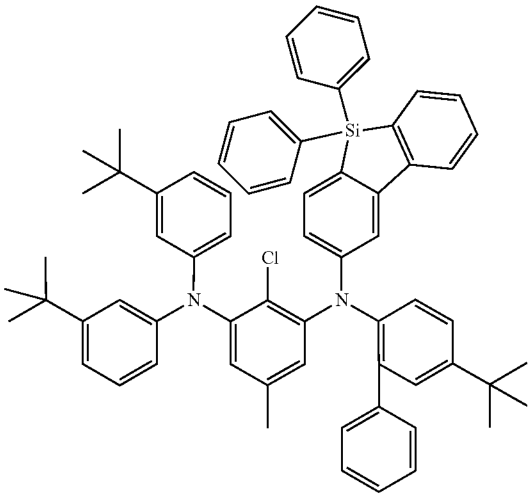

C-5

In the synthesis of Intermediate C-3, Intermediate C-5 was synthesized in the same manner as in the synthesis of Intermediate C-3 using C-3 (5 g), C-4 (6.6 g), and xylene (50 mL) instead of C-1 (10 g), C-2 (12.3 g), and toluene.

6.7 g of Intermediate C-5 was obtained using a column chromatography purification method (eluent: ethylacetate/hexane). As a result of measuring the mass spectrum of the obtained solid, a peak was confirmed at $[M+H]^+=961$.

C. Synthesis of Compound A-1

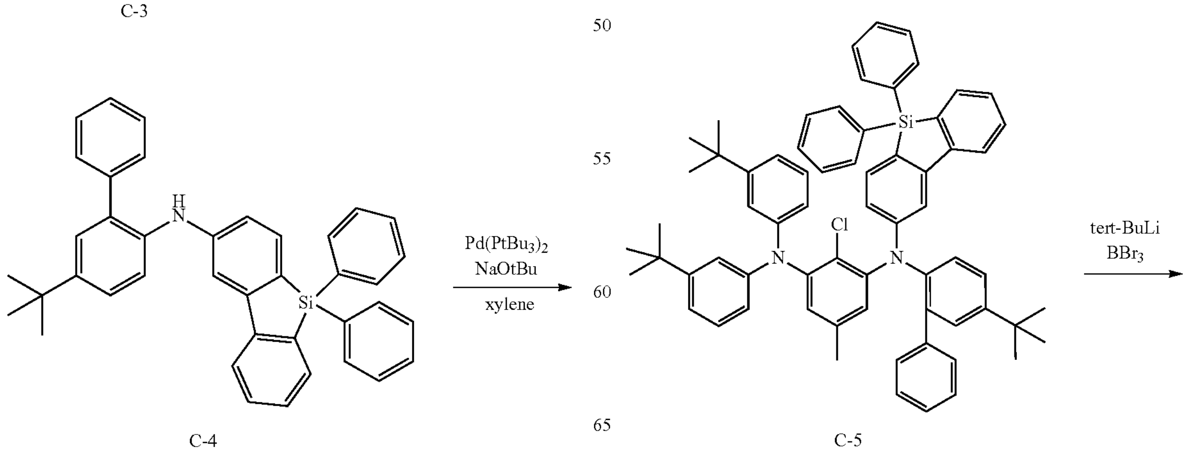

C-4

C-5

-continued

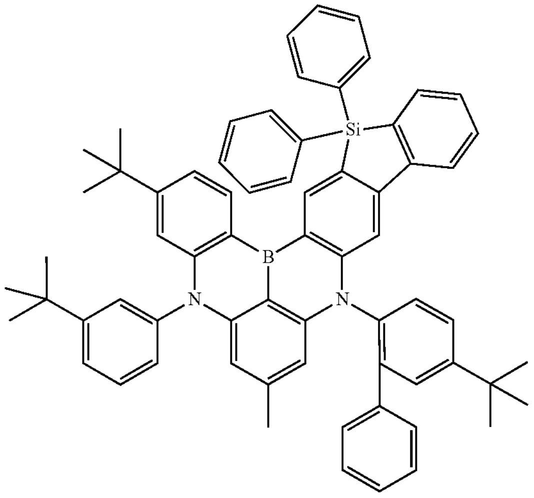

A-1

-continued

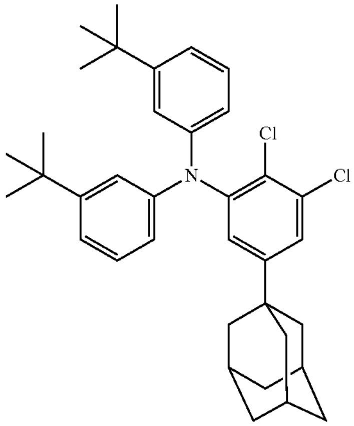

C-7

A 1.7 M tert-butyllithium pentane solution (12.8 ml) was added to a flask containing Intermediate C-5 (6.0 g) and toluene (60 ml) at 0° C. under an argon atmosphere. After the completion of dropwise addition, the resulting solution was warmed to 70° C. and stirred for 4 hours. The resulting solution was cooled to −40° C., boron tribromide (0.9 ml) was added thereto, and the resulting solution was stirred for 4 hours while being warmed to room temperature. When the reaction was terminated, the resulting product was aliquoted by adding sat. aq. $Na_2S_2O_3$ and sat. aq. $NaHCO_3$ thereto, and then the solvent was distilled off under reduced pressure. The resulting product was purified with a silica gel column chromatography (eluent: hexane/toluene=1/30) to obtain Compound A-1 (1.2 g). As a result of measuring the mass spectrum of the obtained solid, a peak was confirmed at $[M+H]^+$=935.

[Synthesis Example 2] Synthesis of Compound A-4

A. Synthesis of Intermediate C-9

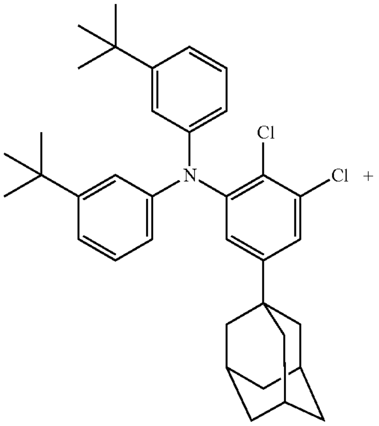

C-7

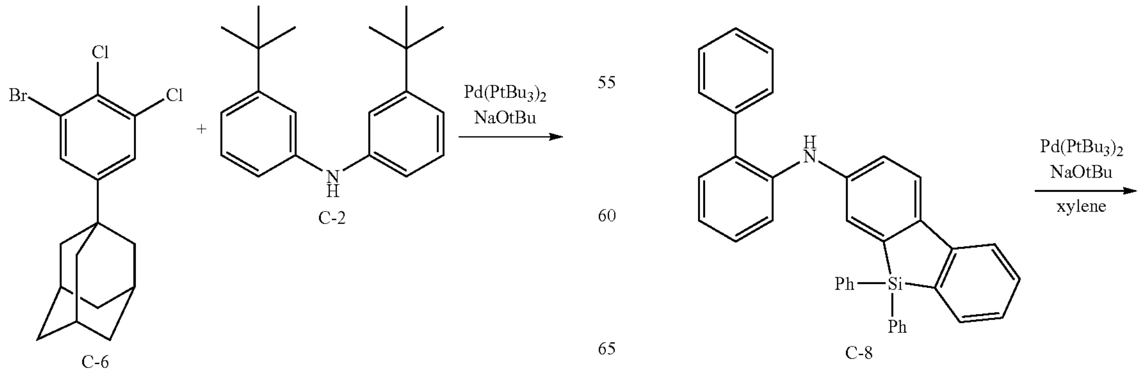

C-6

C-2

C-8

-continued

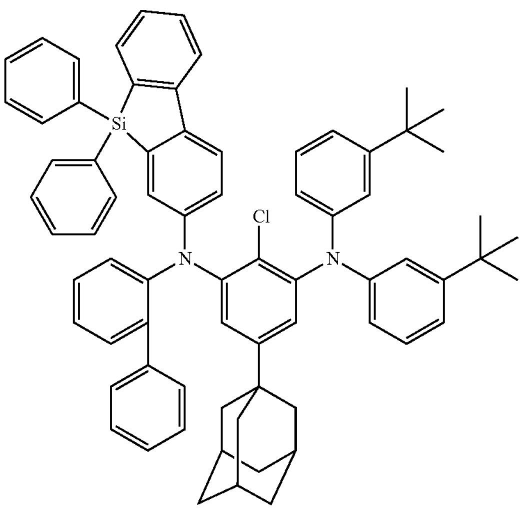

C-9

In the synthesis of Intermediate C-3, 12.4 g of intermediate C-7 was obtained in the same manner as in the synthesis of Intermediate C-3 using C-6 (10 g) and C-2 (8.2 g) instead of C-1 (10 g) and C-2 (12.3 g).

In the synthesis of Intermediate C-5, 9.4 g of Intermediate C-9 was obtained in the same manner as in the synthesis of Intermediate C-5 using C-7 (8 g) and C-8 (7.5 g) instead of C-3 (5 g) and C-4 (6.6 g). As a result of measuring the mass spectrum of the obtained solid, a peak was confirmed at $[M+H]^+=1025$.

B. Synthesis of Compound A-4

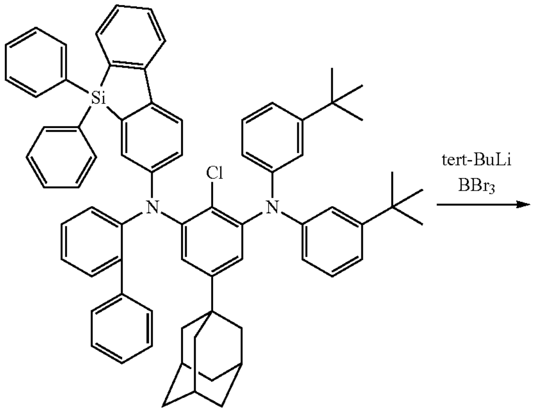

C-9

-continued

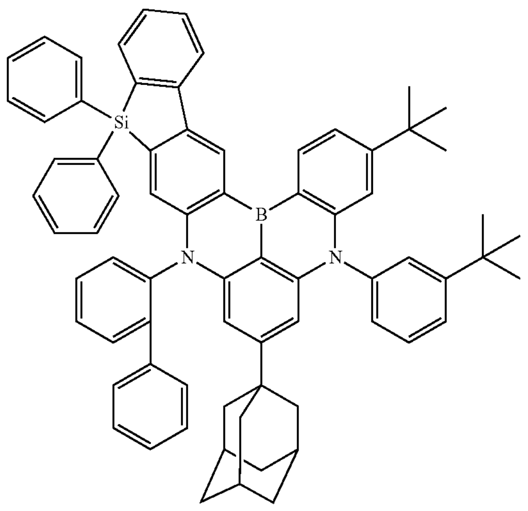

A-4

In the synthesis of Compound A-1, 1.6 g of Compound A-4 was obtained in the same manner as in the synthesis of Compound A-1 using C-9 (8 g) instead of C-5 (6.0 g). As a result of measuring the mass spectrum of the obtained solid, a peak was confirmed at $[M+H]^+=1000$.

[Synthesis Example 3] Synthesis of Compound A-5

A. Synthesis of Intermediate C-13

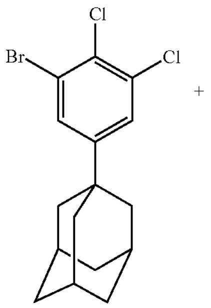

C-6

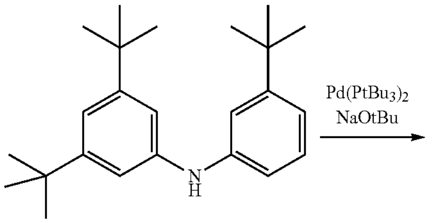

C-10

-continued

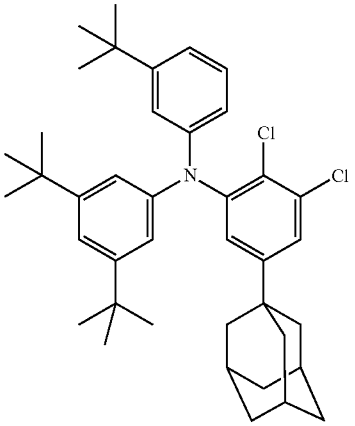

C-11

-continued

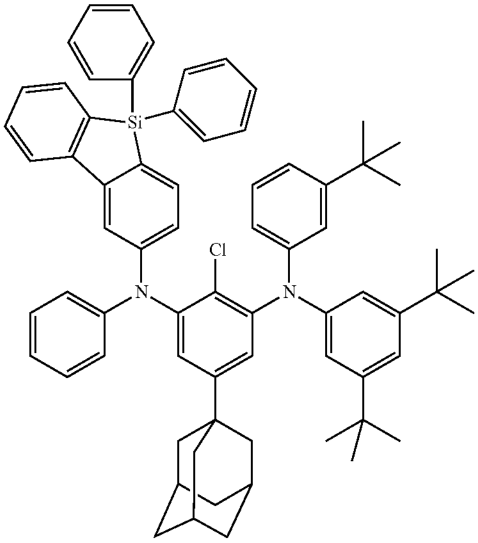

C-13

In the synthesis of Intermediate C-3, 11.9 g of Intermediate C-11 was obtained in the same manner as in the synthesis of Intermediate C-3 using C-6 (10 g) and C-10 (9.8 g) instead of C-1 (10 g) and C-2 (12.3 g).

In the synthesis of Intermediate C-5, 6.3 g of Intermediate C-13 was obtained in the same manner as in the synthesis of Intermediate C-5 using C-11 (6.5 g) and C-12 (4.4 g) instead of C-3 (5 g) and C-4 (6.6 g). As a result of measuring the mass spectrum of the obtained solid, a peak was confirmed at $[M+H]^+=1006$.

B. Synthesis of Compound A-5

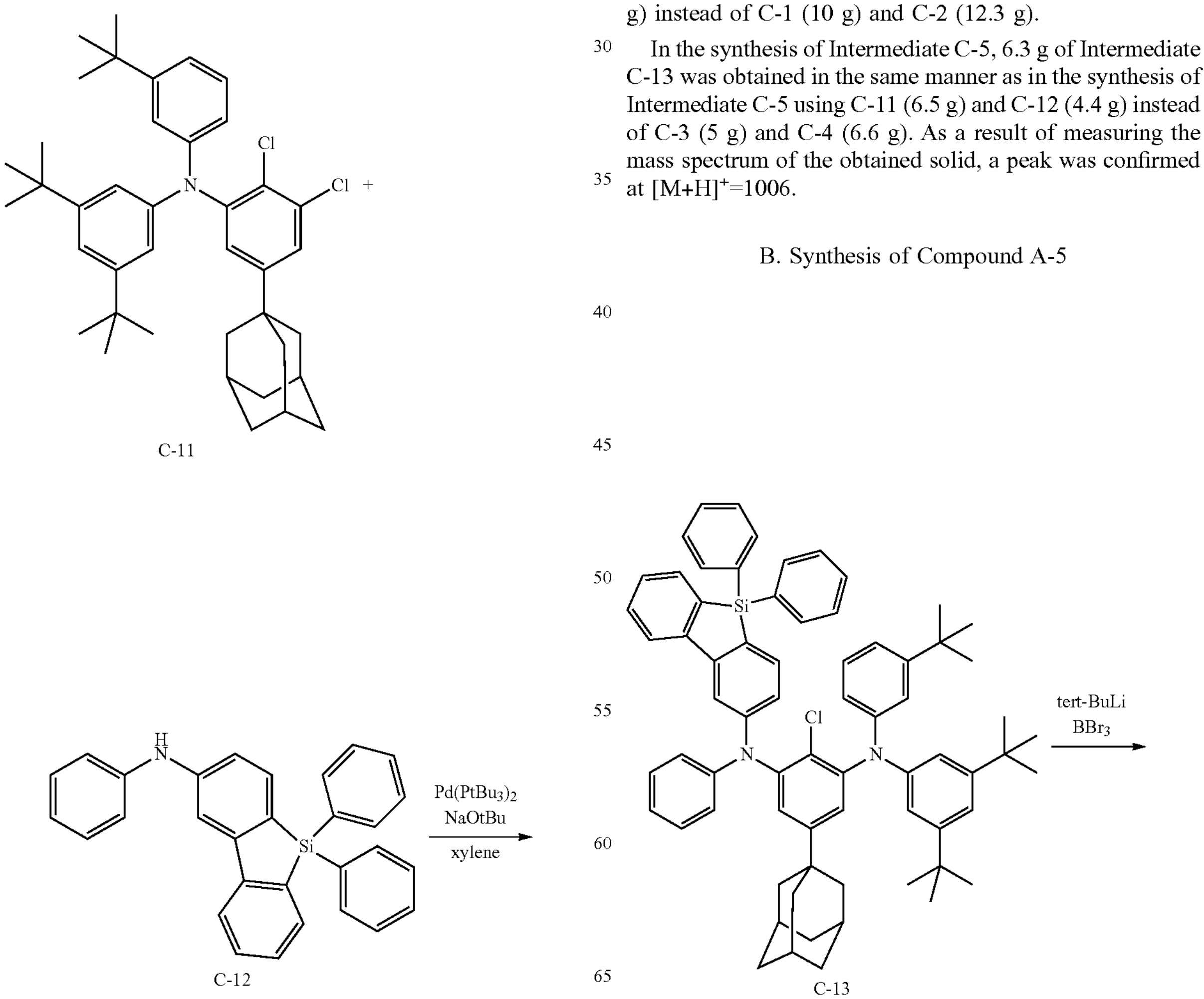

C-11

C-12

C-13

-continued

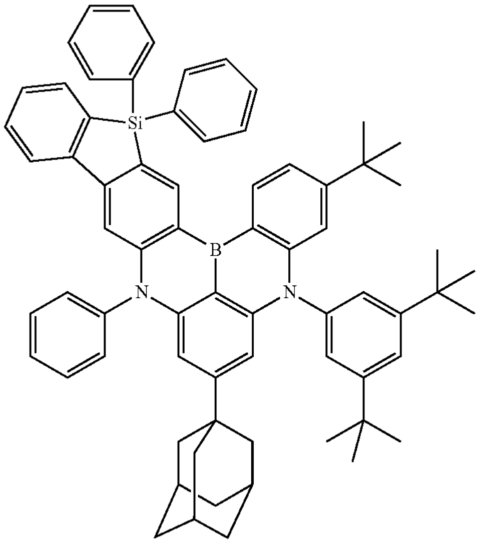

A-5

In the synthesis of Compound A-1, 1.3 g of Compound A-5 was obtained in the same manner as in the synthesis of Compound A-1 using C-13 (6 g) instead of C-5 (6.0 g). As a result of measuring the mass spectrum of the obtained solid, a peak was confirmed at $[M+H]^+=980$.

[Synthesis Example 4] Synthesis of Compound A-2

A. Synthesis of Intermediate C-16

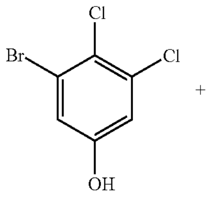

C-14

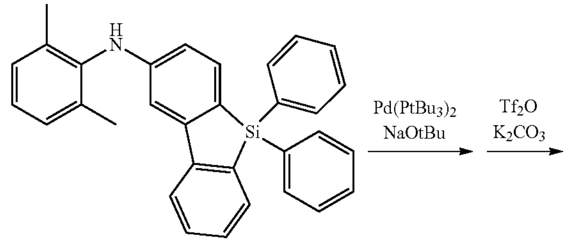

C-15

-continued

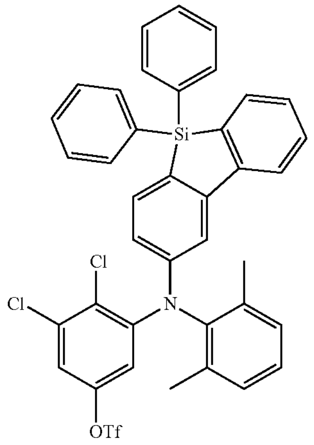

C-16

Here, Tf means a trifluoromethanesulfonyl group.

In the synthesis of Intermediate C-3, an amination reaction was performed in the same manner as in the synthesis of Intermediate C-3 using C-14 (25 g) and C-15 (47.8 g) instead of C-1 (10 g) and C-2 (12.3 g), and then the next reaction was performed without a purification process.

After the amination reaction product was dissolved in dimethylformamide (DMF) (300 mL), potassium carbonate (18.6 g) was added at room temperature, and then triflic anhydride (19.1 g) was slowly added dropwise thereto at 0° C. After the reaction was completed by stirring the resulting solution for 2 hours, 200 ml of water and 300 mL of ethyl acetate were added thereto, and the resulting mixture was stirred for 30 minutes. The organic layer was washed twice using aq. NaCl. The aliquoted organic layer was recovered and filtered by treatment with $Mg_2SO_4$ (anhydrous). The solvent of the filtered solution was distilled off under reduced pressure, and 34.7 g of Intermediate C-16 was obtained using a column chromatography (ethyl acetate/hexane) purification method.

B. Synthesis of Intermediate C-20

C-16 +

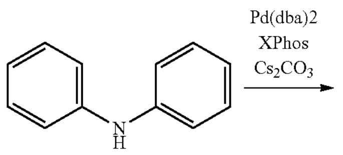

C-17

-continued

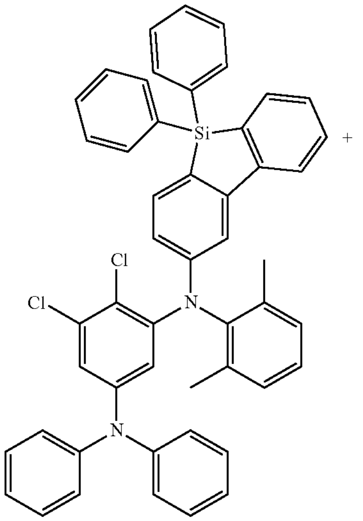

C-18

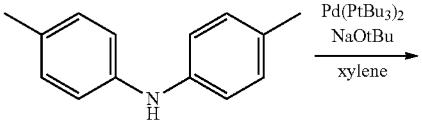

C-19

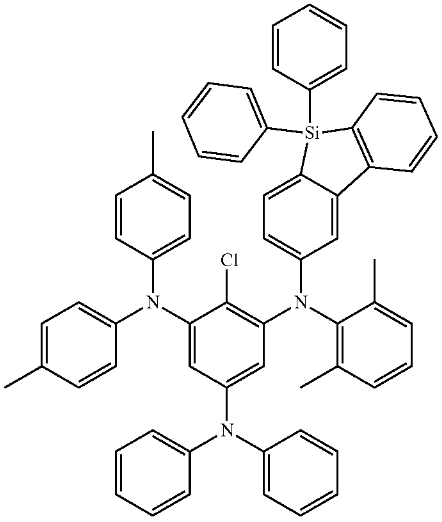

C-20

A flask containing C-16 (33 g), C-17 (7.8 g), palladium(0) bis(dibenzylideneacetone) ($Pd(dba)_2$) (0.25 g), 2-dicyclohexylphosphino-2',4',6'-triisopropylbiphenyl (Xphos) (0.42 g), $CS_2CO_3$ (43 g), and xylene (220 ml) was heated at 130° C., and stirred for 12 hours. The reaction solution was cooled to room temperature, the solution was aliquoted by adding sat. aq. $NH_4Cl$ and toluene thereto, and then the solvent was distilled off under reduced pressure. The residue was purified with silica gel column chromatography (ethylacetate/hexane) to obtain Intermediate C-18 (23.4 g). As a result of measuring the mass spectrum of the obtained solid, a peak was confirmed at $[M+H]^+=765$.

In the synthesis of Intermediate C-5, 7.4 g of Intermediate C-20 was obtained in the same manner as in the synthesis of Intermediate C-5 using C-18 (9 g) and C-19 (2.4 g) instead of C-3 (5 g) and C-4 (6.6 g). As a result of measuring the mass spectrum of the obtained solid, a peak was confirmed at $[M+H]^+=926$.

C. Synthesis of Compound A-2

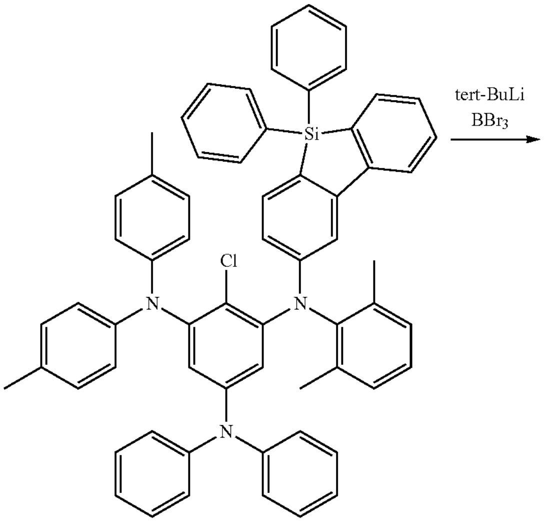

C-20

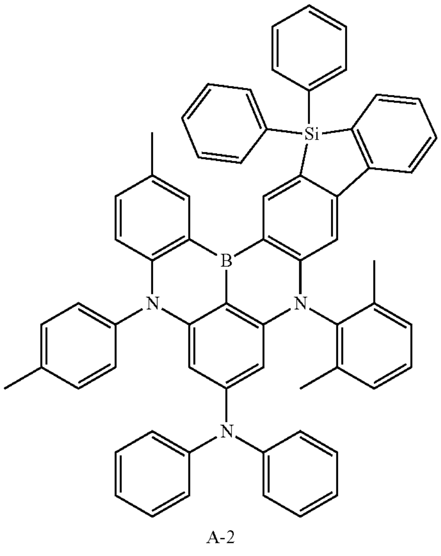

A-2

In the synthesis of Compound A-1, 1.6 g of Compound A-2 was obtained in the same manner as in the synthesis of Compound A-1 using C-20 (6.5 g) instead of C-5 (6.0 g). As a result of measuring the mass spectrum of the obtained solid, a peak was confirmed at $[M+H]^+=900$ from Compound A-2.

[Synthesis Example 5] Synthesis of Compound A-3

A. Synthesis of Intermediate C-22

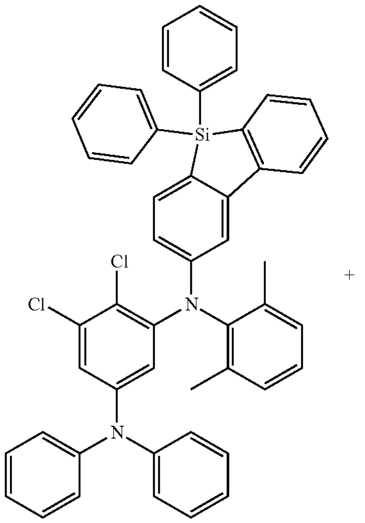

C-18

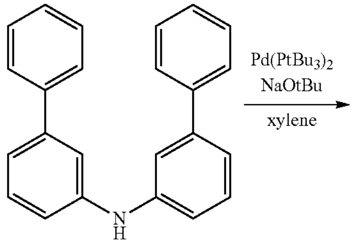

C-21

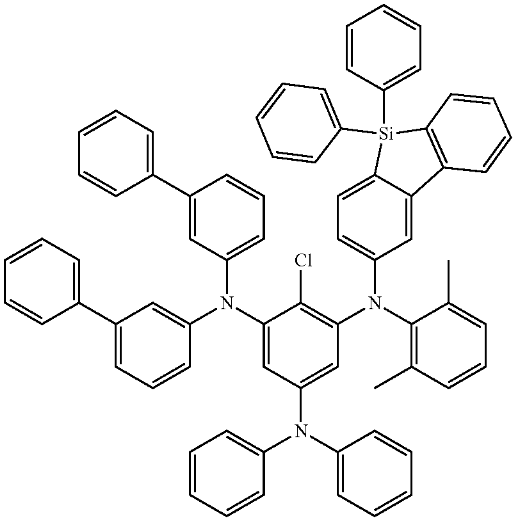

C-22

In the synthesis of Intermediate C-5, 8.1 g of Intermediate C-22 was obtained in the same manner as in the synthesis of Intermediate C-5 using C-18 (9 g) and C-21 (4.0 g) instead of C-3 (5 g) and C-4 (6.6 g). As a result of measuring the mass spectrum of the obtained solid, a peak was confirmed at $[M+H]^+$=1050.

B. Synthesis of Compound A-3

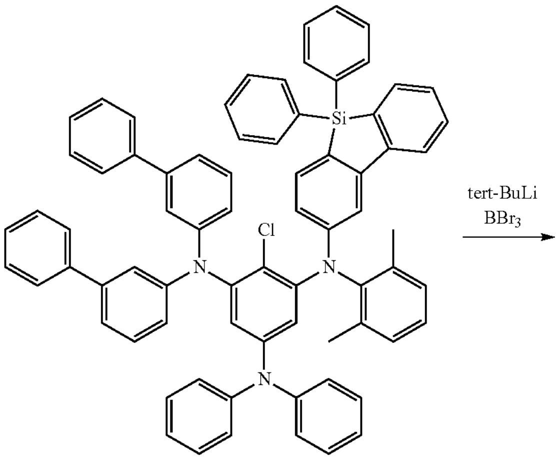

C-22

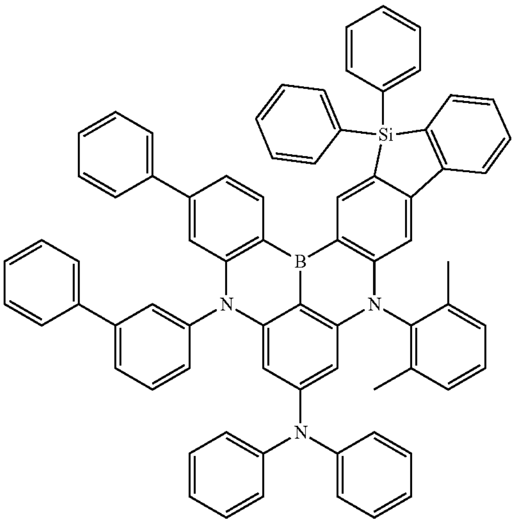

A-3

In the synthesis of Compound A-1, 2.4 g of Compound A-3 was obtained in the same manner as in the synthesis of Compound A-1 using C-22 (7 g) instead of C-5 (6.0 g). As a result of measuring the mass spectrum of the obtained solid, a peak was confirmed at $[M+H]^+$=1024 from Compound A-3.

[Synthesis Example 6] Synthesis of Compound A-8

A. Synthesis of Intermediate C-25

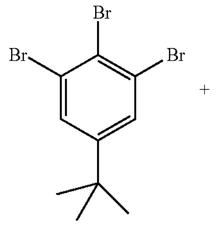

C-23

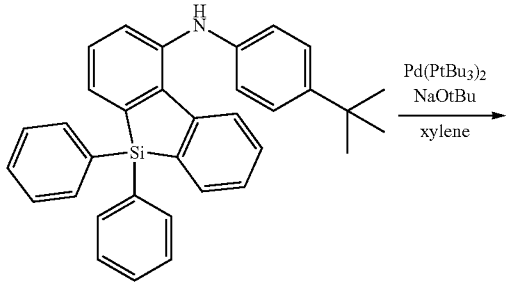

C-24

-continued

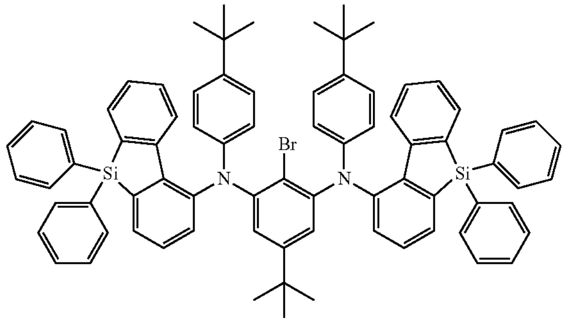

C-25

In the synthesis of Intermediate C-5, 16.6 g of Intermediate C-25 was obtained in the same manner as in the synthesis of Intermediate C-5 using C-23 (8 g) and C-24 (21.8 g) instead of C-3 (5 g) and C-4 (6.6 g). As a result of measuring the mass spectrum of the obtained solid, a peak was confirmed at $[M+H]^+=1171$.

B. Synthesis of Compound A-8

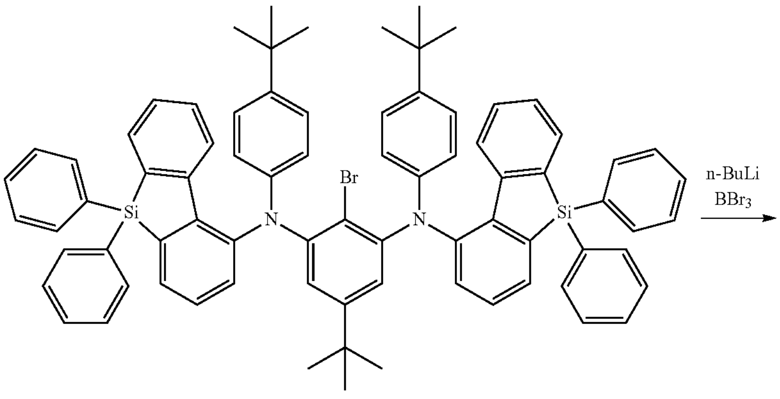

C-25

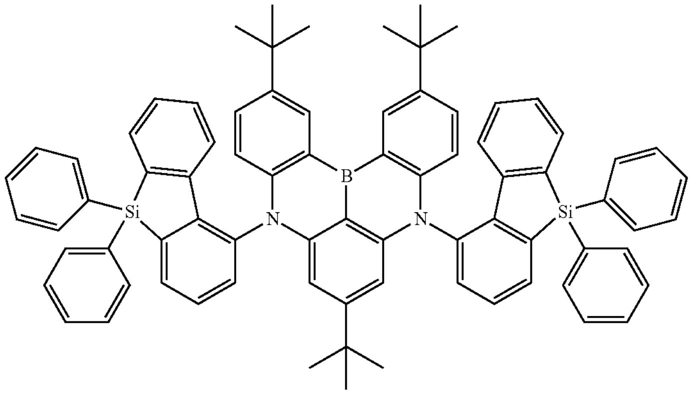

A-8

An n-butyllithium pentane solution (10.2 ml, 2.5 M in hexane) was added to a flask containing Intermediate C-25 (15 g) and toluene (80 ml) at 0° C. under an argon atmosphere. After the completion of dropwise addition, the resulting solution was warmed to 50° C. and stirred for 2 hours. The resulting solution was cooled to −40° C., boron tribromide (1.8 ml) was added thereto, and the resulting solution was stirred for 4 hours while being warmed to room temperature. Thereafter, the resulting solution was cooled again to 0° C., N, N-diisopropylethylamine (10 ml) was added thereto, and the reaction solution was further stirred at room temperature for 30 minutes. After the liquid was aliquoted by adding sat. aq. NaCl and ethyl acetate thereto, the solvent was distilled off under reduced pressure. The resulting product was purified with a silica gel column chromatography (eluent: hexane/toluene) to obtain Compound A-8 (1.8 g). As a result of measuring the mass spectrum of the obtained solid, a peak was confirmed at $[M+H]^+=1102$.

[Synthesis Example 7] Synthesis of Compound A-9

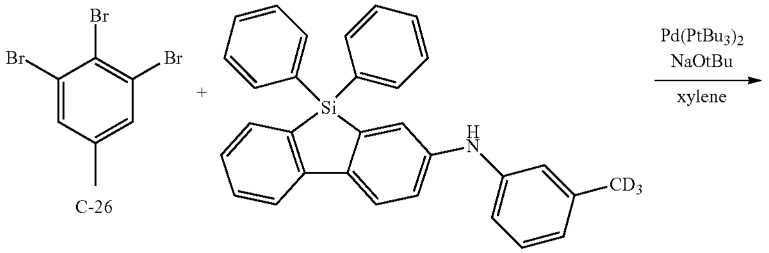

C-26

C-27

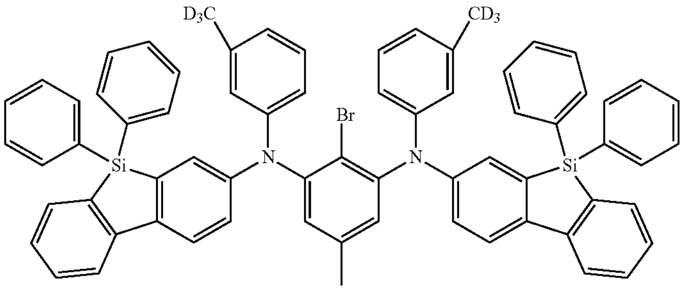

C-28

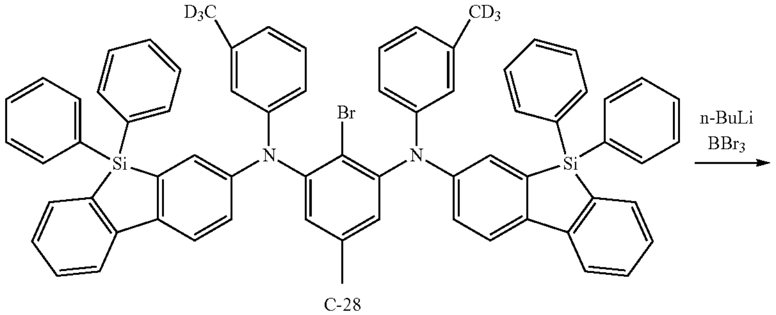

C-28

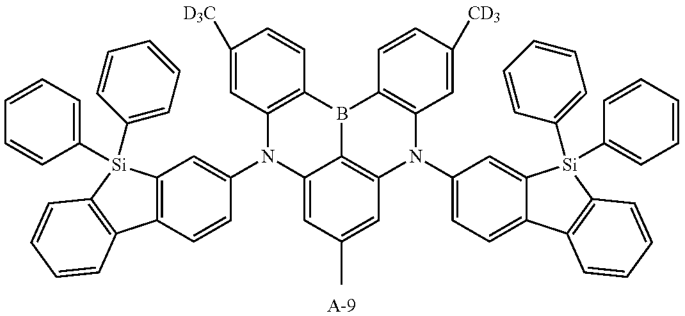

A-9

In the synthesis of Intermediate C-5, 14.6 g of Intermediate C-28 was obtained in the same manner as in the synthesis of Intermediate C-5 using C-26 (8 g) and C-27 (22.6 g) instead of C-3 (5 g) and C-4 (6.6 g). As a result of measuring the mass spectrum of the obtained solid, a peak was confirmed at $[M+H]^+=1051$.

In the synthesis of Compound A-8, 1.3 g of Compound A-9 was obtained in the same manner as in the synthesis of Compound A-8 using C-28 (13 g) instead of C-25 (15 g). As a result of measuring the mass spectrum of the obtained solid, a peak was confirmed at $[M+H]^+=981$.

[Synthesis Example 8] Synthesis of Compound A-6

A. Synthesis of Intermediate C-31

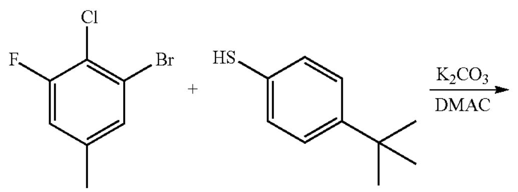

C-29 C-30

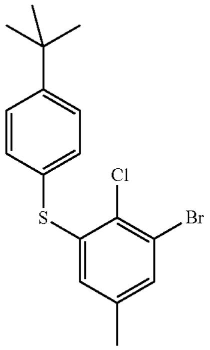

C-31

A flask containing Intermediate C-29 (20 g), C-30 (14.9 g), $K_2CO_3$ (24.7 g), and N,N-dimethylacetamide (DMAC) (200 mL) was heated at 160° C., and stirred for 12 hours. After the flask was cooled to room temperature, the liquid was aliquoted by adding ethyl acetate (300 mL) and water (200 mL) thereto, and then the organic layer was washed twice with aq. 1N NaOH. The solvent of the organic layer was distilled off under reduced pressure, and purified with silica gel column chromatography (eluent: hexane/toluene) to obtain Intermediate C-31 (13.5 g). As a result of measuring the mass spectrum of the obtained solid, a peak was confirmed at $[M+H]^+=369$.

B. Synthesis of Compound A-6

C-31 + C-4 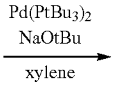

-continued

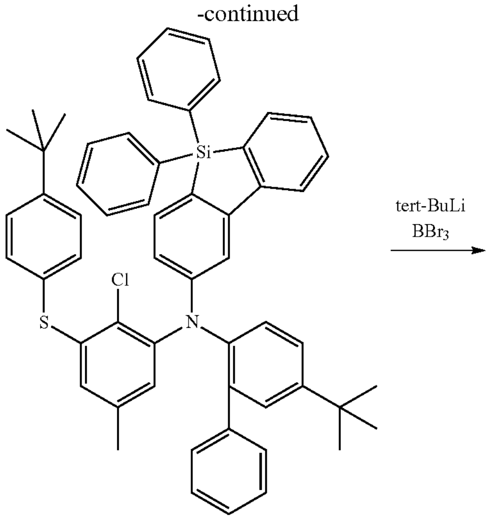

C-32

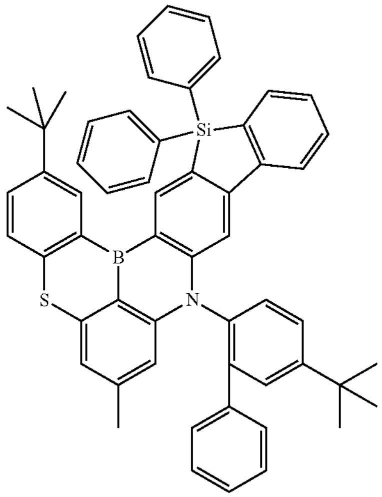

A-6

In the synthesis of Intermediate C-5, 14.3 g of Intermediate C-32 was obtained in the same manner as in the synthesis of Intermediate C-5 using C-31 (11 g) and C-4 (18 g) instead of C-3 (5 g) and C-4 (6.6 g). As a result of measuring the mass spectrum of the obtained solid, a peak was confirmed at $[M+H]^+=846$.

In the synthesis of Compound A-1, 1.5 g of Compound A-6 was obtained in the same manner as in the synthesis of Compound A-1 using C-32 (13 g) instead of C-5 (6.0 g). As a result of measuring the mass spectrum of the obtained solid, a peak was confirmed at $[M+H]^+=820$.

[Synthesis Example 9] Synthesis of Compound A-7

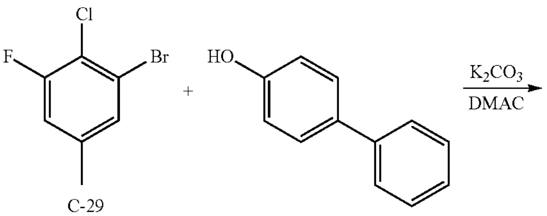

C-29 C-33

-continued

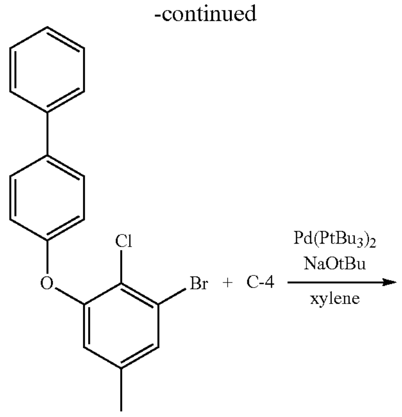

C-34

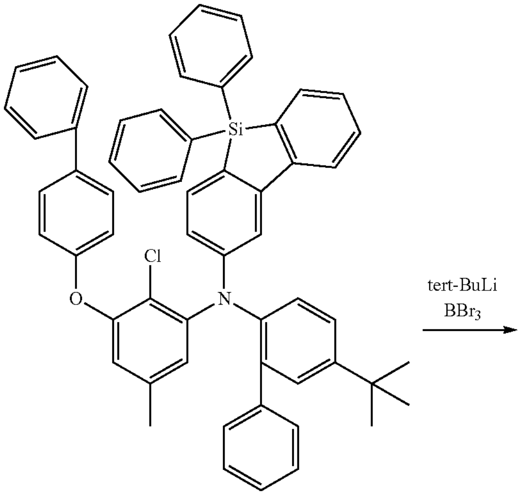

C-35

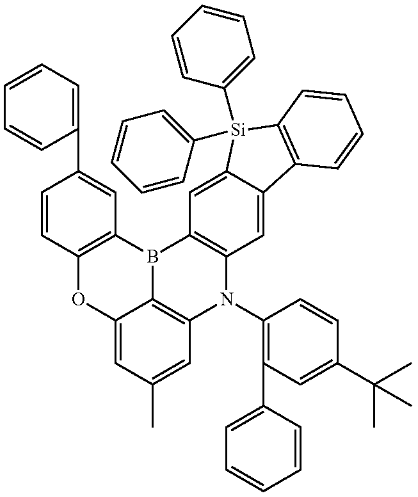

A-7

In the synthesis of Intermediate C-31, 8.8 g of Intermediate C-34 was obtained in the same manner as in the synthesis of Intermediate C-31 using C-29 (15 g) and C-33 (11.4 g) instead of C-29 (20 g) and C-30 (14.9 g). As a result of measuring the mass spectrum of the obtained solid, a peak was confirmed at $[M+H]^+=373$.

In the synthesis of Intermediate C-5, 12.2 g of Intermediate C-35 was obtained in the same manner as in the synthesis of Intermediate C-5 using C-34 (8 g) and C-4 (13 g) instead of C-3 (5 g) and C-4 (6.6 g). As a result of measuring the mass spectrum of the obtained solid, a peak was confirmed at $[M+H]^+=850$.

In the synthesis of Compound A-1, 0.9 g of Compound A-7 was obtained in the same manner as in the synthesis of Compound A-1 using C-35 (10 g) instead of C-5 (6.0 g). As a result of measuring the mass spectrum of the obtained solid, a peak was confirmed at $[M+H]^+=824$.

EXPERIMENTAL EXAMPLES

Experimental Example 1

Example 1

A glass substrate thinly coated with indium tin oxide (ITO) to have a thickness of 1, 300 Å was put into distilled water in which a detergent was dissolved, and ultrasonically washed. In this case, a product manufactured by Fischer Co., was used as the detergent, and distilled water, which had been filtered twice with a filter manufactured by Millipore Co., was used as the distilled water. After the ITO was washed for 30 minutes, ultrasonic washing was repeated twice by using distilled water for 10 minutes. After the washing using distilled water was completed, the substrate was ultrasonically washed with a solvent of isopropyl alcohol, acetone and methanol, dried, and then transported to a plasma cleaner. Furthermore, the substrate was cleaned by using oxygen plasma for 5 minutes, and then was transported to a vacuum deposition machine.

The following compound HAT was thermally vacuum-deposited to have a thickness of 50 Å on the ITO transparent electrode thus prepared, thereby forming a hole injection layer. The following compound HT-A was vacuum-deposited as a first hole transport layer to have a thickness of 1,000 Å thereon, and subsequently, the following compound HT-B was deposited to have a thickness of 100 Å as a second hole transport layer. A host BH-A and a dopant Compound A-1 were vacuum-deposited at a weight ratio of 97:3, thereby forming a light emitting layer having a thickness of 200 Å.

Next, the following compound ET-A was vacuum-deposited to have a thickness of 50 Å as a first electron transport layer, subsequently, the following compound ET-B and the following compound Liq were deposited at a ratio of 1:1 to have a thickness of 300 Å as a second electron transport layer which simultaneously injects and transports electrons, sequentially, magnesium and silver (mass ratio 10:1) were simultaneously deposited to have a thickness of 500 Å thereon to form a cathode, thereby manufacturing an organic light emitting device.

In the aforementioned procedure, the deposition rate of the organic materials were maintained at 0.4 to 1.0 Å/sec, the deposition rates of silver and magnesium were maintained at 2 Å/sec, and the degree of vacuum during the deposition was maintained at $5\times10^{-8}$ to $1\times10^{-7}$ torr, thereby manufacturing an organic light emitting device.

HAT

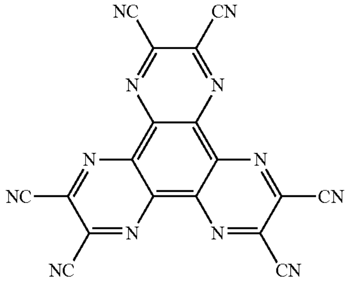

-continued
HT-A
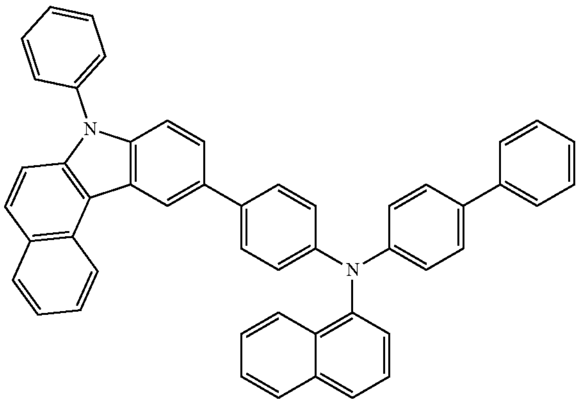
HT-B
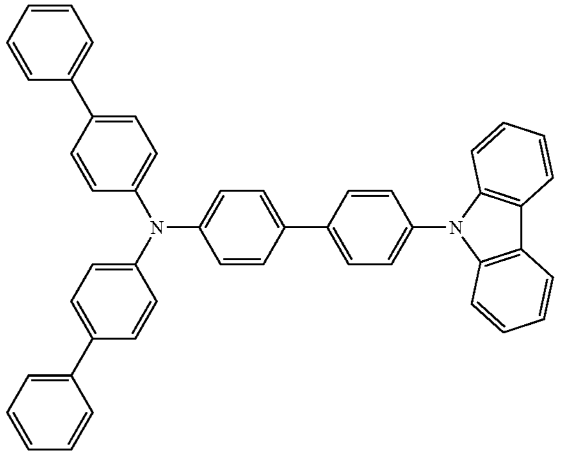
ET-A
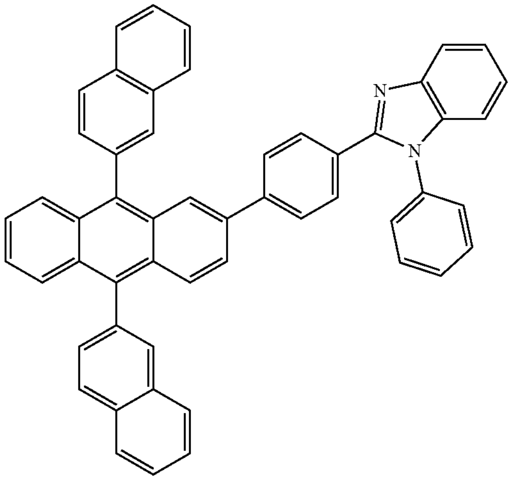
-continued
ET-B
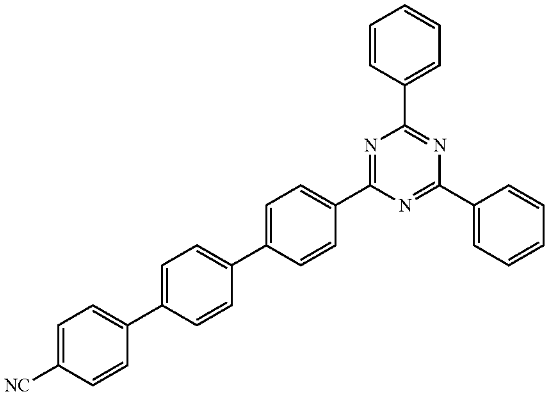
Liq
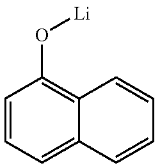
BH-A
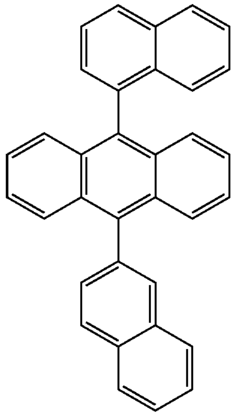
BH-B
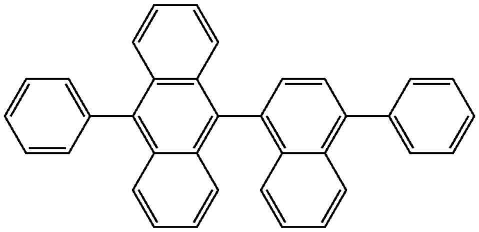
BH-C
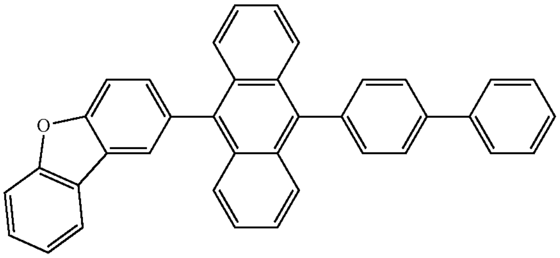

-continued

BH-D

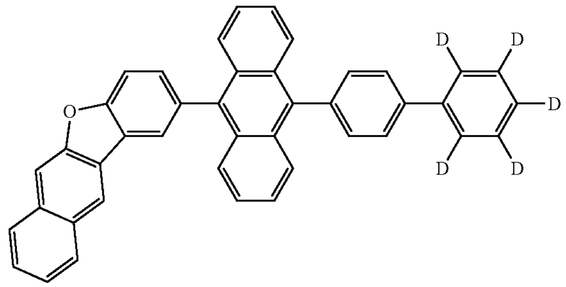

Examples 2 to 11

Organic light emitting devices were manufactured in the same manner as in Example 1, except that the host and dopant compounds described in the following Table 1 were used as materials for a light emitting layer in Example 1.

Comparative Examples 1 to 4

Organic light emitting devices were manufactured in the same manner as in Example 1, except that the host and dopant compounds described in the following Table 1 were used as materials for a light emitting layer in Example 1.

X-1

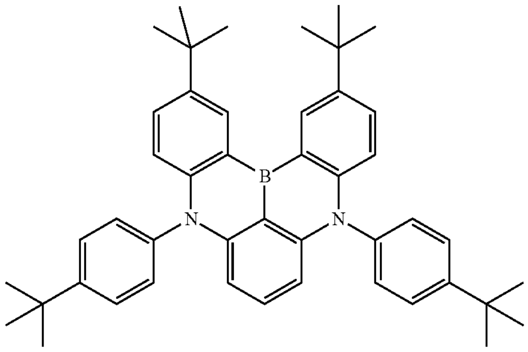

X-2

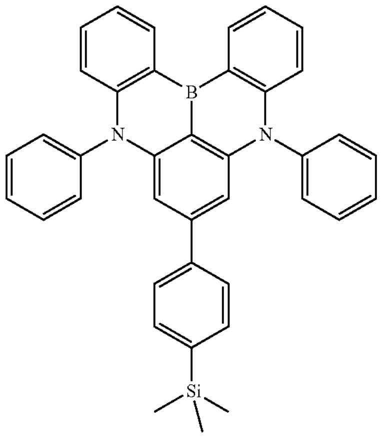

-continued

X-3

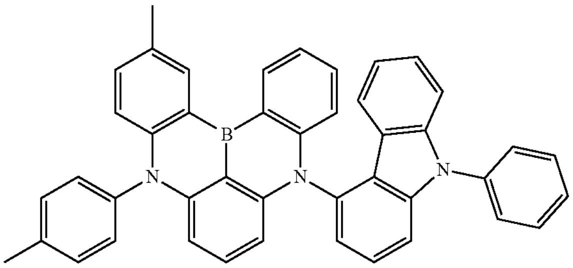

Examples 12 to 18 and Comparative Examples 5 and 6

Organic light emitting devices were manufactured in the same manner as in Example 1, except that the host and dopant compounds described in the following Table 1 were used as materials for a light emitting layer in Example 1. Specifically, as the host, a first host and a second host were used as a weight ratio of 1:1 instead of BH-A of Example 1.

TABLE 1

| | First host (Light emitting layer) | Second host (Light emitting layer) | Dopant (Light emitting layer) |
|---|---|---|---|
| Example 1 | BH-A | — | A-1 |
| Example 2 | BH-A | — | A-2 |
| Example 3 | BH-A | — | A-4 |
| Example 4 | BH-A | — | A-6 |
| Example 5 | BH-A | — | A-8 |
| Comparative Example 1 | BH-A | — | X-1 |
| Comparative Example 2 | BH-A | — | X-2 |
| Example 6 | BH-B | — | A-2 |
| Example 7 | BH-C | — | A-1 |
| Example 8 | BH-C | — | A-4 |
| Example 9 | BH-C | — | A-8 |
| Example 10 | BH-D | — | A-2 |
| Example 11 | BH-D | — | A-8 |
| Comparative Example 3 | BH-C | — | X-3 |
| Comparative Example 4 | BH-D | — | X-2 |
| Example 12 | BH-A | BH-C | A-1 |
| Example 13 | BH-A | BH-C | A-4 |
| Example 14 | BH-B | BH-C | A-2 |
| Example 15 | BH-A | BH-D | A-1 |
| Example 16 | BH-B | BH-D | A-4 |
| Example 17 | BH-B | BH-D | A-6 |
| Example 18 | BH-C | BH-D | A-2 |
| Comparative Example 5 | BH-A | BH-C | X-1 |
| Comparative Example 6 | BH-B | BH-C | X-2 |

For each of the organic light emitting devices manufactured by Examples 1 to 18 and Comparative Examples 1 to 6, the driving voltage and the efficiency were measured at a current density of 10 $mA/cm^2$, and the results are shown in the following Table 2.

TABLE 2

| entry | 10 mA/cm$^2$ Driving voltage (V) | Light emitting efficiency (cd/A) |
|---|---|---|
| Example 1 | 4.3 | 3.85 |
| Example 2 | 4.3 | 4.11 |
| Example 3 | 4.3 | 3.87 |
| Example 4 | 4.2 | 3.81 |
| Example 5 | 4.2 | 3.93 |
| Comparative Example 1 | 4.5 | 3.74 |
| Comparative Example 2 | 4.6 | 3.52 |
| Example 6 | 4.3 | 4.15 |
| Example 7 | 4.1 | 3.81 |
| Example 8 | 4.1 | 3.91 |
| Example 9 | 4.1 | 3.92 |
| Example 10 | 4 | 3.89 |
| Example 11 | 3.9 | 3.99 |
| Comparative Example 3 | 4.4 | 3.70 |
| Comparative Example 4 | 4.5 | 3.55 |
| Example 12 | 4.223 | 3.89 |
| Example 13 | 4.2 | 4.00 |
| Example 14 | 4.1 | 4.00 |
| Example 15 | 4.1 | 3.98 |
| Example 16 | 4.2 | 4.09 |
| Example 17 | 4.2 | 3.77 |
| Example 18 | 3.9 | 3.99 |
| Comparative Example 5 | 4.4 | 3.72 |
| Comparative Example 6 | 4.4 | 3.51 |

Experimental Example 2

X-4

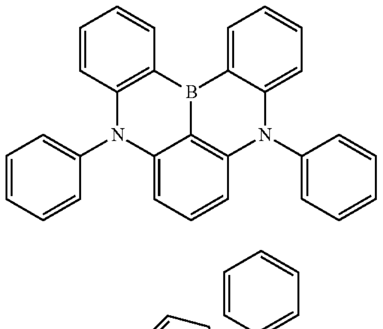

B-1

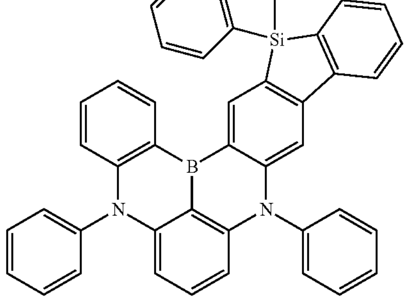

-continued

B-2

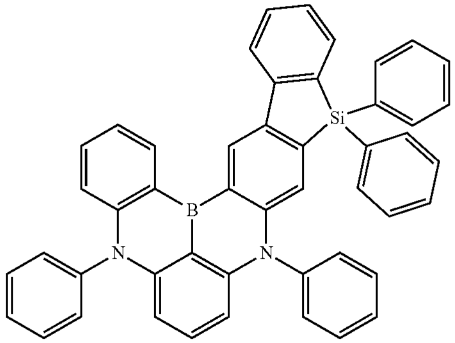

B-3

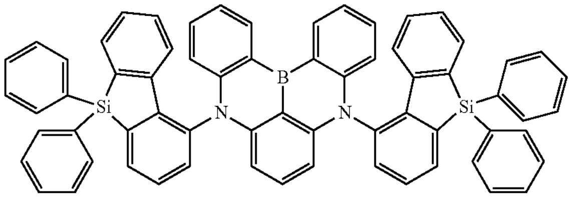

The energy levels of singlet ($S_1$) and the triplet ($T_1$) were calculated in the absorption state of the molecule using the compound by TD-DFT (B3LYP) method/6-31G* basis method. The calculation results are shown in the following Table 3.

TABLE 3

| | Compound | $S_1$ (eV) | $T_1$ (eV) | $\Delta E_{ST}$ (eV) |
|---|---|---|---|---|
| Comparative Example 7 | X-4 | 3.14 | 2.64 | 0.50 |
| Comparative Example 8 | X-2 | 3.05 | 2.54 | 0.51 |
| Example 19 | B-1 | 2.97 | 2.54 | 0.43 |
| Example 20 | B-2 | 2.94 | 2.49 | 0.45 |
| Example 21 | B-3 | 2.99 | 2.61 | 0.38 |

$\Delta E_{ST}$ is defined as an absolute value of the difference between $E_S$ (singlet energy level, eV) and $E_T$ (triplet energy level, eV). $\Delta E_{ST}$ of each of the compounds B-1 to B-3 in Examples 19 to 21 has a value smaller than those of X-2 and X-4. The value ($\Delta E_{ST}$) of the difference between triplet energy and singlet energy of the compound of Formula 1 is less than 0.5 eV (more preferably 0.15 eV or less), and the smaller the value is, the higher the quantum yield of the material is due to the thermally activated delayed fluorescence (TADF) effect when the compound is used as a dopant of the light emitting layer, and accordingly, the efficiency of the device may also be enhanced.

The thermally activated delayed fluorescence means a phenomenon in which the reverse intersystem crossing is induced from the triplet excited state to the singlet excited state by thermal energy, and the excitons in the singlet excited state move to the ground state to cause fluorescence emission.

Experimental Example 3

The value ($\Delta E_{ST}$) of the difference between triplet energy and singlet energy of the compound of Formula 1 was actually measured, and a measuring device used for the measurement was a JASCO FP-8600 fluorescence spectrophotometer.

The singlet energy $E_S$ may be obtained as follows. A sample for measurement is prepared by dissolving a compound to be measured, using toluene as a solvent, at a concentration of 1 μM. The sample solution is put into a quartz cell and degassed using nitrogen gas ($N_2$) to remove oxygen in the solution, and then the fluorescence spectrum is measured at room temperature (300 K) using a measuring device. In this case, the wavelength value (nm) of the maximum emission peak is obtained, and the value obtained by converting the wavelength value (nm) into an energy value (eV) is defined as the singlet energy $E_S$ (eV).

The triplet energy $E_T$ may be obtained as follows by connecting PMU-830 as a temperature adjusting device to the JASCO FP-8600 fluorescence spectrophotometer measurement device. The quartz cell containing the sample solution from which oxygen is removed, prepared to obtain the singlet energy, is placed in an apparatus containing liquid nitrogen ($N_2$). After temperature stabilization (77 K), the phosphorescence spectrum, which is the emission delayed for 20 microseconds, is measured. In this case, the phosphorescence spectrum has a wavelength (λ, unit: nm) on the x-axis and a luminescence degree on the y-axis, and when a tangential line that goes down in the short wavelength direction from the maximum emission peak at the longest wavelength is drawn, a wavelength value (nm) at a point where the tangential line and the x-axis meet is obtained as in FIG. 3. A value obtained by converting the wavelength value (nm) into an energy value (eV) is defined as a triplet energy $E_T$ (eV).

The singlet energy, the triplet energy, and the value of difference therebetween were obtained using the following compounds by the aforementioned method.

TABLE 4

| | Compound | Singlet energy (eV) | Triplet energy (eV) | $\Delta E_{ST}$ (eV) |
|---|---|---|---|---|
| Example 22 | Compound A-1 | 2.68 | 2.56 | 0.12 |
| Example 23 | Compound A-2 | 2.67 | 2.59 | 0.08 |

The value ($\Delta E_{ST}$) of the difference between triplet energy and singlet energy of the compound of Formula 1 is less than 0.5 eV, more preferably 0.15 eV or less, and when the value satisfies the above range, a high quantum efficiency may be obtained. It was confirmed through Examples 22 and 23 that $\Delta E_{ST}$ of each of Compounds A-1 and A-2 satisfied the above range, and the resulting thermally activated delayed fluorescence effects were indirectly confirmed through comparison of the device data of the Examples and the Comparative Examples in Table 2.

Experimental Example 4

An organic device was manufactured as in the following structures of the hole-only and electron-only devices, in the similar manner as in Example 1.

<Structure of Hole Only Device>

ITO/F4TCNQ (Thickness 100 Å)/HT-A (1000 Å)/HT-B (50 Å)/BH-C(200 Å)+A-1 (3 wt % doping)/HAT (100 Å)/Ag 1000 Å

<Structure of Electron Only Device>

ITO/Mg+Ag (10:1 mass ratio, thickness 330 Å)/Liq (10 Å)/BH-B (200 Å)+A-1 (3 wt % doping)/ET-A (50 Å)/ET-B+Liq (155 Å +155 Å)/Mg+Ag (10:1 mass ratio, thickness 330 Å)/Al (800 Å)

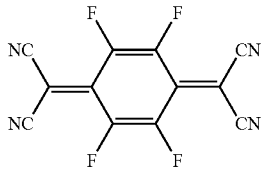

F4TCNQ

The charge mobility may be measured by measuring the time required for the charges (holes or electrons) generated by the potential difference to move to the opposite electrode in the device. The related measurement data are illustrated in FIG. 4.

According to the results in FIG. 4, it can be confirmed that Compounds X-1, X-2 and A-1 have relatively similar electron transfer characteristics, but Compound A-1 has very good hole transfer characteristics. Compound A-1 with improved hole transfer characteristics may improve the efficiency of the device by achieving the charge balance to move the light emitting zone of the device, which is generally biased toward the hole transport layer, and may also lower the driving voltage of the device.

The invention claimed is:

1. A compound of the following Formula 1:

[Formula 1]

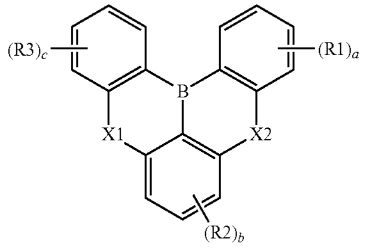

wherein, in Formula 1,

X1 and X2 are each independently NR; O; or S,

R and R1 to R3 are each independently hydrogen; deuterium; a halogen group; a substituted or unsubstituted amine group; a substituted or unsubstituted alkyl group; a substituted or unsubstituted cycloalkyl group; a substituted or unsubstituted silyl group; a substituted or unsubstituted aryl group; or a substituted or unsubstituted heterocyclic group, or optionally bonded to an adjacent group of R and R1 to R3 to form a ring of

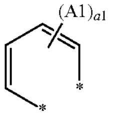

or

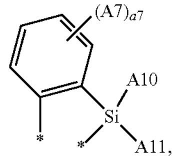

a and c are each independently an integer from 0 to 4, b is an integer from 0 to 3, when a to c are each independently 2 or higher, substituents in the parentheses are the same as or different from each other, A1, A7, A10 and A11 are each independently hydrogen; deuterium; a halogen group; a substituted or unsubstituted alkyl group; a substituted or unsubstituted cycloalkyl group; a substituted or unsubstituted amine group; a substituted or unsubstituted aryl group; or a substituted or unsubstituted heterocyclic group, a1 and a7 are each an integer from 0 to 4, when a1 and a7 are each independently 2 or higher, substituents in the parentheses are the same as or different from each other,

* denotes a bonding position, and wherein at least one selected from the group of a ring formed by a plurality of R1s bonded to each other, a ring formed by a plurality of R3s bonded to each other, and R includes a substituted or unsubstituted dibenzosilole group.

2. The compound of claim 1, wherein the compound of Formula 1 has 1 to 3 silicon atoms.

3. The compound of claim 1, wherein the compound of Formula 1 is one of the following Formulae 2 to 4:

[Formula 2]

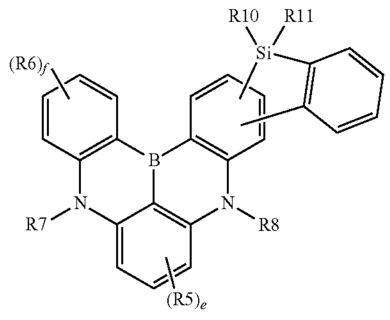

[Formula 3]

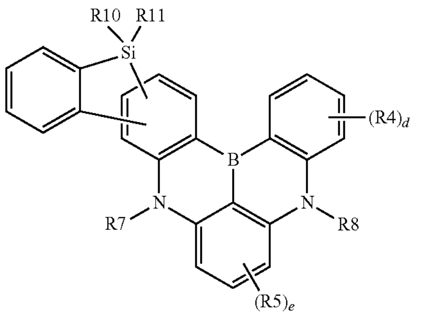

[Formula 4]

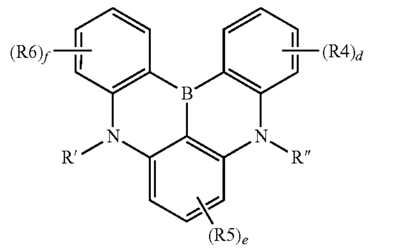

wherein, in Formulae 2 to 4,

R4 to R8 are each independently hydrogen; deuterium; a halogen group; a substituted or unsubstituted amine group; a substituted or unsubstituted alkyl group; a substituted or unsubstituted cycloalkyl group; a substituted or unsubstituted silyl group; a substituted or unsubstituted aryl group; or a substituted or unsubstituted heterocyclic group comprising N, O, or S, d and f are each independently an integer from 0 to 4, e is an integer from 0 to 3, when d to f are each independently 2 or higher, substituents in the parentheses are the same as or different from each other, R' and R" are each independently a substituted or unsubstituted alkyl group; a substituted or unsubstituted cycloalkyl group; a substituted or unsubstituted silyl group; a substituted or unsubstituted aryl group; or a substituted or unsubstituted heterocyclic group, and at least one of R' and R" comprises the following Formula 5,

[Formula 5]

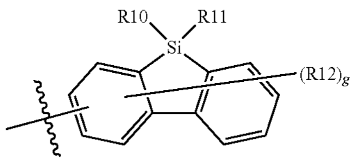

wherein, in Formula 5,

R10 and R11 are each independently a substituted or unsubstituted alkyl group; or a substituted or unsubstituted aryl group, R12 is hydrogen; deuterium; a substituted or unsubstituted alkyl group; a substituted or unsubstituted cycloalkyl group; a substituted or unsubstituted silyl group; a substituted or unsubstituted aryl group; or a substituted or unsubstituted heterocyclic group comprising N, O, or S, g is an integer from 0 to 7, and when g is 2 or higher, substituents in the parentheses are the same as or different from each other.

4. The compound of claim 1, wherein the compound of Formula 1 is any one selected from the group of the following compounds:

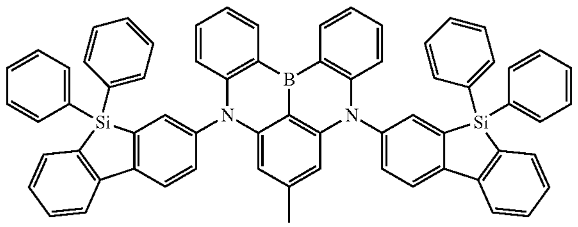

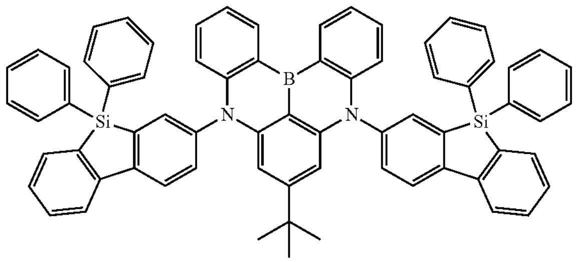

-continued
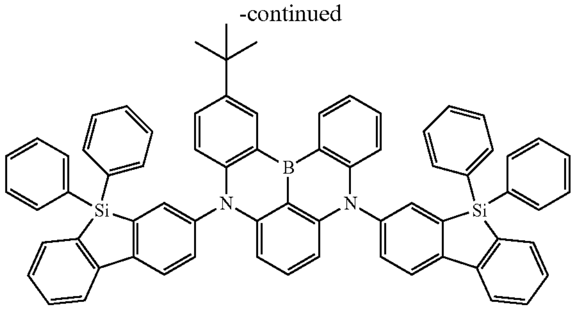
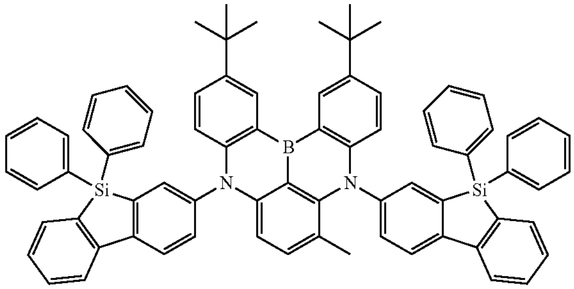
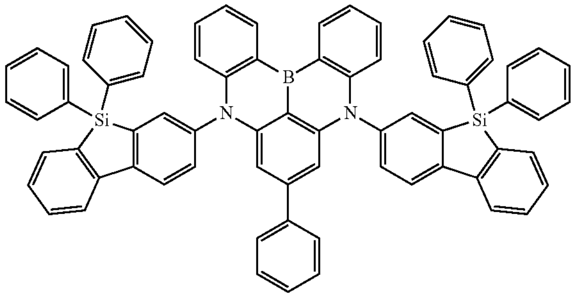
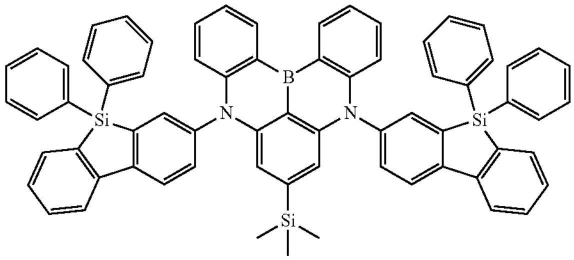
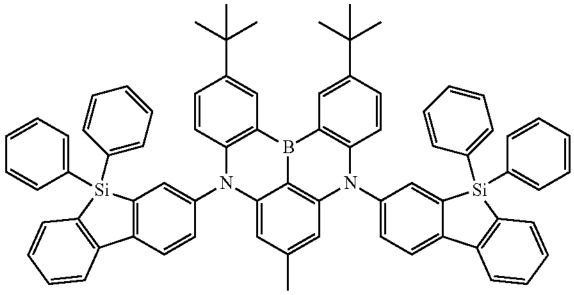
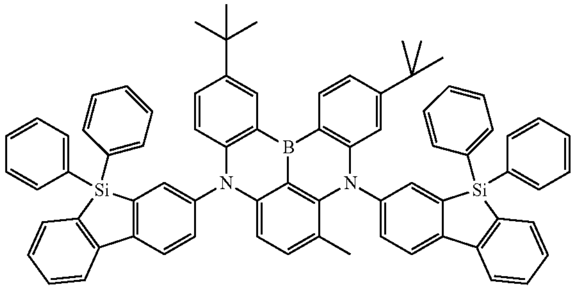
-continued
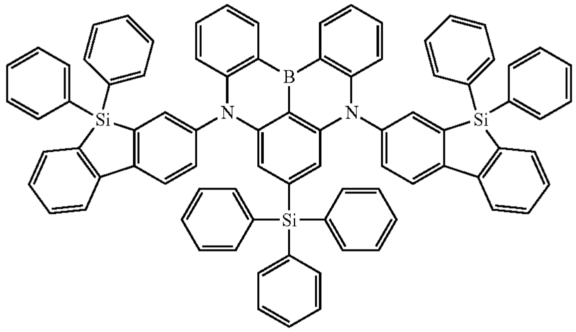
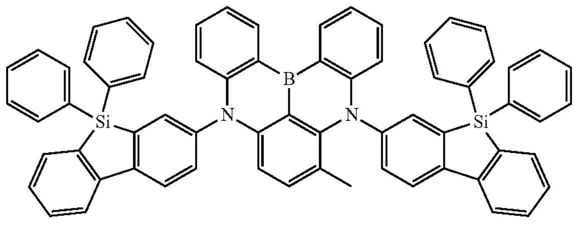
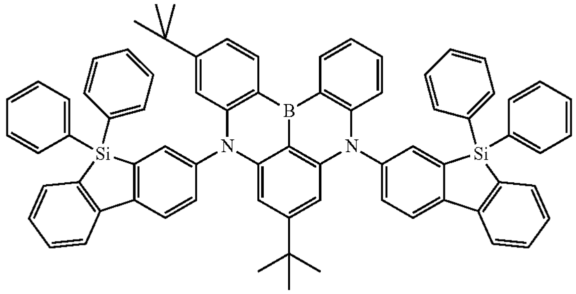
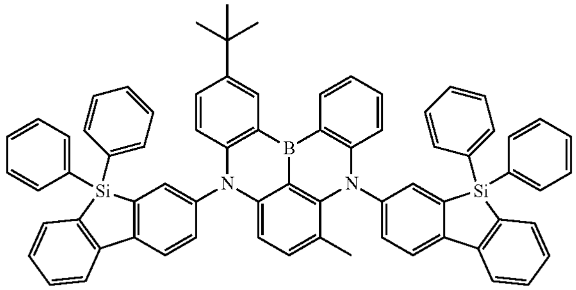
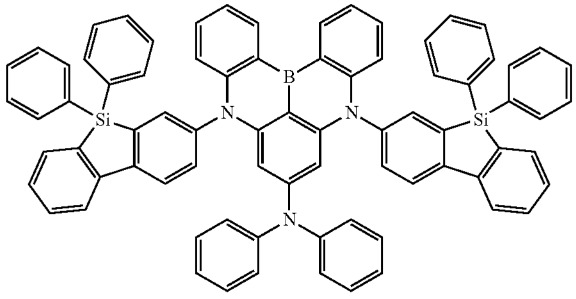
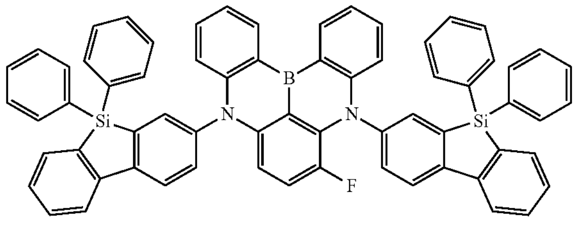

-continued
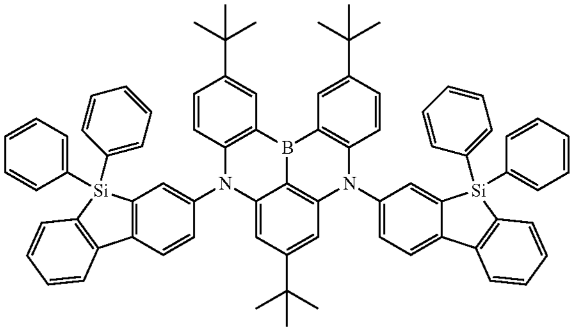
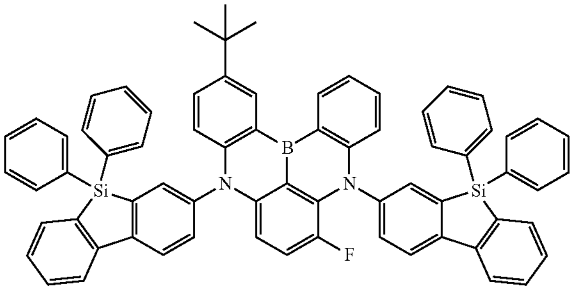
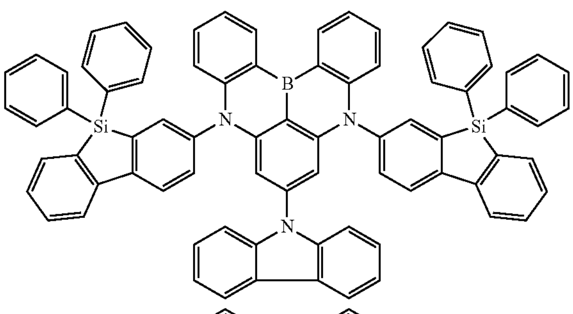
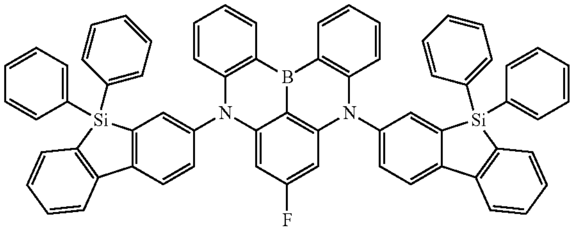
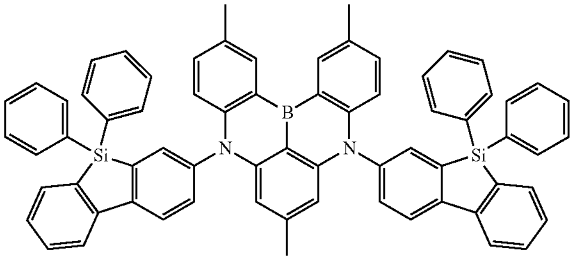
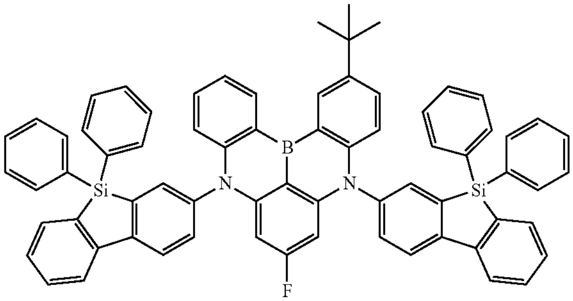
-continued
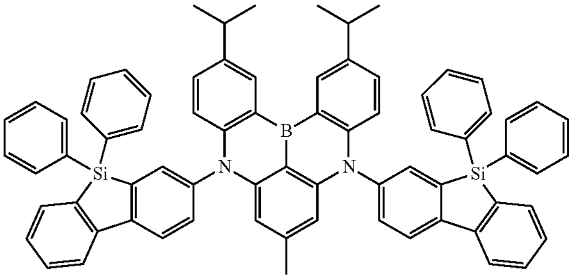
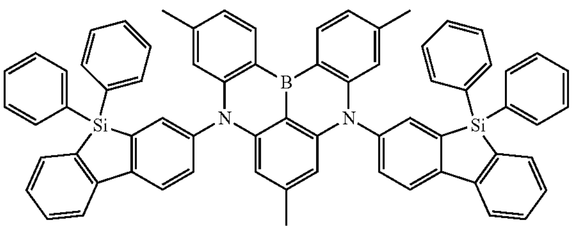
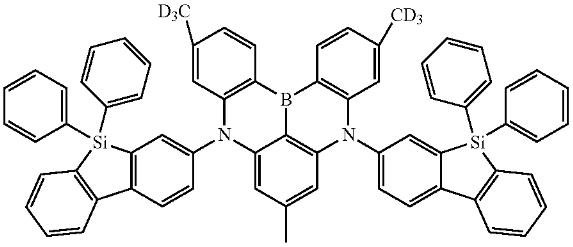
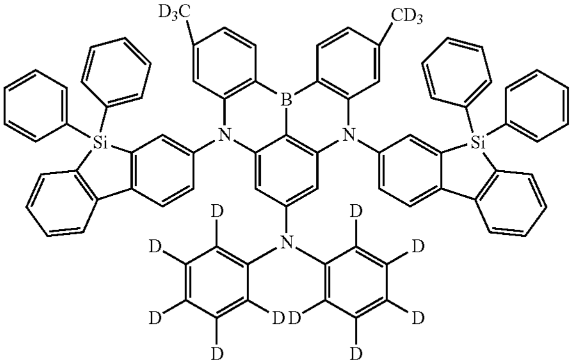
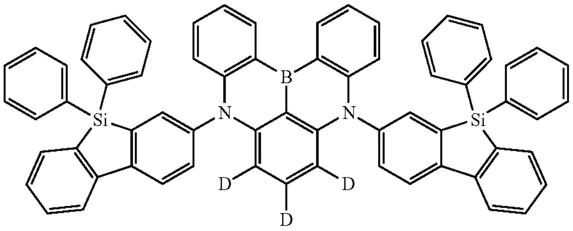
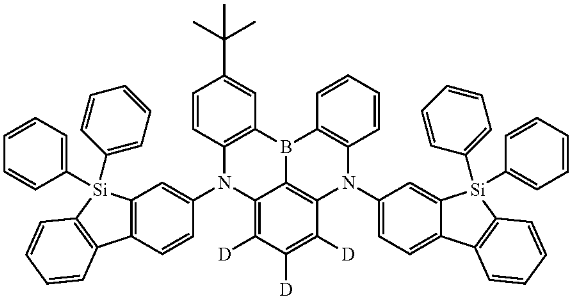

-continued
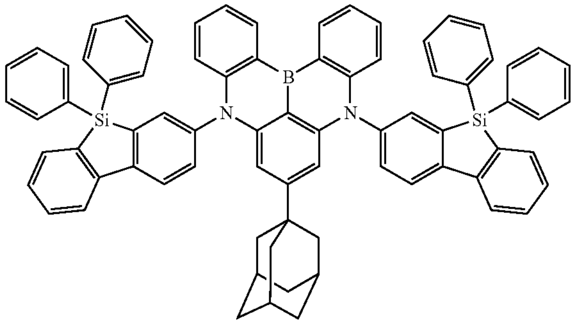
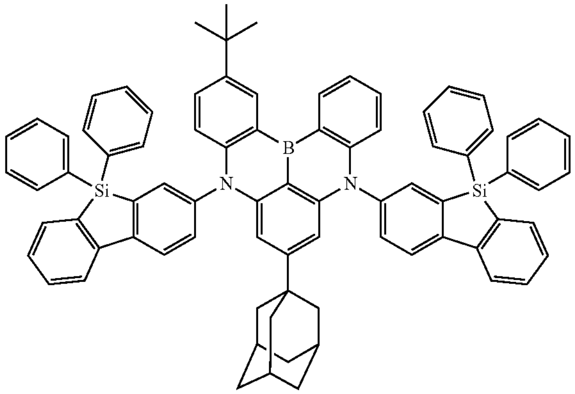
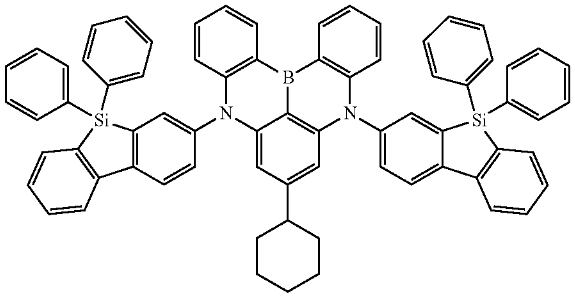
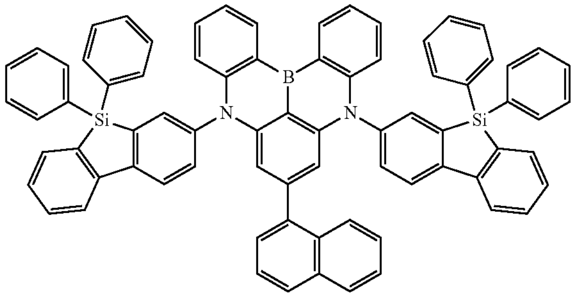
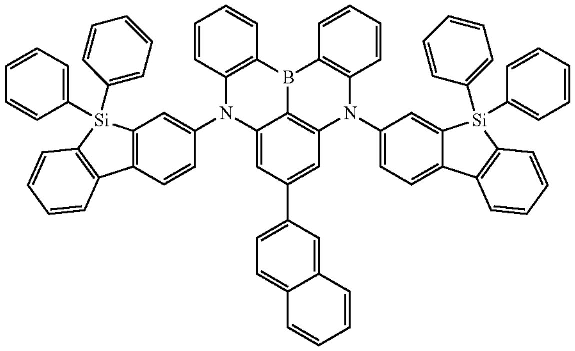
-continued
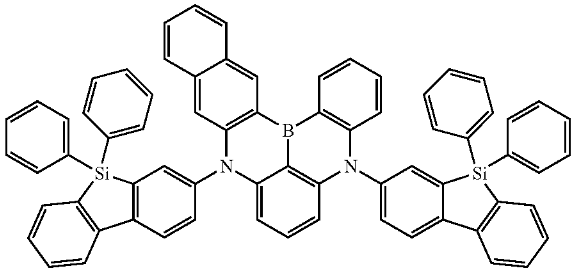
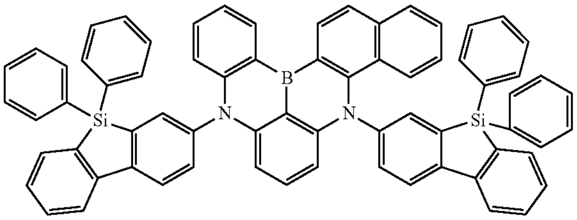
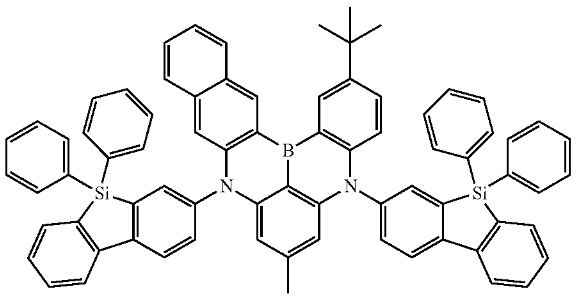
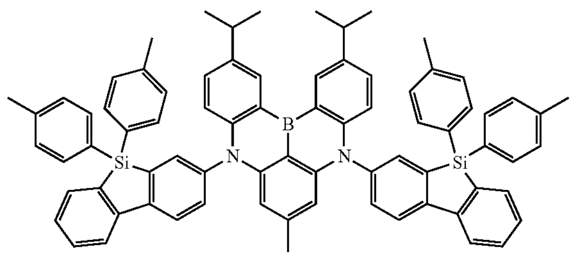
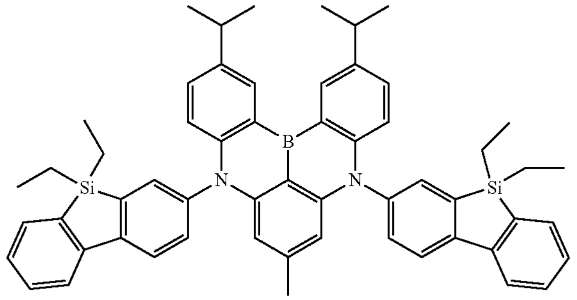
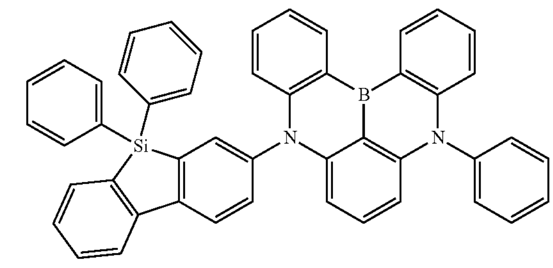

-continued
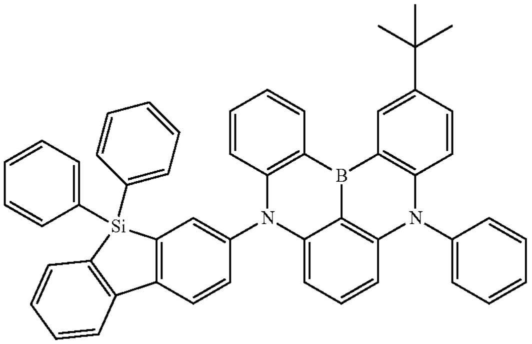
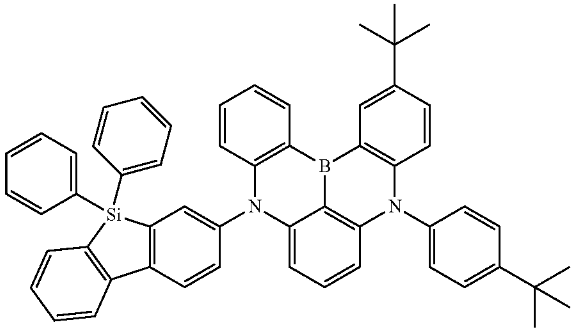
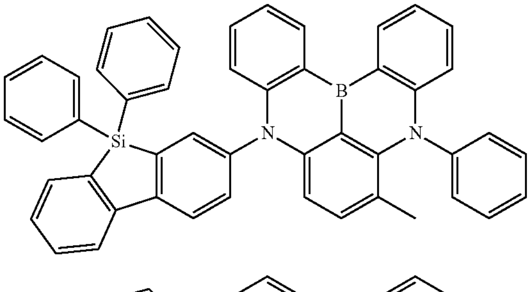
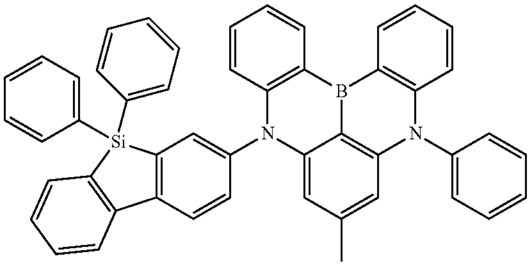
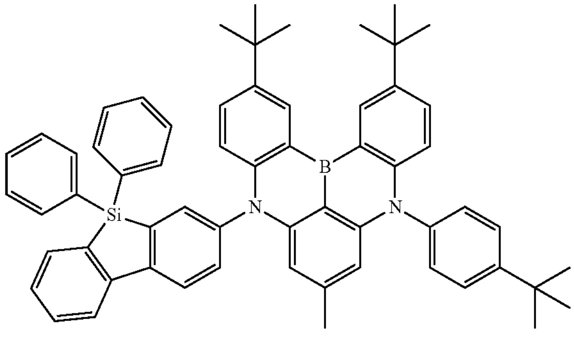
-continued
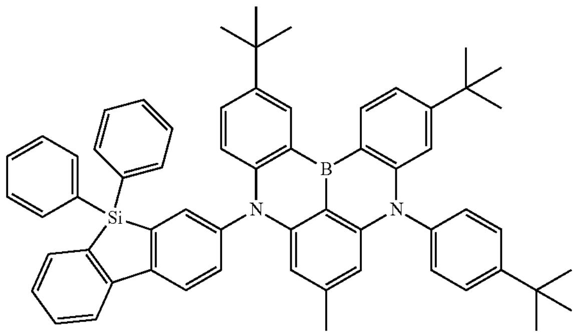
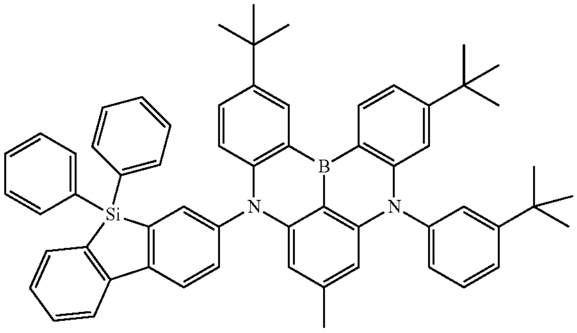
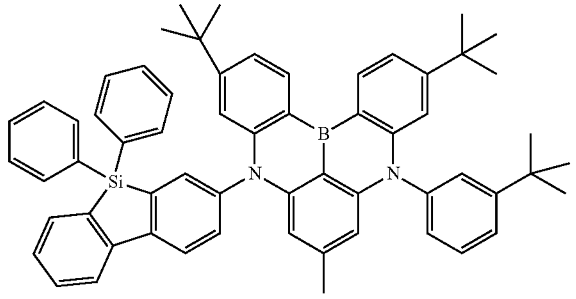
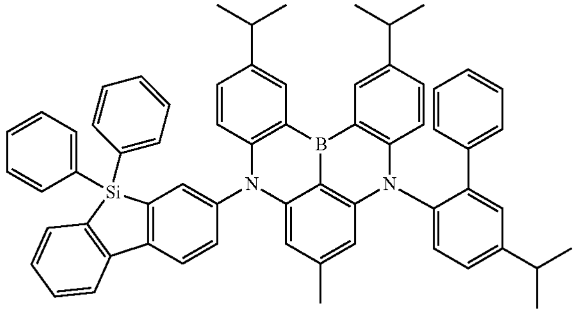
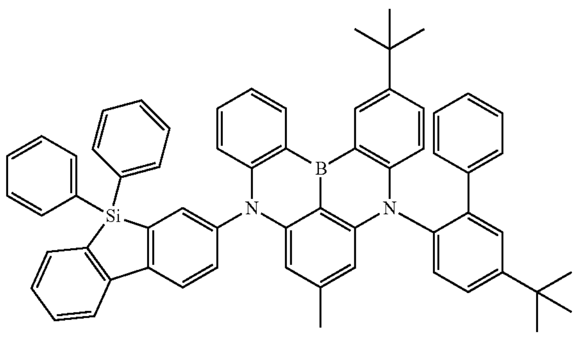

-continued
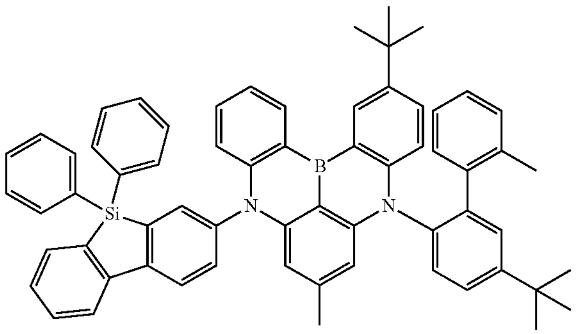
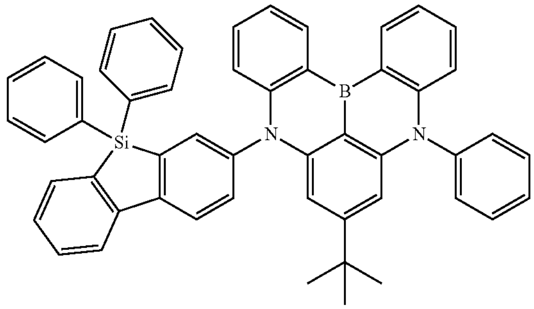
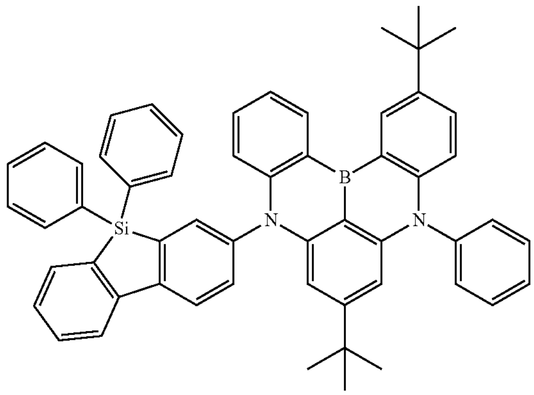
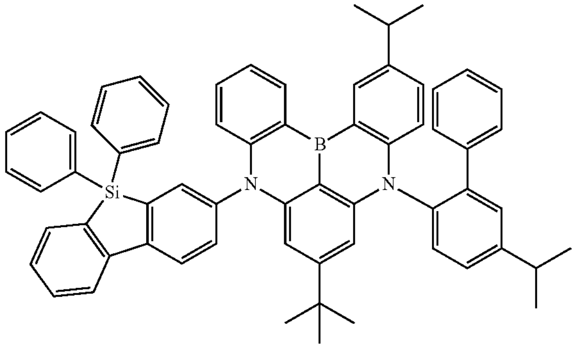
-continued
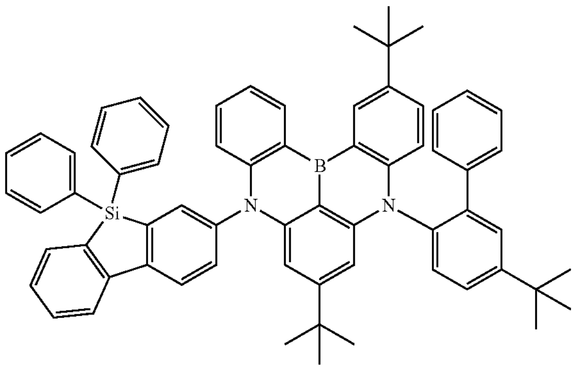
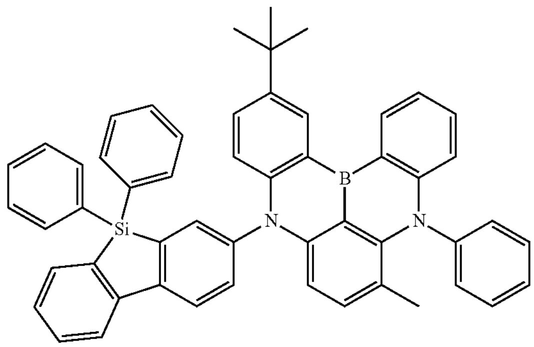
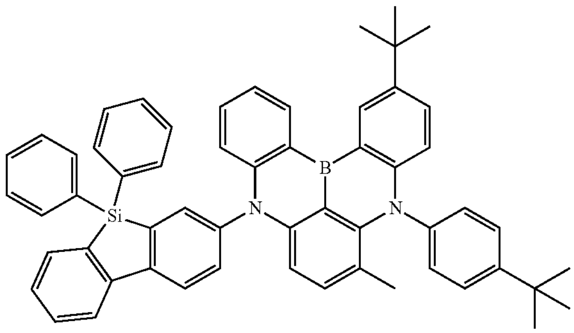
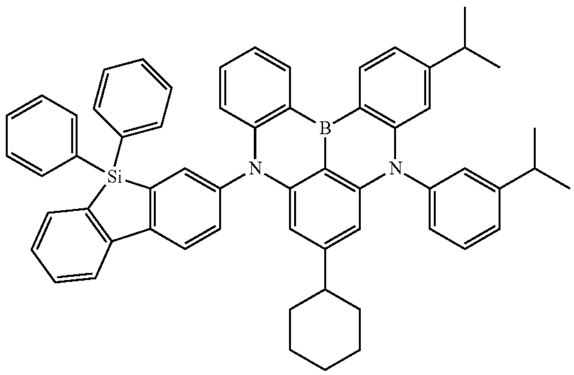

-continued
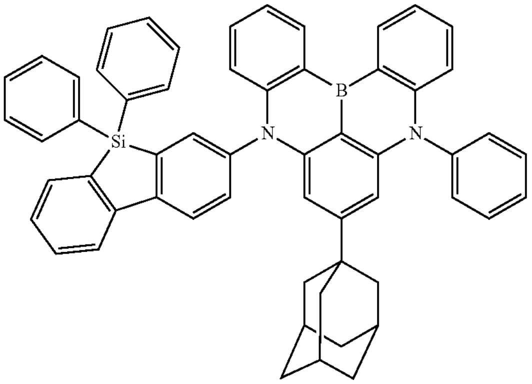
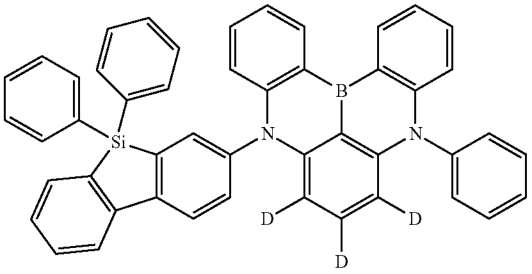
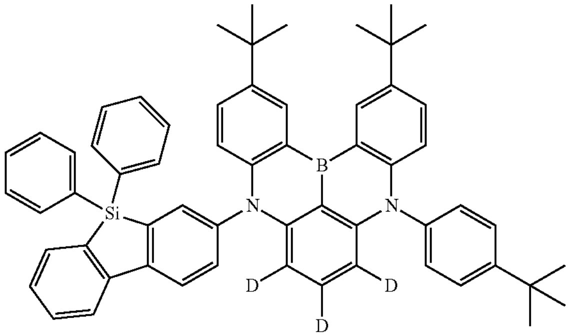
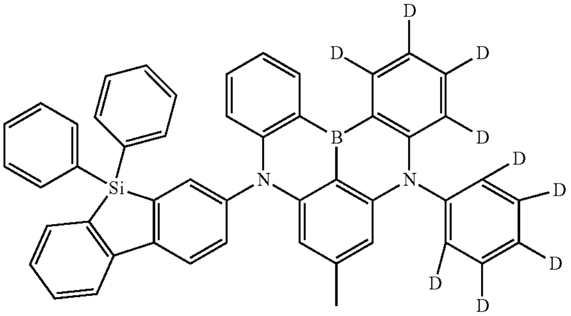
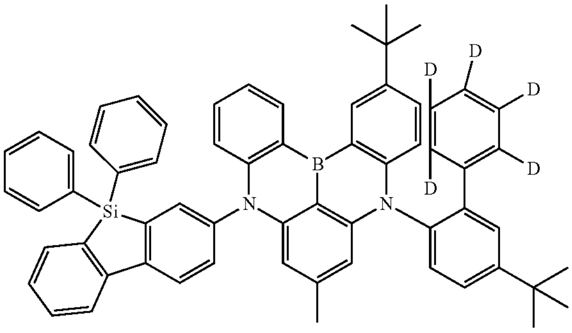
-continued
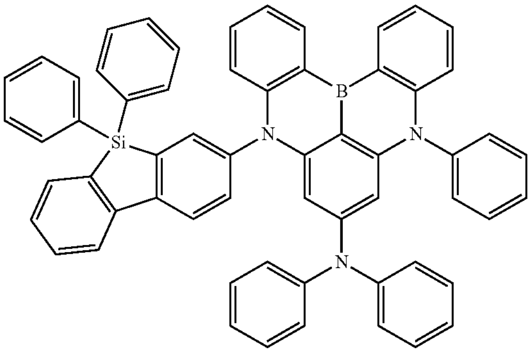
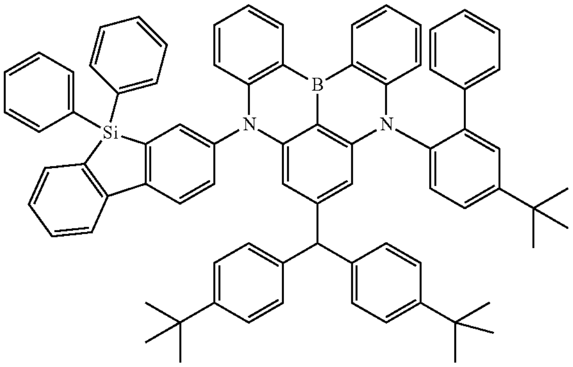
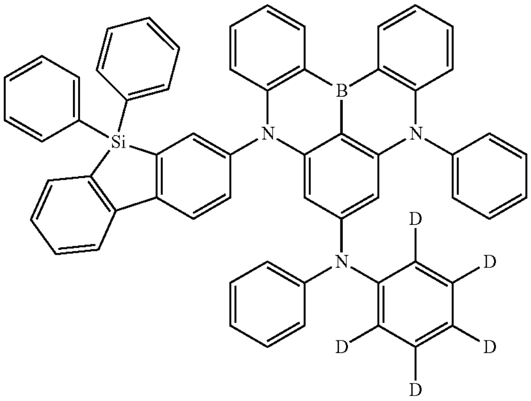
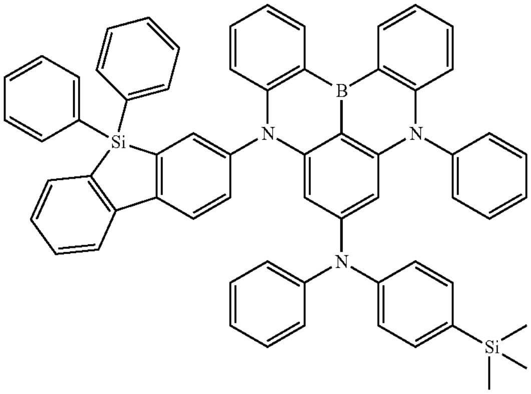

-continued
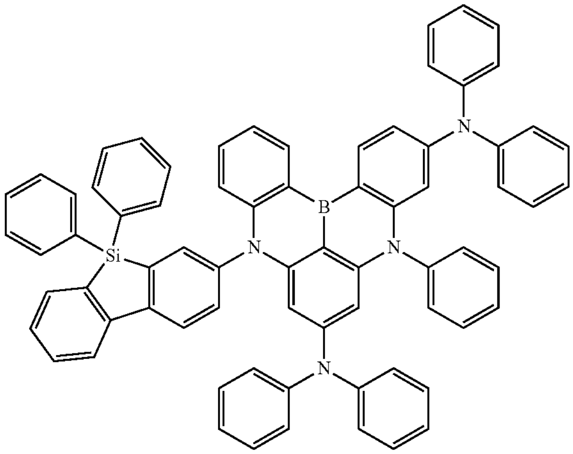
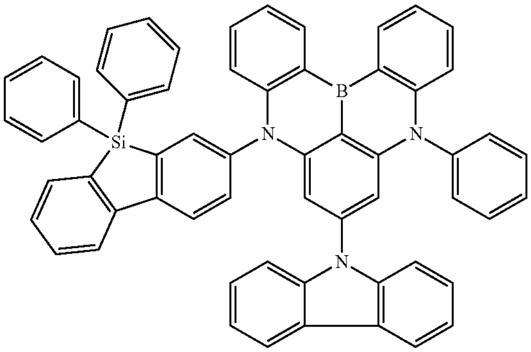
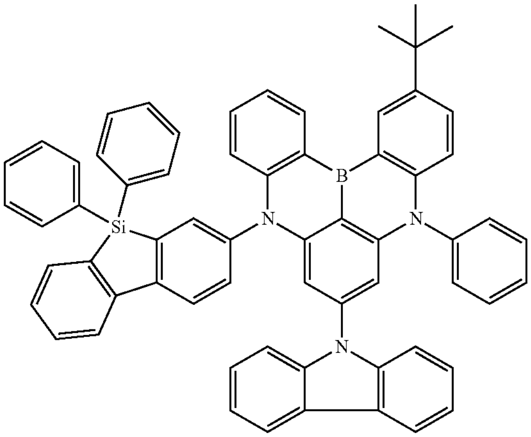
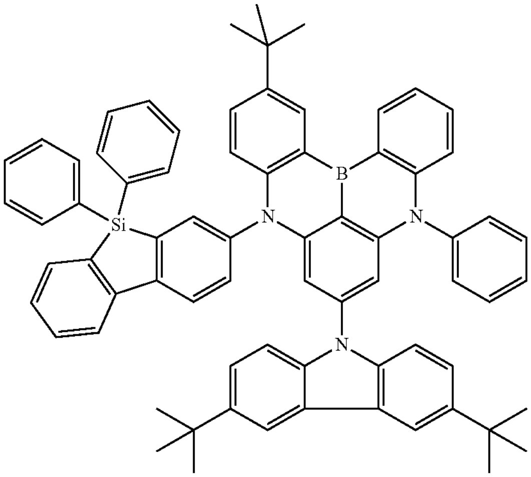
-continued
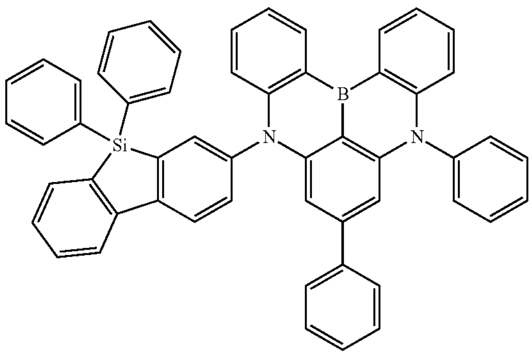
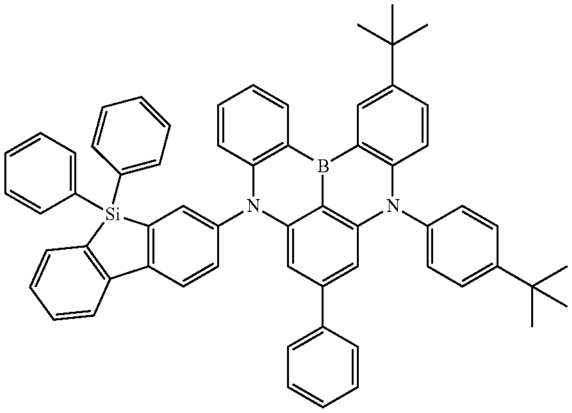
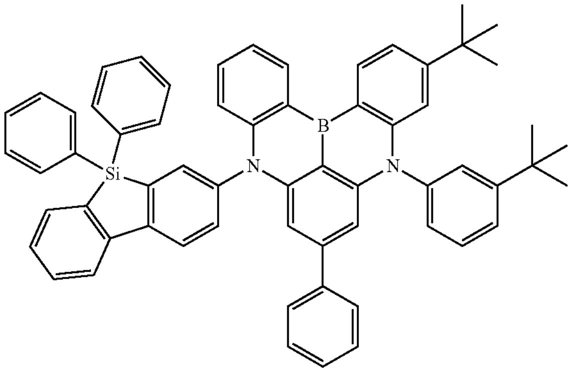
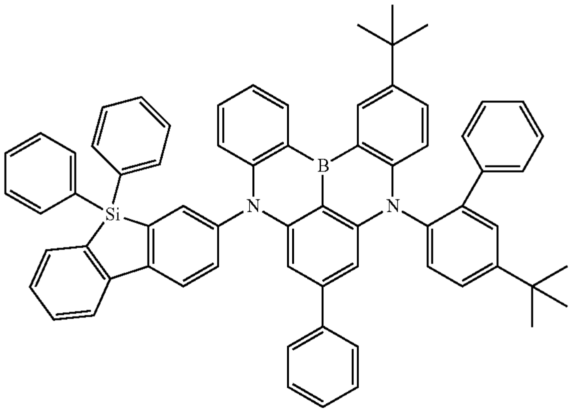

-continued
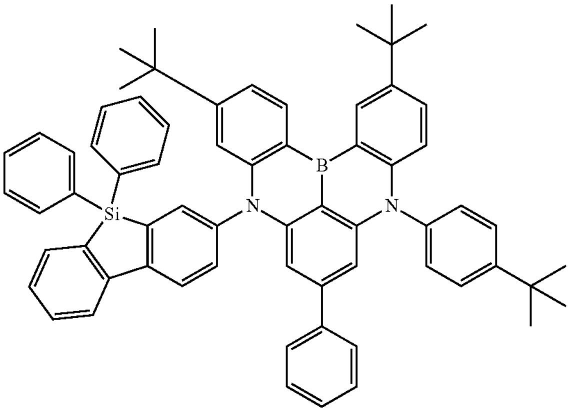
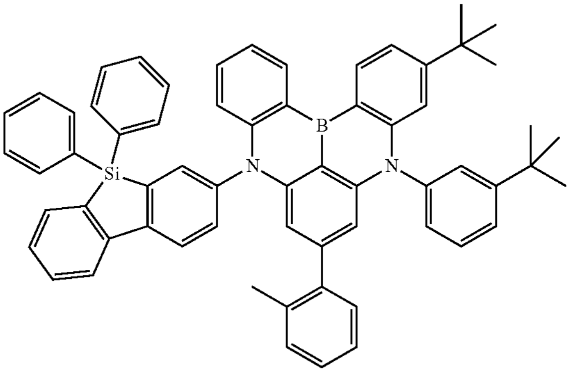
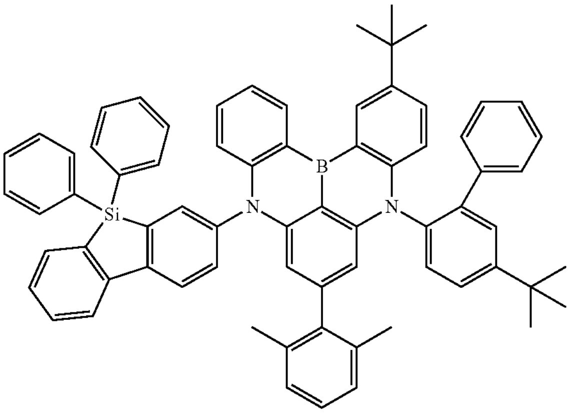
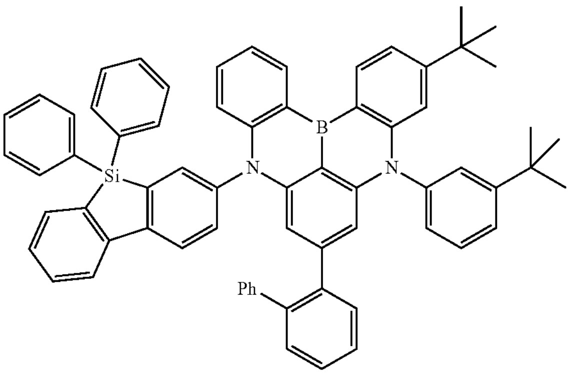
-continued
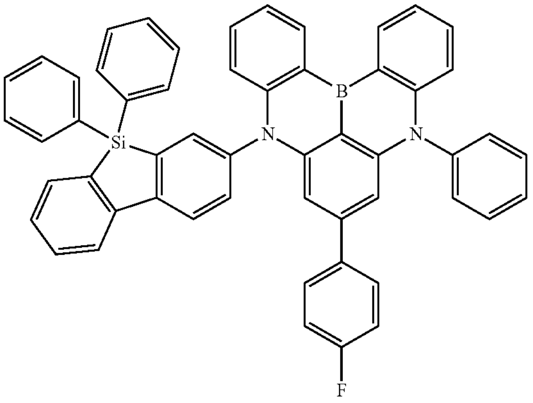
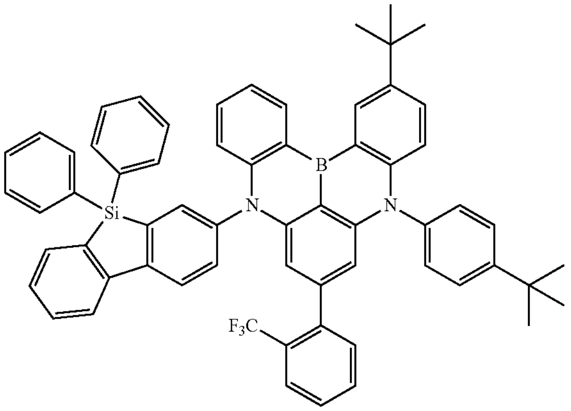
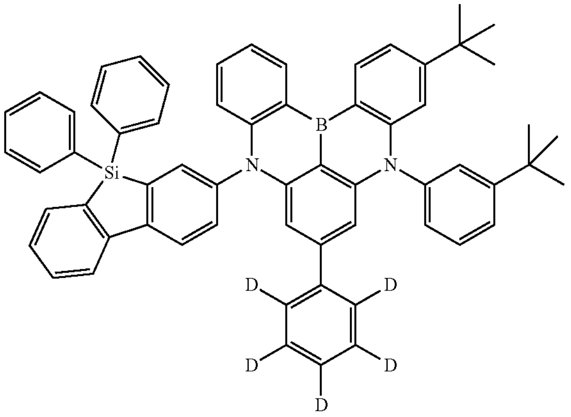
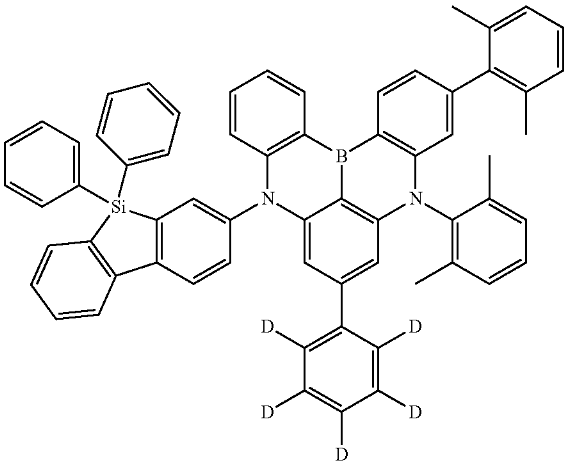

-continued
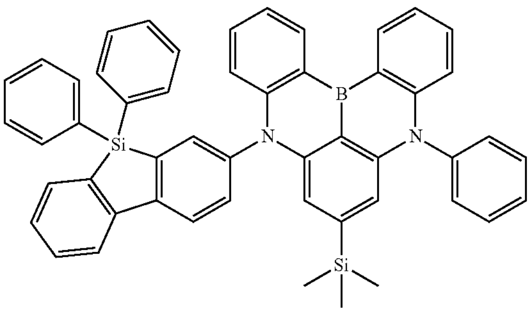
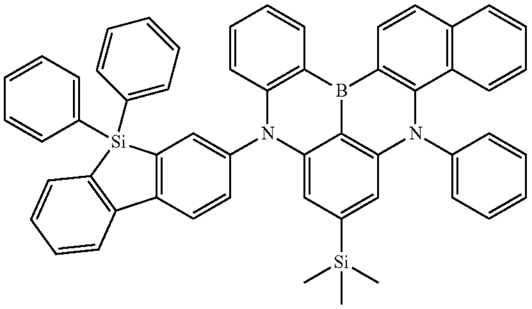
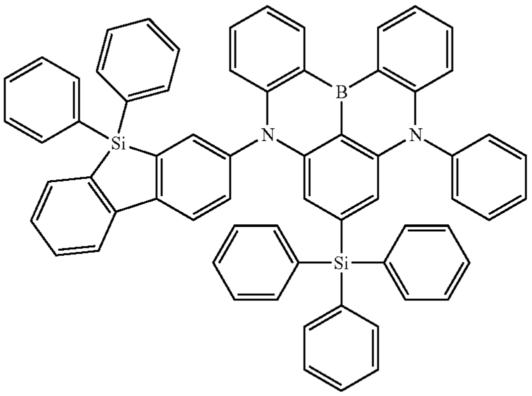
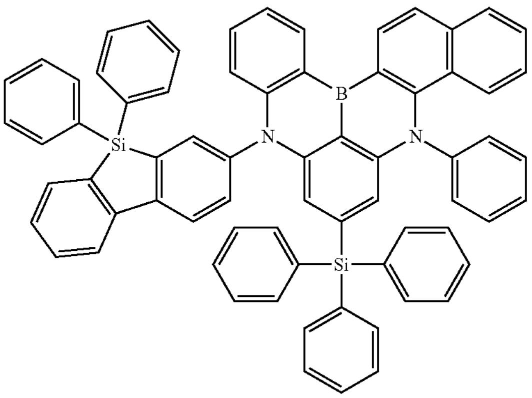
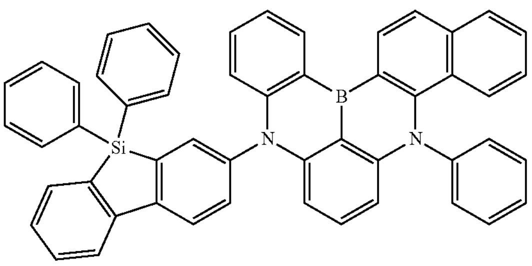
-continued
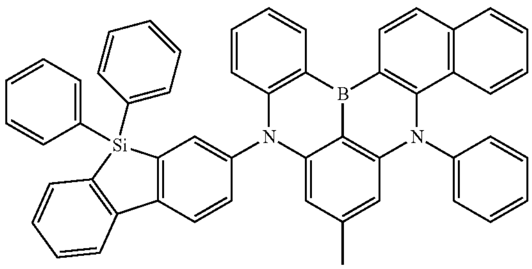
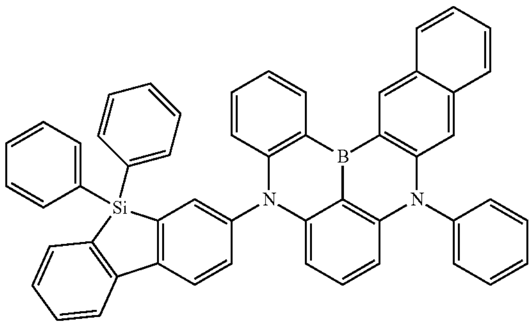
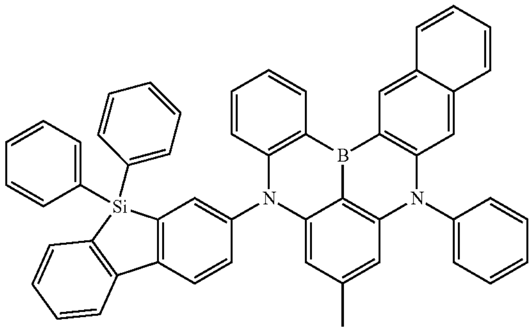
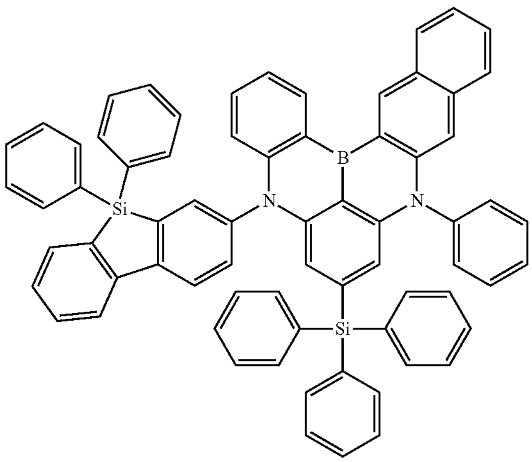

-continued
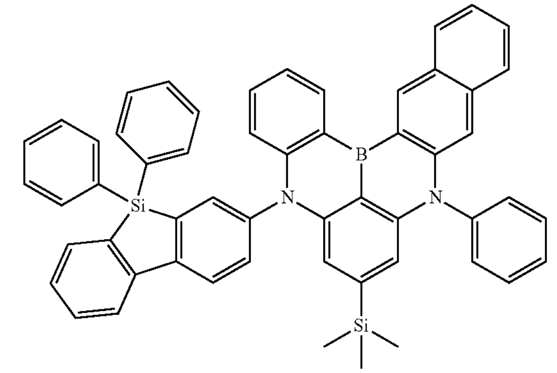
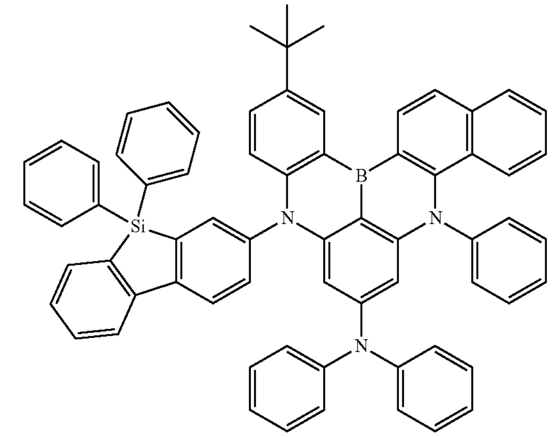
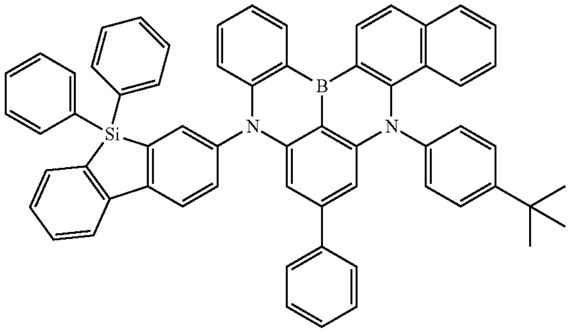
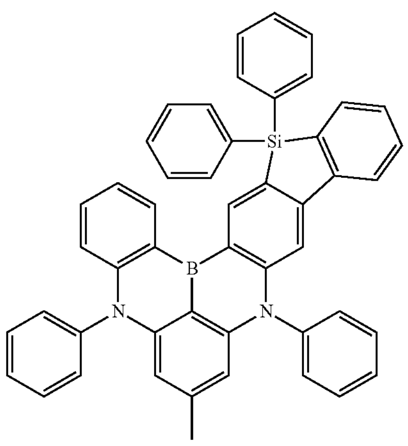
-continued
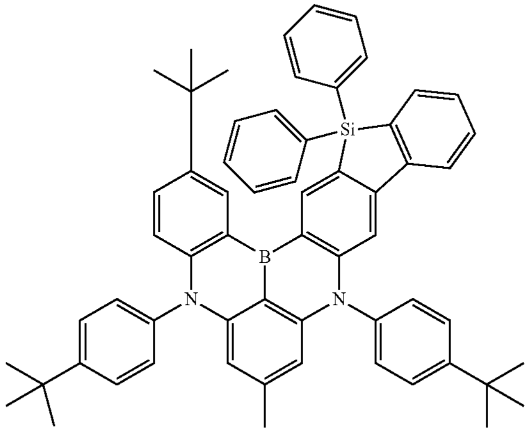
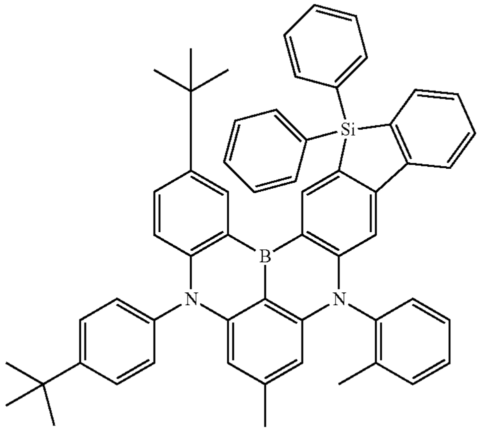
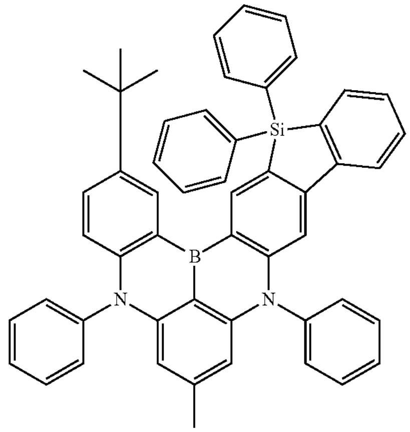
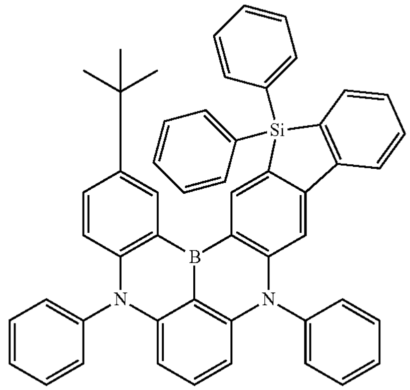

-continued
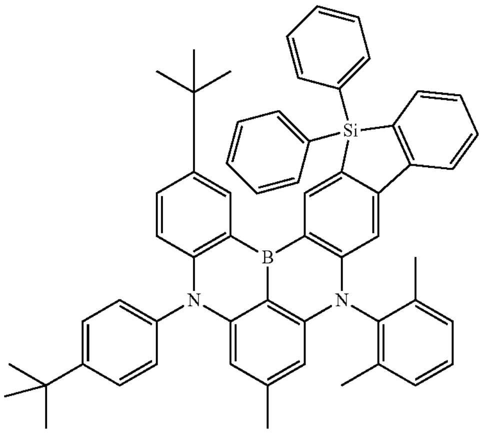
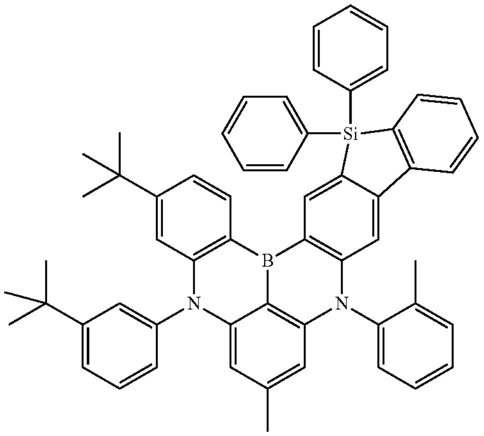
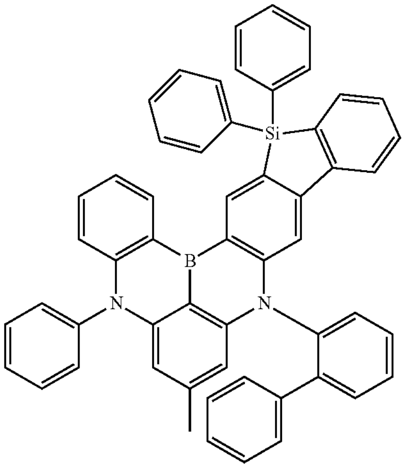
-continued
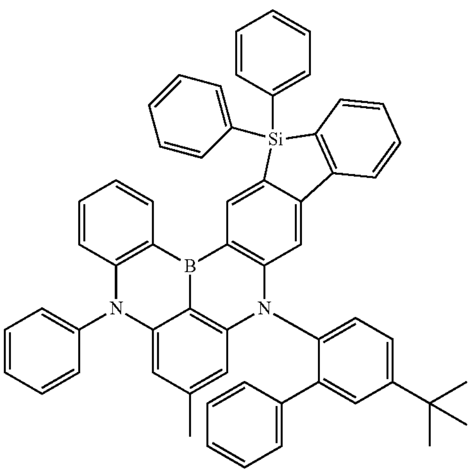
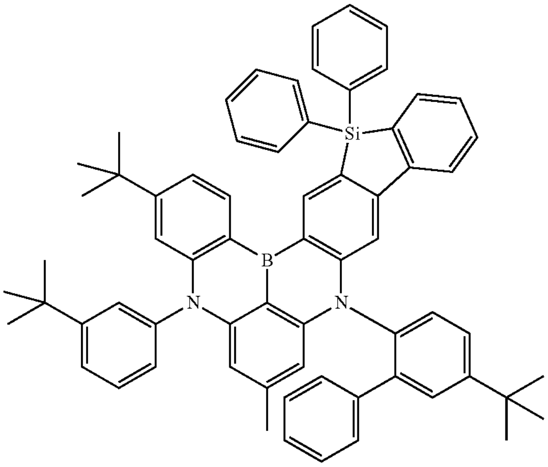
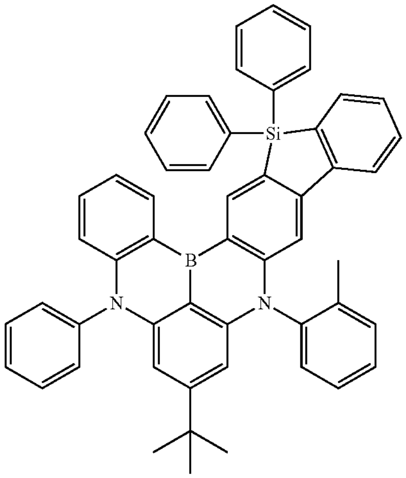

-continued
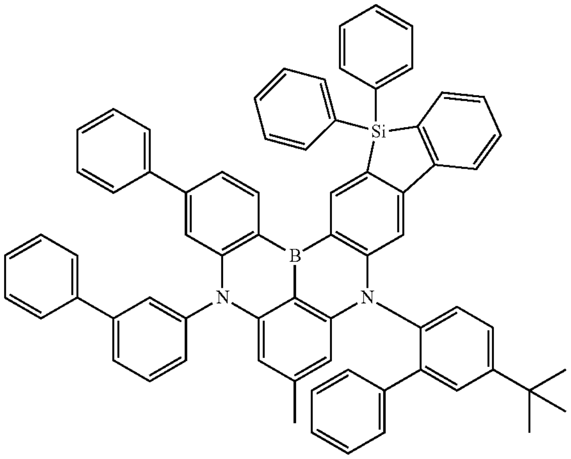
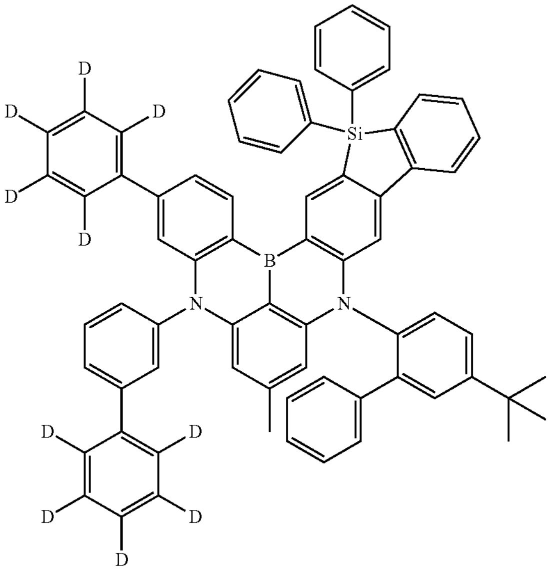
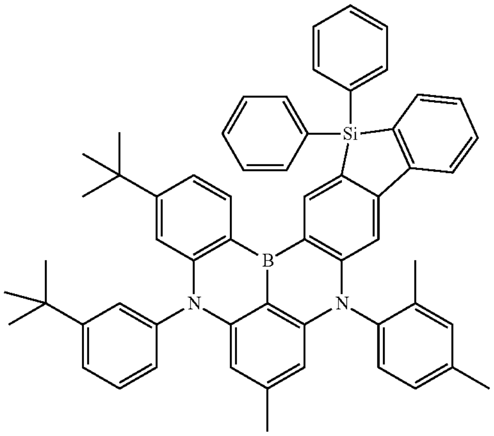
-continued
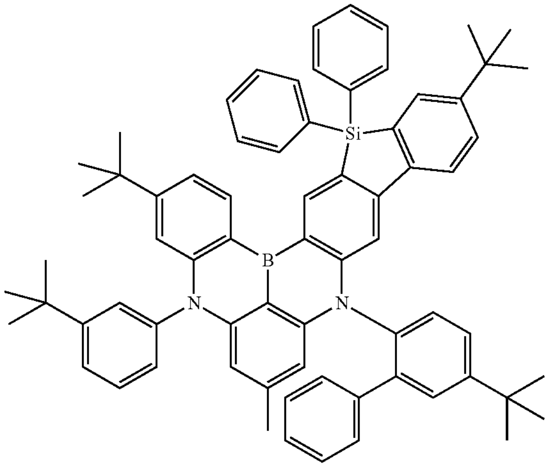
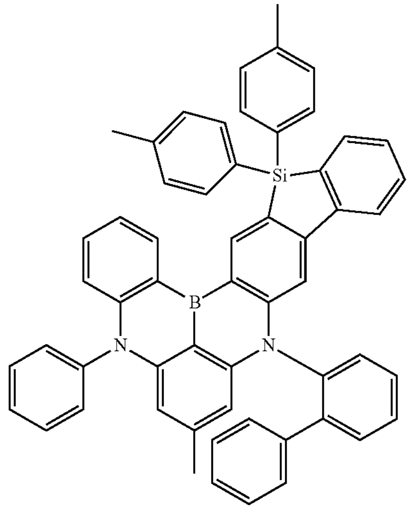
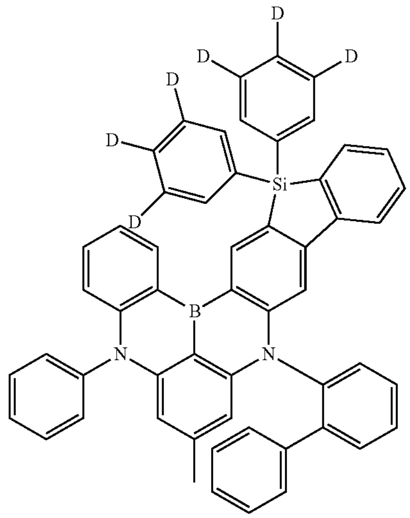

-continued
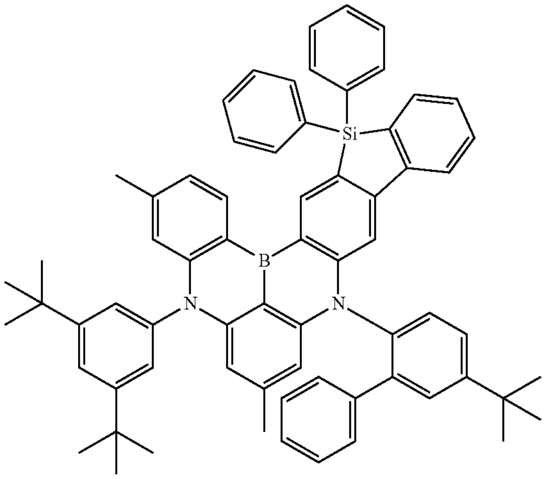
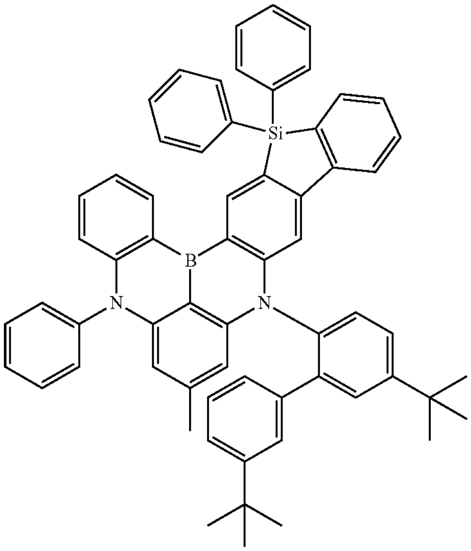
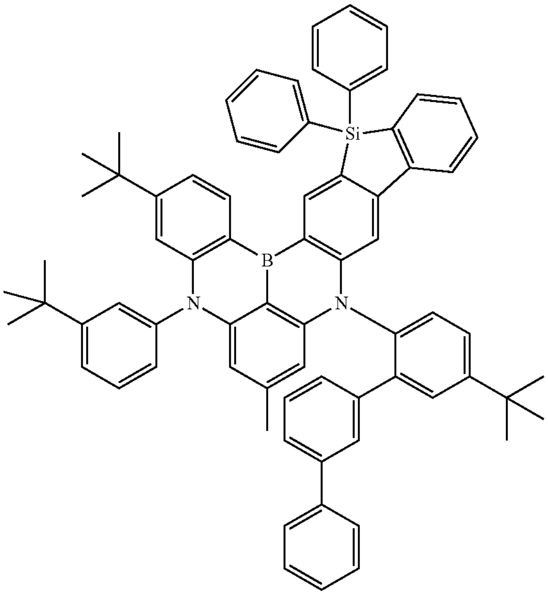
-continued
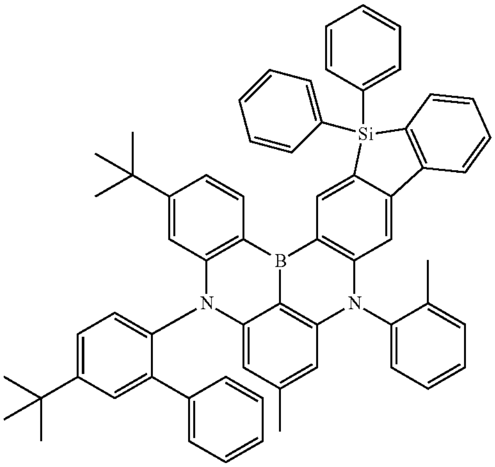
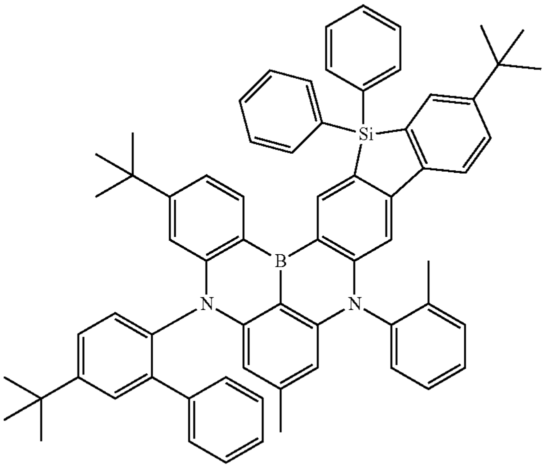
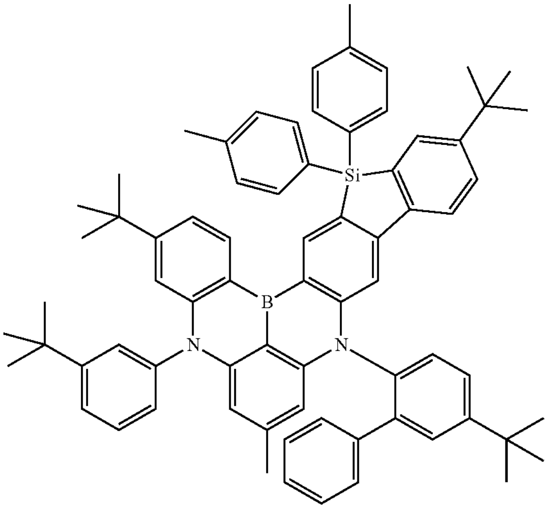

-continued
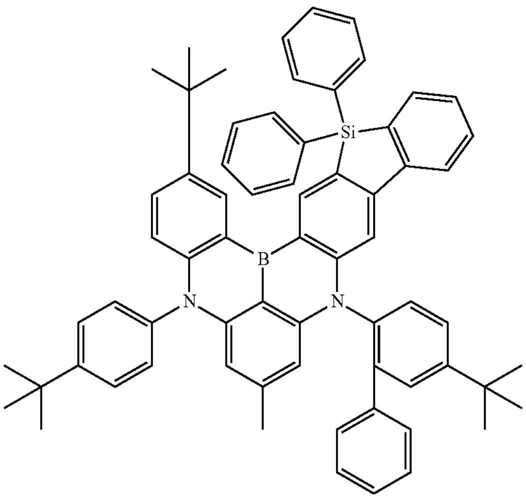
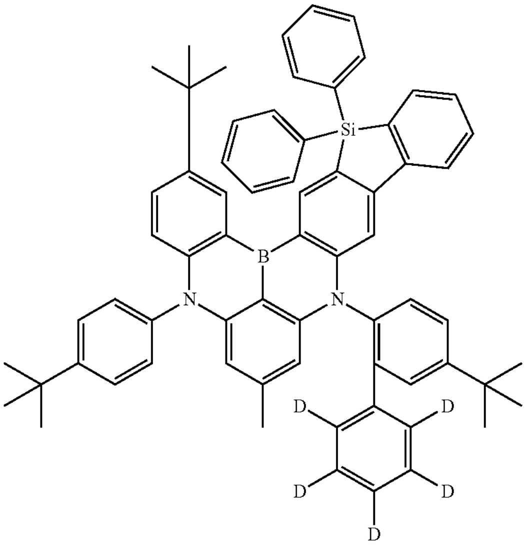
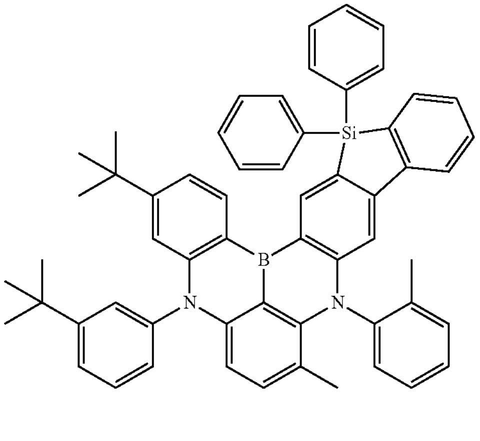
-continued
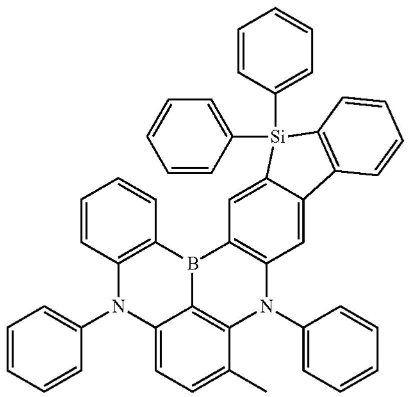
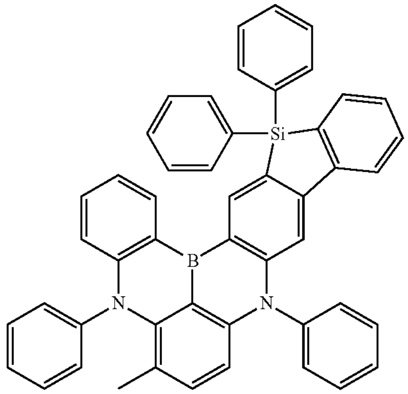
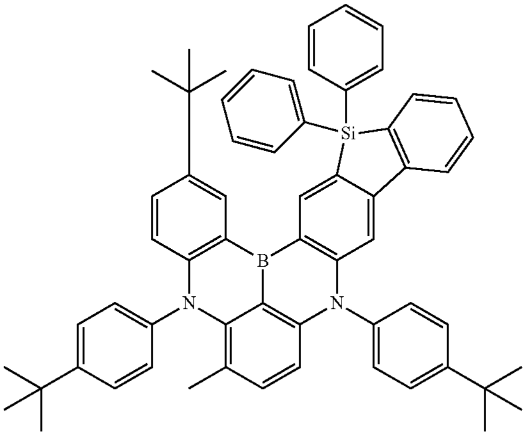
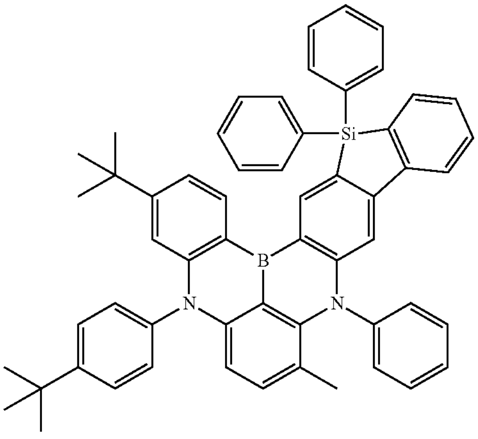

-continued
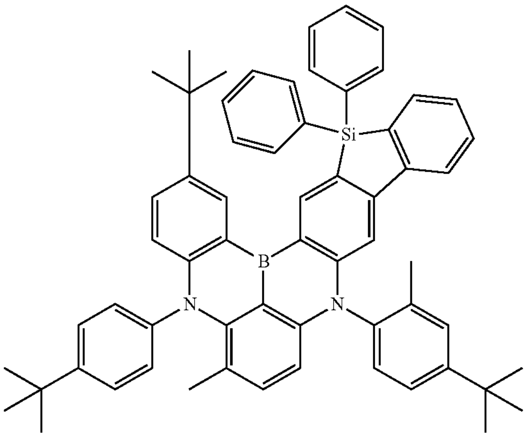
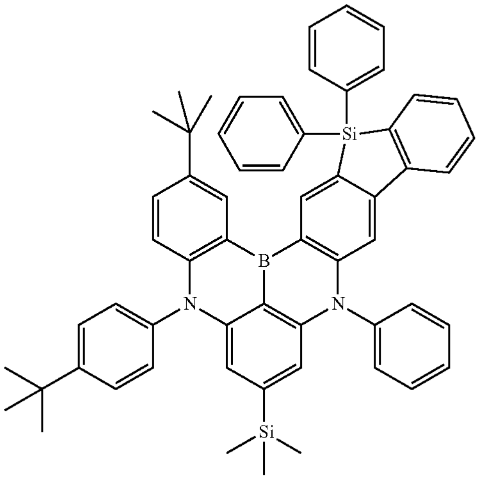
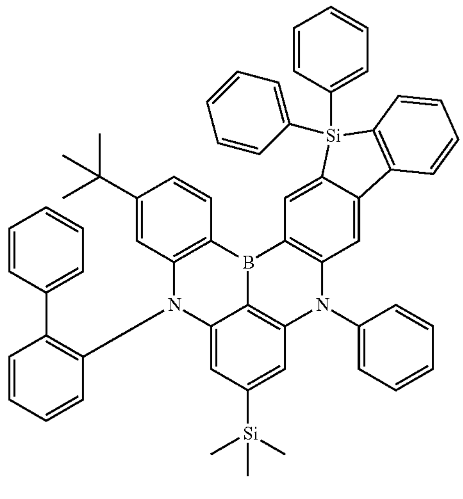
-continued
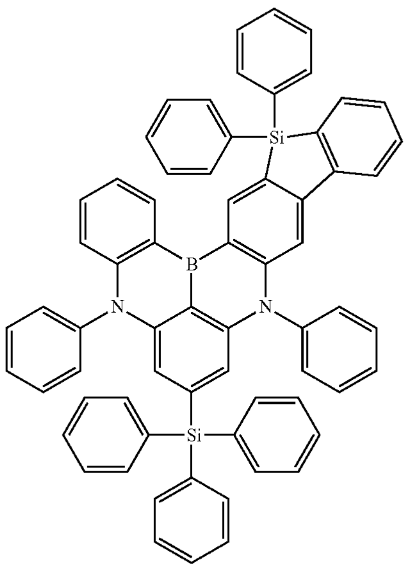
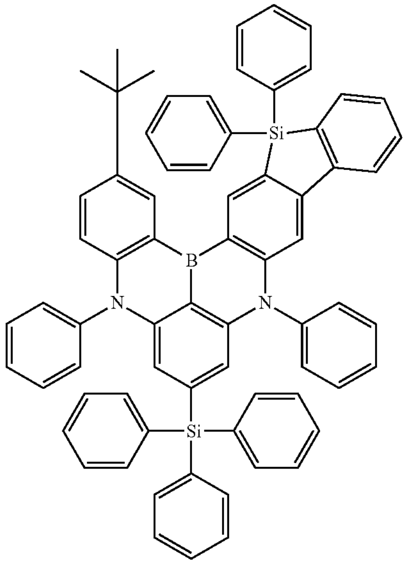
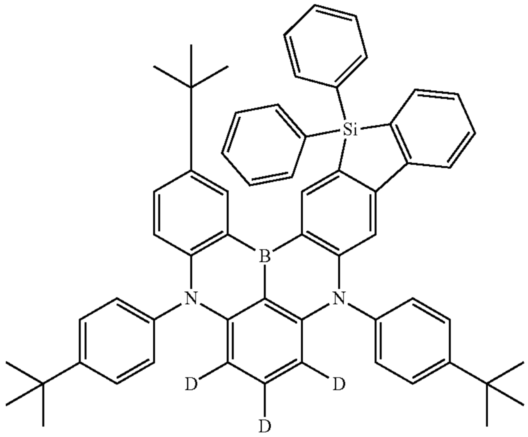

-continued
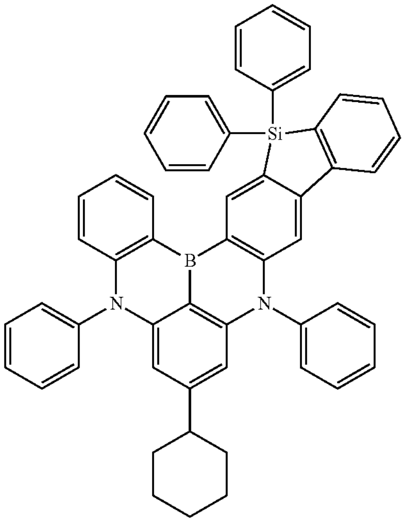
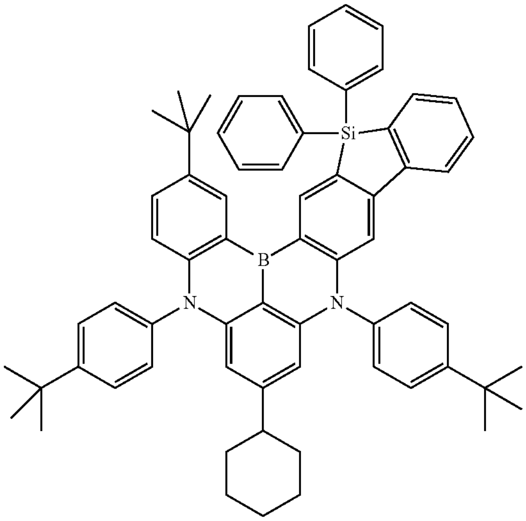
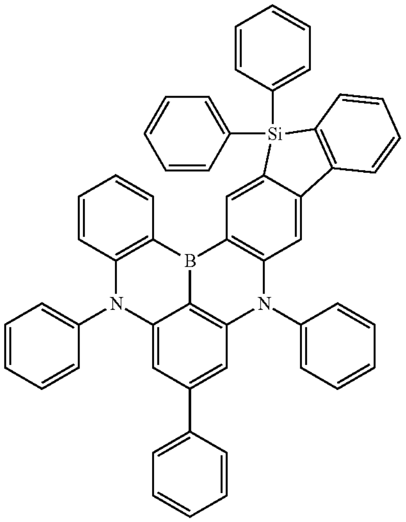
-continued
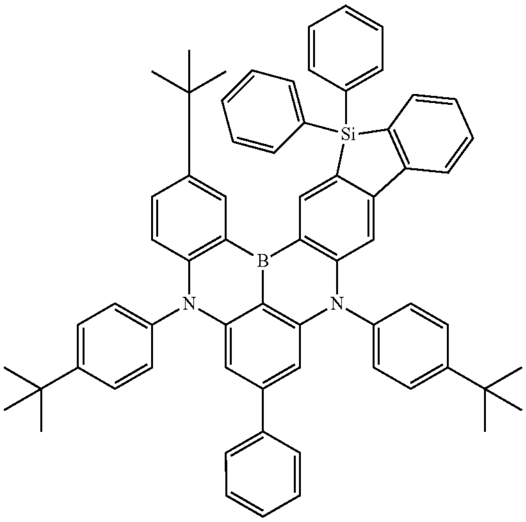
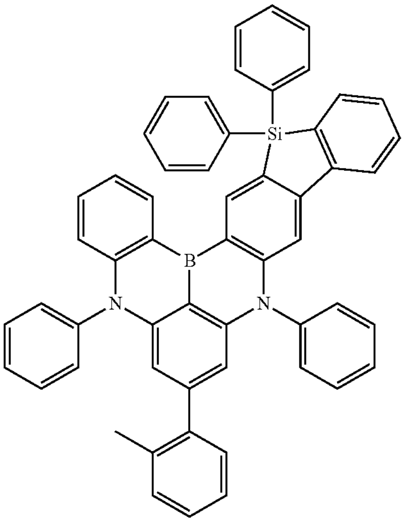
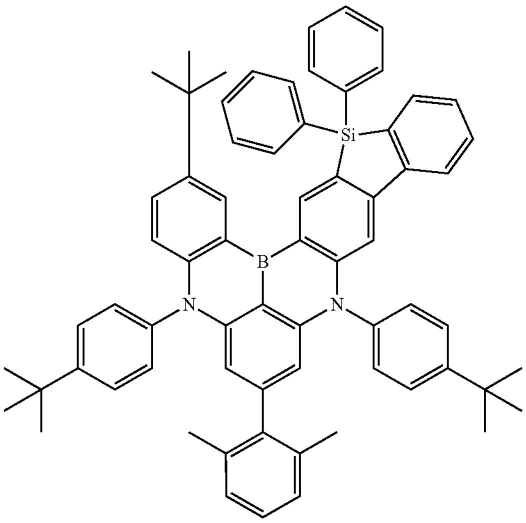

-continued
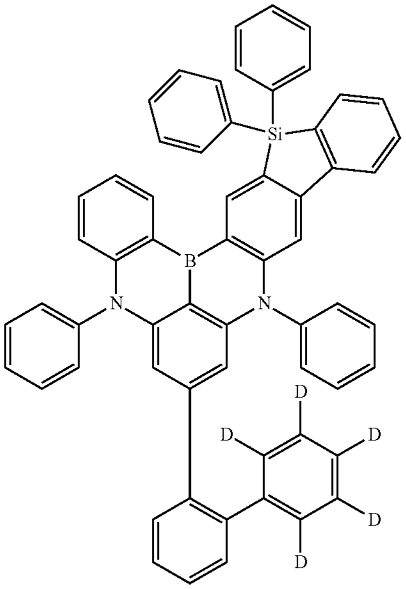
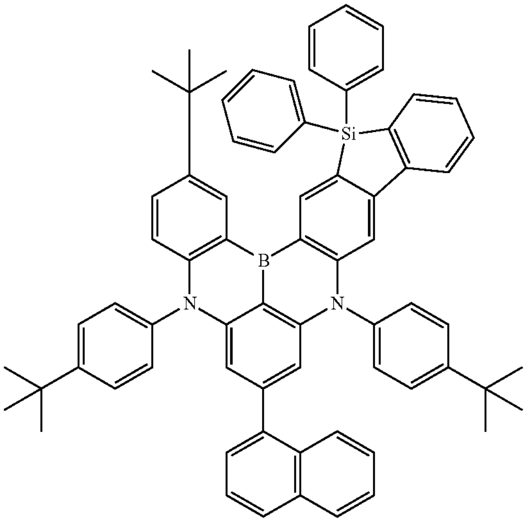
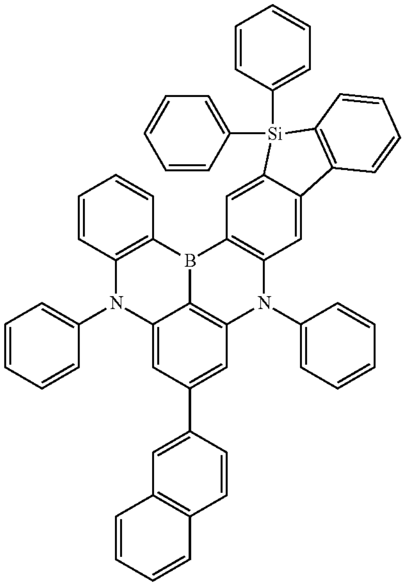
-continued
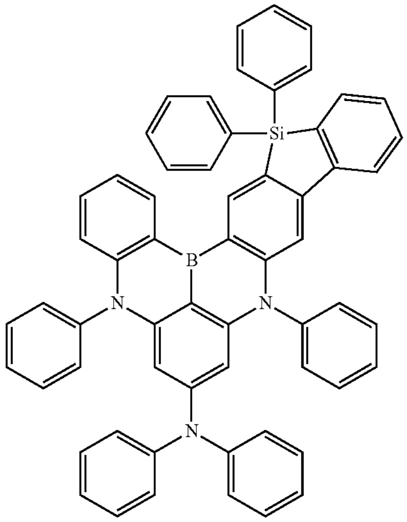
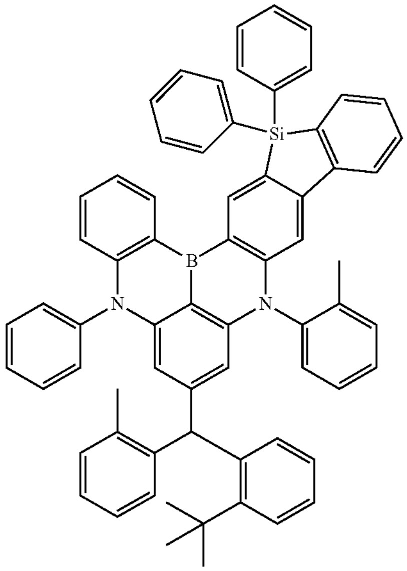
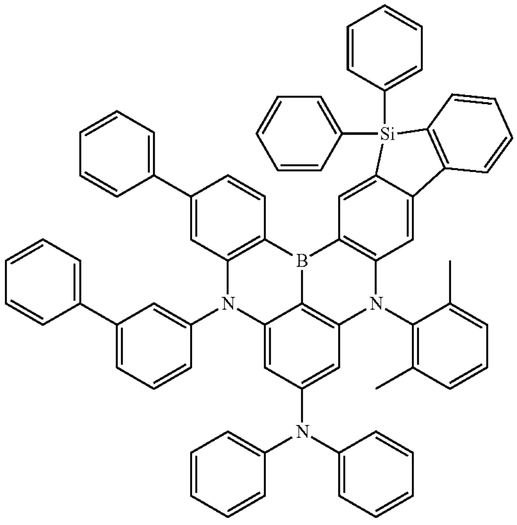

-continued
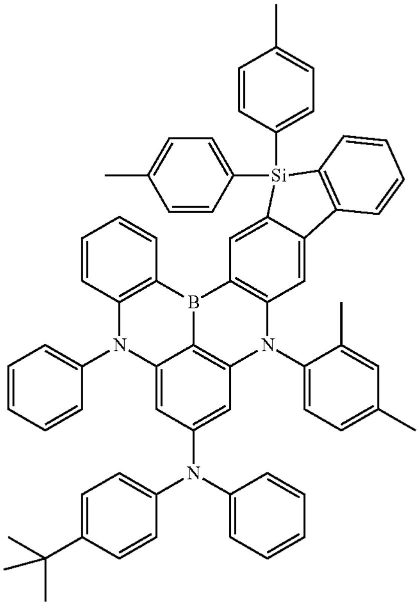
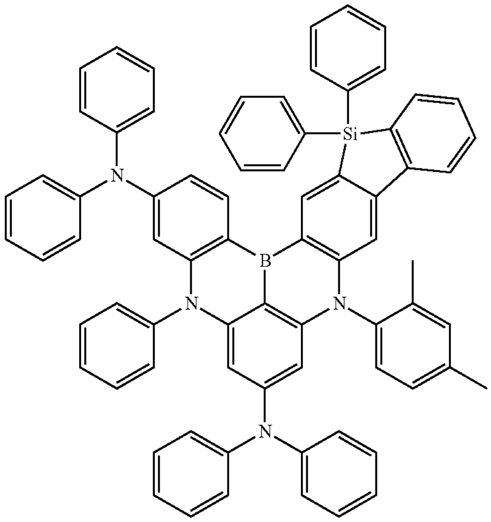
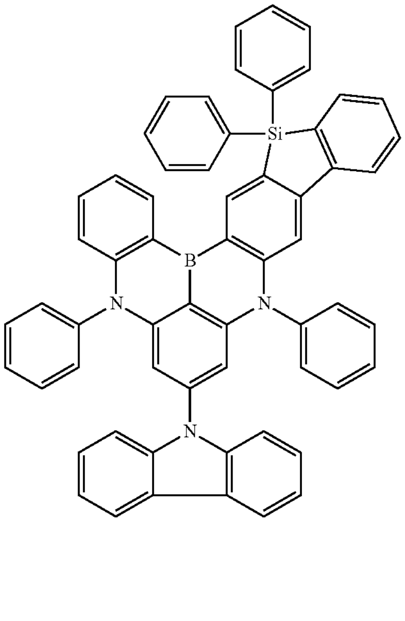
-continued
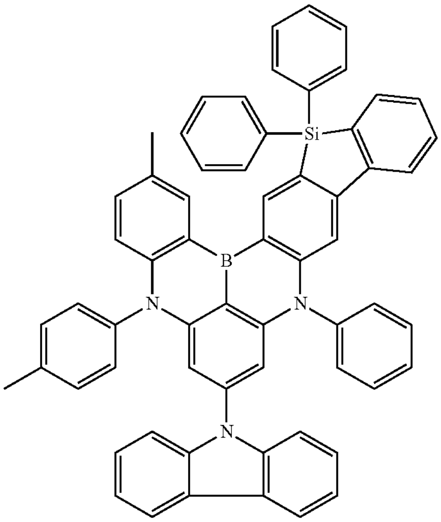
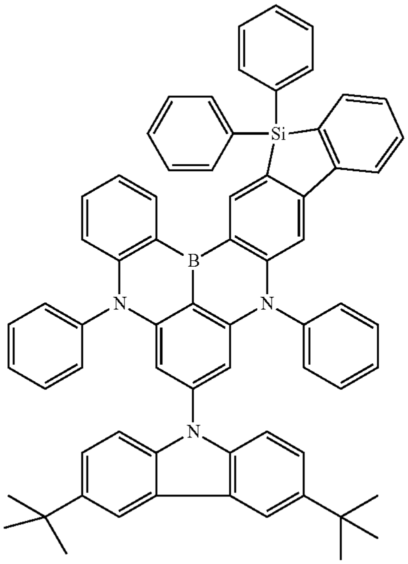
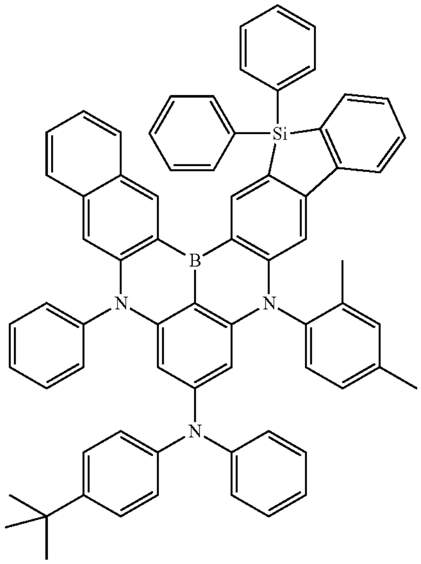

-continued
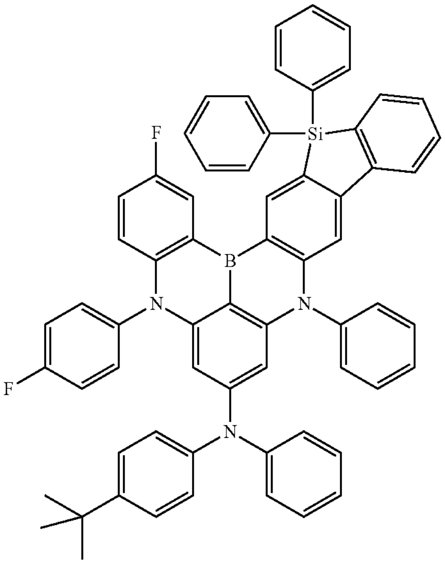
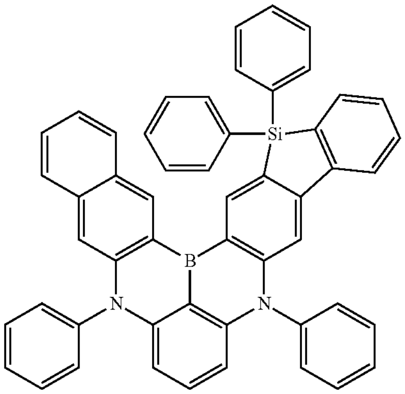
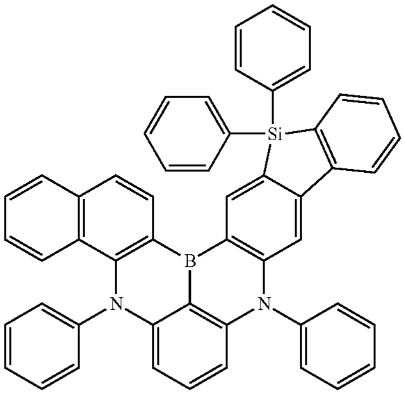
-continued
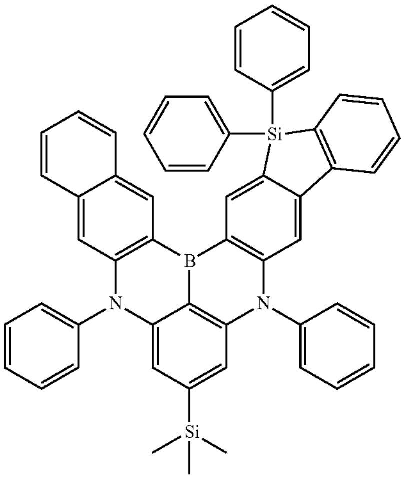
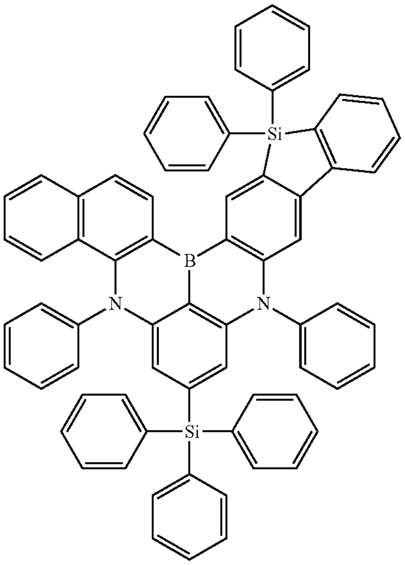
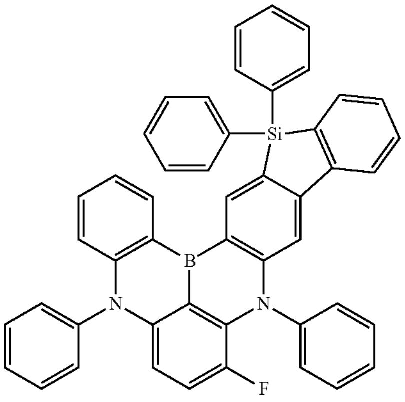

-continued
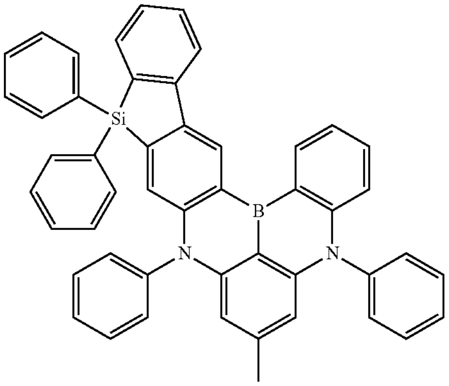
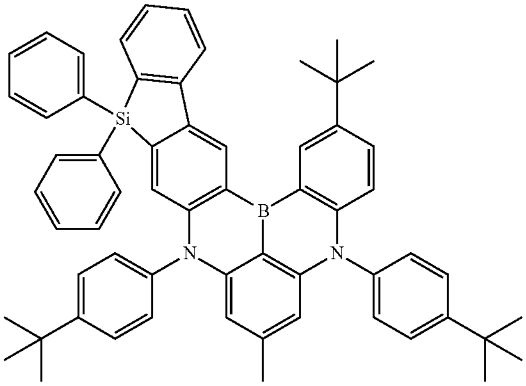
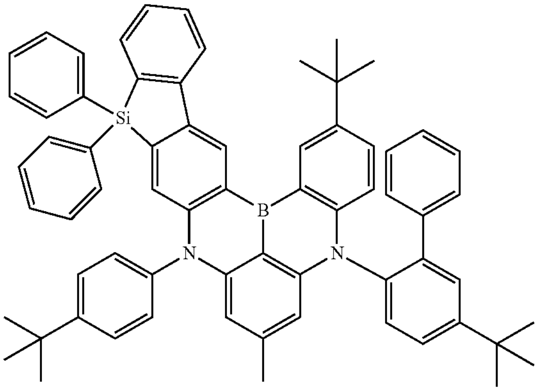
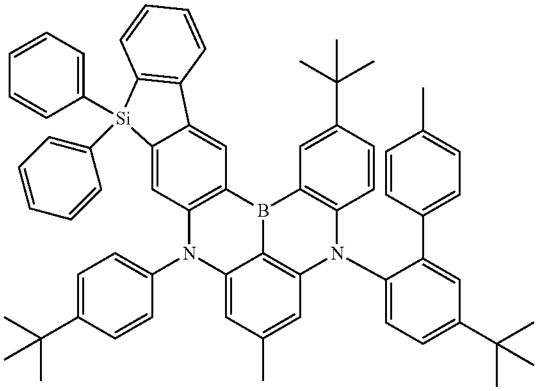
-continued
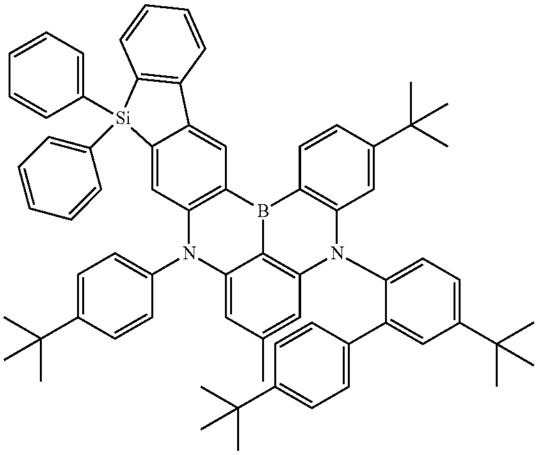
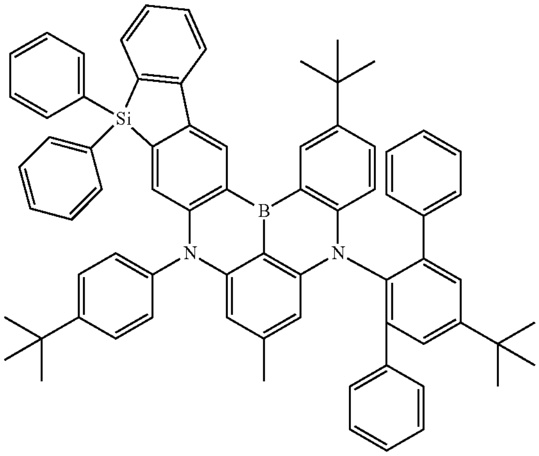
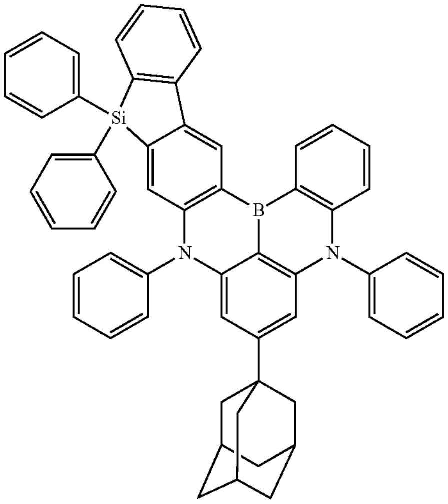

-continued
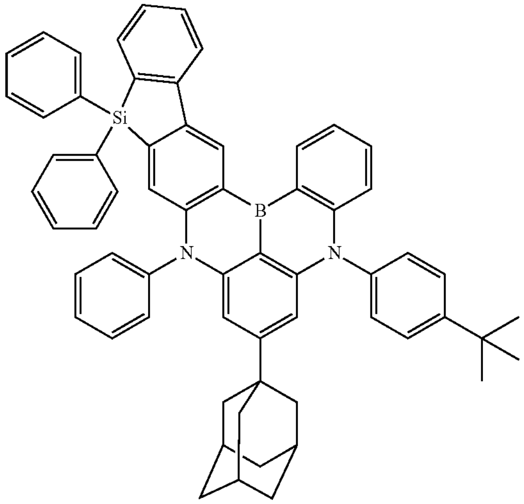
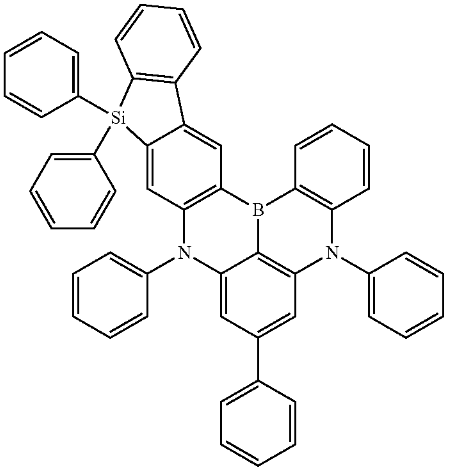
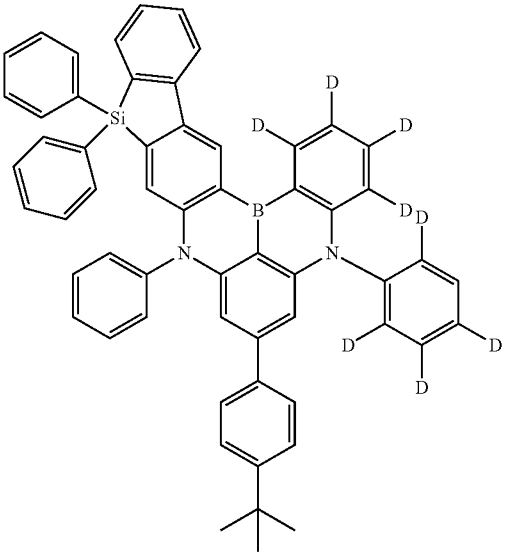
-continued
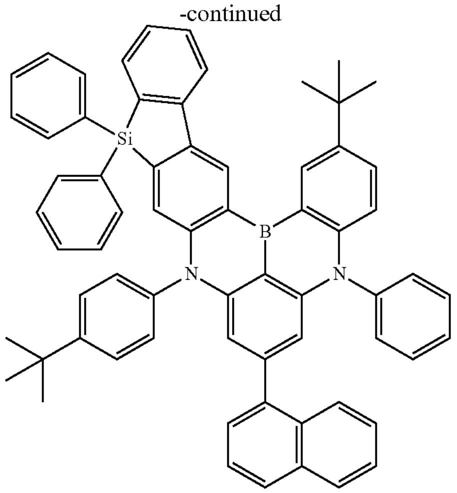
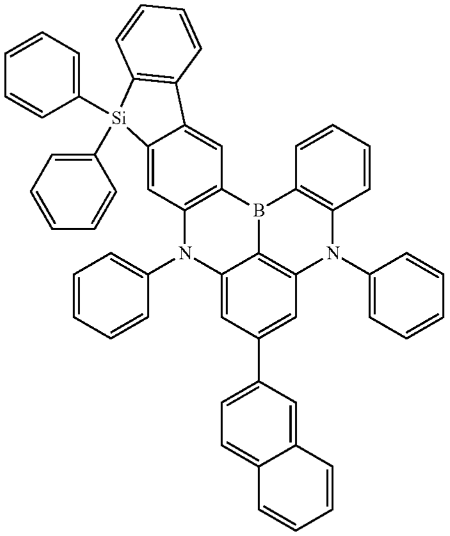
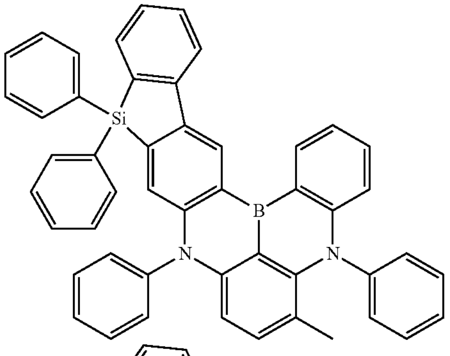
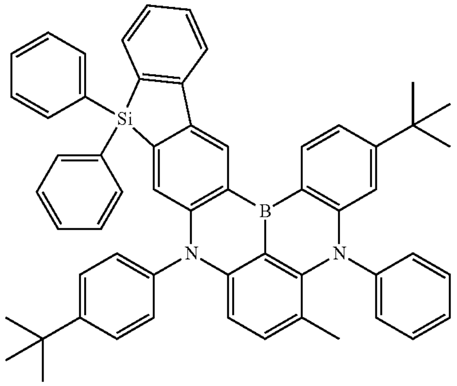

-continued
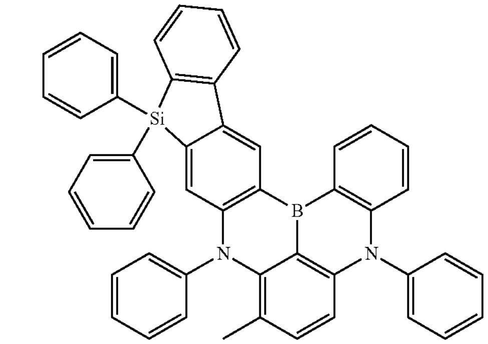
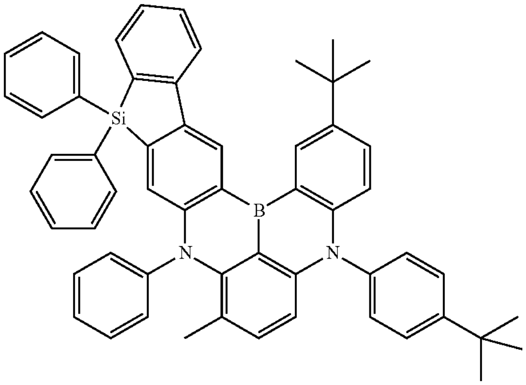
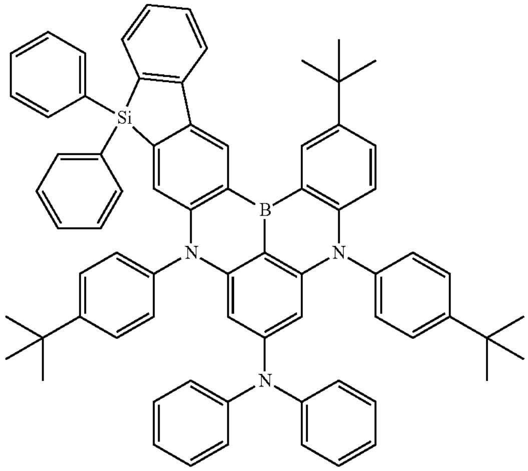
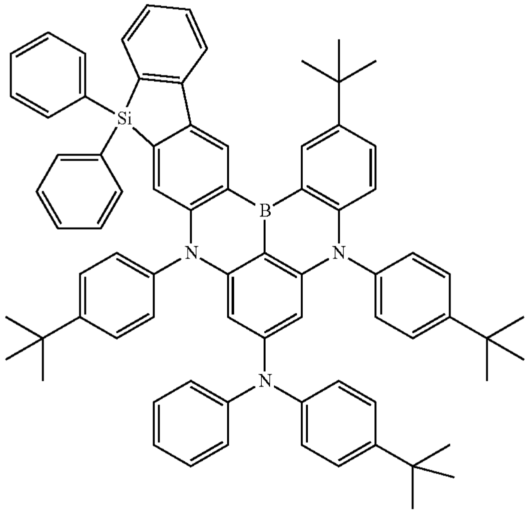
-continued
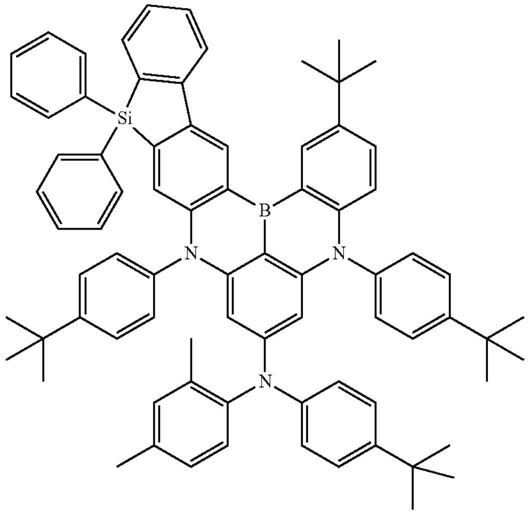
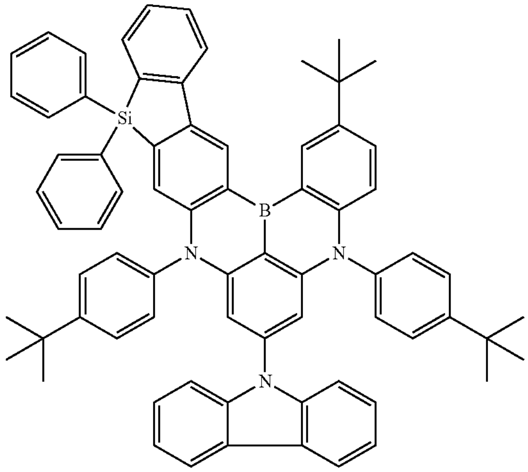
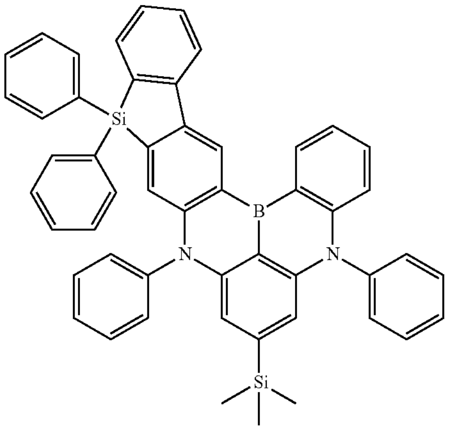

-continued
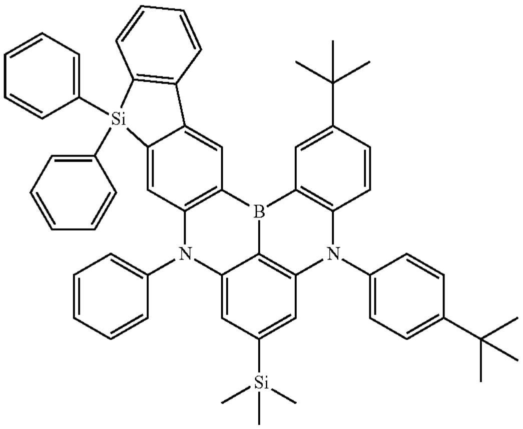
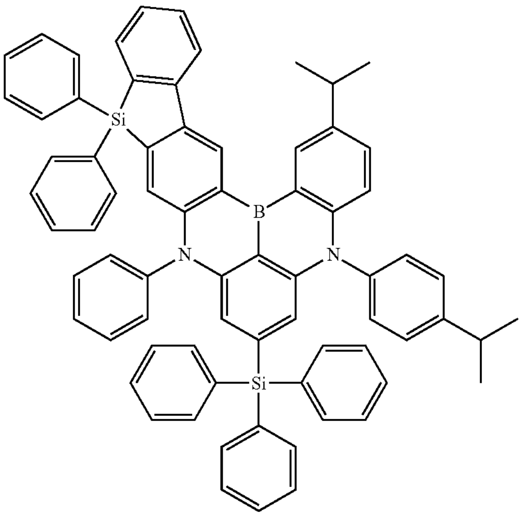
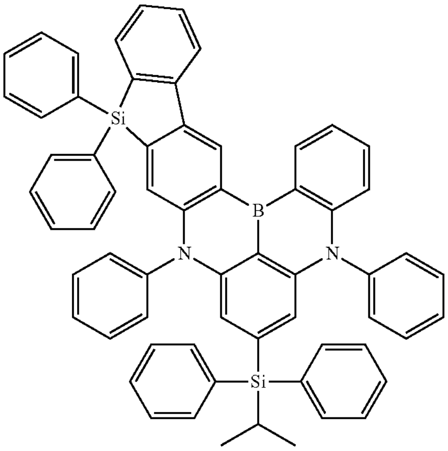
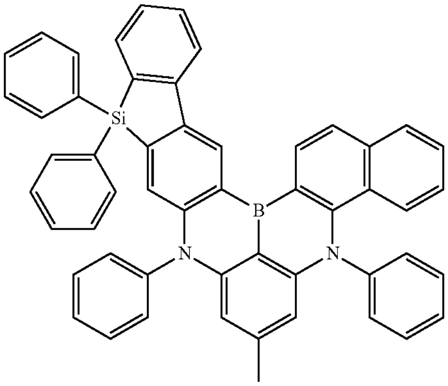
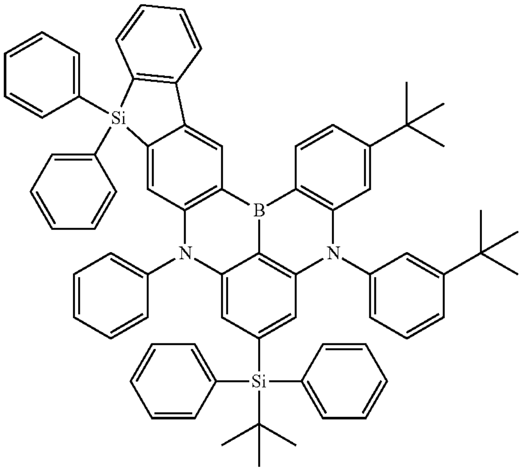
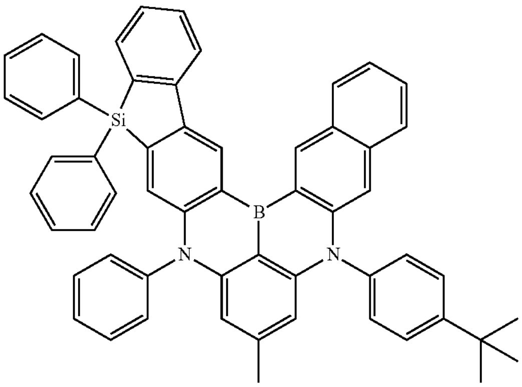

-continued
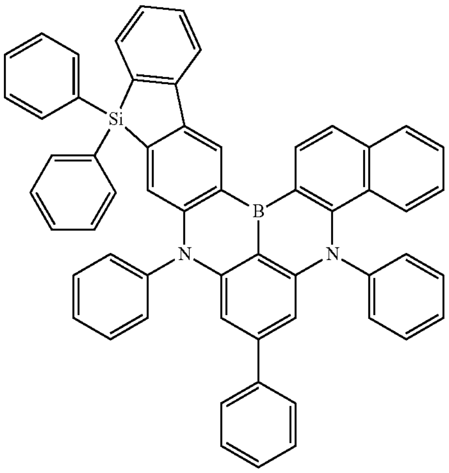
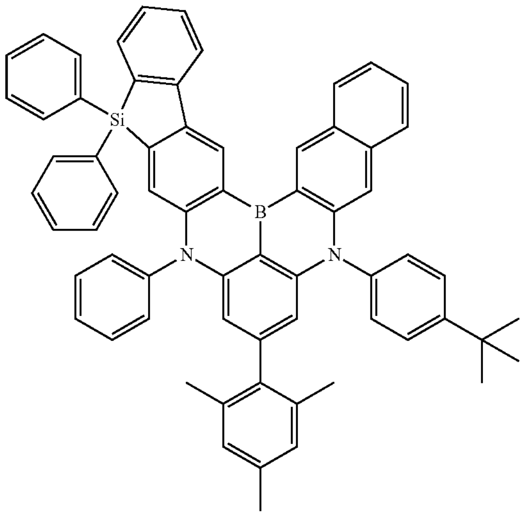
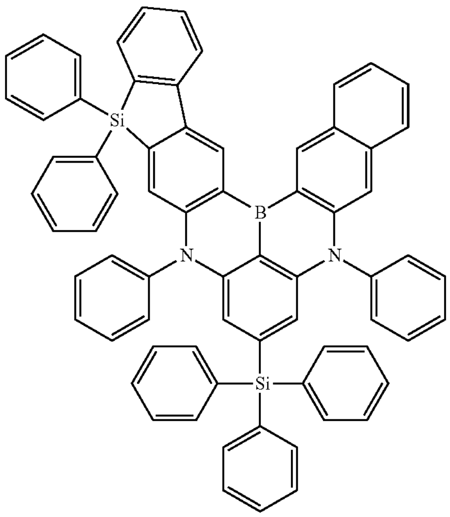
.
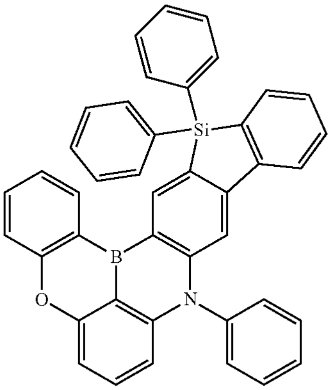
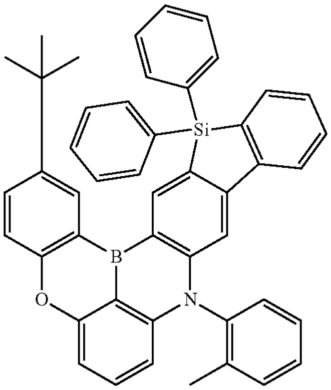
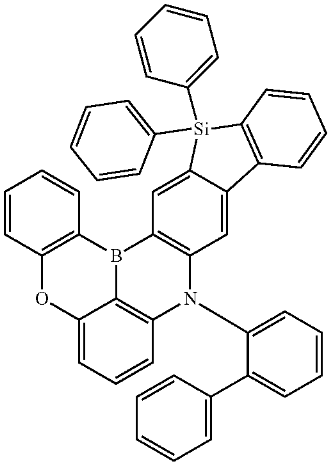
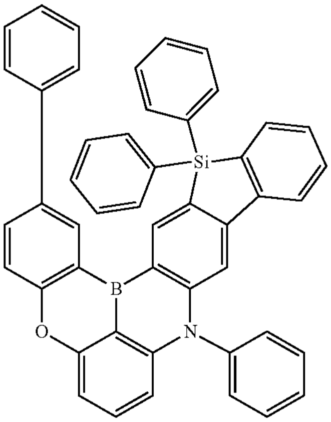

-continued
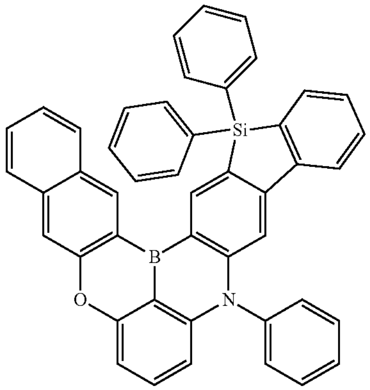
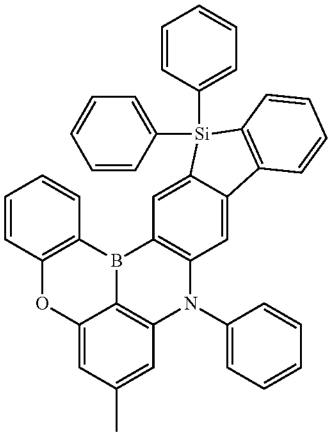
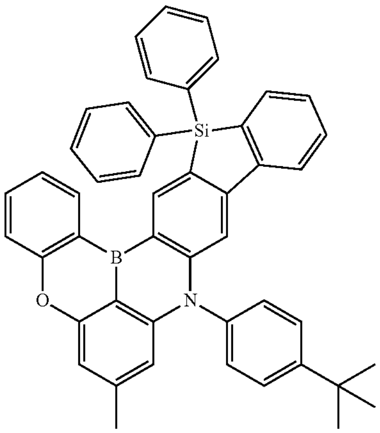
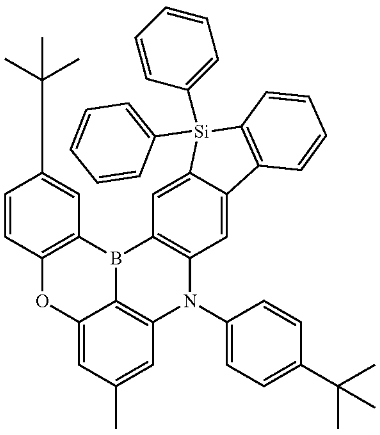
-continued
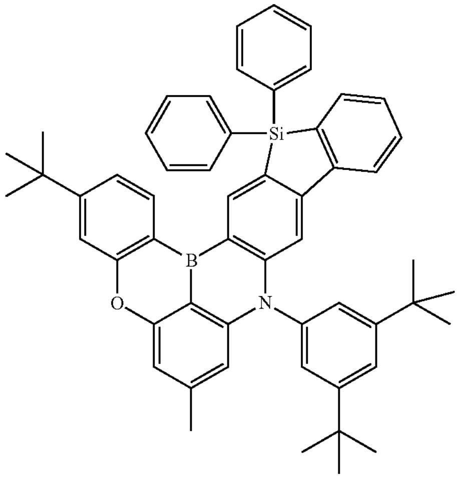
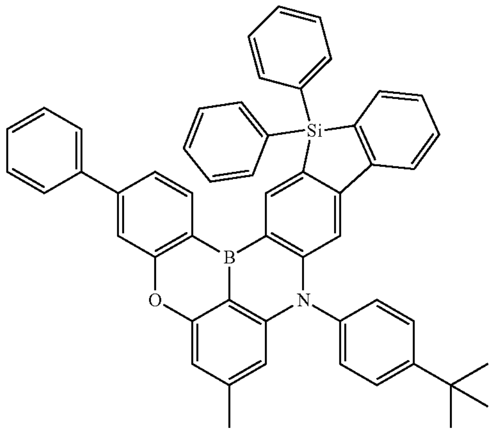
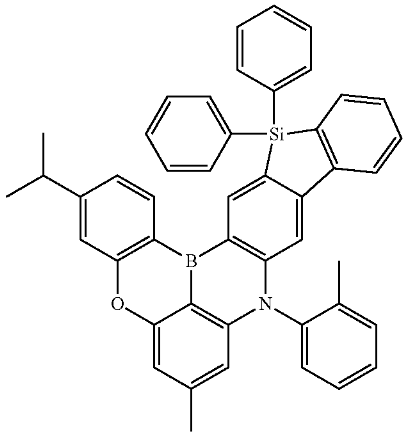

-continued
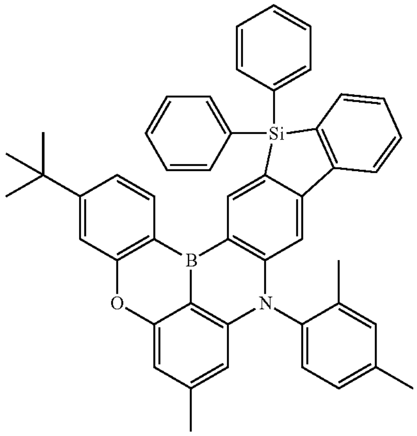
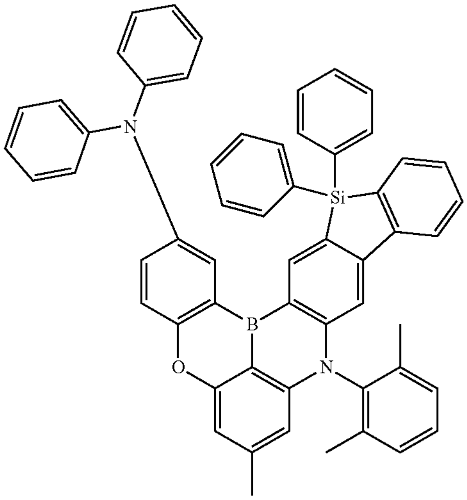
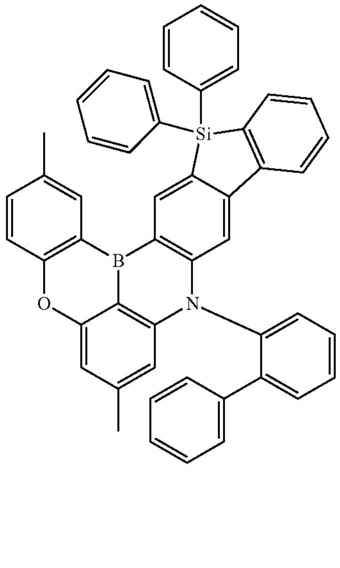
-continued
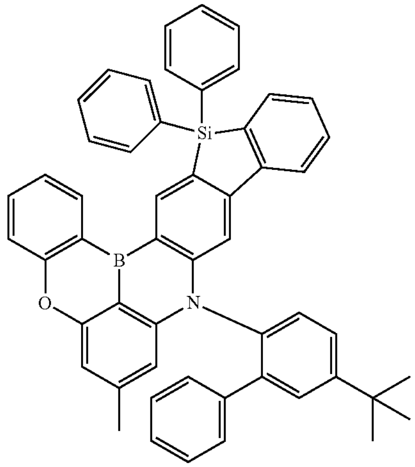
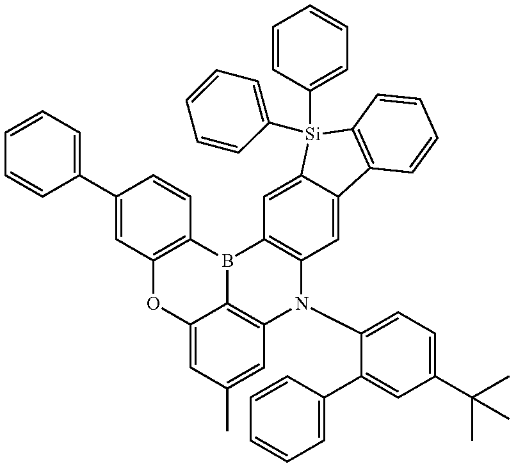
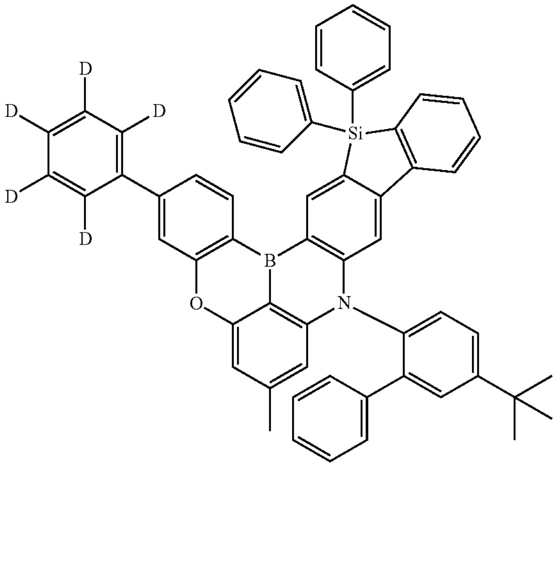

-continued
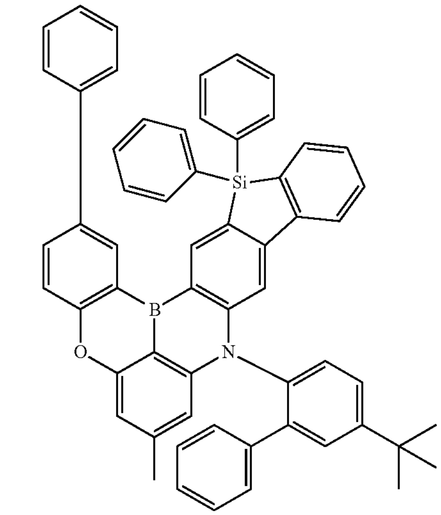
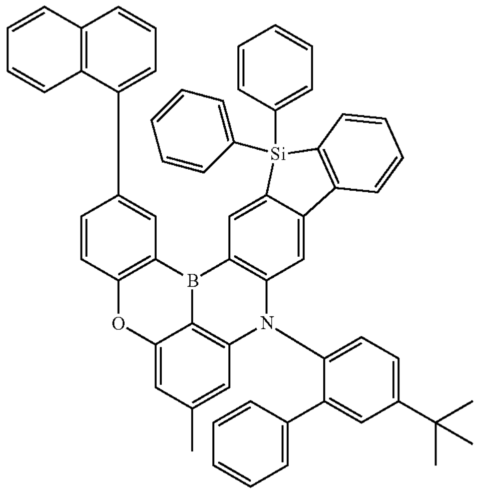
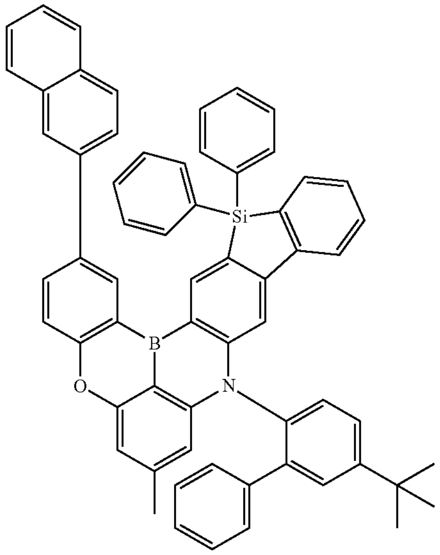
-continued
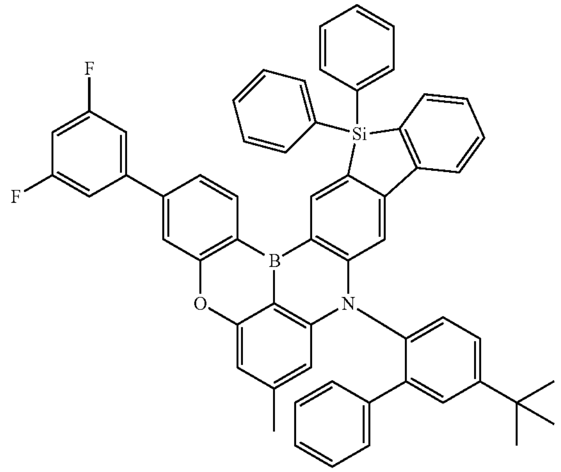
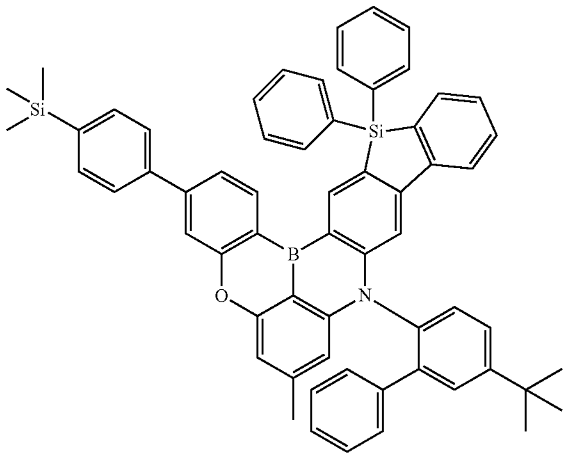
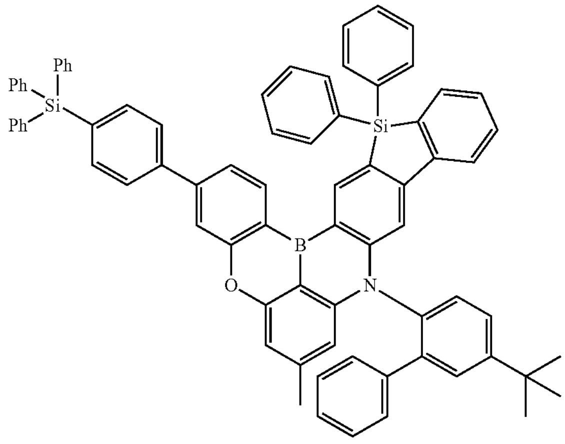

-continued
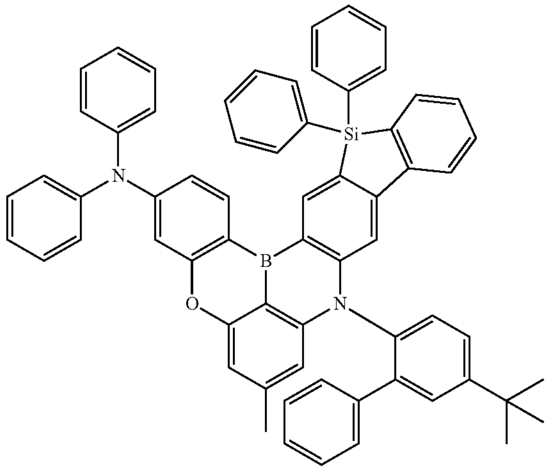
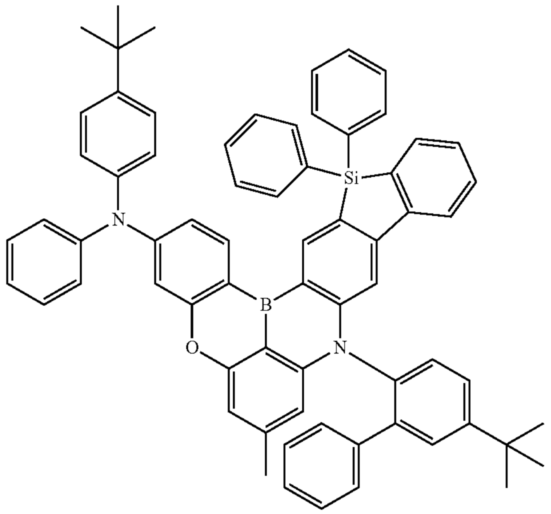
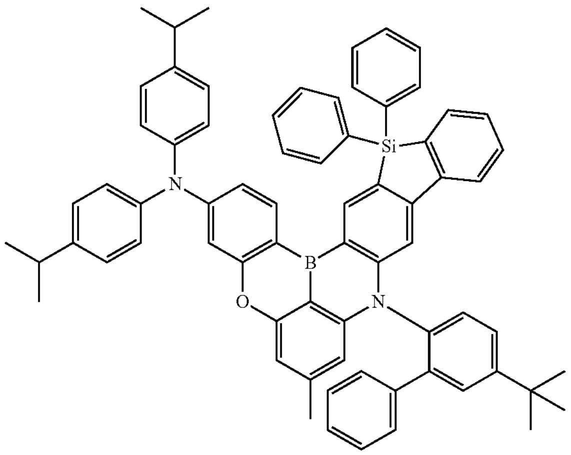
-continued
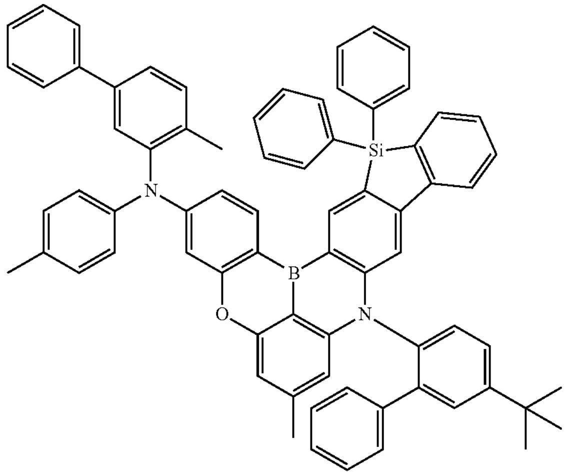
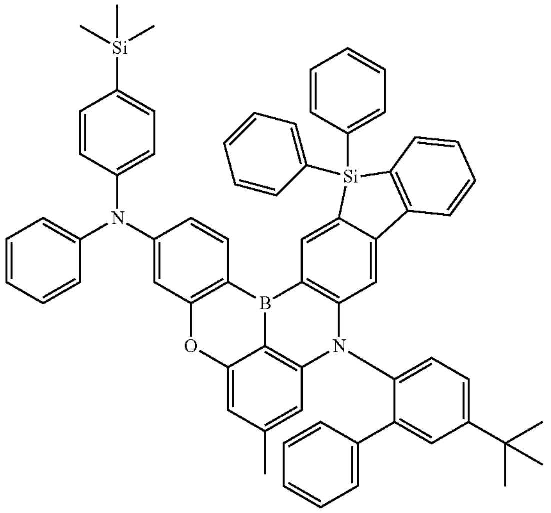
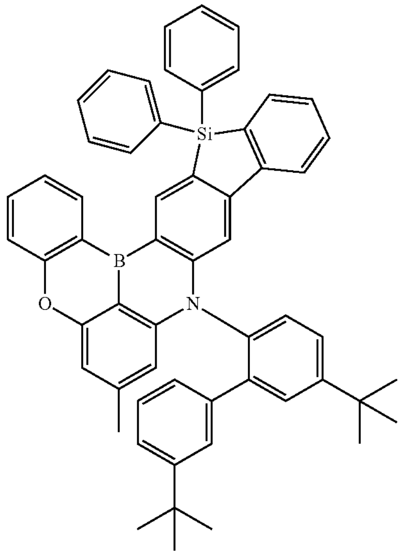

-continued
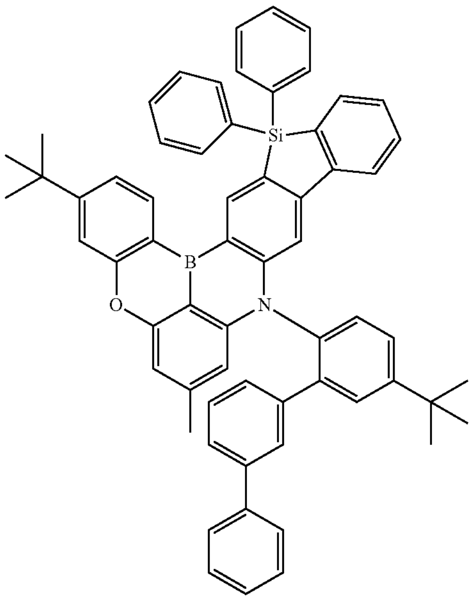
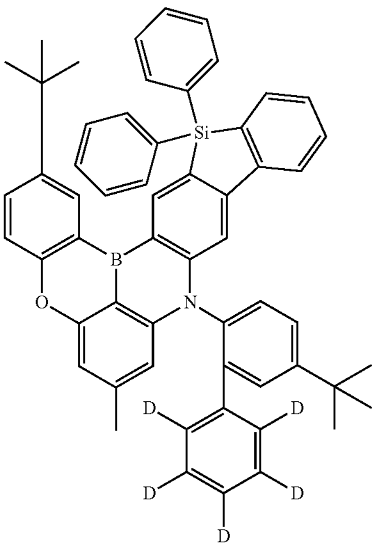
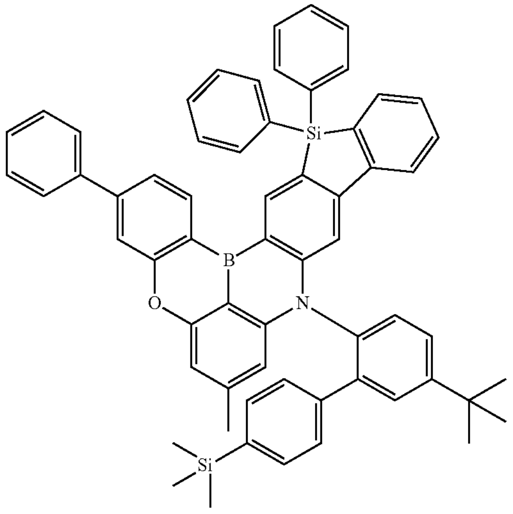
-continued
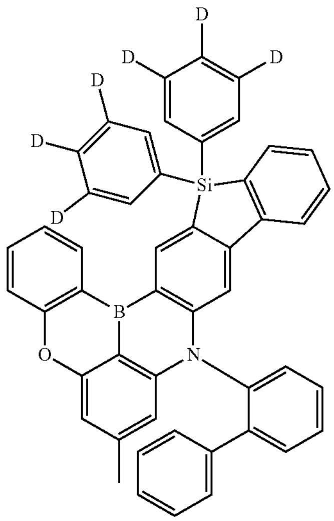
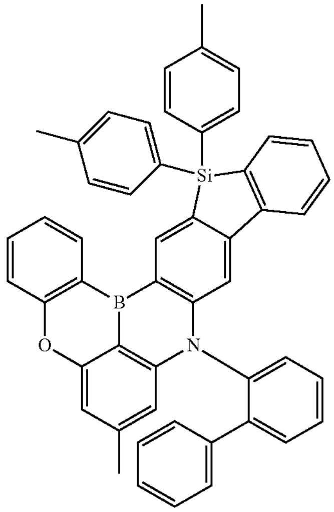
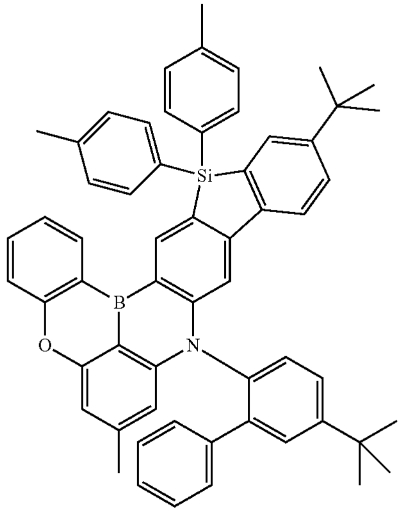 [SMILES: Cc1ccc([Si]2(c3ccc(C)cc3)c3cc(C(C)(C)C)ccc3-c3cc4c(cc32)B2c3ccccc3Oc3cc(C)cc(c32)N4c2ccc(C(C)(C)C)cc2-c2ccccc2)cc1]

-continued
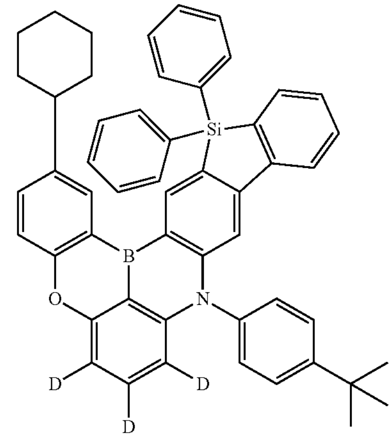
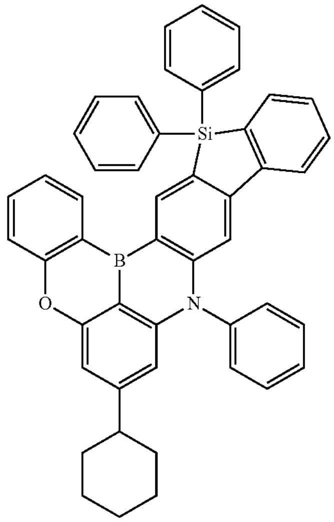
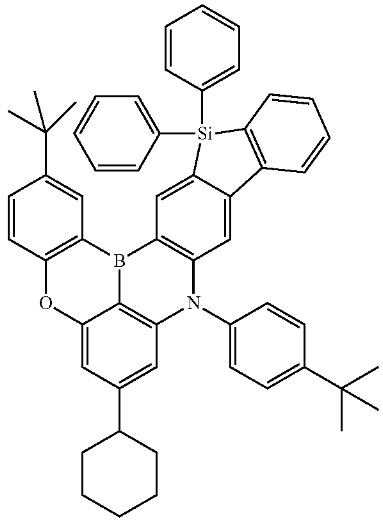
-continued
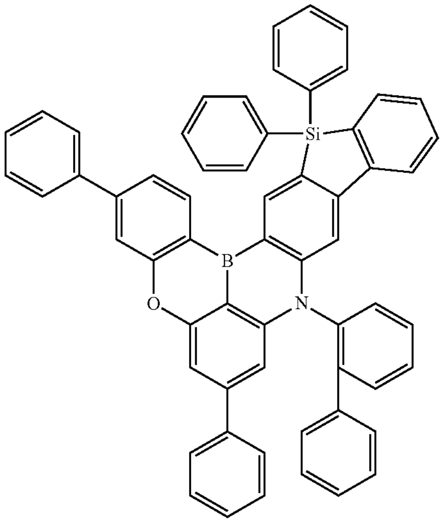
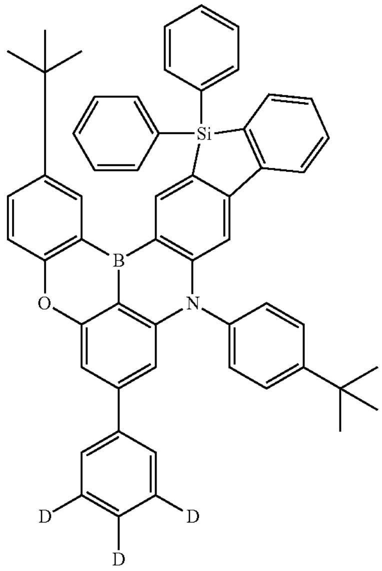
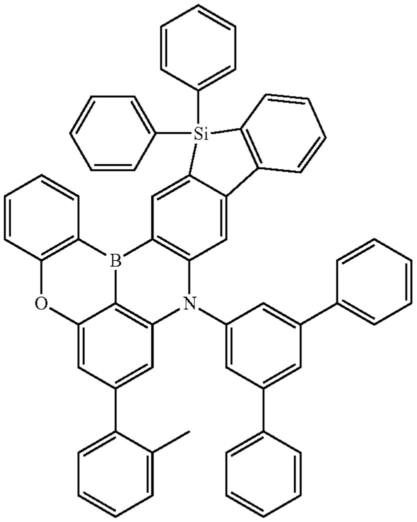

-continued
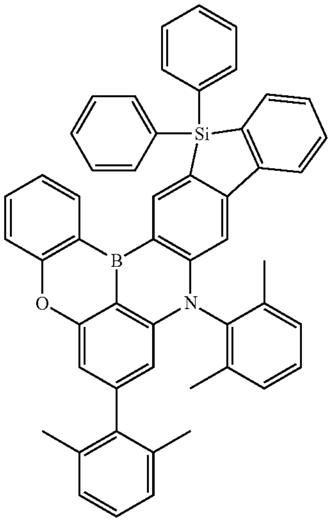
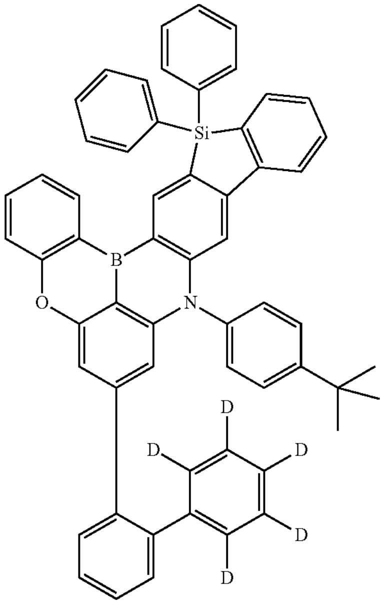
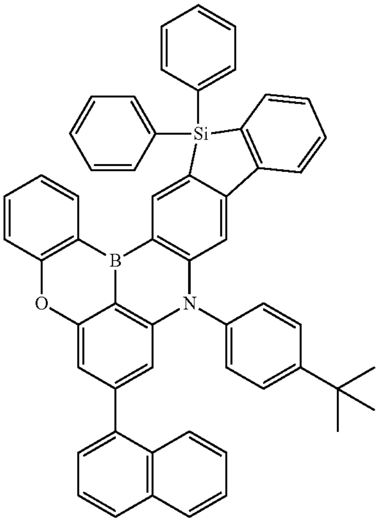
-continued
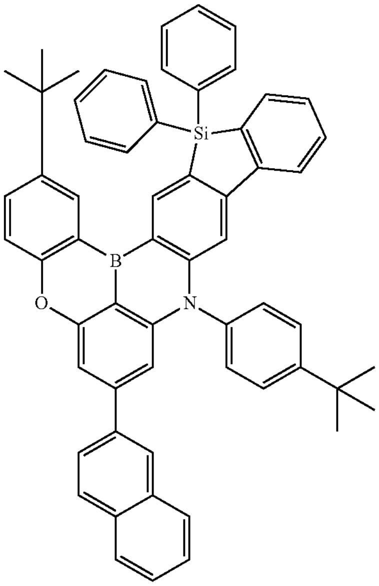
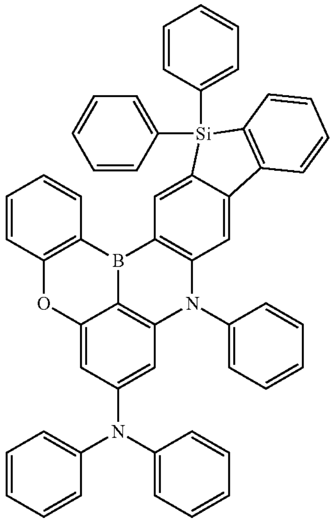
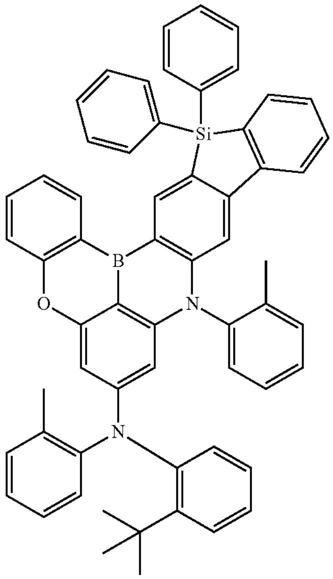

-continued
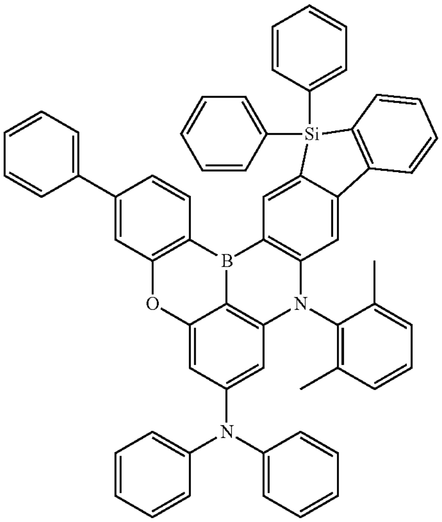
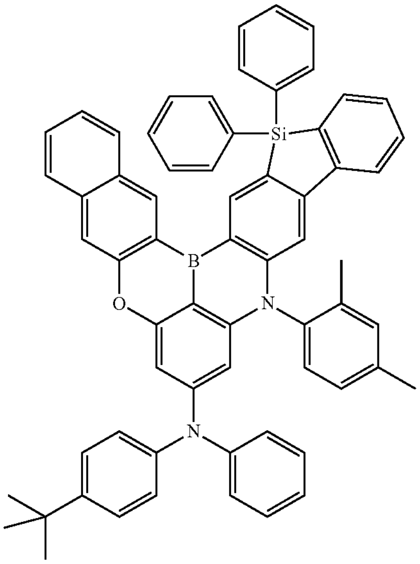
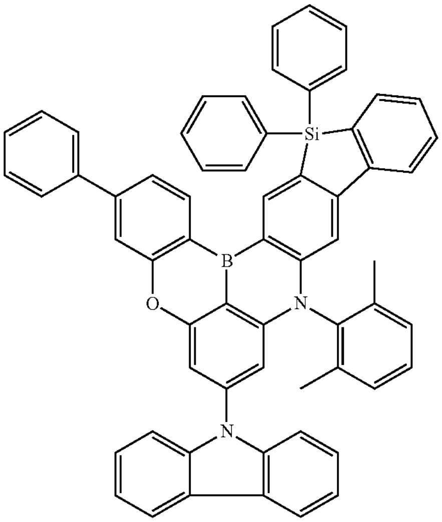
-continued
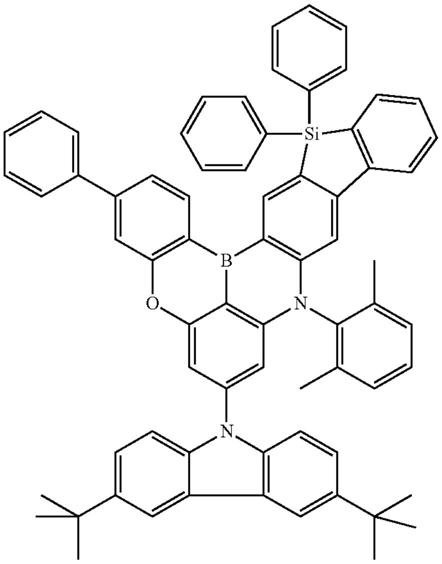
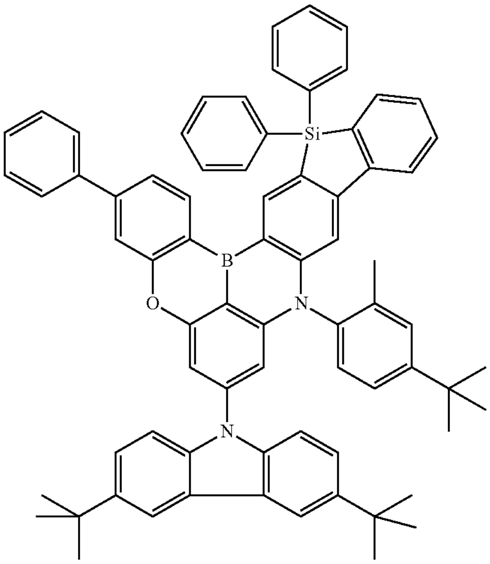
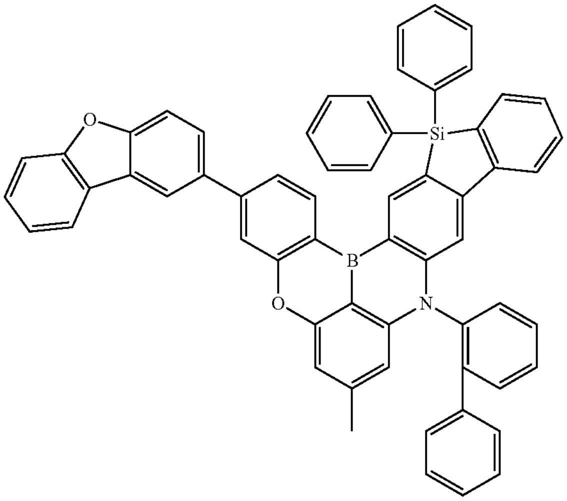

-continued
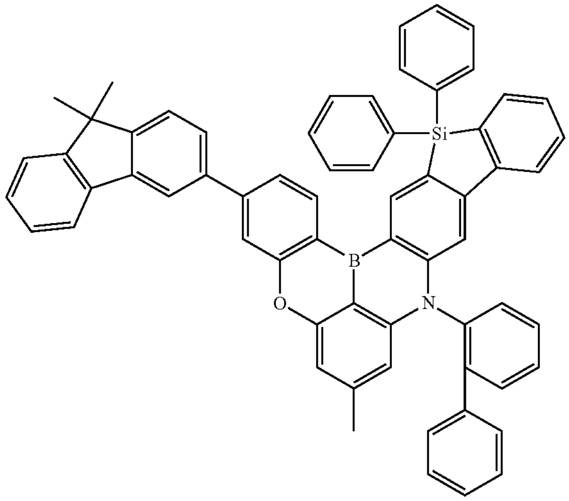
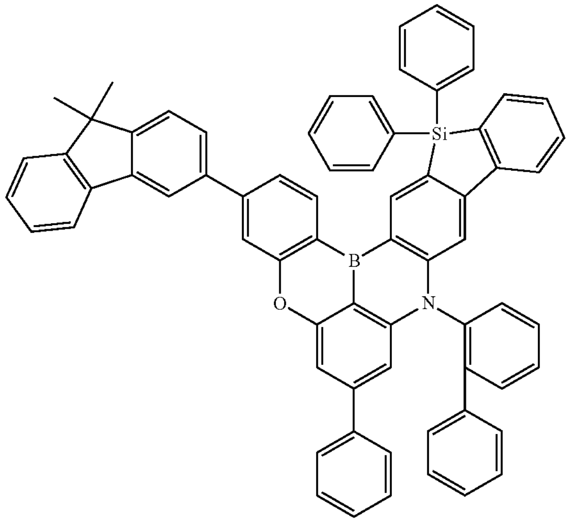
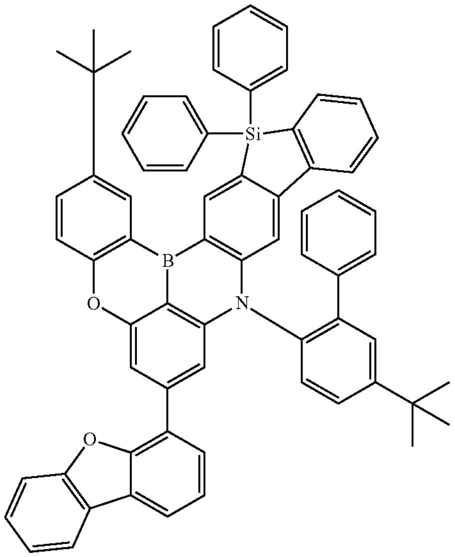
-continued
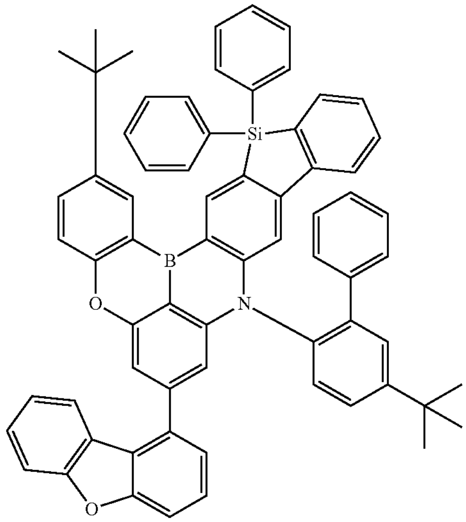
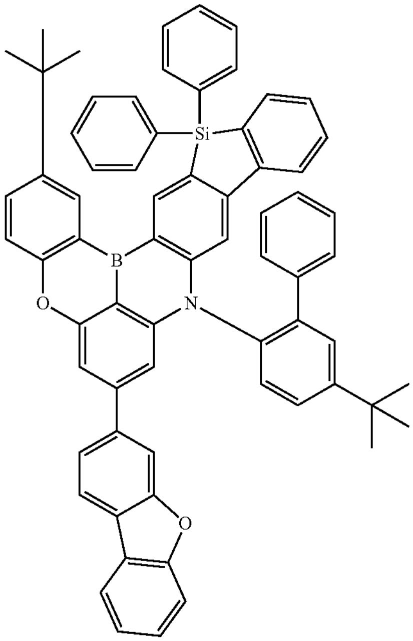

-continued
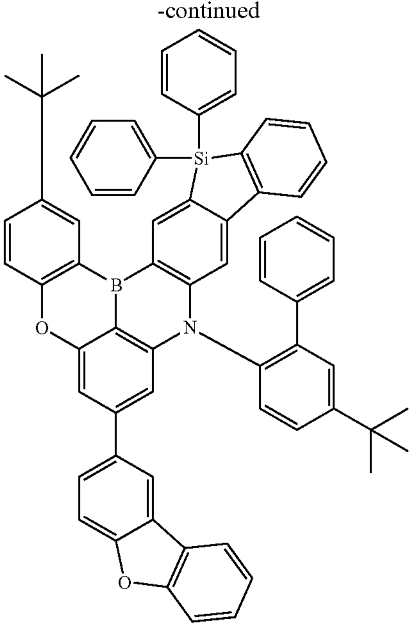
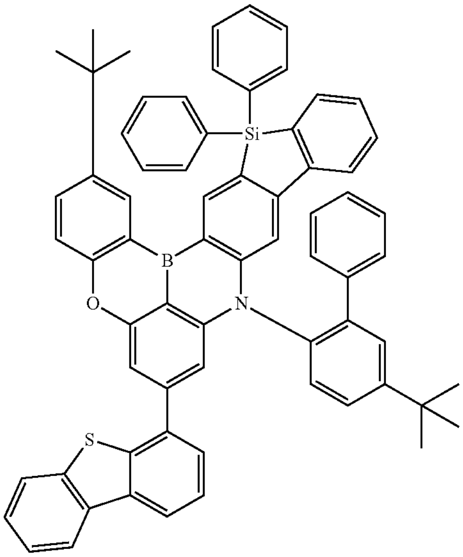
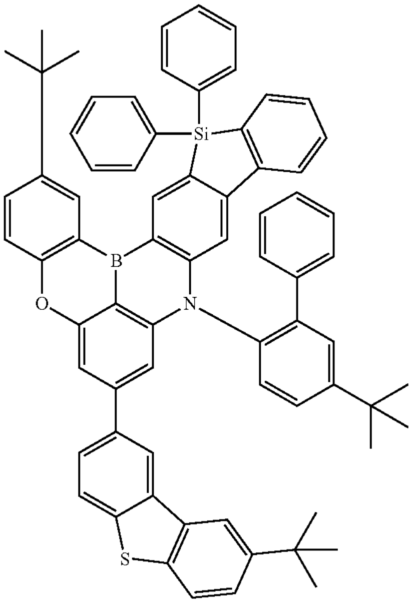
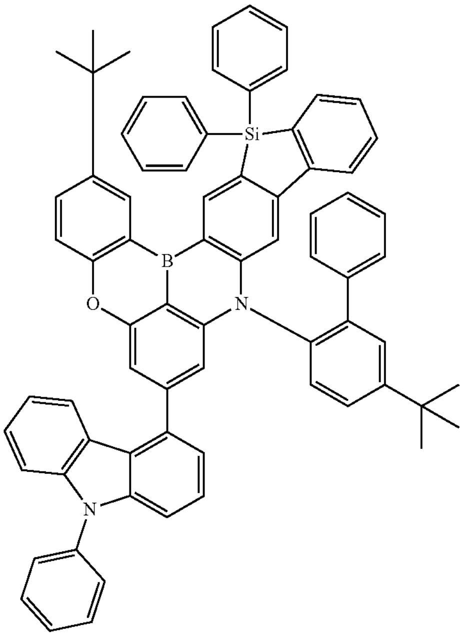
-continued

-continued
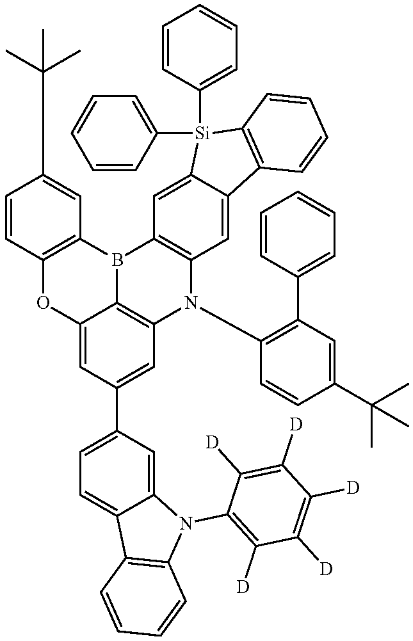
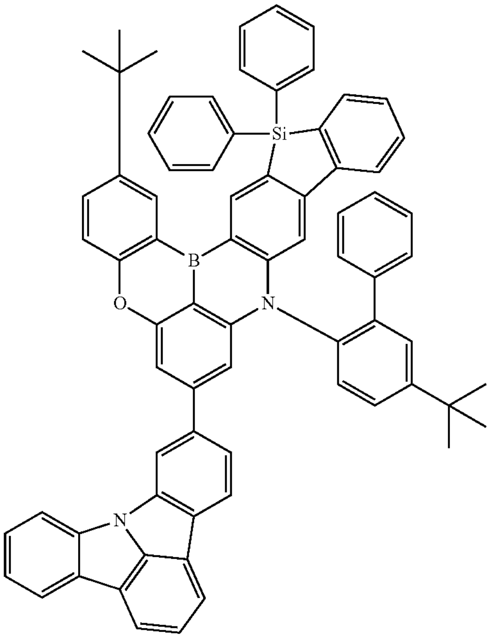
-continued
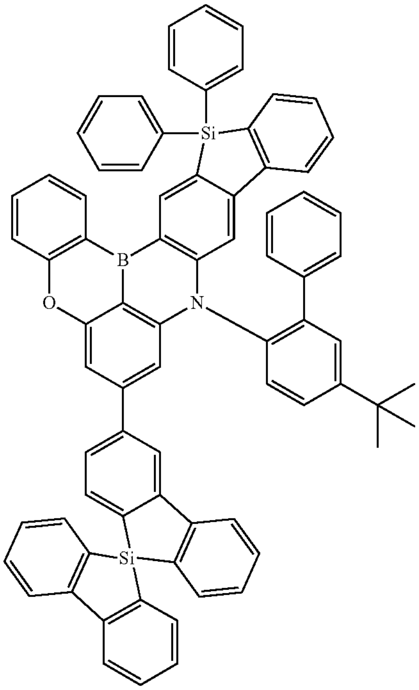
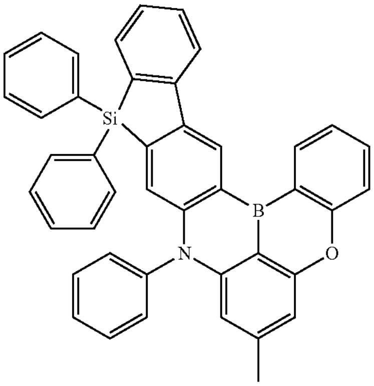
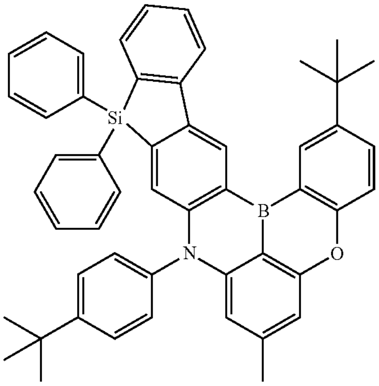

-continued
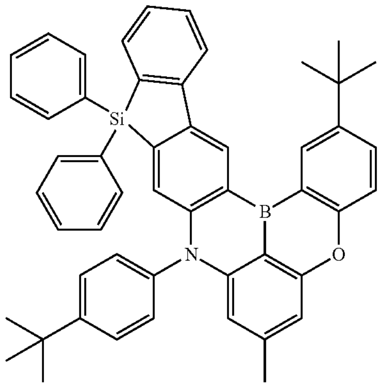
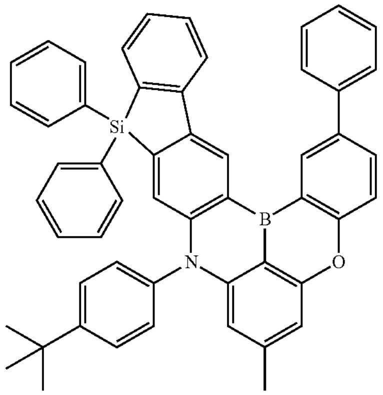
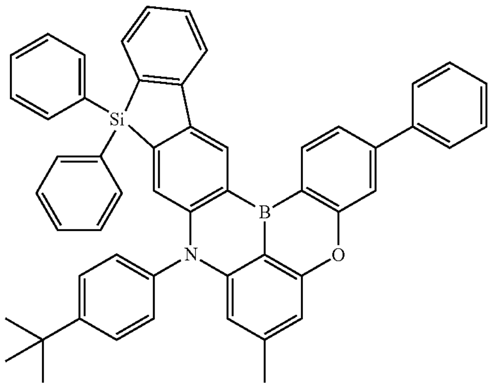
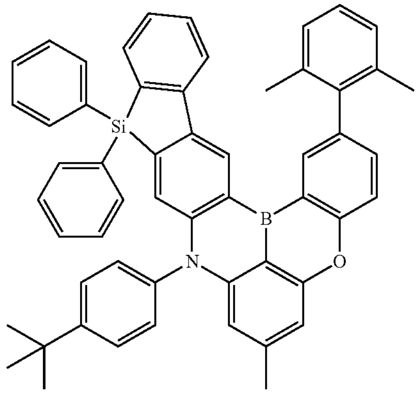
-continued
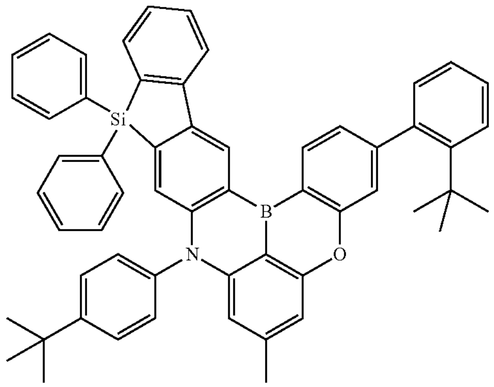
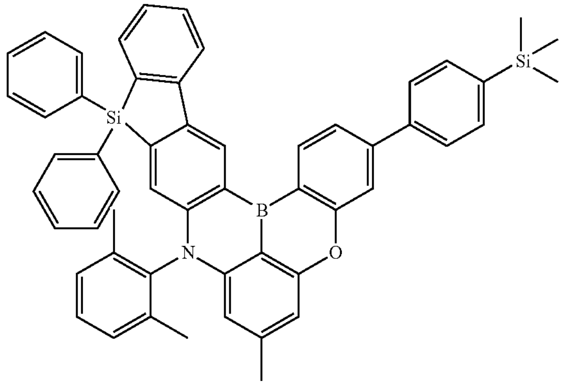
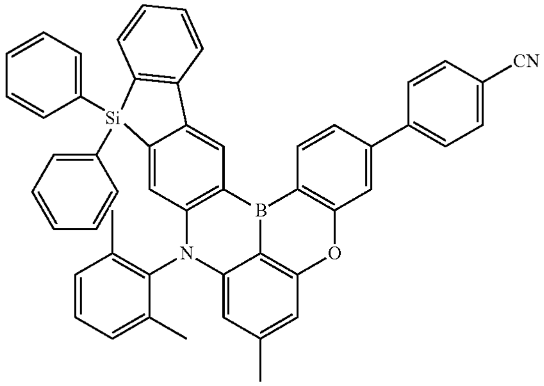
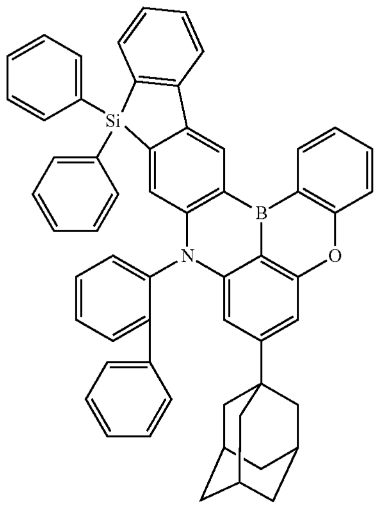

-continued
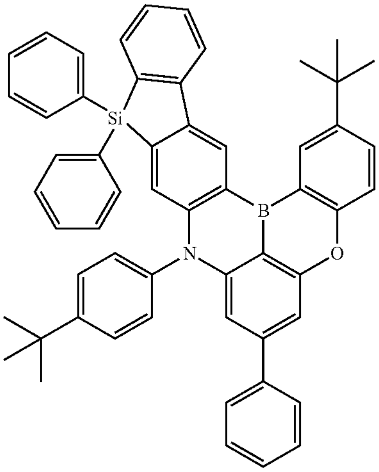
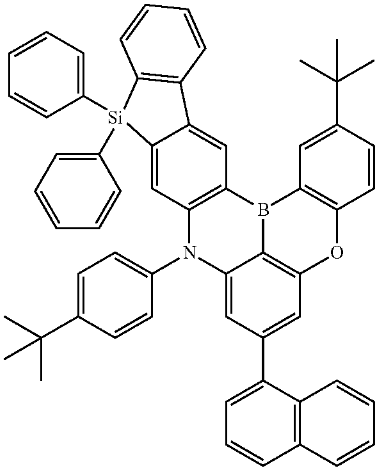
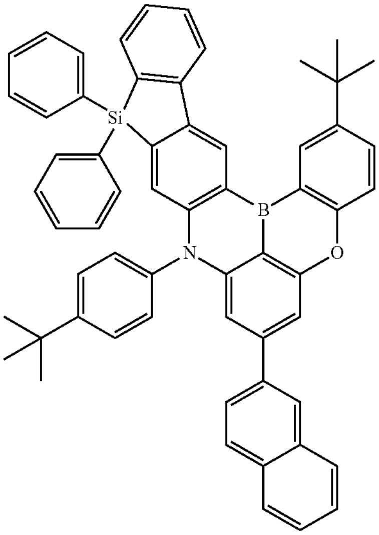
-continued
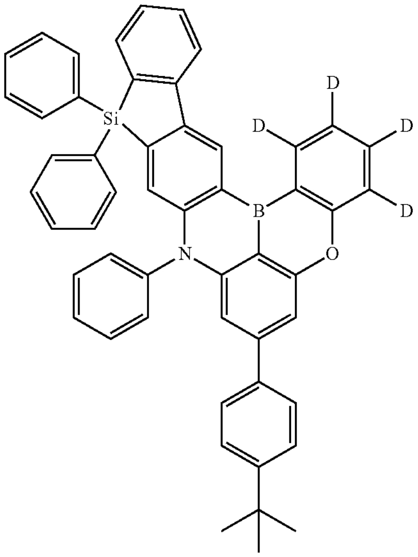
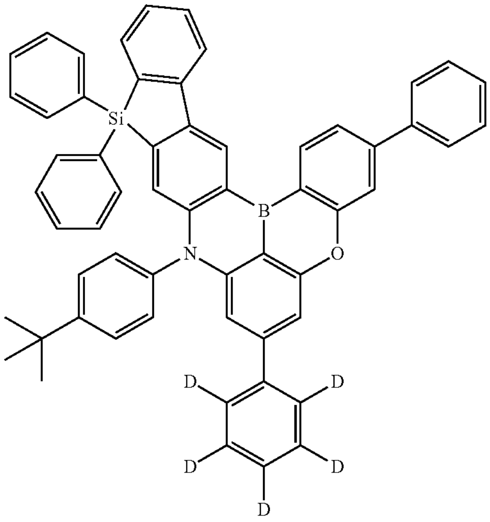
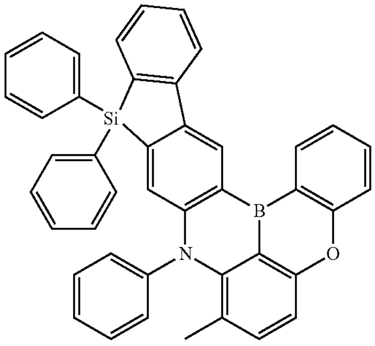

-continued
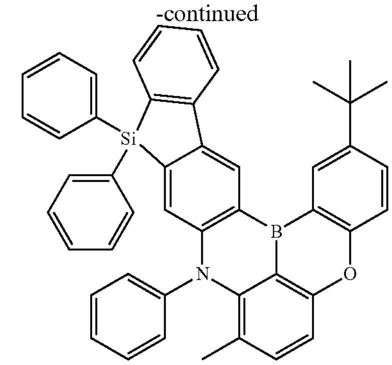
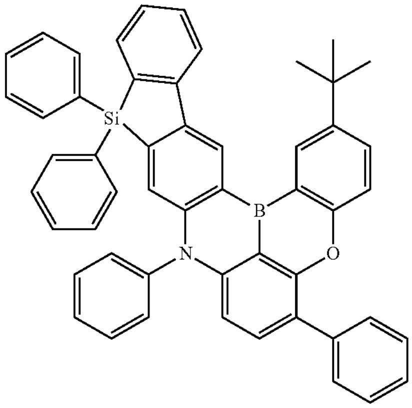
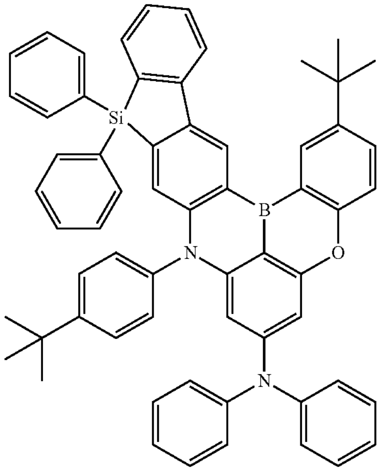
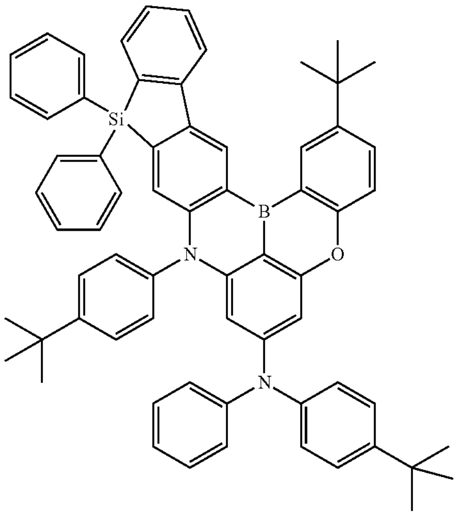
-continued
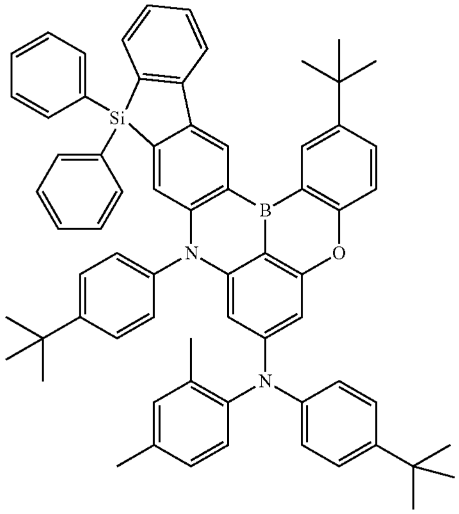
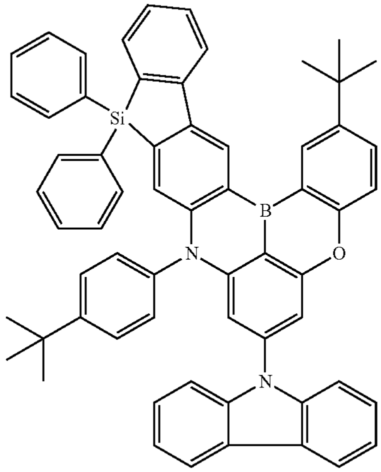
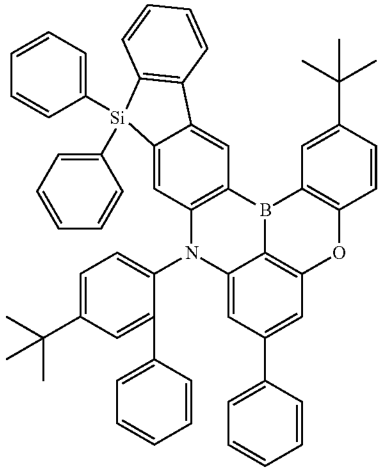

-continued
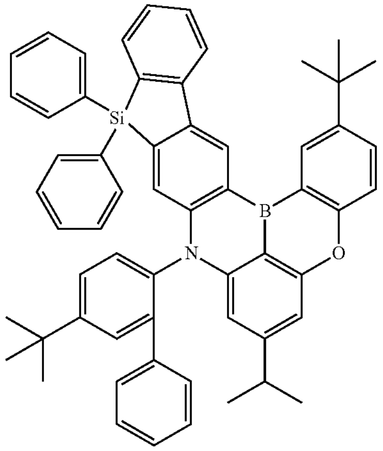
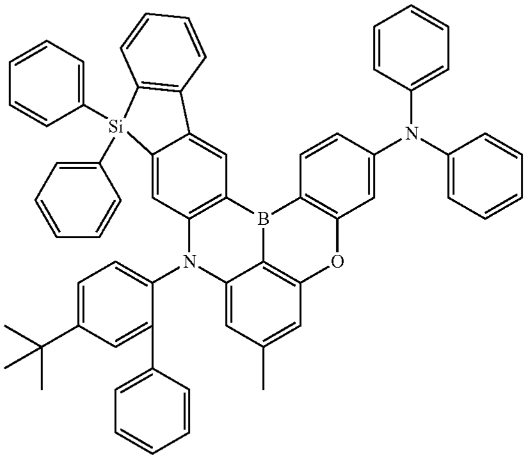
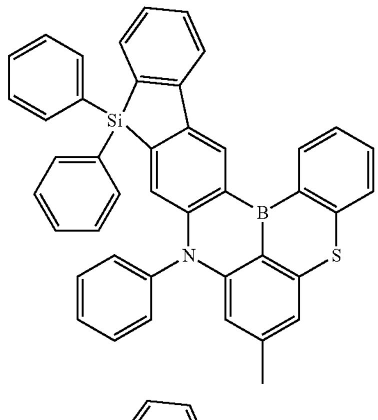
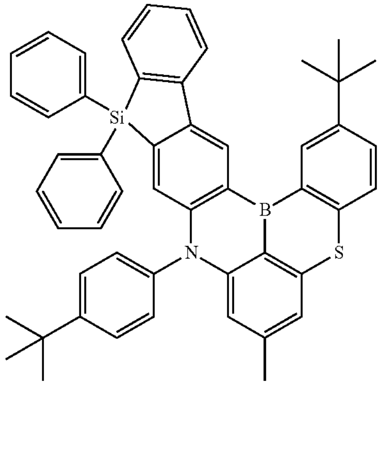
-continued
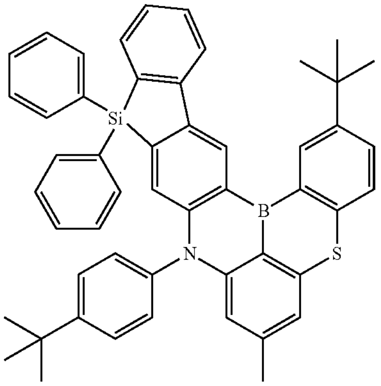
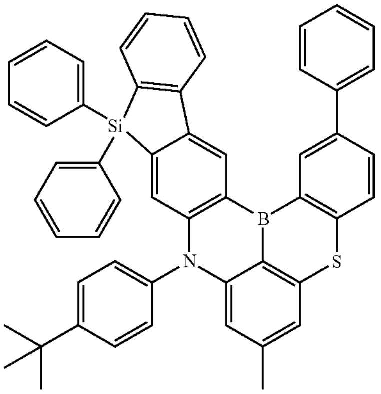
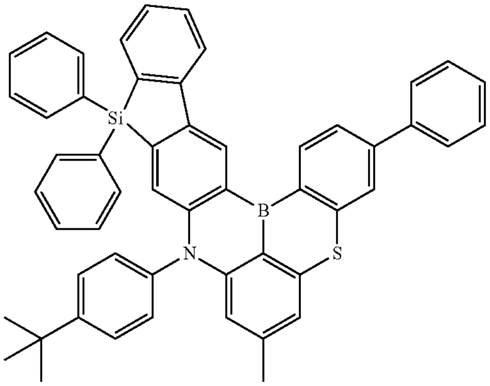
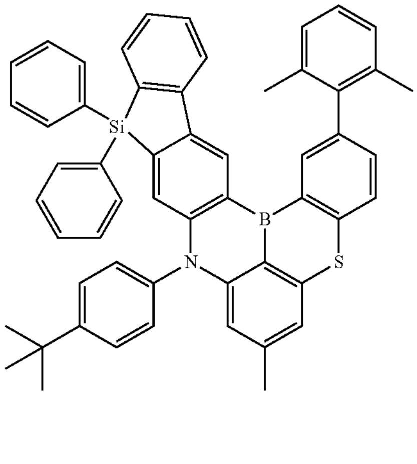

-continued
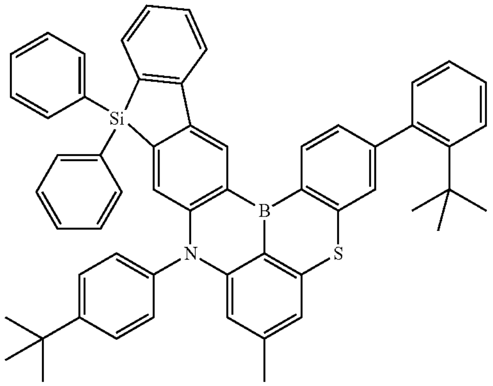
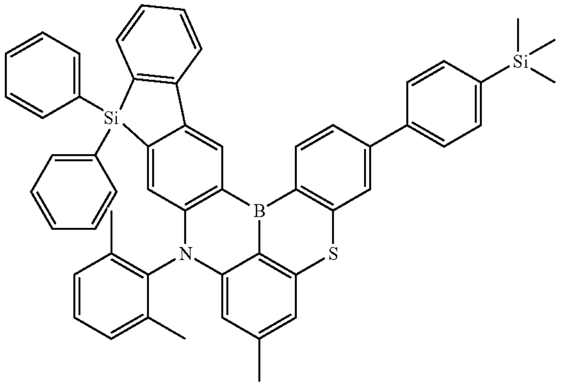
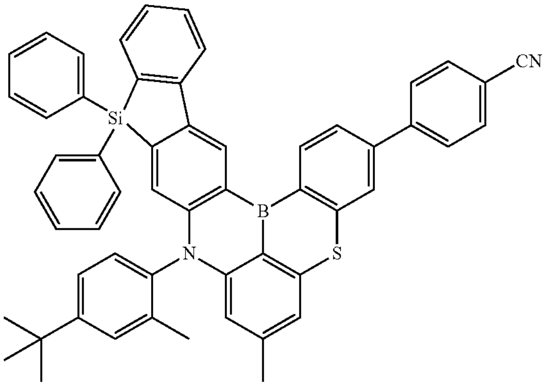
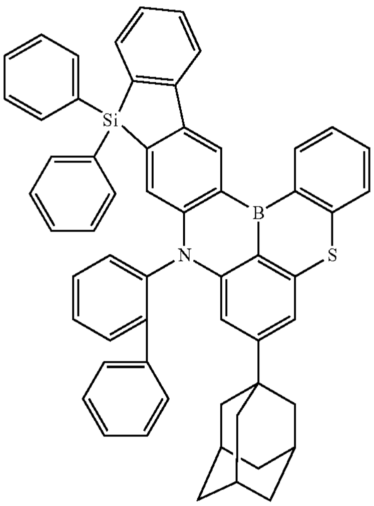
-continued
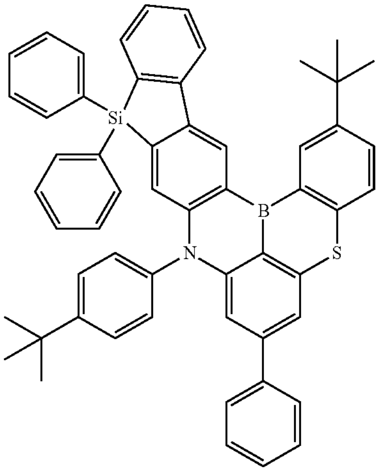
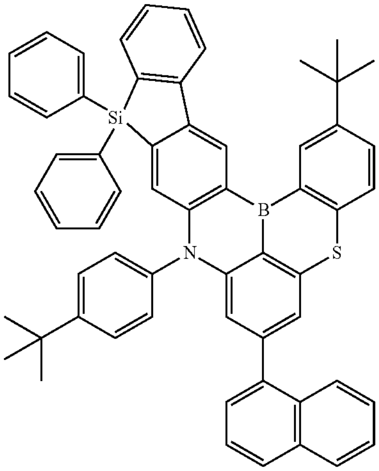
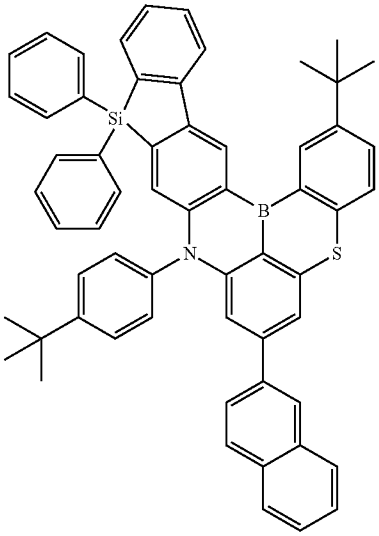

-continued
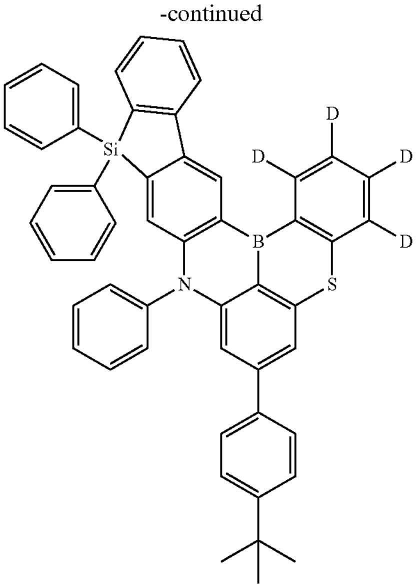
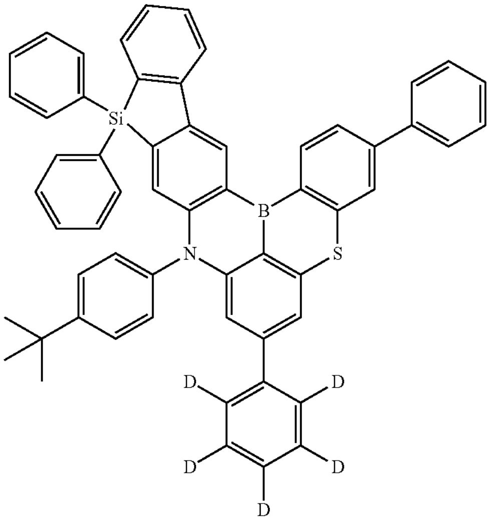
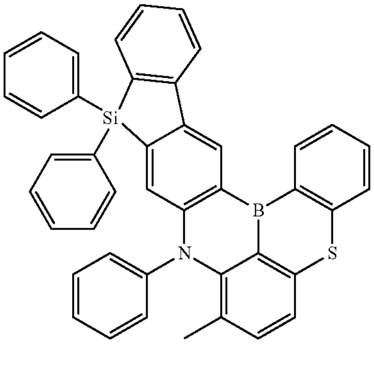
-continued
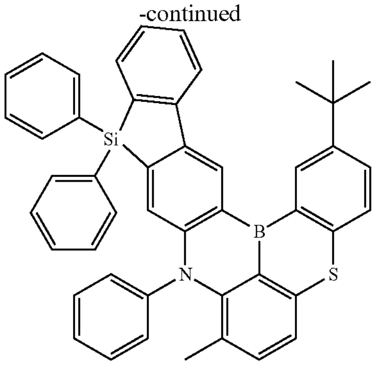
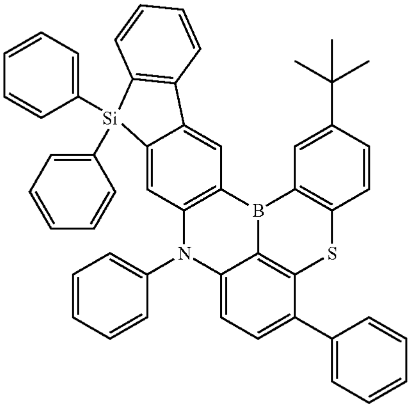
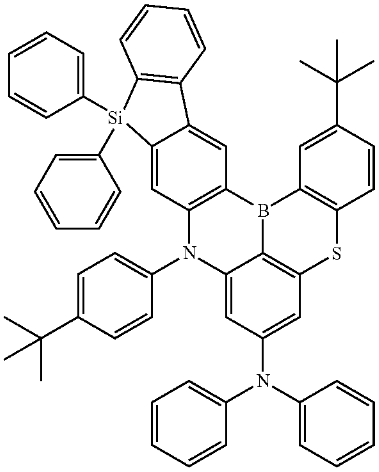
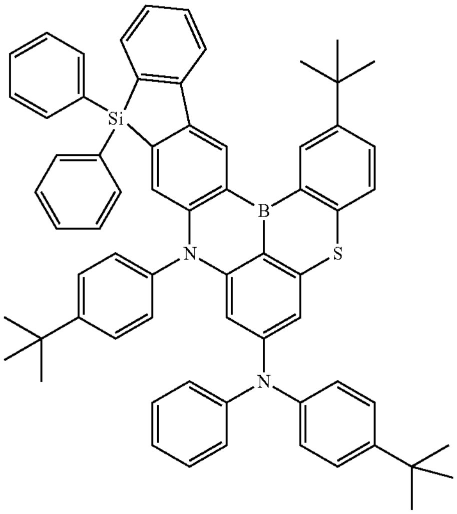

-continued
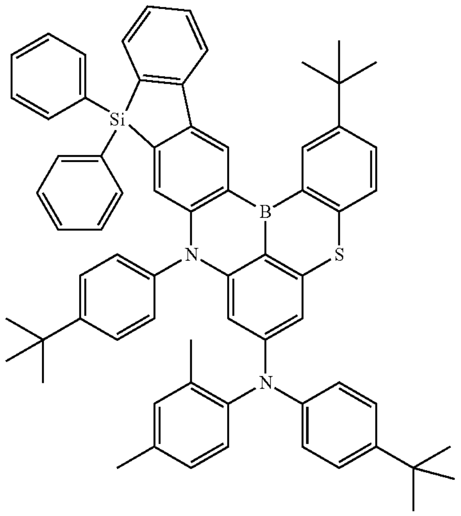
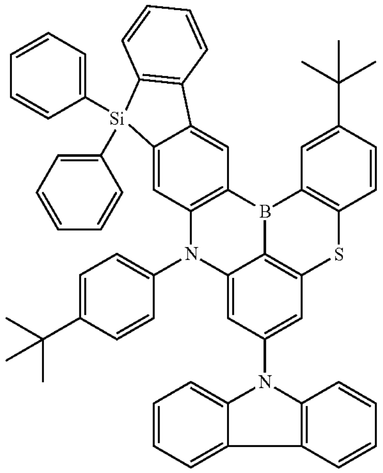
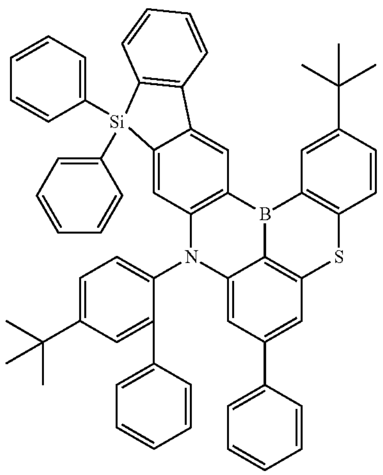
-continued
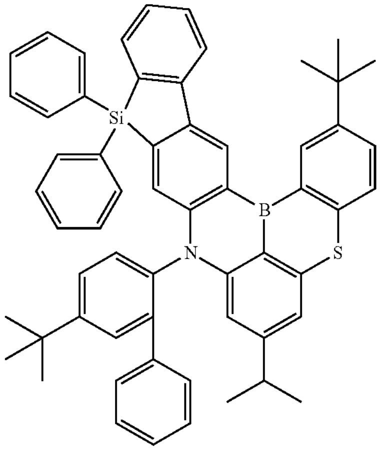
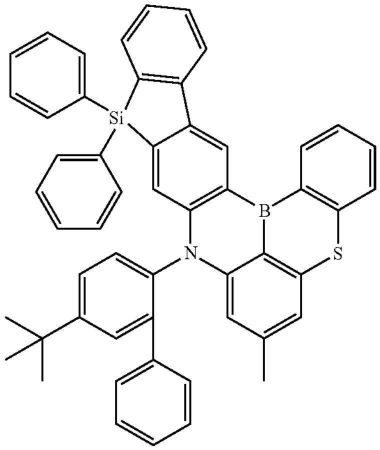
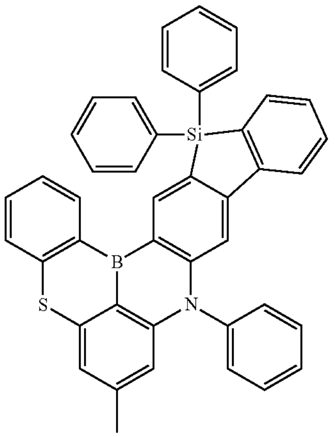

-continued
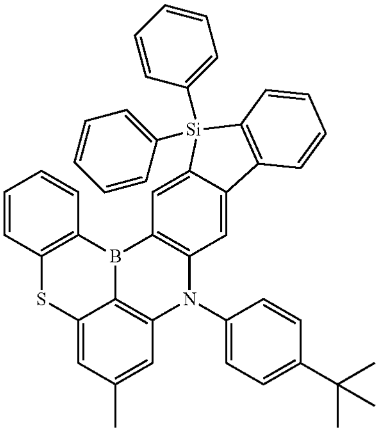
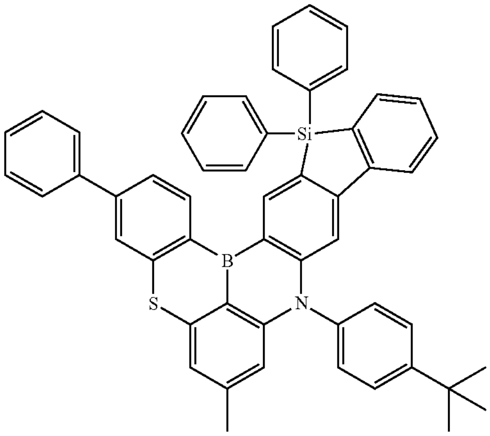
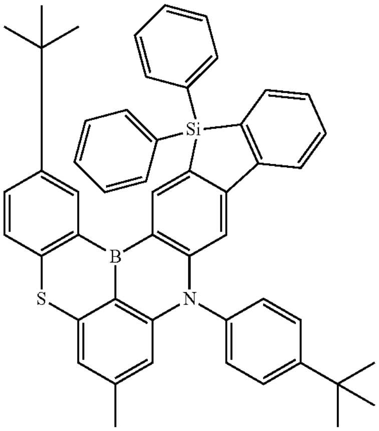
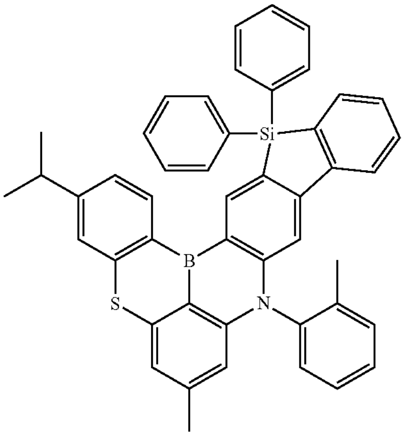
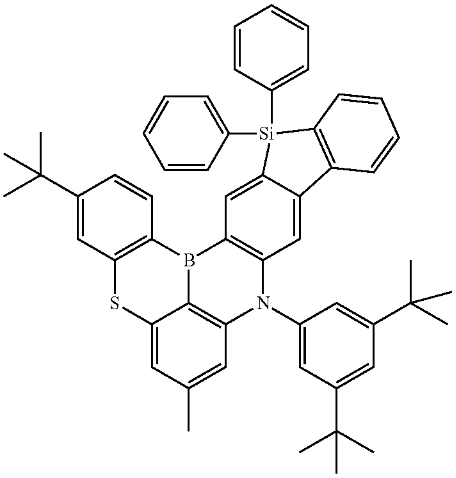
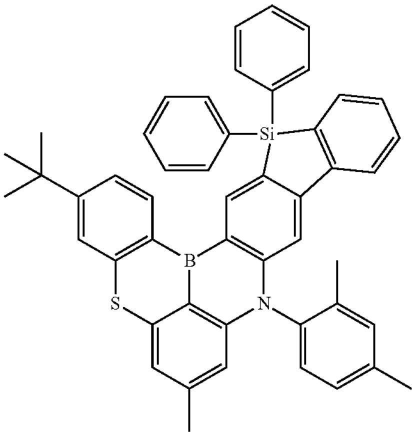

-continued
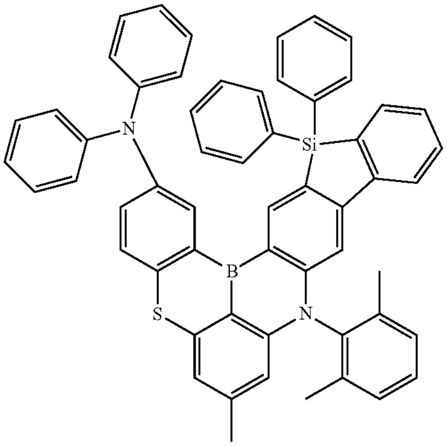
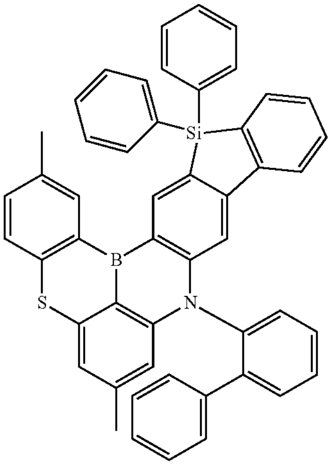
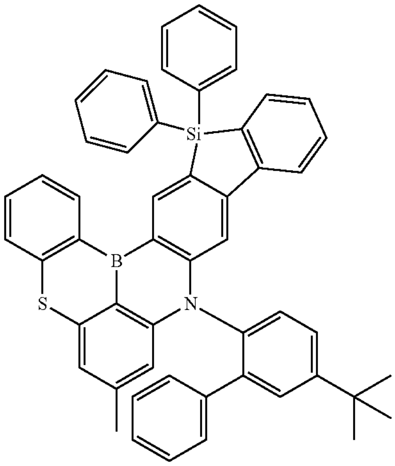
-continued
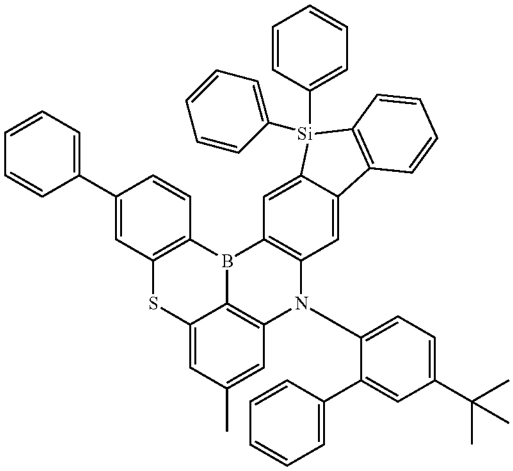
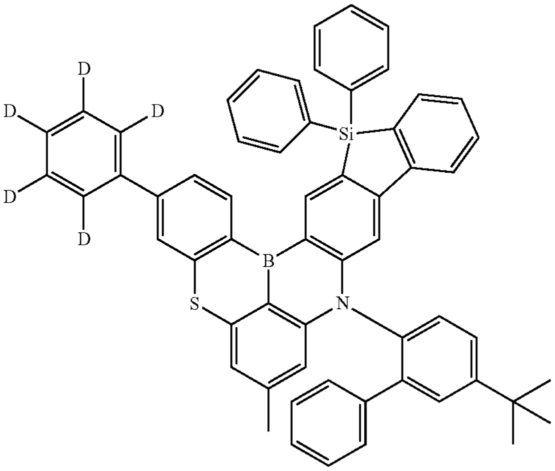
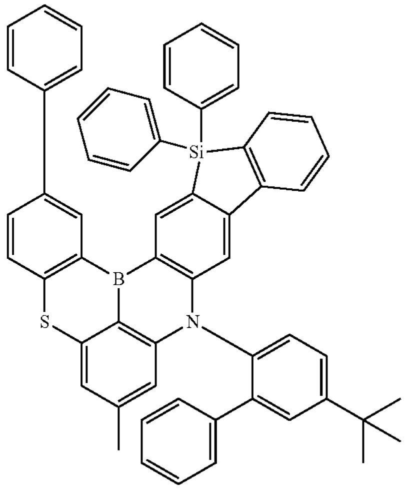

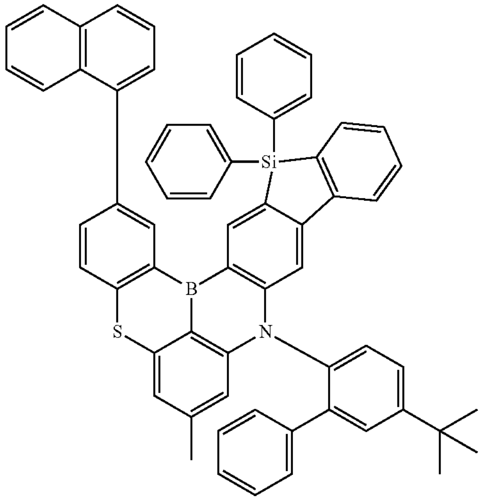
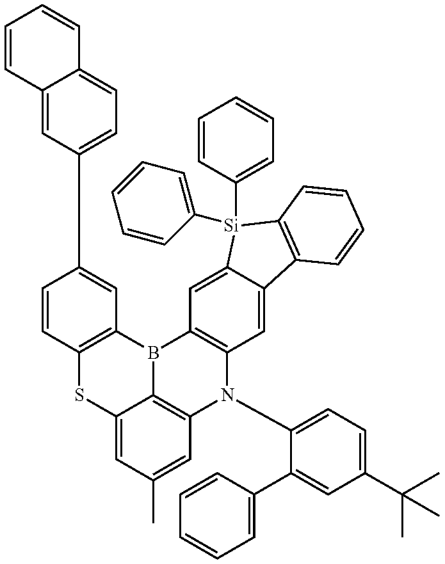
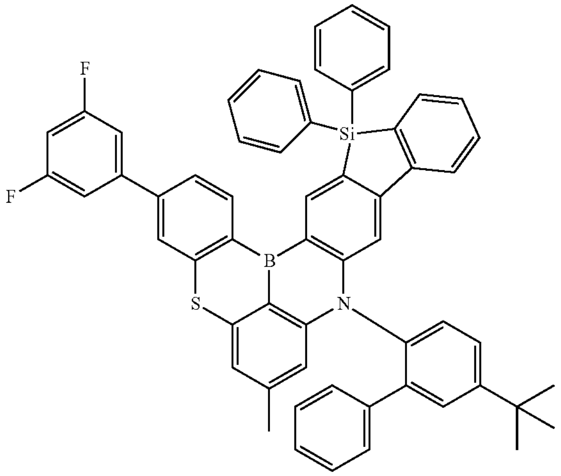
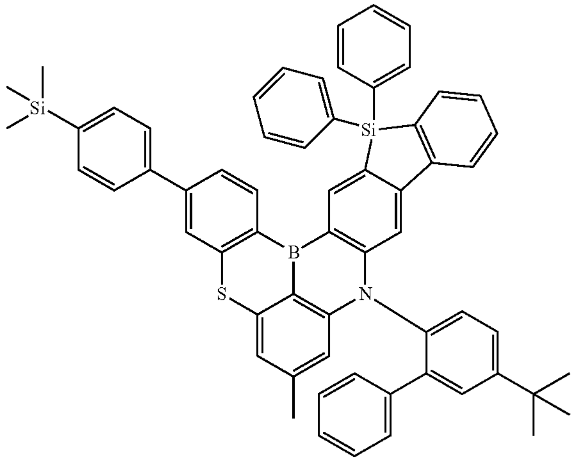
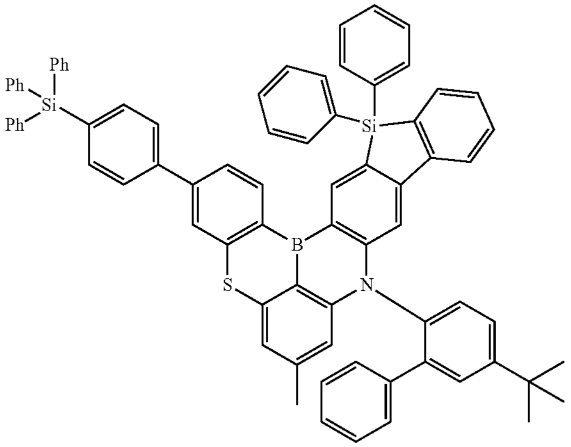
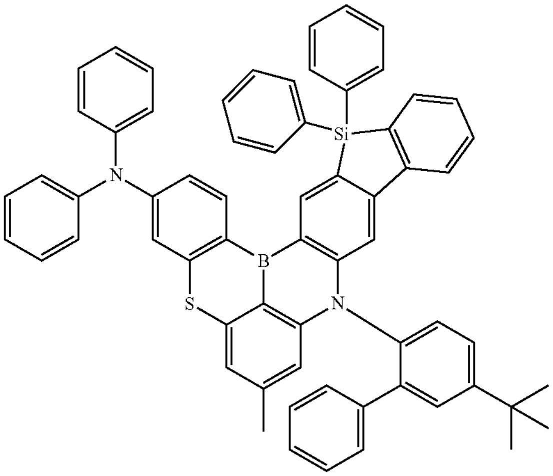

-continued
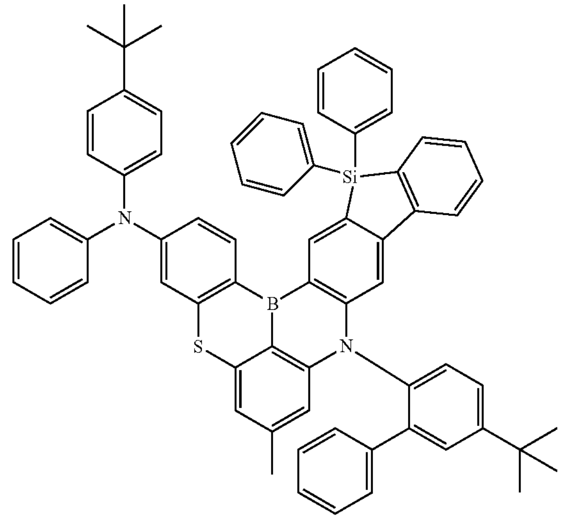
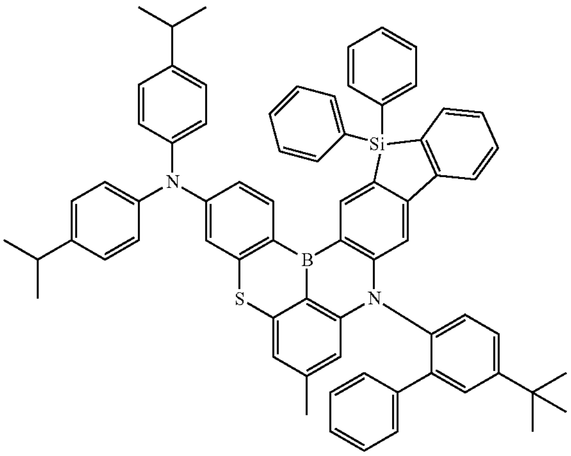
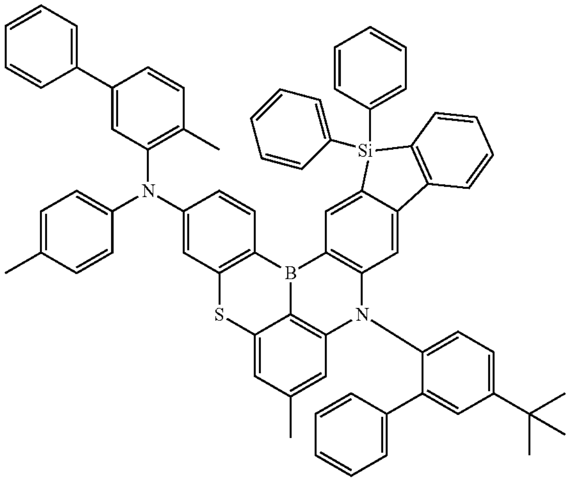
-continued
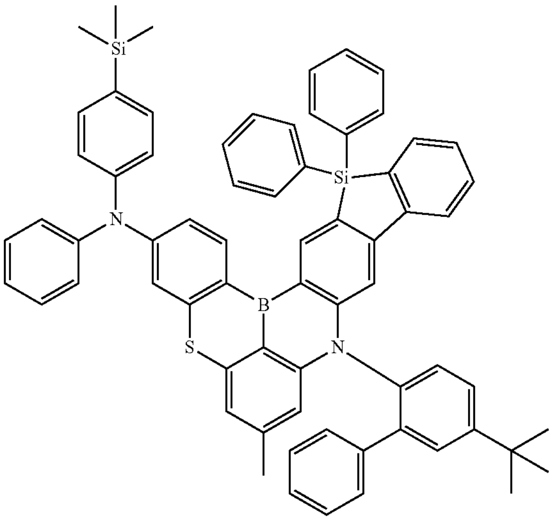
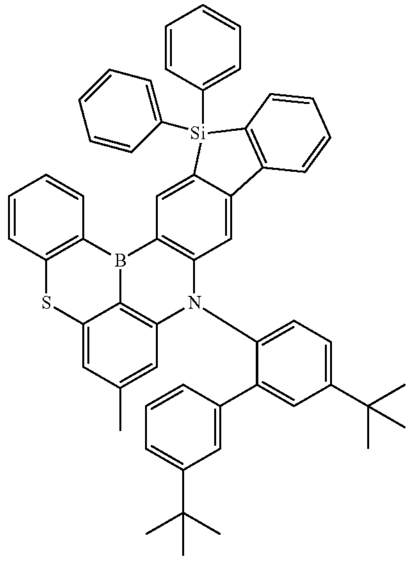
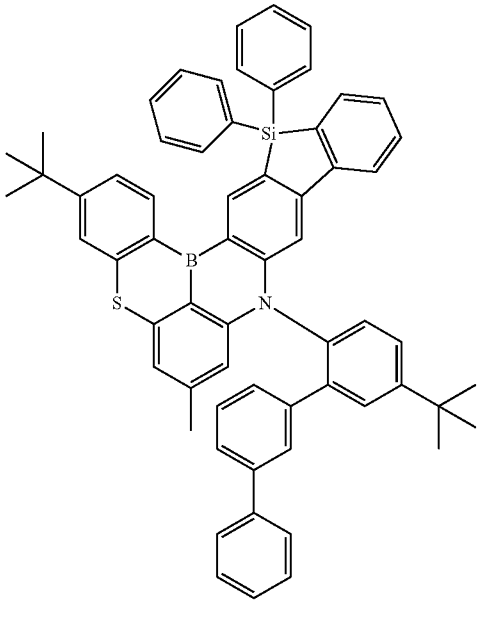

-continued

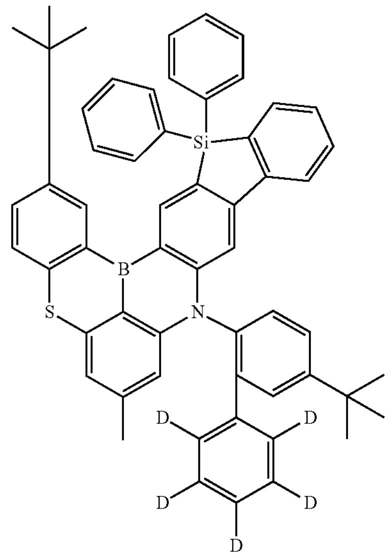

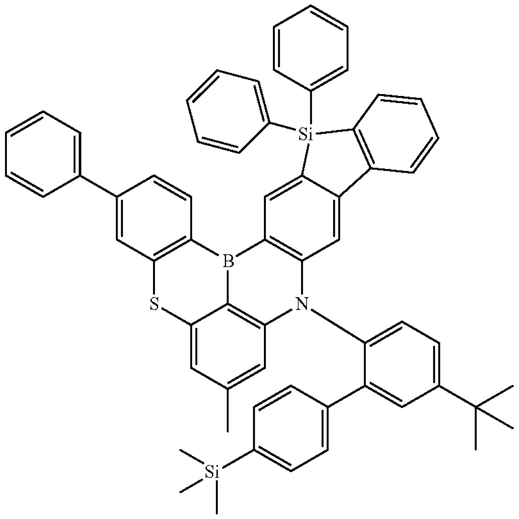

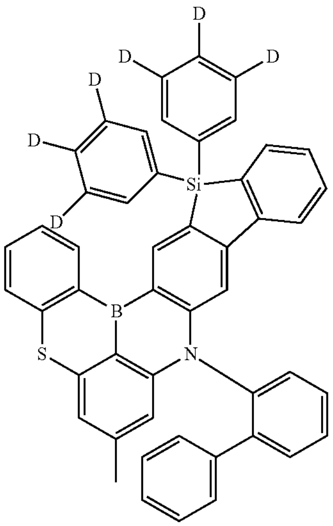

-continued

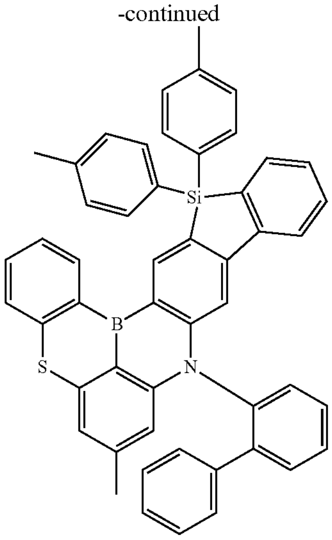

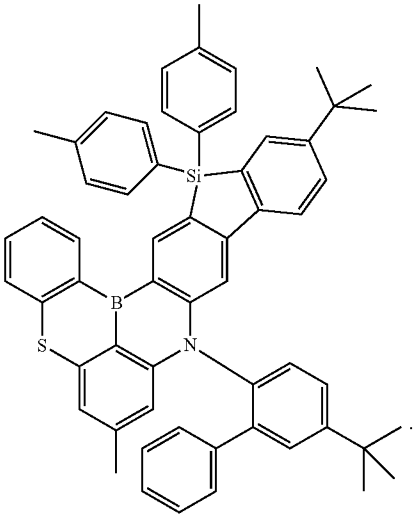

5. An organic light emitting device comprising:

a first electrode;

a second electrode provided to face the first electrode; and an organic material layer having one or more layers provided between the first electrode and the second electrode, wherein one or more layers of the organic material layer comprise the compound according to claim 1.

6. The organic light emitting device of claim 5, wherein the organic material layer comprises a hole transport layer or a hole injection layer, and the hole transport layer or the hole injection layer comprises the compound.

7. The organic light emitting device of claim 5, wherein the organic material layer comprises an electron transport layer or an electron injection layer, and the electron transport layer or the electron injection layer comprises the compound.

8. The organic light emitting device of claim 5, wherein the organic material layer comprises a light emitting layer, and the light emitting layer comprises the compound.

9. The organic light emitting device of claim 5, wherein the organic material layer comprises a light emitting layer, and the light emitting layer comprises the compound as a doping material for the light emitting layer.

10. The organic light emitting device of claim 9, wherein a difference ($\beta_{st}$) between a singlet energy level and a triplet energy level of the compound is less than 0.5 eV.

11. The organic light emitting device of claim 9, wherein the light emitting layer includes a compound of the following Formula 6 as a host:

[Formula 6]

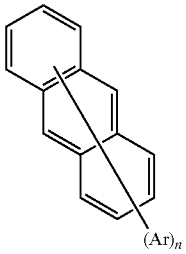

wherein, in Formula 6,

Ar is deuterium; a substituted or unsubstituted aryl group; or substituted or unsubstituted heterocyclic group, n is an integer from 1 to 10, and when n is 2 or higher, substituents in the parentheses are the same as or different from each other.

12. The organic light emitting device of claim 11, wherein Ar is deuterium; an aryl group which is unsubstituted or substituted with a substituent selected from the group consisting of deuterium, an aryl group unsubstituted or substituted with deuterium, and a heterocyclic group unsubstituted or substituted with deuterium; or a heterocyclic group which is unsubstituted or substituted with a substituent selected from the group consisting of deuterium, an aryl group unsubstituted or substituted with deuterium, and a heterocyclic group unsubstituted or substituted with deuterium.

* * * * *